(12) United States Patent
Jiang et al.

(10) Patent No.: US 12,359,779 B1
(45) Date of Patent: Jul. 15, 2025

(54) LED FILAMENT AND LED LIGHT BULB

(71) Applicant: ZHEJIANG SUPER LIGHTING ELECTRIC APPLIANCE CO., LTD., Zhejiang (CN)

(72) Inventors: Tao Jiang, Zhejiang (CN); Aiming Xiong, Zhejiang (CN); Fayong Liu, Zhejiang (CN); Yongnan Wang, Zhejiang (CN); Bao Huang, Zhejiang (CN); Zhikun Wang, Zhejiang (CN); Chengyang Jiang, Zhejiang (CN)

(73) Assignee: ZHEJIANG SUPER LIGHTING ELECTRIC APPLIANCE CO., LTD., Jinyun (CN)

( * ) Notice: Subject to any disclaimer, the term of this patent is extended or adjusted under 35 U.S.C. 154(b) by 0 days.

(21) Appl. No.: 18/813,874

(22) Filed: Aug. 23, 2024

Related U.S. Application Data

(63) Continuation-in-part of application No. 18/642,164, filed on Apr. 22, 2024, which is a continuation of
(Continued)

(30) Foreign Application Priority Data

Nov. 19, 2018 (CN) .......................... 201811378189.2
Dec. 18, 2018 (CN) .......................... 201811549205.X
(Continued)

(51) Int. Cl.
  *F21K 9/64*  (2016.01)
  *F21K 9/232*  (2016.01)
(Continued)

(52) U.S. Cl.
  CPC ................ *F21K 9/64* (2016.08); *F21K 9/232* (2016.08); *F21V 23/06* (2013.01); *F21Y 2103/10* (2016.08); *F21Y 2115/10* (2016.08)

(58) Field of Classification Search
  CPC . F21K 9/238; F21K 9/237; F21K 9/64; F21K 9/232; F21Y 2107/00;
  (Continued)

(56) References Cited

U.S. PATENT DOCUMENTS 10,260,683 B2 * 4/2019 Bergmann .......... H01L 25/0753
10,323,799 B2 * 6/2019 Huang .................... F21K 9/232
(Continued)

*Primary Examiner* — William J Carter
(74) *Attorney, Agent, or Firm* — Simon Kuang Lu

(57) ABSTRACT

An LED light filament includes an LED section, first and second conductive electrodes, and a conductive portion. The LED section includes LED chips. The first conductive electrode and the second conductive electrode are disposed at two ends of the LED section. The conductive portion is electrically connected between the LED chips. An LED chip among the LED chips has an electrical connecting portion, an end portion of the conductive portion is connected to the electrical connecting portion, the conductive portion has a first bent portion and a second bent portion. The conductive portion extends from the electrical connecting portion along a first direction of the LED chip, toward a second direction of the LED chip through the first bent portion, and toward a third direction of the LED chip through the second bent portion, and the first to third directions are different directions. An LED light bulb is also provided.

22 Claims, 70 Drawing Sheets

Related U.S. Application Data application No. 18/126,000, filed on Mar. 24, 2023, now Pat. No. 12,007,077, which is a continuation-in-part of application No. 17/408,519, filed on Aug. 23, 2021, now Pat. No. 11,686,436, which is a continuation-in-part of application No. 16/894,913, filed on Jun. 8, 2020, now Pat. No. 11,421,827, which is a continuation-in-part of application No. 16/748,070, filed on Jan. 21, 2020, now Pat. No. 10,784,428, which is a continuation-in-part of application No. 16/234,124, filed on Dec. 27, 2018, now Pat. No. 10,845,008, which is a continuation-in-part of application No. 15/858,036, filed on Dec. 29, 2017, now Pat. No. 10,544,905, which is a continuation-in-part of application No. 29/627,379, filed on Nov. 27, 2017, now Pat. No. Des. 879,330, and a continuation-in-part of application No. 29/619,287, filed on Sep. 28, 2017, now Pat. No. Des. 862,740, and a continuation-in-part of application No. 15/723,297, filed on Oct. 3, 2017, now Pat. No. 10,655,792, which is a continuation-in-part of application No. 15/168,541, filed on May 31, 2016, now Pat. No. 9,995,474, and a continuation-in-part of application No. 15/308,995, filed as application No. PCT/CN2015/090815 on Sep. 25, 2015, now Pat. No. 10,781,979, said application No. 15/723,297 is a continuation-in-part of application No. 15/499,143, filed on Apr. 27, 2017, now Pat. No. 10,240,724, which is a continuation-in-part of application No. 15/384,311, filed on Dec. 19, 2016, now Pat. No. 10,487,987, which is a continuation-in-part of application No. 15/366,535, filed on Dec. 1, 2016, now Pat. No. 10,473,271, and a continuation-in-part of application No. 15/237,983, filed on Aug. 16, 2016, now Pat. No. 10,228,093, said application No. 18/126,000 is a continuation-in-part of application No. 17/900,897, filed on Sep. 1, 2022, now Pat. No. 11,629,825, which is a continuation of application No. 17/356,576, filed on Jun. 24, 2021, now Pat. No. 11,525,547, which is a continuation of application No. 16/914,461, filed on Jun. 28, 2020, now Pat. No. 11,085,591, which is a continuation of application No. 16/840,469, filed on Apr. 6, 2020, now Pat. No. 10,711,951, which is a continuation of application No. 16/505,732, filed on Aug. 28, 2019, now Pat. No. 10,677,396, which is a continuation of application No. 15/858,036, filed on Dec. 29, 2017, now Pat. No. 10,544,905, which is a continuation-in-part of application No. 15/723,297, filed on Oct. 3, 2017, now Pat. No. 10,655,792, which is a continuation-in-part of application No. 15/168,541, filed on May 31, 2016, now Pat. No. 9,995,474, and a continuation-in-part of application No. 15/308,995, filed on Nov. 4, 2016, now Pat. No. 10,781,979, and a continuation-in-part of application No. 15/499,143, filed on Apr. 27, 2017, now Pat. No. 10,240,724, which is a continuation-in-part of application No. 15/384,311, filed on Dec. 19, 2016, now Pat. No. 10,487,987, which is a continuation-in-part of application No. 15/366,535, filed on Dec. 1, 2016, now Pat. No. 10,473,271, which is a continuation-in-part of application No. 15/237,983, filed on Aug. 16, 2016, now Pat. No. 10,228,093, said application No. 15/858,036 is a continuation-in-part of application No. 29/627,379, filed on Nov. 27, 2017, now Pat. No. Des. 879,330, and a continuation-in-part of application No. 29/619,287, filed on Sep. 28, 2017, now Pat. No. Des. 862,740.

(30) Foreign Application Priority Data

| Jan. 22, 2019 | (CN) | 201910060475.2 |
| Jun. 10, 2019 | (CN) | 201910497661.2 |
| Nov. 1, 2019 | (CN) | 201911057715.X |
| Dec. 5, 2019 | (CN) | 201911234236.0 |
| Aug. 24, 2020 | (CN) | 202010856691.0 |
| Sep. 1, 2020 | (CN) | 202010904065.4 |
| Sep. 3, 2020 | (CN) | 202010912636.9 |
| Nov. 20, 2020 | (CN) | 202011313059.8 |
| Feb. 27, 2021 | (CN) | 202110108853.7 |
| Jul. 9, 2021 | (CN) | 202110779145.6 |
| Oct. 23, 2023 | (CN) | 202311381406.4 |
| Jan. 29, 2024 | (CN) | 202410121595.X |

(51) Int. Cl.
 *F21V 23/06* (2006.01)
 *F21Y 103/10* (2016.01)
 *F21Y 115/10* (2016.01)

(58) Field of Classification Search
 CPC .................. F21Y 2107/70; F21Y 2115/10; F21Y 103/10; H01L 2924/181; F21V 23/06
 See application file for complete search history.

(56) References Cited

U.S. PATENT DOCUMENTS

| | | | | |
|---|---|---|---|---|
| 10,655,792 | B2 * | 5/2020 | Jiang | F21K 9/232 |
| 10,969,063 | B2 * | 4/2021 | Schlereth | H01L 25/0753 |
| 2009/0184618 | A1 * | 7/2009 | Hakata | F21K 9/232 |
| | | | | 313/1 |
| 2011/0050073 | A1 * | 3/2011 | Huang | F21V 29/70 |
| | | | | 313/317 |
| 2012/0169251 | A1 * | 7/2012 | Lai | F21K 9/232 |
| | | | | 315/294 |
| 2012/0300432 | A1 * | 11/2012 | Matsubayashi | H10H 20/8512 |
| | | | | 362/84 |
| 2013/0100645 | A1 * | 4/2013 | Ooya | C09K 11/77348 |
| | | | | 362/84 |
| 2013/0141892 | A1 * | 6/2013 | Okazaki | F21V 29/85 |
| | | | | 362/363 |
| 2013/0215625 | A1 * | 8/2013 | Takeuchi | F21V 19/003 |
| | | | | 362/363 |
| 2015/0003038 | A1 * | 1/2015 | Liu | H01L 24/29 |
| | | | | 438/27 |
| 2017/0012177 | A1 * | 1/2017 | Trottier | F21K 9/00 |
| 2018/0172218 | A1 * | 6/2018 | Feit | F21V 23/06 |
| 2019/0137047 | A1 * | 5/2019 | Hu | F21K 9/90 |
| 2019/0139943 | A1 * | 5/2019 | Tiwari | H10H 20/8513 |
| 2019/0368667 | A1 * | 12/2019 | On | F21K 9/238 |
| 2020/0176646 | A1 * | 6/2020 | Li | F21K 9/232 |

* cited by examiner

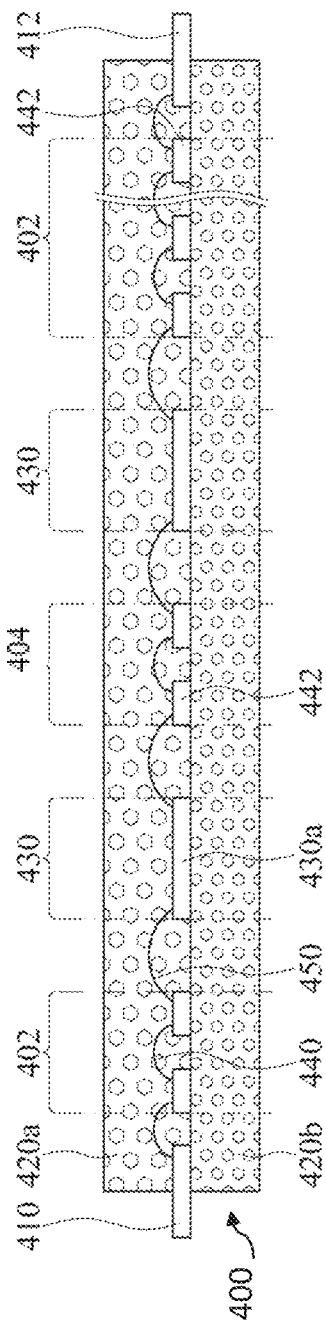
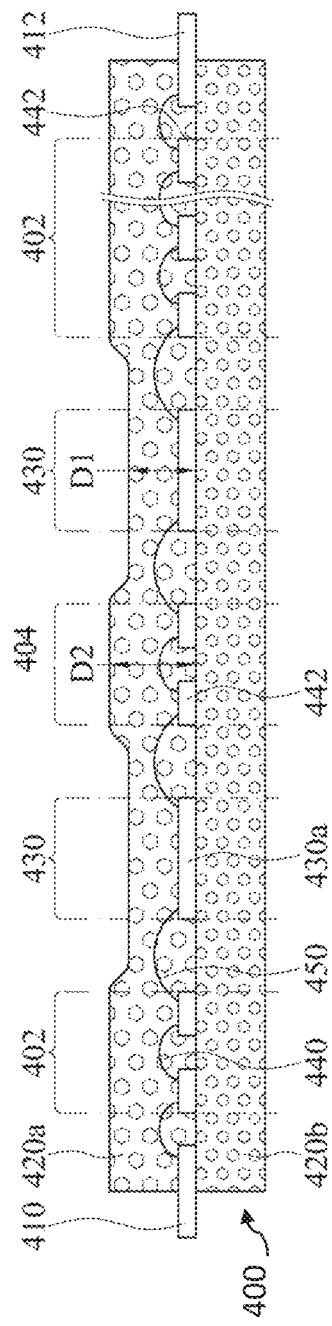
FIG. 4B
FIG. 4C

LED FILAMENT AND LED LIGHT BULB

CROSS-REFERENCE TO RELATED APPLICATIONS

This application is a continuation-in-part (CIP) of application Ser. No. 18/642,164, filed on 2024 Apr. 22. This application also claims priority under 35 U.S.C. § 119 (a) to patent application No. 202311381406.4 filed in China on Oct. 23, 2023 and patent application No. 202410121595.X filed in China on Jan. 29, 2024. The prior applications are herewith incorporated by reference in its entirety.

TECHNICAL FIELD

The present disclosure relates to a lighting field, and more particularly to an LED filament and its application in an LED light bulb.

RELATED ART

Incandescent bulbs have been widely used for homes or commercial lighting for decades. However, incandescent bulbs are generally with lower efficiency in terms of energy application, and about 90% of energy input can be converted into a heat form to dissipate. In addition, because the incandescent bulb has a very limited lifespan (about 1,000 hours), it needs to be frequently replaced. These traditional incandescent bulbs are gradually replaced by other more efficient lighting devices, such as fluorescent lights, high-intensity discharge lamps, light-emitting diodes (LEDs) lights and the like. In these electric lamps, the LED light lamp attracts widespread attention in its lighting technology. The LED light lamp has the advantages of long lifespan, small in size, environmental protection and the like, therefore the application of the LED light lamp continuously grows.

In recent years, LED light bulbs with LED filaments have been provided on the market. At present, LED light bulbs using LED filaments as illumination sources still have the following problems to be improved.

Firstly, an LED hard filament is provided with a substrate (for example, a glass substrate) and a plurality of LED chips disposed on the substrate. However, the illumination appearance of the LED light bulbs relies on multiple combinations of the LED hard filaments to produce the better illumination appearances. The illumination appearance of the single LED hard filament cannot meet the general needs in the market. A traditional incandescent light bulb is provided with a tungsten filament, the uniform light emitting can be generated due to the natural bendable property of the tungsten filament. In contrast, the LED hard filament is difficult to achieve such uniform illumination appearances. There are many reasons why LED hard filaments are difficult to achieve the uniform illumination appearance. In addition to the aforementioned lower bendable property, one of the reasons is that the substrate blocks the light emitted by the LED chip, and furthermore the light generated by the LED chip is displayed similar to a point light source which causes the light showing concentrated illumination and with poor illumination uniformity. In other words, a uniform distribution of the light emitted from LED chip produces a uniform illumination appearance of the LED filament. On the other hand, the light ray distribution similar to a point light source may result in uneven and concentrated illumination.

Secondly, there is one kind of LED soft filament, which is similar to the structure of the above-mentioned LED hard filament and is employed a flexible printed circuit substrate (hereinafter referred to FPC) instead of the glass substrate to enable the LED filament having a certain degree of bending. However, by utilizing the LED soft filament made of the FPC, the FPC has a thermal expansion coefficient different from that of the silicon gel coated covering the LED soft filament, and the long-term use causes the displacement or even degumming of the LED chips. Moreover, the FPC may not beneficial to flexible adjustment of the process conditions and the like. Besides, during bending the LED soft filament it has a challenge in the stability of the metal wire bonded between LED chips. When the arrangement of the LED chips in the LED soft filament is dense, if the adjacent LED chips are connected by means of metal wire bonding, it is easy to cause the stress to be concentrated on a specific part of the LED soft filament when the LED soft filament is bent, thereby the metal wire bonding between the LED chips are damaged and even broken.

In addition, the LED filament is generally disposed inside the LED light bulb, and in order to present the aesthetic appearance and also to make the illumination of the LED filament more uniform and widespread, the LED filament is bent to exhibit a plurality of curves. Since the LED chips are arranged in the LED filaments, and the LED chips are relatively hard objects, it is difficult for the LED filaments to be bent into a desired shape. Moreover, the LED filament is also prone to cracks due to stress concentration during bending.

In order to increase the aesthetic appearance and make the illumination appearance more uniform, an LED light bulb has a plurality of LED filaments, which are disposed with different placement or angles. However, since the plurality of LED filaments need to be installed in a single LED light bulb, and these LED filaments need to be fixed individually, the assembly process will be more complicated and the production cost will be increased.

In addition, since the driving requirements for lighting the LED filament are substantially different from for lighting the conventional tungsten filament lamp. Therefore, for LED light bulbs, how to design a power supply circuitry with a stable current to reduce the ripple phenomenon of the LED filament in an acceptable level so that the user does not feel the flicker is one of the design considerations. Besides, under the space constraints and the premises of achieving the required light efficiency and the driving requirements, how to design a power supply circuitry with the structure simply enough to embed into the space of the lamp head is also a focus of attention.

Patent No. CN202252991U discloses the light lamp employing with a flexible PCB board instead of the aluminum heat dissipation component to improve heat dissipation. Wherein, the phosphor is coated on the upper and lower sides of the LED chip or on the periphery thereof, and the LED chip is fixed on the flexible PCB board and sealed by an insulating adhesive. The insulating adhesive is epoxy resin, and the electrodes of the LED chip are connected to the circuitry on the flexible PCB board by gold wires. The flexible PCB board is transparent or translucent, and the flexible PCB board is made by printing the circuitry on a polyimide or polyester film substrate. Patent No. CN105161608A discloses an LED filament light-emitting strip and a preparation method thereof. Wherein the LED chips are disposed without overlapped, and the light-emitting surfaces of the LED chips are correspondingly arranged, so that the light emitting uniformity and heat dissipation is improved accordingly. Patent No. CN103939758A discloses that a transparent and thermally conductive heat dissipation layer is formed between the interface of the carrier and the LED chip for heat exchange with the LED chip. According to the aforementioned patents, which respectively use a PCB board, adjust the chips arrangement or form a heat dissipation layer, the heat dissipation of the filament of the lamp can be improved to a certain extent correspondingly; however, the heat is easy to accumulate due to the low efficiency in heat dissipation. The last one, Publication No. CN204289439U discloses an LED filament with omnidirectional light comprising a substrate mixed with phosphors, at least one electrode disposed on the substrate, at least one LED chip mounted on the substrate, and the encapsulant coated on the LED chip. The substrate formed by the silicone resin contained with phosphors eliminates the cost of glass or sapphire as a substrate, and the LED filament equipping with this kind of substrate avoids the influence of glass or sapphire on the light emitting of the LED chip. The 360-degree light emitting is realized, and the illumination uniformity and the light efficiency are greatly improved. However, due to the fact that the substrate is formed by silicon resin, the defect of poor heat resistance is a disadvantage.

SUMMARY

It is noted that the present disclosure includes one or more inventive solutions currently claimed or not claimed, and in order to avoid confusion between the illustration of these embodiments in the specification, a number of possible inventive aspects herein may be collectively referred to "present/the invention."

A number of embodiments are described herein with respect to "the invention." However, the word "the invention" is used merely to describe certain embodiments disclosed in this specification, whether or not in the claims, is not a complete description of all possible embodiments. Some embodiments of various features or aspects described below as "the invention" may be combined in various ways to form an LED light bulb or a portion thereof.

In view of this, an LED filament is provided. The LED filament comprises an LED section, a first conductive electrode, a second conductive electrode, and a conductive portion. The LED section comprises a plurality of LED chips connected in series and a light conversion layer wrapping the plurality of LED chips. The first conductive electrode is disposed at one of two ends of the LED section and electrically connected to the plurality of LED chips, and a portion of the first conductive electrode is wrapped by the light conversion layer. The second conductive electrode is disposed at the other end of the LED section and electrically connected to the plurality of LED chips, and a portion of the second conductive electrode is wrapped by the light conversion layer. The conductive portion is electrically connected between the plurality of LED chips. An LED chip among the plurality of LED chips has an electrical connecting portion, an end portion of the conductive portion is connected to the electrical connecting portion, the conductive portion has a first bent portion and a second bent portion, and the conductive portion extends from the electrical connecting portion along a first direction of the LED chip, extends toward a second direction of the LED chip through the first bent portion, and extends toward a third direction of the LED chip through the second bent portion, and wherein the first direction, the second direction, and the third direction are different directions.

In some embodiments, the first direction is a height direction of the LED chip, the second direction is a width direction of the LED chip, and the third direction is a length direction of the LED chip In some embodiments, a distance between the first bent portion and a surface of the LED chip is between 80 μm and 120 μm and a distance between the first bent portion and the second bent portion is between 100 μm and 120 μm.

In some embodiments, the LED filament further comprises a first solder layer. The first solder layer is made of a soldering material, and the end portion of the conductive portion is between the electrical connecting portion of the LED chip and the first solder layer.

In some embodiments, a projection area of the first solder layer on the electrical connecting portion of the LED chip is larger than a projection area of a bonding region between the conductive portion and the electrical connecting portion of the LED chip.

In some embodiments, the end portion of the conductive portion and the first solder layer together form a joining portion, the joining portion has a meshy surface, and a plurality of bulges and a plurality of indents are alternately arranged on the meshy surface.

In some embodiments, the LED filament further comprises a second solder layer. The second solder layer is made of the solder material, and the end portion of the conductive portion is between the first solder layer and the second solder layer.

In some embodiments, each of a projection area of the first solder layer on the electrical connecting portion of the LED chip and a projection area of the second solder layer on the electrical connecting portion of the LED chip is larger than a projection area of a bonding region between the conductive portion and the first solder layer, and between the conductive portion and the second solder layer on the electrical connecting portion of the LED chip.

In some embodiments, a projection area of a bonding region between the conductive portion and the electrical connecting portion of the LED chip is smaller than the projection area of the first solder layer, and the projection area of the first solder layer is smaller than the projection area of the second solder layer.

In some embodiments, the plurality of LED chips further comprises a first row of LED chips and a second row of LED chips, the first row of LED chips and the second row of LED chips are connected in parallel, the LED chips of the first row of LED chips are connected in series, the LED chips of the second row of LED chips connected in series, and the first row of LED chips and the second row of LED chips are alternately arranged along a width direction of the LED filament.

In some embodiments, the LED filament further comprises a first conductive portion and a second conductive portion. The first conductive portion and the second conductive portion are electrically connected between the LED chip and the first conductive electrode. One of two ends of the first conductive portion is connected to the LED chip, the other end of the first conductive portion is connected to the first conductive electrode, one of two ends of the second conductive portion is connected to the first conductive electrode, and the other end of the second conductive portion is connected to the LED chip. The first conductive portion firstly extends downwards and then upwards by taking a first bending point of the first conductive portion as a first turning point of the first conductive portion, and the first conductive portion then extends upwards and then downwards by taking a second bending point of the first conductive portion as a second turning point of the first conductive portion; the second conductive portion firstly extends upwards and then downwards by taking a first bending point of the second conductive portion as a first turning point of the second conductive portion, and the second conductive portion then extend downwards and then upwards by taking a second bending point of the second conductive portion as a second turning point of the second conductive portion.

According to another embodiment, an LED light bulb is provided. The LED light bulb comprises a lamp housing, a bulb base, a stem, two conductive supports, a driving circuit, and a flexible LED filament. The lamp housing has a central axis. The bulb base is connected to the lamp housing. The stem is disposed in the lamp housing along the central axis of the lamp housing. The two conductive supports are disposed in the lamp housing and have opposite polarities. The driving circuit is disposed in the bulb base and electrically connected to the two conductive supports. The flexible LED filament is disposed in the lamp housing and electrically connected to the two conductive supports. The flexible LED filament comprises an LED section, a first conductive electrode, a second conductive electrode, and a conductive portion. The LED section comprises a plurality of LED chips connected in series and a light conversion layer wrapping the plurality of LED chips. The first conductive electrode is disposed at one of two ends of the LED section and electrically connected to the plurality of LED chips and one of the two conductive supports, and a portion of the first conductive electrode is wrapped by the light conversion layer. The second conductive electrode is disposed at the other end of the LED section and electrically connected to the plurality of the LED chips and the other one of the two conductive supports, and a portion of the second conductive electrode is wrapped by the light conversion layer. The conductive portion is electrically connected between the plurality of LED chips. An LED chip among the plurality of LED chips has an electrical connecting portion, an end portion of the conductive portion is connected to the electrical connecting portion, the conductive portion has a first bent portion and a second bent portion, and the conductive portion extends from the electrical connecting portion along a first direction of the LED chip, extends toward a second direction of the LED chip through the first bent portion, and extends toward a third direction of the LED chip through the second bent portion, and wherein the first direction, the second direction, and the third direction are different directions.

In some embodiments, the first direction is a height direction of the LED chip, the second direction is a width direction of the LED chip, and the third direction is a length direction of the LED chip.

In some embodiments, a distance between the first bent portion and a surface of the LED chip is between 80 μm and 120 μm and a distance between the first bent portion and the second bent portion is between 100 μm and 120 μm.

In some embodiments, the LED filament further comprises a first solder layer, the first solder layer is made of a soldering material, and the end portion of the conductive portion is between the electrical connecting portion of the LED chip and the first solder layer.

In some embodiments, a projection area of the first solder layer on the electrical connecting portion of the LED chip is larger than a projection area of a bonding region between the conductive portion and the electrical connecting portion of the LED chip.

In some embodiments, the end portion of the conductive portion and the first solder layer together form a joining portion, the joining portion has a meshy surface, and a plurality of bulges and a plurality of indents are alternately arranged on the meshy surface.

In some embodiments, the LED filament comprises a second solder layer, the second solder layer is made of the solder material, and the end portion of the conductive portion is between the first solder layer and the second solder layer.

In some embodiments, each of a projection area of the first solder layer on the electrical connecting portion of the LED chip and a projection area of the second solder layer on the electrical connecting portion of the LED chip is larger than a projection area of a bonding region between the conductive portion and the first solder layer, and between the conductive portion and the second solder layer on the electrical connecting portion of the LED chip.

In some embodiments, a projection area of a bonding region between the conductive portion and the electrical connecting portion of the LED chip is smaller than the projection area of the first solder layer, and the projection area of the first solder layer is smaller than the projection area of the second solder layer.

In some embodiments, the plurality of LED chips further comprises a first row of LED chips and a second row of LED chips, the first row of LED chips and the second row of LED chips are connected in parallel, the LED chips of the first row of LED chips are connected in series, the LED chips of the second row of LED chips connected in series, and the first row of LED chips and the second row of LED chips are alternately arranged along a width direction of the LED filament.

In some embodiments, the LED filament further comprises a first conductive portion and a second conductive portion electrically connected between the LED chip and the first conductive electrode; wherein one of two ends of the first conductive portion is connected to the LED chip, the other end of the first conductive portion is connected to the first conductive electrode, one of two ends of the second conductive portion is connected to the first conductive electrode, and the other end of the second conductive portion is connected to the LED chip. The first conductive portion firstly extends downwards and then upwards by taking a first bending point of the first conductive portion as a first turning point of the first conductive portion, and the first conductive portion then extends upwards and then downwards by taking a second bending point of the first conductive portion as a second turning point of the first conductive portion; the second conductive portion firstly extends upwards and then downwards by taking a first bending point of the second conductive portion as a first turning point of the second conductive portion, and the second conductive portion then extend downwards and then upwards by taking a second bending point of the second conductive portion as a second turning point of the second conductive portion.

To make the above and other objects, features, and advantages of the present invention clearer and easier to understand, the following embodiments will be described in detail with reference to the accompanying drawings.

BRIEF DESCRIPTION OF THE DRAWINGS

The present invention will become more readily apparent to those ordinarily skilled in the art after reviewing the following detailed description and accompanying drawings, in which:

FIG. 4B to FIG. 4G are cross sectional views of various LED filaments in accordance with the present invention;

DETAILED DESCRIPTION

Figure 1:
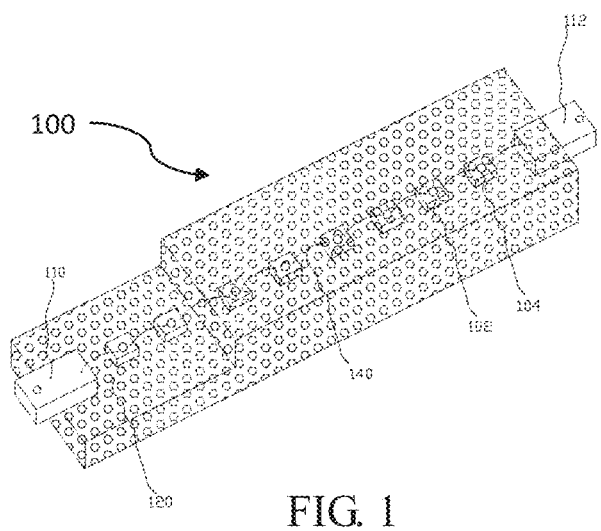
FIG. 1 is a perspective view of the LED filament with partial sectional view in accordance with an embodiment of the present invention.

The present disclosure provides a novel LED filament and its application the LED light bulb. The present disclosure will now be described in the following embodiments with reference to the drawings. The following descriptions of various implementations are presented herein for purpose of illustration and giving examples only. This invention is not intended to be exhaustive or to be limited to the precise form disclosed. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of components may be exaggerated for clarity. Like numbers refer to like elements throughout.

It will be understood that when an element is referred to as being "connected" or "coupled" to or "on" another element, it can be directly connected or coupled to or on the other element or intervening elements may be present. In contrast, when an element is referred to as being "directly connected" or "directly coupled," or "immediately connected" or "immediately coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to a direct connection (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly. In the disclosure, the terms "horizontal", "vertical" and "parallel" are defined to include a range of ±10% on the standard definitions. For example, "vertical" usually indicates 90 degrees relative to a reference line, but in the disclosure, "vertical" indicates to include from 80 degrees to 100 degrees.

Terms such as "same," "equal," "planar," or "coplanar," as used herein when referring to orientation, layout, location, position, shapes, sizes, amounts, or other measures do not necessarily mean an exactly identical orientation, layout, location, position, shape, size, amount, or other measure, but are intended to encompass nearly identical orientation, layout, location, position, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Unless expressly stated otherwise, comparative quantitative terms (such as "above" and "below") are intended to encompass equivalent concepts. As an example, "above" can mean not only "greater than" in the mathematical sense, but also "equal to".

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

FIG. 1 is a perspective with a partially cross sectional view showing an embodiment of a light emitting part of the present invention. The present invention will be described below with an LED filament as a light emitting part. However, the embodiment in which the LED filament of the LED light bulb of the present invention may be implemented is not limited thereto. And any LED filament can be bent with various shapes and therefore capable of emitting an omni-directional light that should be regarded as an equivalent replacement element for the light emitting part of the present invention. The LED filament 100 includes a plurality of LED chip units 102, 104, wires 140, at least two conductive electrodes 110, 112, and a light conversion layer 120 (in a particular embodiment, the light conversion layer may be referred to a silicone layer). The LED chip units 102, 104 and the conductive electrodes 110, 112 are electrically connected by the wires 140, respectively. The phosphors in the light conversion layer 120 absorbs certain radiation (such as light) and emits the light. The LED filament 100 emitting light rays when the conductive electrodes 110, 112 are powered on (voltage source or current source). In the present embodiment, the light emitted by the LED filament can be substantially 360 degrees and similar to the illumination of the point light source. Therefore, once the LED filament of the embodiment of the present invention is applied to an LED light bulb, the illumination with omni-directional light can be achieved.

As shown in FIG. 1, the cross sectional shape of the LED filament 100 of the present invention is rectangular, but the cross sectional shape of the LED filament 100 is not limited thereto. The cross sectional shape of the LED filament 100 may be triangular, circular, elliptical, polygonal, rhombus, or even square with the corners as chamfered or rounded.

The LED chip units 102, 104, or named with the LED section 102, 104, may be composed of a single LED chip, or two LED chips. Of course, it may also include multiple LED chips, that is, equal to or greater than three LED chips.

Figure 2A:
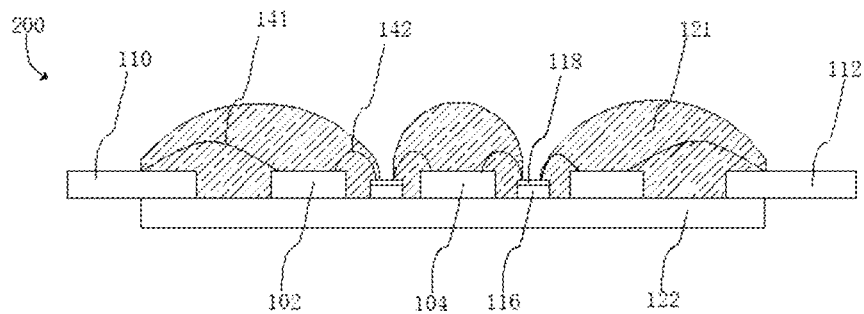
FIG. 2A to FIG. 2F are cross sectional views of various LED filaments in accordance with the present invention.

FIG. 2A to FIG. 2F are cross sectional views showing various embodiments of the LED filament in accordance with the present invention. As shown in FIG. 2A, the LED filament includes the LED chip units 102, 104, the conductive electrodes 110, 112, and the wires. The difference between the present embodiment and the previous embodiment is the light conversion layer 120 in the present embodiment is provided with a first light conversion layer 121 and a base layer 122. The upper surface of the base layer 122 is attached with a plurality of copper foils 116 and the LED chip units 102 and 104. The copper foils 116 are located between two adjacent LED chip units 102, 104. Wherein, the conductive electrodes 110, 112 are disposed corresponding to the LED chip units 102, 104, and the LED chip units 102, 104 and the copper foil 116, the LED chip units 102, 104 and the conductive electrodes 110, 112 are electrically connected by wires respectively. The LED chip is provided with a p-junction and an n-junction, wherein the conductive wires comprise a first wire 141 used for connecting the LED chip units 102, 104 with the conductive electrodes 110, 112, and a second wire 142 used for connecting the LED chip units 102, 104 with the copper foil 116. The first light conversion layer 121 covers a single LED chip unit and the first wire 141 and the second wire 142 connecting to the LED chip unit. The number of the first light conversion layers 121 is the same as the number of the LED chip unit. The LED light bulb employs the LED filament as aforementioned designs, the heat dissipation function and the light emitting efficiency of the LED filament are improved due to the thermal radiation area is increased. Furthermore, because the probability of the wire disconnection is reduced, the reliability of the LED light bulb product is increased, and also the brightness and illuminated appearance of the LED filament with bending curve is achieved.

According to present embodiment, each of the LED chip units 102, 104 includes two LED chips, and of course, may also include a plurality of LED chips, that is, equal to or greater than three LED chips. The exterior shape of the LED chip can be a strip type, but the present invention is not limited thereto. The strip type LED chip has fewer conductive electrodes, reducing the possibility of shielding the light emitted by the LED chip. The LED chip units 102 and 104 are connected in series and the conductive electrodes 110 and 112 are disposed at two ends of the connected LED chip units, and a portion of each of the conductive electrodes 110 and 112 is exposed outside the first light conversion layer 121. Each of the six sides of every LED chip in the LED chip units 102, 104 is covered by the first light conversion layer 121, that is, six sides of the LED chip of the LED units 102, 104 are covered by a first light conversion layer 121, and the coverage of the first light conversion layer 121 may be partial overlap or as wrap but not limited to direct contact with the LED chip. Preferably, in the present embodiment, each of the six sides of the LED chip of the LED chip units 102, 104 directly contacts the first light conversion layer 121. However, in the implementation, the first light conversion layer 121 may cover merely one of the six sides of each of the LED chip of the LED chip units 102, 104, that is, the first light conversion layer 121 directly contacts the one side such as a top or a bottom side. Similarly, the first light conversion layer 121 can directly contact at least one side of the two conductive electrodes 110, 112 or the copper foil 116.

The wire is a gold wire or an aluminum wire, and the combination of the copper foil 116 and the gold wire to provide the LED filament having a stabilized and a flexible conductive structure. The copper foil 116 can be replaced by any other conductive material. The width or/and length of the opening of the copper foil 116 is larger than the contour of the LED chip units 102, 104 and further to define the positions of the LED chip units 102, 104. Furthermore, at least two of the six faces of the LED chip units 102, 104 are contacted and covered by the first light conversion layer 121. By utilizing the copper foil 116 and the wire as linkage, a plurality of the LED chip units 102 and 104 are interconnected in series, in parallel or in a combination of both. Then, the front end and the rear end of the interconnected LED chip units 102, 104 are respectively connected to the two conductive electrodes 110, 112 disposing on the base layer 122, and the conductive electrodes 110, 112 are electrically connected to the power supply to provide the electricity for emitting the LED chip units 102, 104.

The first light conversion layer 121 covers two ends of the copper foil 116, wherein the covering area or the average thickness of the first conversion layer 121 disposing on each of the two ends of the copper foil 116 are substantially the same or not equal. The first light conversion layer 121 covers the upper surface of the copper foil 116 with an area ratio about 30 to 40 percent. In an embodiment of the present invention, as shown in the FIG. 2B, the first light conversion layer 121 may cover the entire copper foil 116 disposing between the two adjacent first light conversion layers. Wherein the covering area or the average thickness of the first conversion layer 121 disposing on the two ends of the copper foil 116 and on the middle of the copper foil 116 are not equal. The first light conversion layer 121 covering the middle surface of the copper foil has a thickness in a range of about 30 to 50 micron (μm). The surface of the first light conversion layer 121 is an arc shape, and the height of the arc shape gradually decreases from the middle to both sides with respect to the base layer 122, and the angle between each of two sides of the curved shape and the base layer 122 is an acute angle or an obtuse angle.

The first light conversion layer 121 includes a phosphor gel or a phosphor film. At least a portion of each of the six sides of the LED chip units 102, 104 directly contacts the first light conversion layer 121 and/or one or both sides of each of the LED chip unit 102, 104 are bonded to the first light conversion layer 121 through the glue. In the aforementioned embodiment, the six sides the LED chip units 102, 104 are all covered by the first light conversion layer 121 and/or partially direct contacted with the first light conversion layer 121. Both embodiments have equivalent concept. In some embodiments, the foregoing glue may also incorporate with phosphors to increase the overall light conversion efficiency. The glue is usually also a silicon gel. The difference between the glue and the silicon gel is the glue generally mixed with silver powder or heat dissipating powder to improve the thermal conductivity.

Figure 2B:
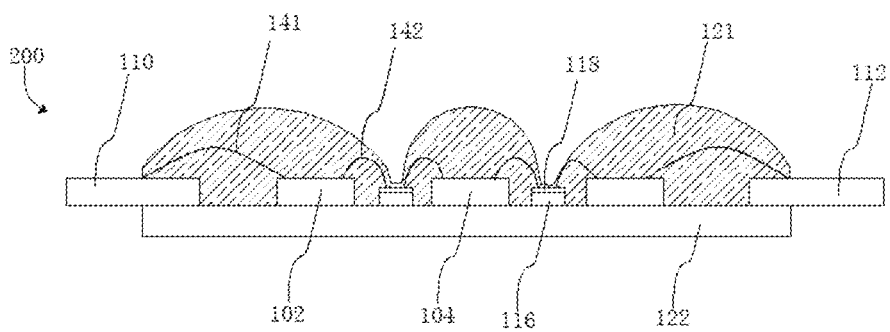
Figure 2C:
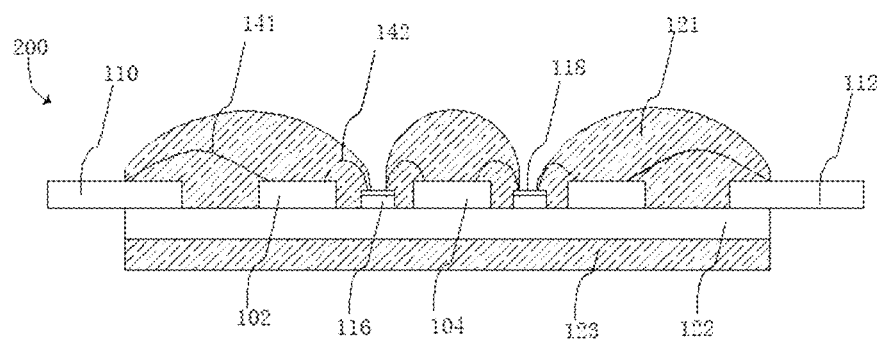
Figure 2D:
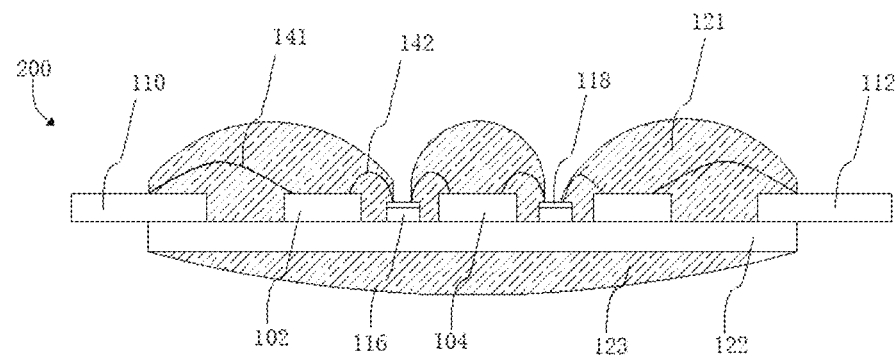

As shown in FIG. 2C, the difference from the aforementioned embodiment is that the lower surface of the base layer 122 is covered by a second light conversion layer 123 with a uniform thickness. The upper surface and the lower surface of the base layer 122 are opposite to each other. As shown in FIG. 2D, the second light conversion layer 123 covering the lower surface of the base layer 122 has an inclined side or an inclined side with an arc shape. The lower surface of the base layer 122 covering by the second light conversion layer 123, the LED filament therefore can generate fluorescence with more yellow light and less blue light. Therefore, the difference in color temperature between the front and back surfaces of the LED chip units 102 and 104 can be reduced. Thereby, the color temperature of emitting light from both sides of the LED chip units 102 and 104 is closer.

Figure 2E:
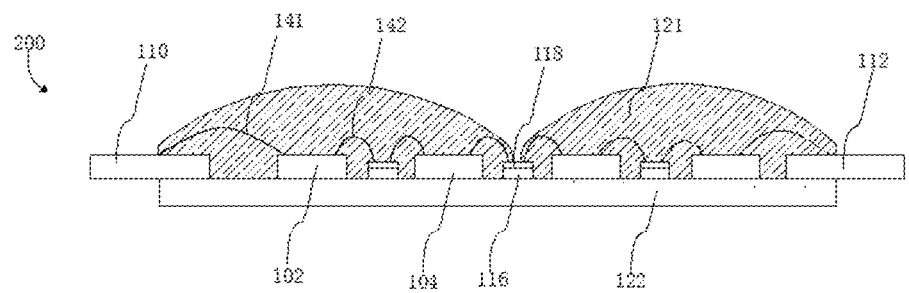

In one embodiment, as shown in FIG. 2E, the first light conversion layer 121 covers two adjacent LED chip units 102, 104, a copper foil 116 is located between two adjacent LED chip units 102, 104, and the first wire 141 and the second wire 142 connecting between the LED chip units 102 and 104. In one embodiment, a silver plating layer 118 is disposed on the upper surface of the copper foil 116, and a portion of the copper foil 116 located at the ends of the LED filament and extending beyond the base layer 122 can serve as the conductive electrodes 110, 112. The silver plating layer 118 not only has good electrical conductivity but also has the effect of increasing light reflection. The surface of the silver plating layer 118 can be selectively provided with a solder mask layer (not shown), and the thickness of the solder mask layer is 30~50 um. The solder mask layer is obtained by an OSP (Organic Solderability Preservatives) process. The solder mask layer has functions of oxidation resistance, thermal shock resistance, and moisture resistance.

Figure 2F:
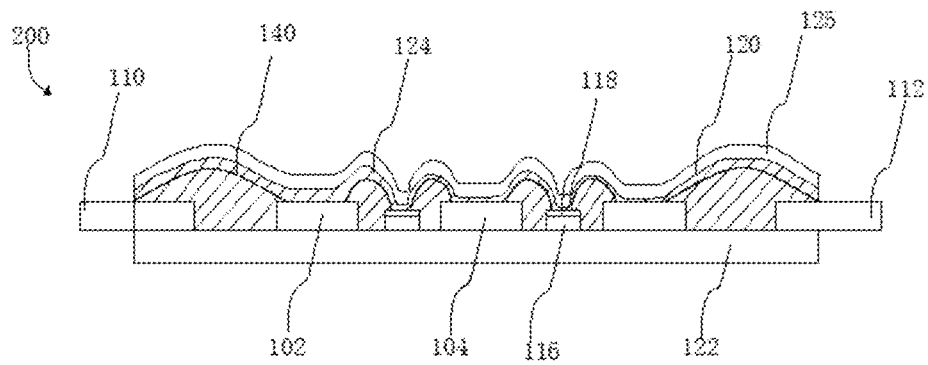

In another embodiment of the present invention, as shown in FIG. 2F, the LED filament 200 has LED chip units 102, 104, conductive electrodes 110, 112, wires 140, and a light conversion layer 120. The copper foil 116 is located between the adjacent two LED chip units 102, 104, the conductive electrodes 110, 112 are arranged corresponding to the LED chip units 102, 104, and the LED chip units 102, 104 and the copper foil 116, the LED chip units 102, 104 and the conductive electrodes 110, 112 are electrically connected by wire 140 respectively. The light conversion layer 120 is disposed on the LED chip units 102, 104 and at least two sides of conductive electrodes 110, 112. The light conversion layer 120 exposes a portion of each of the conductive electrodes 110, 112 of the LED filament, and the light conversion layer 120 includes a phosphor layer 124 and a silicon layer 125. The phosphor layer 124 directly contacts the surfaces of the LED chip unit 102, 104. In the phosphors spraying process, the phosphors may be sprayed on the surfaces of the LED chip unit 102, 104, the copper foil 116, the conductive electrodes 110, 112 and the wire 140 by electrostatic spraying to form the phosphor layer 124. Then, the vacuum coating method can be used to dispose a silicon layer 125 on the phosphor layer 124, wherein the silicon layer 125 does not contain phosphor. The thickness of the phosphor layer 124 and the silicon layer 125 are equal or unequal. The thickness of the phosphor layer 124 and silicon layer 125 respectively is about 30 to 70 micron (um) and 30 to 50 micron (um). In another embodiment, the surfaces of the LED chip units 102, 104, the copper foil 116, the conductive electrodes 110, 112, and the wires 140 may be covered with a transparent resin layer, and the transparent resin layer does not contain phosphors, and then covered by phosphors powder on the transparent resin layer. The thickness of the transparent resin layer and the phosphor layer are equal or unequal, and the thickness of the transparent resin layer is about 30 to 50 micron (um).

Figure 3:
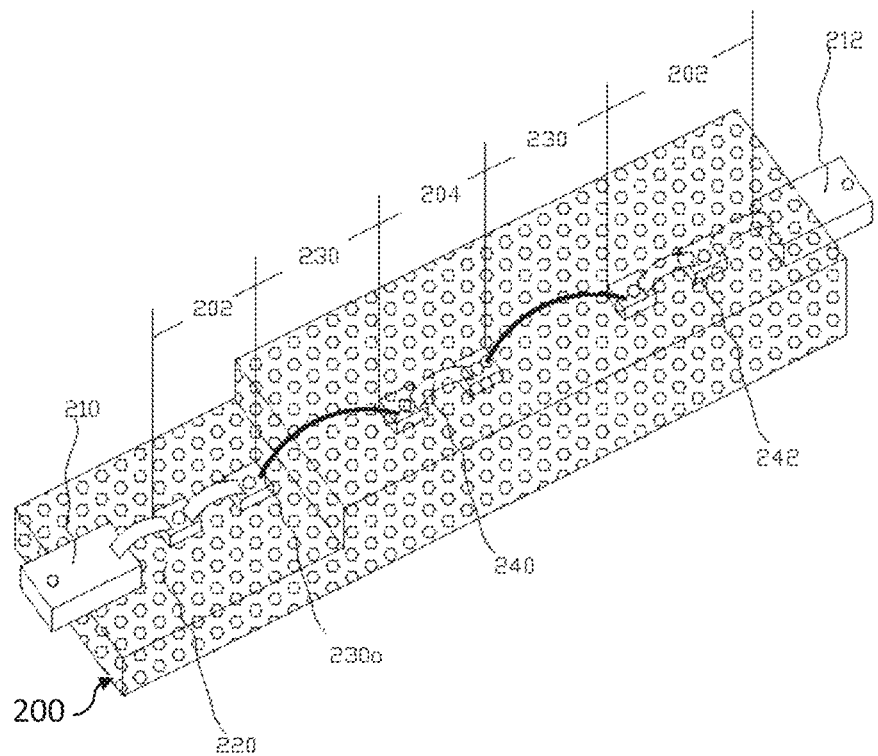
FIG. 3 is a perspective view of the LED filament with partial sectional view in accordance with an embodiment of the present invention.

According to the structure of the LED filament 100 described above, as shown in FIG. 3, an LED filament 200 comprises a plurality of LED sections 202, 204, a plurality of conductive sections 230, at least two conductive electrodes 210, 212 and a light conversion layer 220. The conductive section 230 is located between two adjacent LED sections 202, 204. The two conductive electrodes 210, 212 are disposed on the LED filament 200 correspondingly and electrically connected to each of the LED sections 202, 204. The adjacent two LED sections 202, 204 are electrically connected to each other through the conductive section 230. Each of the LED sections 202, 204 includes at least two LED chips that are electrically connected to each other. The light conversion layer 220 covers the LED sections 202, 204, the conductive sections 230 and the conductive electrodes 210, 212, and a part of each of the two electrodes 210, 212 is exposed respectively. The LED filament 200 further includes a plurality of circuit films 240 (also referred to as light-transmitting circuit films). The LED chips 202 and 204 and the conductive electrodes 210 and 212 are electrically connected to each other through the circuit film 240, and the light conversion layer 220 covers the circuit film 240. The length of the circuit film 240 is less than the length of the conductor 230a, or the shortest distance between two LED chips respectively located in two adjacent LED sections 202, 204 is greater than the distance between two adjacent LED chips in the LED section 202/204.

Figure 4A:
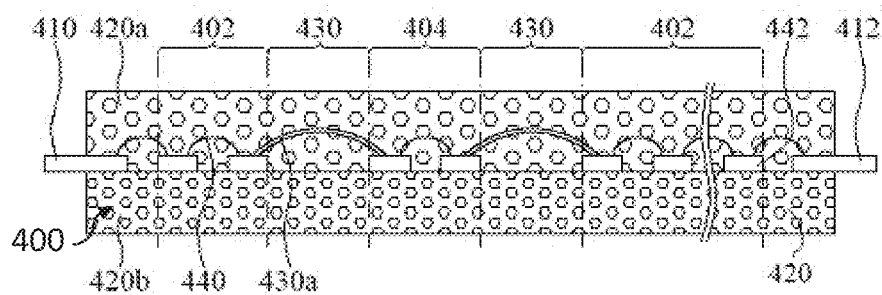
FIG. 4A is a cross sectional view of an LED filament in accordance with an embodiment of the present invention.

Referring to FIG. 4A to FIG. 4G, FIG. 4A is a schematic structural view of another embodiment of an LED filament of the present invention. As shown in FIG. 4A, the LED filament 400 has a light conversion layer 420, LED sections 402, 404, conductive electrodes 410, 412, and a conductive section 430 for electrically connecting adjacent two LED sections 402, 404. Each of the LED sections 402, 404 includes at least two LED chips 442 that are electrically connected to each other by the wires 440. In the present embodiment, the conductive section 430 includes at least one conductor 430a that connects the adjacent LED sections 402, 404, wherein the shortest distance between the two LED chips 442 respectively located in the two adjacent LED sections 402, 404 is greater than the distance between two adjacent LED chips 442 within the one LED section 402/404. Therefore, it is ensured that when the two LED sections 402, 404 are bent, the conductive section 430 is not easily broken due to the stress of bending. The length of the wire 440 is less than the length of the conductor 430a. The light conversion layer 420 is coated on at least two sides of the LED chip 442 and conductive electrodes 410, 412, and a portion of each of the conductive electrodes 410, 412 is not coated with the light conversion layer 420. The light conversion layer 420 may have at least one top layer 420a (or upper layer) and one base layer 420b (or lower layer). In the present embodiment, the top layer 420a and the base layer 420b are disposed on the opposing surface of the LED chip 442 and conductive electrodes 410, 412, and a portion of each of the conductive electrodes 410, 412 is excluded. It should be particularly noted that the thickness, diameter or width of the top layer 420a in the LED sections 402, 404 or the conductive section 430 described pertaining to FIG. 4A to FIG. 4G refers to the radial direction of the LED filament. The thickness of the top layer 420a is the distance between its outer surface to the interface of the top layer 420a and the base layer 420b, or the distance from its outer surface and the interface of the LED chip 442 or the conductor 430a and the base layer 420b, wherein the outer surface of the top layer 420a is a surface away from the base layer.

In the present embodiment, the top layer 420a and the base layer 420b may be composed of different particles or particle densities according to the requirements or designed structures. For example, in the case where the main emitting surface of the LED chip 442 is toward to the top layer 420a but not the base layer 420b, the base layer 420b may be composed of light scattering particles to increase the light dispersion. Thereby the brightness of the base layer 420b can be maximized, or even the brightness that can be produced close to the top layer 420a. In addition, the base layer 420b may also be composed of phosphor particles with high density to increase the hardness of the base layer 420b. In the manufacturing process of the LED filament 400, the base layer 420b may be prepared first, and then the LED chip 442, the wire 440 and the conductor 430a are disposed on the base layer 420b. Since the base layer 420b has a hardness that can support the subsequent manufacturing process of the LED chips and the wires, therefore the yield and the firmness of the LED chips 442, the wires 440, and the conductors 430a disposed on the base layer 420b can be improved and resulted in less or even no sink or skew. Finally, the top layer 420a is overlaid on the base layer 420b, the LED chip 442, the wires 440, and the conductor 430a.

As shown in FIG. 4B, in the present embodiment, the conductive section 430 is also located between the two adjacent LED sections 402, 404, and the plurality of LED chips 442 in the LED sections 402, 404 are electrically connected to each other through the wires 440. However, the conductor 430a in the conductive section 430 in FIG. 4B is not in the form of a wire but in a sheet or film form. In some embodiments, the conductor 430a can be a copper foil, a gold foil, or other materials that can conduct electrical conduction. In the present embodiment, the conductor 430a is attached to the surface of the base layer 420b and contact with the top layer 420a, that is, located between the base layer 420b and the top layer 420a. Moreover, the conductive section 430 and the LED sections 402, 404 are electrically connected by wires 450, that is, the two closest LED chips 442 respectively located in the adjacent two LED sections 402, 404 are electrically connected by the wires 450 and the conductors 430a of the conductive section 430. Wherein, the length of the conductive section 430 is greater than the distance between two adjacent LED chips of one LED sections 402, 404, and the length of the wire 440 in the LED sections 402, 404 is less than the length of the conductor 430a. This design ensures that the conductive section 430 has good bendability. Assuming that the maximum thickness of the LED chip in the radial direction of the filament is H, the thickness of the conductive electrode and the conductor 430a in the radial direction of the filament is around 0.5H to 1.4H, preferably around 0.5H to 0.7H. This ensures the wire bonding process can be carried out while ensures the quality of the LED filament and the precision of the wire bonding process, thereby the LED filament has good strength and the stability of the product is improved.

As shown in FIG. 4C, in the present embodiment, the LED sections 402, 404 and the conductive section 430 of the LED filament have different structural features. In the present embodiment, the LED sections 402, 404 and the conductive section 430 have different widths, thicknesses, or diameters in the radial direction of the LED filaments. As shown in FIG. 4C, the conductive section 430 is relatively thinner compared to the LED sections 402, 404, therefore it is helpful to the LED filament curling to various curves. In the present embodiment, the base layer 420b is substantially uniform in width, thickness or diameter in the radial direction of the LED filament, whether in the LED sections 402, 404 or in the conductive section 430. And, the top layer 420a has different widths, thicknesses or diameters in the radial direction of the LED filaments for the LED section 402, 404 and the conductive section 430. As shown in FIG. 4C, the top layer 420a of the LED sections 402, 404 has a maximum diameter D2 in the radial direction of the LED filament, while the top layer 420a of the conductive section 430 has the largest diameter D1 in the radial direction of the LED filament, D2 will be greater than D1. The diameter of the top layer 420a is gradually reduced from the LED sections 402, 404 toward to the conductive section 430, and is gradually increased from the conductive section 430 toward to adjacent LED sections 402, 404, so that the top layer 420a is conformally covered the LED filament and forms a smooth concave-convex curve along the axial direction of the LED filament.

Figure 4D:
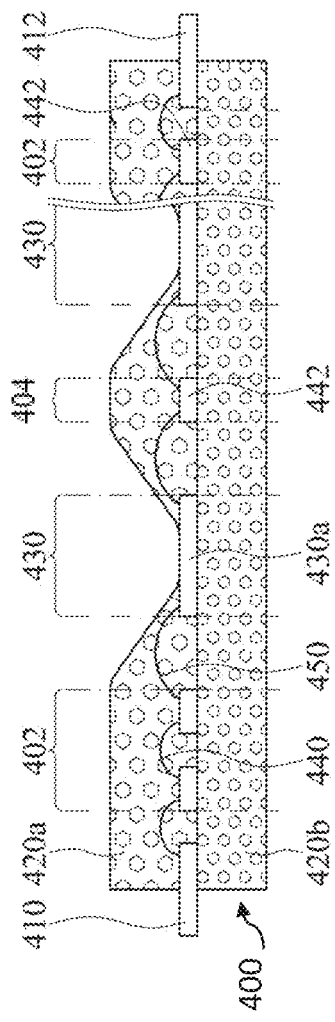

As shown in FIG. 4D, in the present embodiment, the top layer 420a of the LED sections 402, 404 has the largest diameter (or maximum thickness) in the radial direction of the LED filament and the diameter of the top layer 420a is gradually reduced from the LED sections 402, 404 to the conductive section 430, and a portion of the conductor 430a (for example, the intermediate portion) is not covered by the top layer 420a. The base layer 420b, whether in the LED sections 402, 404 or in the conductive section 430, has substantially the same width, thickness or diameter in the radial direction of the LED filament. In the present embodiment, the number of LED chips 442 in each of the LED sections 402, 404 may be different. For example, some LED sections 402, 404 have only one LED chip 442, and some LED sections 402, 404 have two or more LED chips 442. In addition to the number of the LED chip 442 designing in each LED section 402, 402 is different, the types of the LED chip 442 may also be different. It is acceptable as well that the number of the LED chip 442 designing in each LED section 402, 402 is consistent, and the types of the LED chip 442 is different.

Figure 4E:
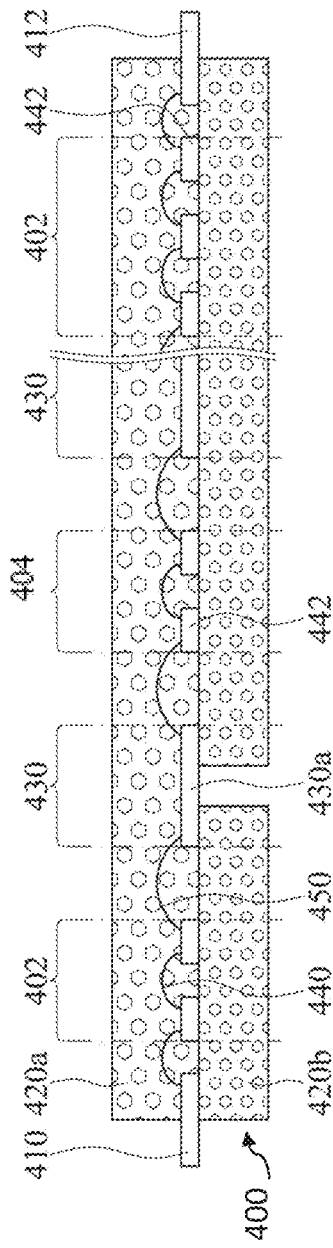

As shown in FIG. 4E, in the present embodiment, the top layer 420a is substantially uniform in width, thickness or diameter in the radial direction of the LED filament, whether in the LED sections 402, 404 or in the conductive section 430. A portion of the base layer 420b has been recessed or hollowed out corresponding to a portion of at least one conductor 430a, for example, the intermediate portion of the at least one conductor 430a is not covered by the base layer 420b, and at least one of the other conductors 430a is completely covered by the base layer 420b.

Figure 4F:
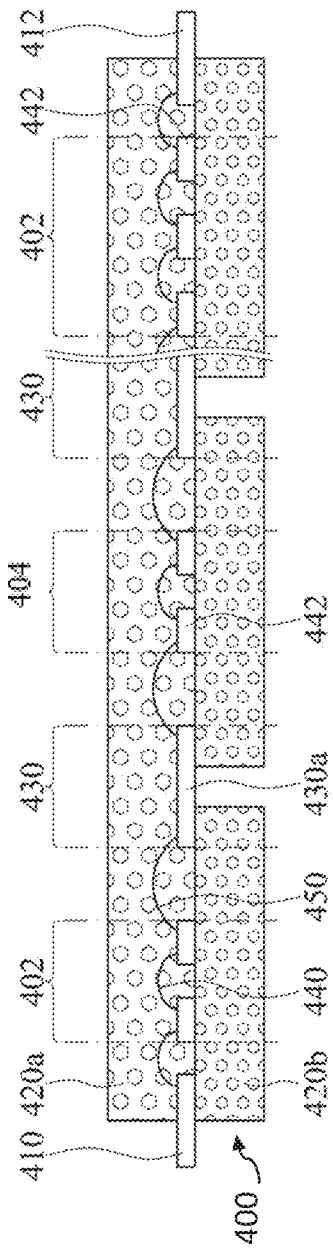

As shown in FIG. 4F, in the present embodiment, the top layer 420a is substantially uniform in width, thickness or diameter in the radial direction of the LED filament, whether in the LED sections 402, 404 or in the conductive section 430. A portion of the base layer 420b has been recessed or hollowed out corresponding to a portion of each conductor 430a, for example, the intermediate portion of the conductor 430a is not covered by the base layer 420b.

Figure 4G:
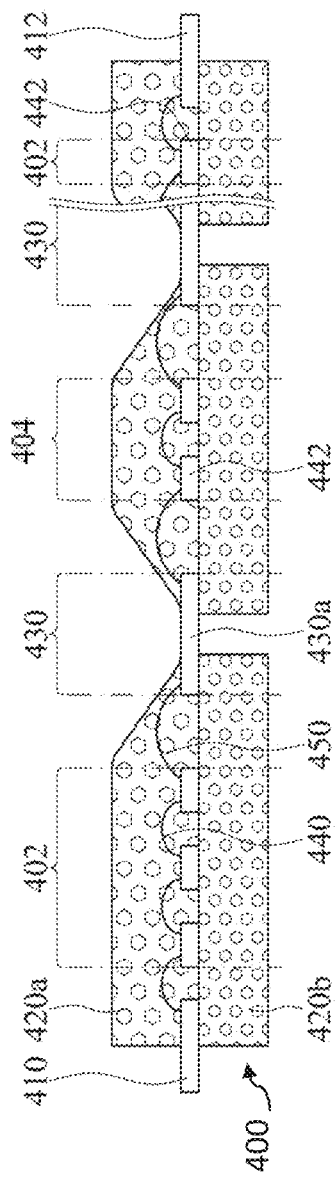

As shown in FIG. 4G, in the present embodiment, the top layer 420a of the LED sections 402, 404 has the largest diameter in the radial direction of the LED filament, and the diameter of the top layer 420a is gradually decreased from the LED sections 402, 404 to the conductive section 430. Moreover, a portion of the conductor 430a (for example, the middle portion) is not covered by the top layer 420a, and a portion of the base layer 420b is recessed or hollowed out such that a portion of the conductor 430a (for example, the intermediate portion) is not covered by the base layer 420b. In other words, at least a portion of the conductor 430a at the opposite sides thereof are not covered by the top layer 420a and the base layer 420b, respectively.

As described above with respect to the embodiments of FIG. 4E to FIG. 4G, when the base layer 420b has a recession region or hollow region corresponding to a part of or all of the conductive sections 430, and the recession region or the hollow region may be in the form of a slit or a groove. Therefore, the conductor 430a is not completely exposed and the conductive section 430 can be provided with better bendability.

Figure 5:
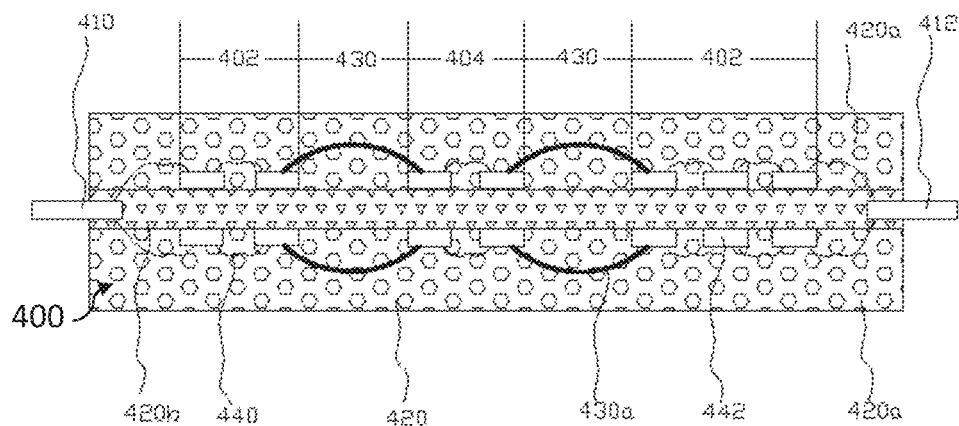
FIG. 5 is a cross sectional view of an LED filament with multiple layers in accordance with an embodiment of the present invention.

FIG. 5 illustrates another embodiment of an LED filament layered structure. In the present embodiment, the LED sections 402, 404, the gold wires 440, and the top layer 420a are disposed on both sides of the base layer 420b, that is, the base layer 420b is located between the two top layers 420a. The conductive electrodes 410, 412 are respectively disposed at both ends of the base layer 420b. As shown in the figure, the LED sections 402, 404 in the upper and lower top layers 420a can be connected to the same conductive electrode 410/412 by gold wires 440, in this way, the light ray distribution can be more uniform. Moreover, the gold wire 440 may be bent with posture to reduce the impact force, the posture may be, for example, slightly M-shape, curve or straight shape.

Figure 6:
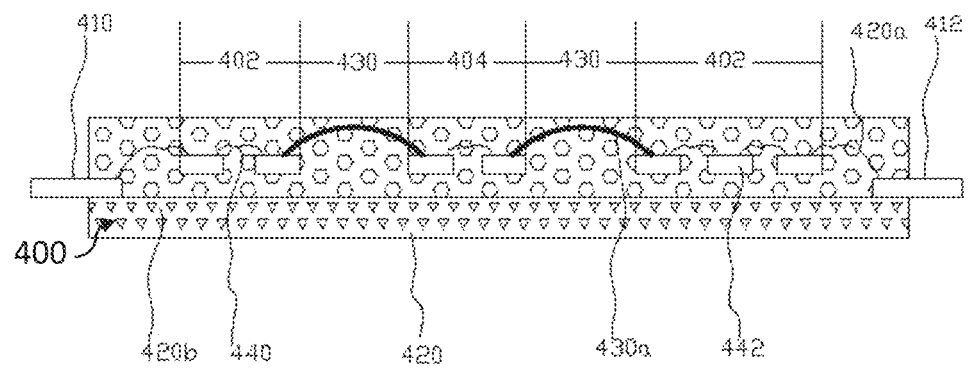
FIG. 6 is a cross sectional view of an LED filament with multiple layers in accordance with an embodiment of the present invention.

FIG. 6 illustrates another embodiment of the LED filament layered structure of the present invention. As shown in FIG. 6, the light conversion layer of LED filament 400 includes a top layer 420a and a base layer 420b. Each side of the LED sections 402, 404 is in direct contact with the top layer 420a, and the base layer 420b is not in contact with the LED sections 402, 404. In the manufacturing process, the base layer 420b can be formed in advance, and the LED sections 402, 404 and the top layer 420a are formed successively.

Figure 7:
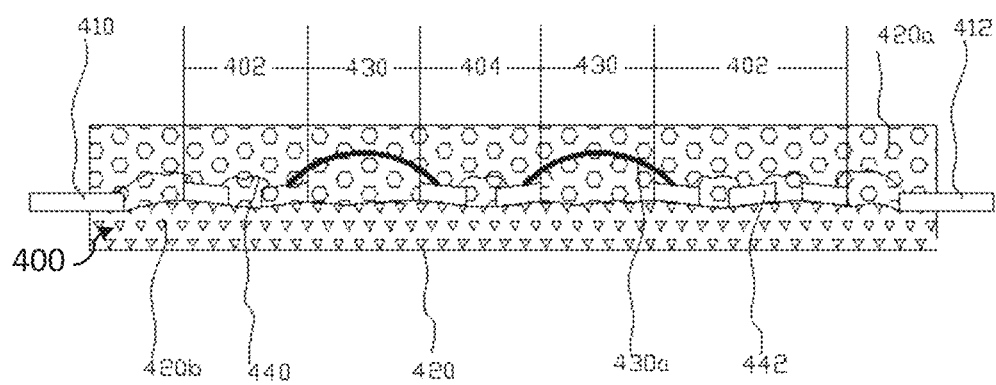
FIG. 7 is a cross sectional view of an LED filament with multiple layers in accordance with an embodiment of the present invention.

In another embodiment, as shown in FIG. 7, the base layer 420b of the LED filament 400 is formed with a wavy surface accompanying undulations, then the LED sections 402, 404 are disposed thereon and consequently are inclined to different directions. Thus, the LED filament has a broader light emitting angle. That is to say, from the side view, the LED sections are arranged with different angles with respect to the horizontal plane rather than in parallel to the horizontal plane, wherein the horizontal plane is defined by the interface of the bottom surface of the base layer and the surface of the carrier, and the carrier is used to provide the supporting in the manufacturing process. Furthermore, the configured height/angle/direction between each LED section can also be different. In other words, a plurality of LED sections are connected in series and not aligning in a straight line. In this way, the filament 400 has the effect of increasing the emitting angle and the uniformity of the light without being bent or curved.

Figure 8:
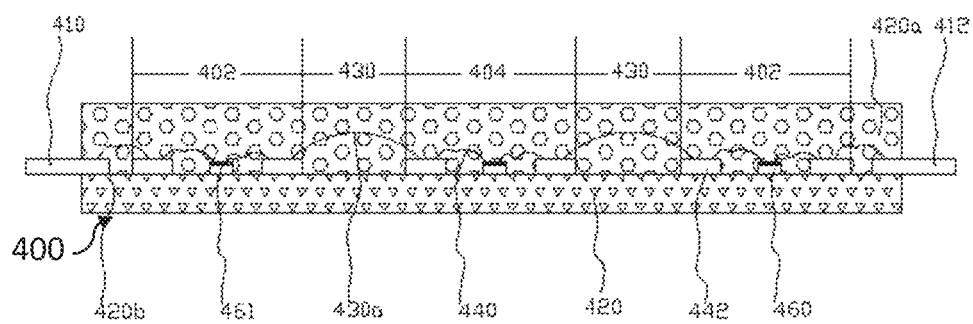
FIG. 8 is a cross sectional view of an LED filament with multiple layers in accordance with an embodiment of the present invention.

In the LED filament structure as shown in FIG. 8, the filament 400 includes at least one LED section 402, 404, at least one pair of conductive electrodes 410, 412, a plurality of gold wires 440, a light conversion layer 420, and at least one conductive section 430 electrically connecting the two adjacent LED sections 402, 404. Wherein each of the LED sections 402, 404 includes at least two LED chips 142 that are electrically connected to each other by wires 440. The light conversion layer 420 includes a base layer 420a and a top layer 420b, and a copper foil 460 having a plurality of openings is attached to the base layer 420a. The upper surface of the copper foil 460 may further have a silver plating layer 461, and the copper foil located at each end of the LED filament as a conductive electrode 410, 412 and extending beyond the light conversion layer 420. Subsequently, the LED sections 402, 404 can be disposed to the base layer 420a by means of die bond paste or the like. Thereafter, a phosphor glue or phosphor film is applied to coat the LED sections 402, 404, gold wire 440, conductive section 430, and a portion of the conductive electrodes 410, 412 to form a light conversion layer 420. The width or/and length of the opening of the copper foil 460 is greater than that of the LED chip 442, defining the position of the LED chip. At least two of the six faces of the LED chip, generally five faces in the present embodiment, being covered by the phosphor glue. In the present embodiment, the combination of copper foil 460 and the gold wire 440 provides a solid conductive structure and also maintaining the flexibleness of the LED filament. Besides, the silver plating layer 461 has an effect of increasing light reflection in addition to good electrical conductivity.

Figure 9:
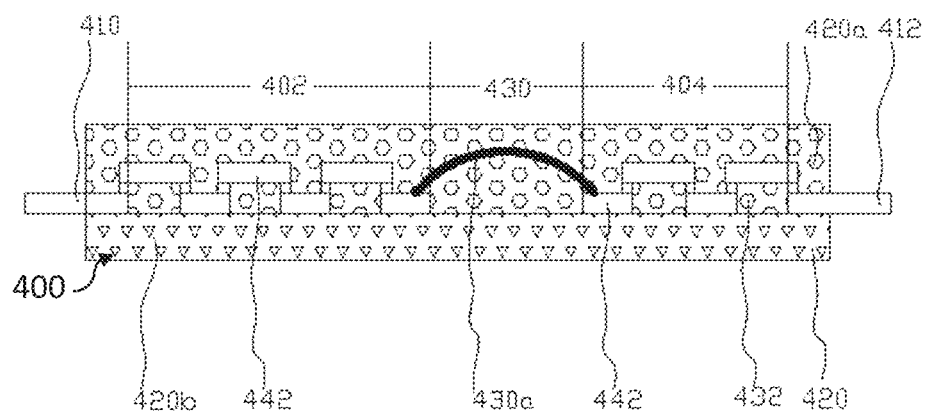
FIG. 9 is a cross sectional view of an LED filament with multiple layers in accordance with an embodiment of the present invention.

In the LED filament package structure as shown in FIG. 9, the LED filament 400 is similar to the LED filament disclosed in FIG. 8, and the difference is that: (1) the LED chip 442 used for the filament 400 is a flip chip having the same solder pad height, wherein the solder pad is directly connected to the silver plating layer 461; (2) the length of the opening of the LED filament described aforementioned (that is, the length in the axial direction of the LED filament) must be greater than the LED chip 442 in order to accommodate the LED chip 442, furthermore, the LED chip 442 of the LED filament in the present embodiment is located corresponding to the opening 432 and above the copper foil 460/silver plating layer 461, therefore the length of the LED chip 442 is greater than the opening 432. The present embodiment omits the step of gold wire bonding in compared to the previous embodiment.

The LED filament structures as shown in FIG. 9 can be employed. The feature of the LED filament structure is that the LED chip is used as flip-chip configuration, that is, the original height of the different solder pads is processed to the same height, usually the lower N-pole extension is processed to the same height as the P-pole.

Figure 10:
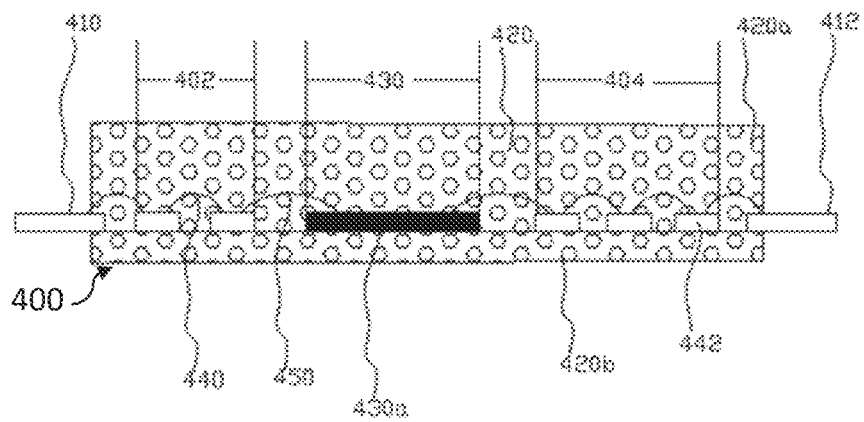
FIG. 10 is a cross sectional view of an LED filament in accordance with an embodiment of the present invention.

The connection mode between the conductor in the conductive section and the light conversion layer is described as follows. Referring to FIG. 10, in the LED filament structure shown in FIG. 10, the LED filament 400 has a light conversion layer 420, the LED sections 402, 404, the conductive electrodes 410, 412, and at least one conductive section 430. The conductive section 430 is located between adjacent LED sections 402 and 404. The LED sections 402 and 404 include at least two LED chips 442 electrically connected to each other through the wires 440. In the present embodiment, the conductive section 430 includes a conductor 430a. The conductive section 430 and the LED sections 402, 404 are electrically connected by wires 450, that is, two LED chips respectively located in the adjacent two LED sections 402, 404 and closest to the conductive section 430 are electrically connected to each other through the wires 450 connecting with the conductor 430a in the conductive section 430. The length of the conductive section 430 is greater than the distance between two adjacent LED chips in one single LED sections 402, 404, and the length of the wire 440 is less than the length of the conductor 430a. The light conversion layer 420 is disposed on at least one side of the LED chip 442 and the conductive electrode 410, 412, and a part of the two conductive electrodes is exposed from the light conversion layer. The light conversion layer 420 includes at least a top layer 420a and a base layer 420b. In the present embodiment, the LED sections 402, 404, the conductive electrodes 410, 412, and the conductive section 430 are all attached to the base layer 420b.

The conductor 430a can be a copper foil or other electrically conductive material. The upper surface of the conductor 430a may further have a silver plating layer, and subsequently, the LED chip 442 may be attached to the base layer 420b by means of die bond paste or the like. Thereafter, a phosphor glue or phosphor film is applied to coat over the LED chip 442, the wires 440, 450, and a portion of the conductive electrodes 410, 412 to form a light conversion layer 420. At least two of the six faces of the LED chip, generally five faces in the present embodiment, being covered by the phosphor glue. The wires 440, 450 may be gold wires. In the present embodiment, the combination of copper foil 460 and the gold wire 440 provides a solid conductive structure and also maintaining the flexibleness of the LED filament. Besides, the silver plating layer 461 has an effect of increasing light reflection in addition to good electrical conductivity.

Figure 11:
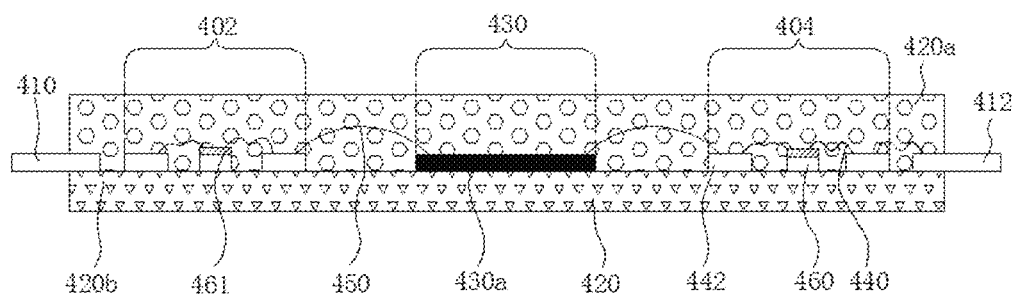
FIG. 11 is a cross sectional view of the structure of an LED filament in accordance with an embodiment of the present invention.

The structure as shown in FIG. 11 discloses a copper foil 460 is disposed between the two LED chips 442, and a silver plating layer 461 is disposed on the copper foil. The copper foil 460 is electrically connected to the LED chips 442 through the wire 440.

Figure 12:
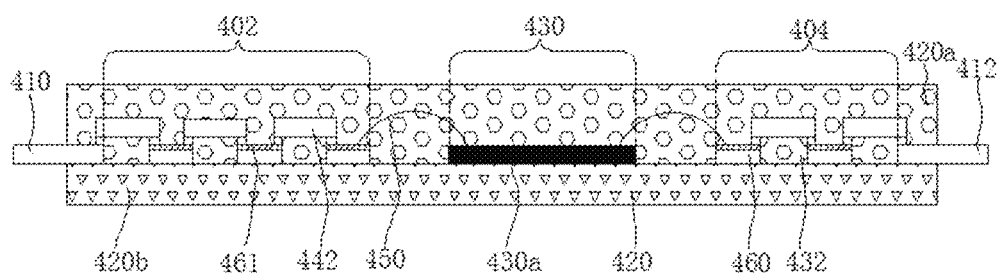
FIG. 12 is a cross sectional view of the structure of an LED filament in accordance with an embodiment of the present invention.

The structure as shown in FIG. 12 discloses: (1) the LED chip used for the LED filament is a flip chip having the same solder pad height and the solder pad is directly connected to the silver plating layer; (2) the length of the aforementioned opening (e.g., opening 432 in FIG. 9) of the LED filament in the longitudinal direction of the LED filament must be greater than the length of the LED chip to accommodate the LED chip, and the LED chip 442 of the LED filament of the present embodiment corresponds to the opening 432 is located above the copper foil 460 and the silver plating layer 461, so the length of the LED chip 442 is greater than the length of the opening.

According to the aforementioned embodiments of the present invention, since the LED filament structure is provided with at least one LED section and at least one conductive section, when the LED filament is bent, the stress is easily concentrated on the conductive section. Therefore, the breakage probability of the gold wire connected between the adjacent LED chips is reduced during bending. Thereby, the quality of the LED filament and its application is improved. In addition, the conductive section employs a copper foil structure, which reduces the length of the metal wire bonding and further reduces the breakage probability of the metal wire during bonding. In other embodiments of the invention, in order to improve the bendability of the conductive section, and further prevent the conductor from damaged when the LED filament is bent. The conductor in the LED filament conductive section may be in a shape of "M" or wave profile for providing better flexibility in extending of the LED filament.

Figure 13A:
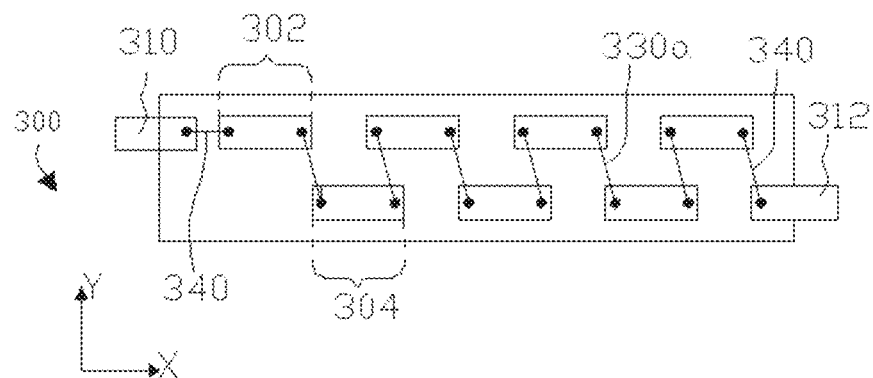
FIG. 13A to FIG. 13F are schematic top views of a plurality of embodiments in accordance with the present invention.

Next, a chip bonding design relating to an LED filament will be described. FIG. 13A is a top view of an embodiment of the LED filament 300 in an unbent state in accordance with the present invention. The LED filament 300 includes a plurality of LED chip units 302, 304, a conductor 330a, and at least two conductive electrodes 310, 312. The LED chip units 302 and 304 may be a single LED chip, or may include a plurality of LED chips, that is, equal to or greater than two LED chips.

The conductor 330a is located between the adjacent two LED chip units 302, 304, the LED chip units 302, 304 are at different positions in the Y direction, and the conductive electrodes 310, 312 are disposed corresponding to the LED chip units 302, 304 and electrically connected to the LED chip units 302 and 304 through the wires 340. The adjacent two LED chip units 302 and 304 are electrically connected to each other through the conductor 330a. The angle between the conductor 330a and the LED filament in the longitudinal direction (X direction) is 30° to 120°, preferably 60° to 120°. In the related art, the direction of the conductor 330a is parallel to the X direction, and the internal stress acting on the cross sectional area of the conductor is large when the filament is bent at the conductor. Therefore, the conductor 330a is disposed at a certain angle with the X direction and it can effectively reduce the internal stress thereof. The wire 340 is at an angle, parallel, vertical or any combination with the X direction. In the embodiment, the LED filament 300 includes two wires 340, one wire 340 is parallel to the X direction, and the other wire 340 has an angle of 30° to 120° with respect to the X direction. The LED filament 300 emits light after its conductive electrodes 310, 312 are powered with voltage source or current source.

Figure 13B:
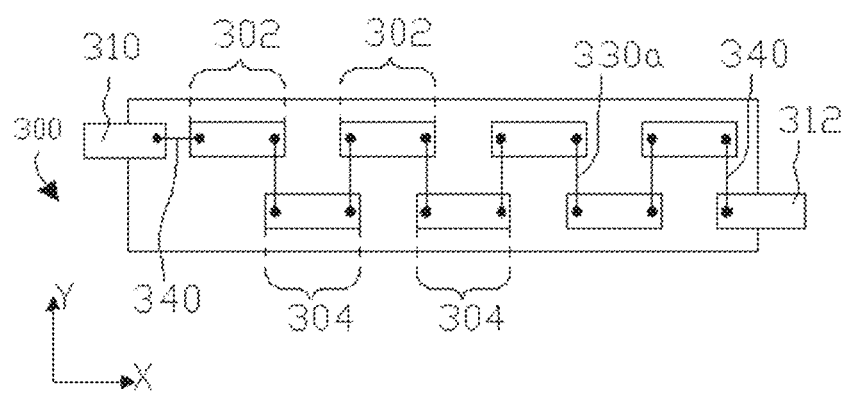
Figure 13C:
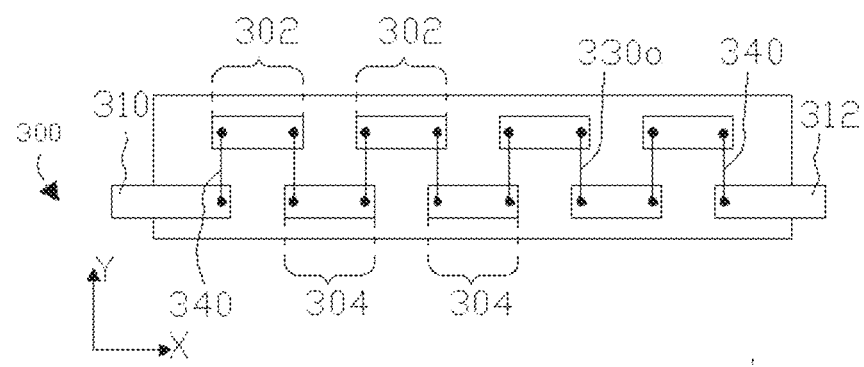
Figure 13D:
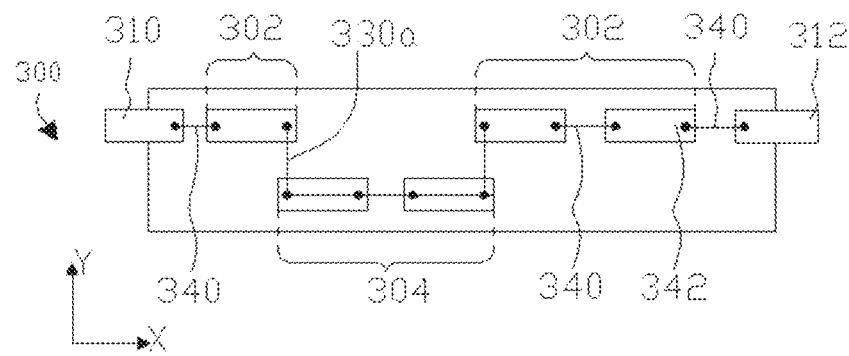

FIG. 13B to FIG. 13D show the case where the conductor 330a is 90° with respect to the X direction, that is, the conductor 330a is perpendicular to the X direction, which can reduce the internal stress on the conductor cross sectional area when the filament is bent. In some embodiment the wire 340 both in parallel and vertically with respect to the X direction are combined in an LED filament, as shown in FIG. 13B, the LED filament 300 includes two wires 340, one wire 340 being parallel to the X direction and the other wire 340 being perpendicular to the X direction.

As shown in FIG. 13C, the difference from the embodiment shown in FIG. 13B is that the wire 340 is perpendicular to the X direction, and the bendability duration between the conductive electrodes 310, 312 and the LED chip units 302, 304 is improved. Further, since the conductor 330a and the wire 340 are simultaneously arranged to be perpendicular to the X direction, the LED filament can have good bendability at any position.

Figure 13E:
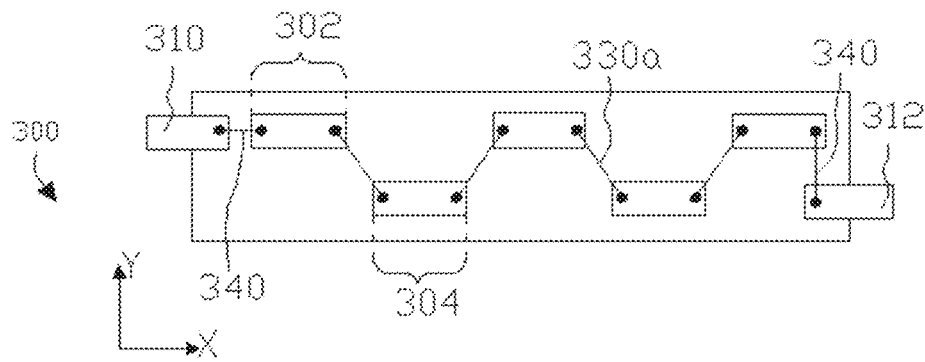

FIG. 13E is a top view of the LED filament 300 in an unbent state in accordance with one embodiment of the present invention. FIG. 13E differs from the embodiment shown in FIG. 13C is that, in the X direction, the LED chip unit 304 is between two adjacent LED chip units 302, and no overlap with the LED chip unit 302 in the projection in the Y direction, so that when the LED filament is bent at the conductor 330a, the LED chip is not damaged, thereby improving the stability of the LED light bulb product quality.

Figure 13F:
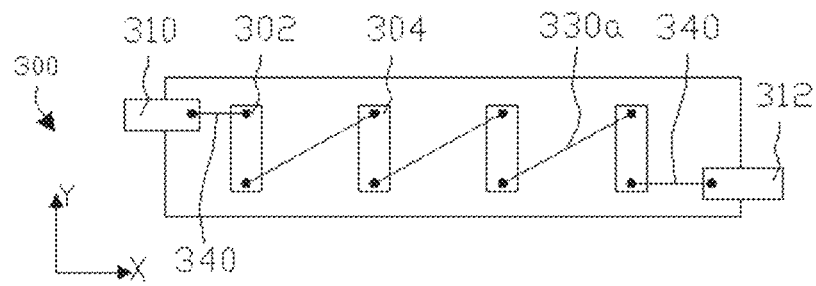

FIG. 13F is a top view showing an embodiment of the LED filament 300 in an unbent state. In the present embodiment, the LED chip units 302 and 304 are single LED chips, and the width of the LED chip units 302 and 304 is parallel to the X direction. Preferably, the LED chip units 302 and 304 are at substantially the same position in the Y direction, so that the overall width of the LED filament 300 is smaller, thereby shortening the heat dissipation path of the LED chip and improving the thermal dissipation effect. The adjacent two LED chip units 302 and 304 are connected by a conductor 330a, and the angle between the conductor 330a and the X direction is 30° to 120°, which reduces the internal stress on the cross sectional area of the wire and also improves the bendability of the wire when the LED filament 300 is bent. In other embodiments, the LED chip unit longitudinally may have an angle with the X direction as the conductor 330a, which may further reduce the overall width of the LED filament 300.

Figure 14:
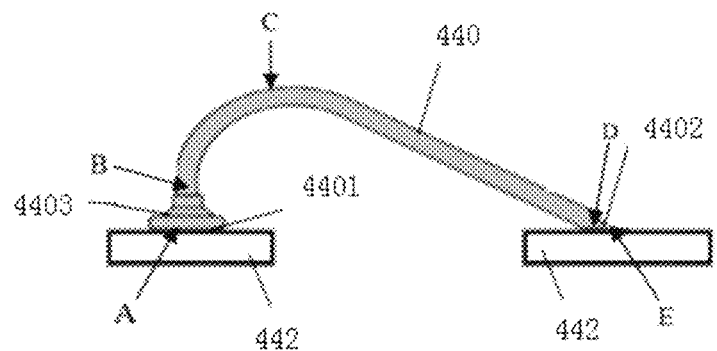
FIG. 14 is a schematic structural view of an LED chip bonding wire of an embodiment in accordance with the present invention.

When the wire bonding process of the face up chip is carried out along the x direction, for example, the bonding wire and the bonding conductor are gold wires, the quality of the bonding wire is mainly determined by the stress at the five points A, B, C, D, and E as shown in FIG. 14. The point A is the junction of the soldering pad 4401 and the gold ball 4403, point B is the junction of the gold ball 4403 and the gold wire 440, point C is between the two segments of the gold wire 440, point D is the gold wire 440 and the two solder butted joints 4402, and the point E is between the two solder butted joints 4402 and the surface of the chip 442. Because of point B is the first bending point of the gold wire 440, and the gold wire 440 at the point D is thinner, thus gold wire 440 is frangible at points B and D. So that, for example, in the implementation of the structure of the LED filament 300 package, the top layer 420a needs to cover points B, C and D. If one of the six faces of the LED chip 442 farthest from the base layer 420b is defined as the upper surface of the LED chip 442, the distance from the upper surface of the LED chip 442 to the surface of the top layer 420a is in a range of around 100 to 200 um.

The LED filament structure in the aforementioned embodiments is mainly applicable to the LED light bulb product, so that the LED light bulb can achieve the omni-directional light illuminating effect through the flexible bending characteristics of the single LED filament. The specific embodiment in which the aforementioned LED filament applied to the LED light bulb is further explained below.

Figure 15A:
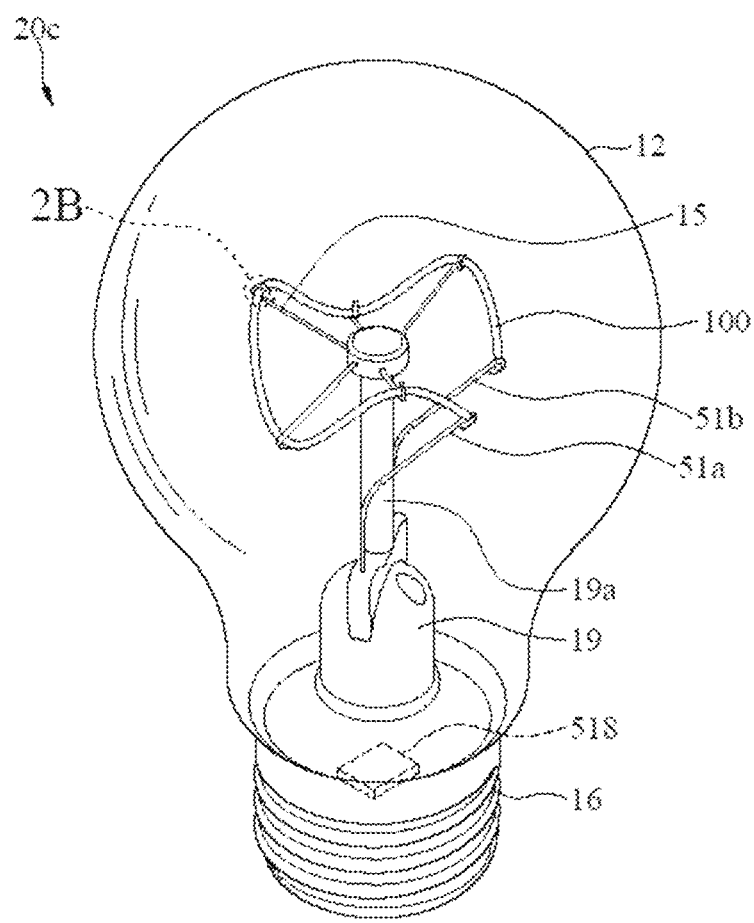
FIG. 15A illustrates a perspective view of an LED light bulb according to the third embodiment of the instant disclosure.

Please refer to FIG. 15A. FIG. 15A illustrates a perspective view of an LED light bulb according to the third embodiment of the present disclosure. According to the third embodiment, the LED light bulb 20c comprises a lamp housing 12, a bulb base 16 connected with the lamp housing 12, two conductive supports 51a, 51b disposed in the lamp housing 12, a driving circuit 518 electrically connected with both the conductive supports 51a, 51b and the bulb base 16, a stem 19, supporting arms 15 and a single LED filament 100.

The lamp housing 12 is a material which is preferably light transmissive or thermally conductive, such as, glass or plastic, but not limited thereto. In implementation, the lamp housing 12 may be doped with a golden yellow material or its surface coated with a yellow film to absorb a portion of the blue light emitted by the LED chip to reduce the color temperature of the light emitted by the LED light bulb 20c. In other embodiments of the present invention, the lamp housing 12 includes a layer of luminescent material (not shown), which may be formed on the inner surface or the outer surface of the lamp housing 12 according to design requirements or process feasibility, or even integrated in the material of the lamp housing 12. The luminescent material layer comprises low reabsorption semiconductor nanocrystals (hereinafter referred to as quantum dots), the quantum dots comprises a core, a protective shell and a light absorbing shell, and the light absorbing shell is disposed between the core and the protective shell. The core emits the emissive light with emission wavelength, and the light absorbing shell emits the excited light with excitation wavelength. The emission wavelength is longer than the excitation wavelength, and the protective shell provides the stability of the light.

The LED filament 100 shown in FIG. 15A is bent to form a contour resembling to a circle while being observed from the top view of FIG. 15A. According to the embodiment of FIG. 15A, the LED filament 100 is bent to form a wave shape from side view. The shape of the LED filament 100 is novel and makes the illumination more uniform. In comparison with a LED bulb having multiple LED filaments, single LED filament 100 has less connecting spots. In implementation, single LED filament 100 has only two connecting spots such that the probability of defect soldering or defect mechanical pressing is decreased.

The stem 19 has a stand 19a extending to the center of the bulb shell 12. The stand 19a supports the supporting arms 15. The first end of each of the supporting arms 15 is connected with the stand 19a while the second end of each of the supporting arms 15 is connected with the LED filament 100.

Figure 15B:
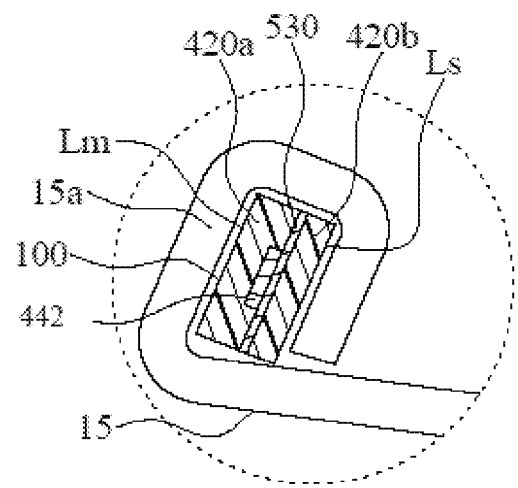
FIG. 15B illustrates an enlarged cross-sectional view of the dashed-line circle of FIG. 15A.

Please refer to FIG. 15B which illustrates an enlarged cross-sectional view of the dashed-line circle of FIG. 15A. The second end of each of the supporting arms 15 has a clamping portion 15a which clamps the body of the LED filament 100. The clamping portion 15a may, but not limited to, clamp at either the wave crest or the wave trough. Alternatively, the clamping portion 15a may clamp at the portion between the wave crest and the wave trough. The shape of the clamping portion 15a may be tightly fitted with the outer shape of the cross-section of the LED filament 100. The dimension of the inner shape (through hole) of the clamping portion 15a may be a little bit smaller than the outer shape of the cross-section of the LED filament 100. During manufacturing process, the LED filament 100 may be passed through the inner shape of the clamping portion 15a to form a tight fit. Alternatively, the clamping portion 15a may be formed by a bending process. Specifically, the LED filament 100 may be placed on the second end of the supporting arm 15 and a clamping tooling is used to bend the second end into the clamping portion to clamp the LED filament 100.

The supporting arms 15 may be, but not limited to, made of carbon steel spring to provide with adequate rigidity and flexibility so that the shock to the LED light bulb caused by external vibrations is absorbed and the LED filament 100 is not easily to be deformed. Since the stand 19a extending to the center of the bulb shell 12 and the supporting arms 15 are connected to a portion of the stand 19a near the top thereof, the position of the LED filaments 100 is at the level close to the center of the bulb shell 12. Accordingly, the illumination characteristics of the LED light bulb 20c are close to that of the traditional light bulb including illumination brightness. The illumination uniformity of LED light bulb 20c is better. In the embodiment, at least a half of the LED filaments 100 is around a center axle of the LED light bulb 20c. The center axle is coaxial with the axle of the stand 19a.

In the embodiment, the first end of the supporting arm 15 is connected with the stand 19a of the stem 19. The clamping portion of the second end of the supporting arm 15 is connected with the outer insulation surface of the LED filaments 100 such that the supporting arms 15 are not used as connections for electrical power transmission. In an embodiment where the stem 19 is made of glass, the stem 19 would not be cracked or exploded because of the thermal expansion of the supporting arms 15 of the LED light bulb 20c. Additionally, there may be no stand in an LED light bulb. The supporting arm 15 may be fixed to the stem or the bulb shell directly to eliminate the negative effect to illumination caused by the stand.

The supporting arm 15 is thus non-conductive to avoid a risk that the glass stem 19 may crack due to the thermal expansion and contraction of the metal filament in the supporting arm 15 under the circumstances that the supporting arm 15 is conductive and generates heat when current passes through the supporting arm 15.

In different embodiments, the second end of the supporting arm 15 may be directly inserted inside the LED filament 100 and become an auxiliary piece in the LED filament 100, which can enhance the mechanical strength of the LED filament 100. Relative embodiments are described later.

The inner shape (the hole shape) of the clamping portion 15a fits the outer shape of the cross section of the LED filament 100; therefore, based upon a proper design, the cross section of the LED filament 100 may be oriented to face towards a predetermined orientation. For example, as shown in FIG. 15B, the LED filament 100 comprises a top layer 420a, LED chips 104, and a base layer 420b. The LED chips 104 are aligned in line along the axial direction (or an elongated direction) of the LED filament 100 and are disposed between the top layer 420a and the base layer 420b. The top layer 420a of the LED filament 100 is oriented to face towards ten o'clock in FIG. 15B. A lighting face of the whole LED filament 100 may be oriented to face towards the same orientation substantially to ensure that the lighting face of the LED filament 100 is visually identical. The LED filament 100 comprises a main lighting face Lm and a subordinate lighting face Ls corresponding to the LED chips. If the LED chips in the LED filament 100 are wire bonded and are aligned in line, a face of the top layer 420a away from the base layer 420b is the main lighting face Lm, and a face of the base layer 420b away from the top layer 420a is the subordinate lighting face Ls. The main lighting face Lm and the subordinate lighting face Ls are opposite to each other. When the LED filament 100 emits light, the main lighting face Lm is the face through which the largest amount of light rays passes, and the subordinate lighting face Ls is the face through which the second largest amount of light rays passes. In the embodiment, there is, but is not limited to, a conductive foil 530 formed between the top layer 420a and the base layer 420b, which is utilized for electrical connection between the LED chips. In the embodiment, the LED filament 100 wriggles with twists and turns while the main lighting face Lm is always towards outside. That is to say, any portion of the main lighting face Lm is towards the bulb shell 12 or the bulb base 16 and is away from the stem 19 at any angle, and the subordinate lighting face Ls is always towards the stem 19 or towards the top of the stem 19 (the subordinate lighting face Ls is always towards inside).

The LED filament 100 shown in FIG. 15A is curved to form a circular shape in a top view while the LED filament is curved to form a wave shape in a side view. The wave shaped structure is not only novel in appearance but also guarantees that the LED filament 100 illuminates evenly. In the meantime, the single LED filament 100, comparing to multiple LED filaments, requires less joint points (e.g., pressing points, fusing points, or welding points) for being connected to the conductive supports 51a, 51b. In practice, the single LED filament 100 (as shown in FIG. 15A) requires only two joint points respectively formed on the two conductive electrodes, which effectively lowers the risk of fault welding and simplifies the process of connection compared to the mechanically connection in the tightly pressing manner.

Figure 15C:
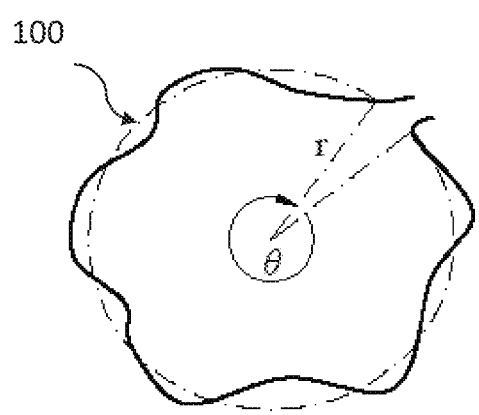
FIG. 15C is a projection of a top view of an LED filament of the LED light bulb of FIG. 15A.

Please refer to FIG. 15C. FIG. 15C is a projection of a top view of an LED filament of the LED light bulb 20c of FIG. 15A. As shown in FIG. 15C, in an embodiment, the LED filament may be curved to form a wave shape resembling a circle observed in a top view to surround the center of the light bulb or the stem. In different embodiments, the LED filament observed in the top view can form a quasi-circle or a quasi U shape.

As shown in FIG. 15B and FIG. 15C, the LED filament 100 surrounds with the wave shape resembling a circle and has a quasi-symmetric structure in the top view, and the lighting face of the LED filament 100 is also symmetric, e.g., the main lighting face Lm in the top view may face outwardly; therefore, the LED filament 100 may generate an effect of an omnidirectional light due to a symmetry characteristic with respect to the quasi-symmetric structure of the LED filament 100 and the arrangement of the lighting face of the LED filament 100 in the top view. Whereby, the LED light bulb 20c as a whole may generate an effect of an omnidirectional light close to a 360 degrees illumination. Additionally, the two joint points may be close to each other such that the conductive supports 51a, 51b are substantially below the LED filament 100. Visually, the conductive supports 51a, 51b keeps a low profile and is integrated with the LED filament 100 to show an elegance curvature.

Figure 16A:
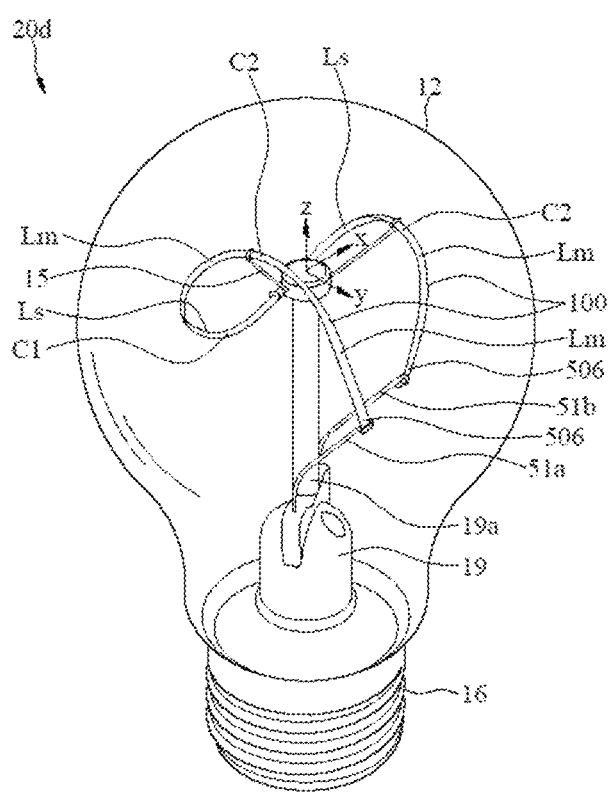
FIG. 16A is a perspective view of an LED light bulb according to an embodiment of the present invention.
Figure 16B:
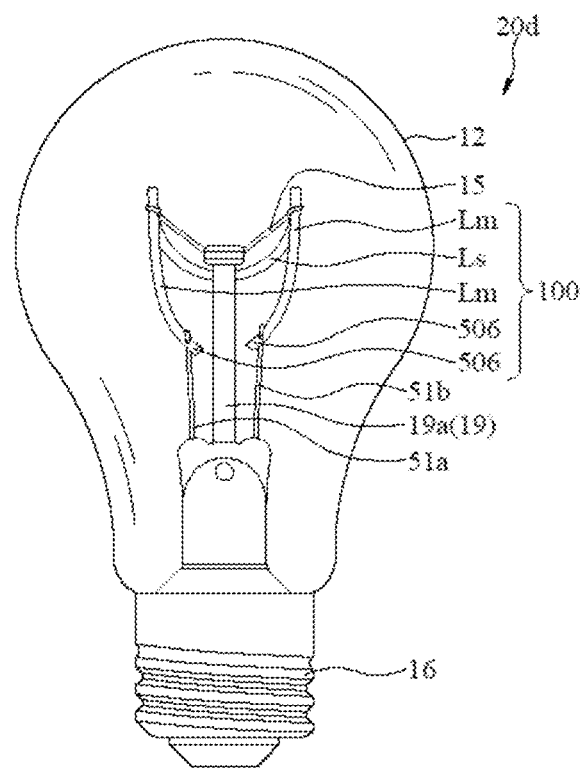
FIG. 16B is a front view of an LED light bulb of FIG. 16A.

Please refer to FIG. 16A and FIG. 16B. FIG. 16A is a perspective view of an LED light bulb according to an embodiment of the present invention. FIG. 16B is a front view (or a side view) of an LED light bulb of FIG. 16A. The LED light bulb 20d shown in FIG. 16A and FIG. 16B is analogous to the LED light bulb 20c shown in FIG. 15A. As shown in FIG. 16A and FIG. 16B, the LED light bulb 20d comprises a bulb shell 12, a bulb base 16 connected to the bulb shell 12, two conductive supports 51a, 51b disposed in the bulb shell 12, supporting arms 15, a stem 19, and one single LED filament 100. The stem 19 comprises a stem bottom and a stem top opposite to each other. The stem bottom is connected to the bulb base 16. The stem top extends to inside of the bulb shell 12 (e.g., extending to the center of the bulb shell 12) along an elongated direction of the stem 19. For example, the stem top may be substantially located at a center of the inside of the bulb shell 12. In the embodiment, the stem 19 comprises the stand 19a. Herein the stand 19a is deemed as a part of the whole stem 19 and thus the top of the stem 19 is the same as the top of the stand 19a. The two conductive supports 51a, 51b are connected to the stem 19. The LED filament 100 comprises a filament body and two conductive electrodes 506. The two conductive electrodes 506 are at two opposite ends of the filament body. The filament body is the part of the LED filament 100 without the conductive electrodes 506. The two conductive electrodes 506 are respectively connected to the two conductive supports 51a, 51b. The filament body is around the stem 19. An end of the supporting arm 15 is connected to the stem 19 and another end of the supporting arm 15 is connected to the filament body.

Figure 16C:
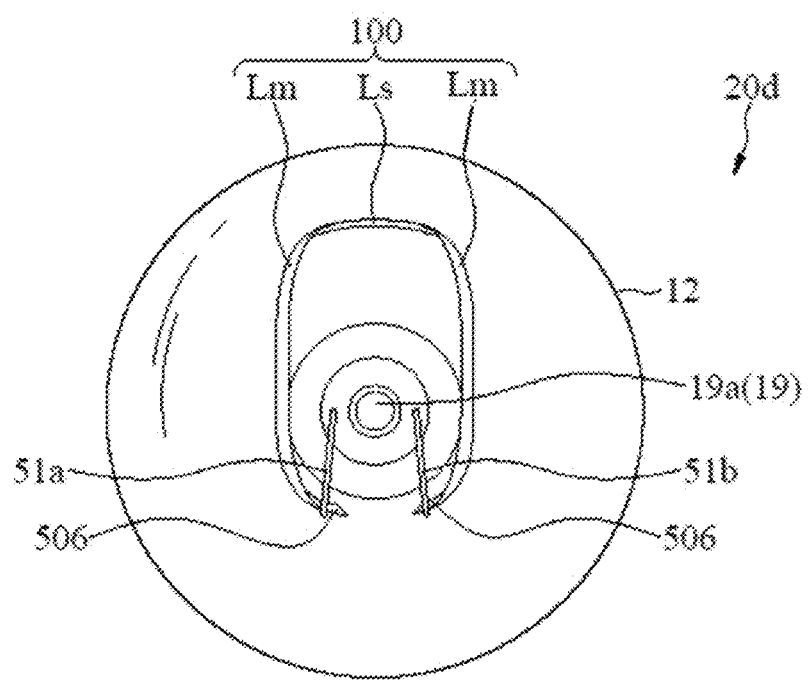
FIG. 16C is a top view of the LED light bulb of FIG. 16A.

Please refer to FIG. 16C. FIG. 16C is a top view of the LED light bulb 20d of FIG. 16A. As shown in FIG. 16B and FIG. 16C, the filament body comprises a main lighting face Lm and a subordinate lighting face Ls. Any portion of the main lighting face Lm is towards the bulb shell 12 or the bulb base 16 at any angle, and any portion of the subordinate lighting face Ls is towards the stem 19 or towards the top of the stem 19, i.e., the subordinate lighting face Ls is towards inside of the LED light bulb 20d or towards the center of the bulb shell 12. In other words, when a user observes the LED light bulb 20d from outside, the user would see the main lighting face Lm of the LED filament 100d at any angle. Based upon the configuration, the effect of illumination is better.

According to different embodiments, the LED filament 100 in different LED light bulbs (e.g., the LED light bulb 20a, 20b, 20c, or 20d) may be formed with different shapes or curves while all of the LED filaments 100 are configured to have symmetry characteristic. The symmetry characteristic has the benefit of creating an even, wide distribution of light rays, so that the LED light bulb is capable of generating an omnidirectional light effect. The symmetry characteristic of the LED filament 100 is discussed below.

The definition of the symmetry characteristic of the LED filament 100 may be based on four quadrants defined in a top view of an LED light bulb. The four quadrants may be defined in a top view of an LED light bulb (e.g., the LED light bulb 20c shown in FIG. 15A), and the origin of the four quadrants may be defined as a center of a stem/stand of the LED light bulb in the top view (e.g., a center of the top of the stand 19a shown in FIG. 15A). The LED filament of the LED light bulb (e.g., the LED filament 100 shown in FIG. 15A) in the top view may be presented as an annular structure, shape or, contour. The LED filament presented in the four quadrants in the top view may be symmetric.

For example, the brightness presented by a portion of the LED filament in the first quadrant in the top view is symmetric with that presented by a portion of the LED filament in the second quadrant, in the third quadrant, or in the fourth quadrant in the top view while the LED filament operates. In some embodiments, the structure of a portion of the LED filament in the first quadrant in the top view is symmetric with that of a portion of the LED filament in the second quadrant, in the third quadrant, or in the fourth quadrant in the top view. In addition, an emitting direction of a portion of the LED filament in the first quadrant in the top view is symmetric with that of a portion of the LED filament in the second quadrant, in the third quadrant, or in the fourth quadrant in the top view.

In another embodiment, an arrangement of LED chips in a portion of the LED filament in the first quadrant (e.g., a density variation of the LED chips in the portion of the LED filament in the first quadrant) in the top view is symmetric with an arrangement of LED chips in a portion of the LED filament in the second quadrant, in the third quadrant, or in the fourth quadrant in the top view.

In another embodiment, a power configuration of LED chips with different power in a portion of the LED filament in the first quadrant in the top view is symmetric with a power configuration of LED chips with different power in a portion of the LED filament in the second quadrant, in the third quadrant, or in the fourth quadrant in the top view.

In another embodiment, refractive indexes of segments of a portion of the LED filament in the first quadrant in the top view are symmetric with refractive indexes of segments of a portion of the LED filament in the second quadrant, in the third quadrant, or in the fourth quadrant in the top view while the segments may be defined by distinct refractive indexes.

In another embodiment, surface roughness of segments of a portion of the LED filament in the first quadrant in the top view are symmetric with surface roughness of segments of a portion of the LED filament in the second quadrant, in the third quadrant, or in the fourth quadrant in the top view while the segments may be defined by distinct surface roughness.

The LED filament presented in the four quadrants in the top view may be in point symmetry (e.g., being symmetric with the origin of the four quadrants) or in line symmetry (e.g., being symmetric with one of the two axis the four quadrants).

A tolerance (a permissible error) of the symmetric structure of the LED filament in the four quadrants in the top view may be up to 20%-50%. For example, in a case that the structure of a portion of the LED filament in the first quadrant is symmetric with that of a portion of the LED filament in the second quadrant, a designated point on portion of the LED filament in the first quadrant is defined as a first position, a symmetric point to the designated point on portion of the LED filament in the second quadrant is defined as a second position, and the first position and the second position may be exactly symmetric or be symmetric with 20%-50% difference.

In addition, a length of a portion of the LED filament in one of the four quadrants in the top view is substantially equal to that of a portion of the LED filament in another one of the four quadrants in the top view. The lengths of portions of the LED filament in different quadrants in the top view may also have 20%-50% difference.

The definition of the symmetry characteristic of the LED filament 100 may be based on four quadrants defined in a side view, in a front view, or in a rear view of an LED light bulb. In the embodiments, the side view may include a front view or a rear view of the LED light bulb. The four quadrants may be defined in a side view of an LED light bulb (e.g., the LED light bulb 20c shown in FIG. 15A). In such case, an elongated direction of a stand (or a stem) from the bulb base 16 towards a top of the bulb shell 12 away from the bulb base 16 may be defined as the Y-axis, and the X-axis may cross a middle of the stand (e.g., the stand 19a of the LED light bulb 20c shown in FIG. 15A) while the origin of the four quadrants may be defined as the middle of the stand. In different embodiment, the X-axis may cross the stand at any point, e.g., the X-axis may cross the stand at the top of the stand, at the bottom of the stand, or at a point with a certain height (e.g., ⅔ height) of the stand.

In addition, portions of the LED filament presented in the first quadrant and the second quadrant (the upper quadrants) in the side view may be symmetric (e.g., in line symmetry with the Y-axis) in brightness, and portions of the LED filament presented in the third quadrant and the fourth quadrant (the lower quadrants) in the side view may be symmetric (e.g., in line symmetry with the Y-axis) in brightness; however, the brightness of the portions of the LED filament presented in the upper quadrants in the side view may be asymmetric with that of the portions of the LED filament presented in the lower quadrants in the side view.

In some embodiments, portions of the LED filament presented in the first quadrant and the second quadrant (the upper quadrants) in the side view may be symmetric (e.g., in line symmetry with the Y-axis) in structure; portions of the LED filament presented in the third quadrant and the fourth quadrant (the lower quadrants) in the side view may be symmetric (e.g., in line symmetry with the Y-axis) in structure. In addition, an emitting direction of a portion of the LED filament in the first quadrant in the side view is symmetric with that of a portion of the LED filament in the second quadrant in the side view, and an emitting direction of a portion of the LED filament in the third quadrant in the side view is symmetric with that of a portion of the LED filament in the fourth quadrant in the side view.

In another embodiment, an arrangement of LED chips in a portion of the LED filament in the first quadrant in the side view is symmetric with an arrangement of LED chips in a portion of the LED filament in the second quadrant in the side view, and an arrangement of LED chips in a portion of the LED filament in the third quadrant in the side view is symmetric with an arrangement of LED chips in a portion of the LED filament in the fourth quadrant in the side view.

In another embodiment, a power configuration of LED chips with different power in a portion of the LED filament in the first quadrant in the side view is symmetric with a power configuration of LED chips with different power in a portion of the LED filament in the second quadrant in the side view, and a power configuration of LED chips with different power in a portion of the LED filament in the third quadrant in the side view is symmetric with a power configuration of LED chips with different power in a portion of the LED filament in the fourth quadrant in the side view.

In another embodiment, refractive indexes of segments of a portion of the LED filament in the first quadrant in the side view are symmetric with refractive indexes of segments of a portion of the LED filament in the second quadrant in the side view, and refractive indexes of segments of a portion of the LED filament in the third quadrant in the side view are symmetric with refractive indexes of segments of a portion of the LED filament in the fourth quadrant in the side view while the segments may be defined by distinct refractive indexes.

In another embodiment, surface roughness of segments of a portion of the LED filament in the first quadrant in the side view are symmetric with surface roughness of segments of a portion of the LED filament in the second quadrant in the side view, and surface roughness of segments of a portion of the LED filament in the third quadrant in the side view are symmetric with surface roughness of segments of a portion of the LED filament in the fourth quadrant in the side view while the segments may be defined by distinct surface roughness.

Additionally, the portions of the LED filament presented in the upper quadrants in the side view may be asymmetric with the portions of the LED filament presented in the lower quadrants in the side view in brightness. In some embodiments, the portion of the LED filament presented in the first quadrant and the fourth quadrant in the side view is asymmetric in structure, in length, in emitting direction, in arrangement of LED chips, in power configuration of LED chips with different power, in refractive index, or in surface roughness, and the portion of the LED filament presented in the second quadrant and the third quadrant in the side view is asymmetric in structure, in length, in emitting direction, in arrangement of LED chips, in power configuration of LED chips with different power, in refractive index, or in surface roughness. In order to fulfill the illumination purpose and the requirement of omnidirectional lamps, light rays emitted from the upper quadrants (the portion away from the bulb base 16) in the side view should be greater than those emitted from the lower quadrants (the portion close to the bulb base 16). Therefore, the asymmetric characteristic of the LED filament of the LED light bulb between the upper quadrants and the lower quadrants in the side view may contribute to the omnidirectional requirement by concentrating the light rays in the upper quadrants.

A tolerance (a permissible error) of the symmetric structure of the LED filament in the first quadrant and the second quadrant in the side view may be 20%-50%. For example, a designated point on portion of the LED filament in the first quadrant is defined as a first position, a symmetric point to the designated point on portion of the LED filament in the second quadrant is defined as a second position, and the first position and the second position may be exactly symmetric or be symmetric with 20%-50% difference.

In addition, a length of a portion of the LED filament in the first quadrant in the side view is substantially equal to that of a portion of the LED filament in the second quadrant in the side view. A length of a portion of the LED filament in the third quadrant in the side view is substantially equal to that of a portion of the LED filament in the fourth quadrant in the side view. However, the length of the portion of the LED filament in the first quadrant or the second quadrant in the side view is different from the length of the portion of the LED filament in the third quadrant or the fourth quadrant in the side view. In some embodiment, the length of the portion of the LED filament in the third quadrant or the fourth quadrant in the side view may be less than that of the portion of the LED filament in the first quadrant or the second quadrant in the side view. The lengths of portions of the LED filament in the first and the second quadrants or in the third and the fourth quadrants in the side view may also have 20%-50% difference.

Figure 16D:
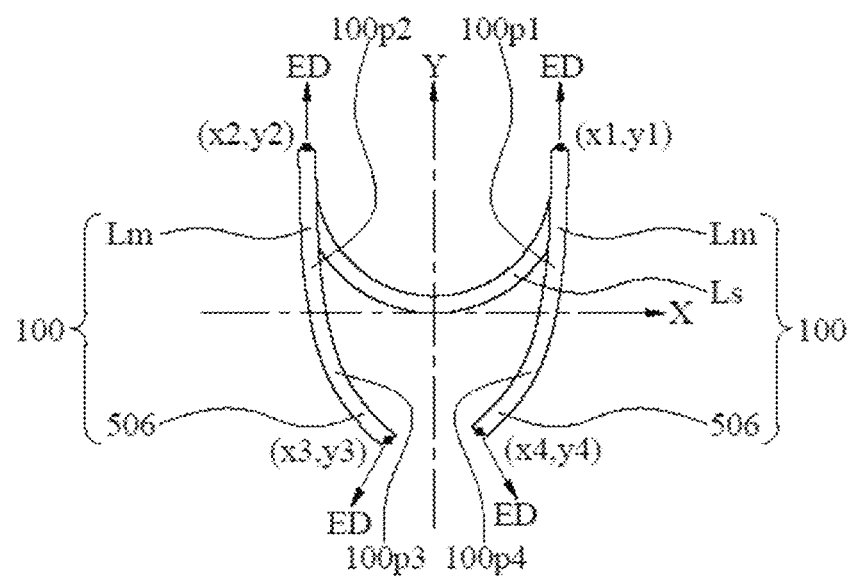
FIG. 16D is the LED filament shown in FIG. 16B presented in two dimensional coordinate system defining four quadrants.

Please refer to FIG. 16D. FIG. 16D is the LED filament 100 shown in FIG. 16B presented in two dimensional coordinate system defining four quadrants. The LED filament 100 in FIG. 16D is the same as that in FIG. 16B, which is a front view (or a side view) of the LED light bulb 20d shown in FIG. 2A. As shown in FIG. 2B and FIG. 2D, the Y-axis is aligned with the stand 19a of the stem (i.e., being along the elongated direction of the stand 19a), and the X-axis crosses the stand 19a (i.e., being perpendicular to the elongated direction of the stand 19a). As shown in FIG. 16D, the LED filament 100 in the side view can be divided into a first portion 100p1, a second portion 100p2, a third portion 100p3, and a fourth portion 100p4 by the X-axis and the Y-axis. The first portion 100p1 of the LED filament 100 is the portion presented in the first quadrant in the side view. The second portion 100p2 of the LED filament 100 is the portion presented in the second quadrant in the side view. The third portion 100p3 of the LED filament 100 is the portion presented in the third quadrant in the side view. The fourth portion 100p4 of the LED filament 100 is the portion presented in the fourth quadrant in the side view.

As shown in FIG. 16D, the LED filament 100 is in line symmetry. The LED filament 100 is symmetric with the Y-axis in the side view. That is to say, the geometric shape of the first portion 100p1 and the fourth portion 100p4 are symmetric with that of the second portion 100p2 and the third portion 100p3. Specifically, the first portion 100p1 is symmetric to the second portion 100p2 in the side view. Particularly, the first portion 100p1 and the second portion 100p2 are symmetric in structure in the side view with respect to the Y-axis. In addition, the third portion 100p3 is symmetric to the fourth portion 100p4 in the side view. Particularly, the third portion 100p3 and the fourth portion 100p4 are symmetric in structure in the side view with respect to the Y-axis.

In the embodiment, as shown in FIG. 16D, the first portion 100p1 and the second portion 100p2 presented in the upper quadrants (i.e., the first quadrant and the second quadrant) in the side view are asymmetric with the third portion 100p3 and the fourth portion 100p4 presented in the lower quadrants (i.e., the third quadrant and the fourth quadrant) in the side view. In particular, the first portion 100p1 and the fourth portion 100p4 in the side view are asymmetric, and the second portion 100p2 and the third portion 100p3 in the side view are asymmetric. According to an asymmetry characteristic of the structure of the filament 100 in the upper quadrants and the lower quadrants in FIG. 16D, light rays emitted from the upper quadrants to pass through the upper bulb shell 12 (the portion away from the bulb base 16) would be greater than those emitted from the lower quadrants to pass through the lower bulb shell 12 (the portion close to the bulb base 16) in order to fulfill the illumination purpose and the requirement of omnidirectional lamps.

Based upon symmetry characteristic of LED filament 100, the structures of the two symmetric portions of the LED filament 100 in the side view (the first portion 100p1 and the second portion 100p2 or the third portion 100p3 and the fourth portion 100p4) may be exactly symmetric or be symmetric with a tolerance in structure. The tolerance (or a permissible error) between the structures of the two symmetric portions of the LED filament 100 in the side view may be 20%-50% or less.

The tolerance can be defined as a difference in coordinates, i.e., x-coordinate or y-coordinate. For example, if there is a designated point on the first portion 100p1 of the LED filament 100 in the first quadrant and a symmetric point on the second portion 100p2 of the LED filament 100 in the second quadrant symmetric to the designated point with respect to the Y-axis, the absolute value of y-coordinate or the x-coordinate of the designated point may be equal to the absolute value of y-coordinate or the x-coordinate of the symmetric point or may have 20% difference compared to the absolute value of y-coordinate or the x-coordinate of the symmetric point.

For example, as shown in FIG. 16D, a designated point (x1, y1) on the first portion 100p1 of the LED filament 100 in the first quadrant is defined as a first position, and a symmetric point (x2, y2) on the second portion 100p2 of the LED filament 100 in the second quadrant is defined as a second position. The second position of the symmetric point (x2, y2) is symmetric to the first position of the designated point (x1, y1) with respect to the Y-axis. The first position and the second position may be exactly symmetric or be symmetric with 20%-50% difference. In the embodiment, the first portion 100p1 and the second portion 100p2 are exactly symmetric in structure. In other words, x2 of the symmetric point (x2, y2) is equal to negative x1 of the designated point (x1, y1), and y2 of the symmetric point (x2, y2) is equal to y1 of the designated point (x1, y1).

For example, as shown in FIG. 16D, a designated point (x3, y3) on the third portion 100p3 of the LED filament 100 in the third quadrant is defined as a third position, and a symmetric point (x4, y4) on the fourth portion 100p4 of the LED filament 100 in the fourth quadrant is defined as a fourth position. The fourth position of the symmetric point (x4, y4) is symmetric to the third position of the designated point (x3, y3) with respect to the Y-axis. The third position and the fourth position may be exactly symmetric or be symmetric with 20%-50% difference. In the embodiment, the third portion 100p3 and the fourth portion 100p4 are symmetric with a tolerance (e.g., a difference in coordinates being less than 20%) in structure. In other words, the absolute value of x4 of the symmetric point (x4, y4) is unequal to the absolute value of x3 of the designated point (x3, y3), and the absolute value of y4 of the symmetric point (x4, y4) is unequal to the absolute value of y3 of the designated point (x3, y3). As shown in FIG. 16D, the level of the designated point (x3, y3) is slightly lower than that of the symmetric point (x4, y4), and the designated point (x3, y3) is slightly closer to the Y-axis than the symmetric point (x4, y4) is. Accordingly, the absolute value of y4 is slightly less than that of y3, and the absolute value of x4 is slightly greater than that of x3.

As shown in FIG. 16D, a length of the first portion 100p1 of the LED filament 100 in the first quadrant in the side view is substantially equal to a length of the second portion 100p2 of the LED filament 100 in the second quadrant in the side view. In the embodiment, the length is defined along an elongated direction of the LED filament 100 in a plane view (e.g., a side view, a front view, or a top view). For example, the first portion 100p1 elongates in the first quadrant in the side view shown in FIG. 16D to form a reversed "V" shape with two ends respectively contacting the X-axis and the Y-axis, and the length of the first portion 100*p*1 is defined along the reversed "V" shape between the X-axis and the Y-axis.

In addition, a length of the third portion 100*p*3 of the LED filament 100 in the third quadrant in the side view is substantially equal to a length of fourth portion 100*p*4 of the LED filament 100 in the fourth quadrant in the side view. Since the third portion 100*p*3 and the fourth portion 100*p*4 are symmetric with respect to the Y-axis with a tolerance in structure, there may be a slight difference between the length of the third portion 100*p*3 and the length of fourth portion 100*p*4. The difference may be 20%-50% or less.

As shown in FIG. 16D, an emitting direction of a designated point of the first portion 100*p*1 and an emitting direction of a symmetric point of the second portion 100*p*2 symmetric to the designated point are symmetric in direction in the side view with respect to the Y-axis. In the embodiment, the emitting direction may be defined as a direction towards which the LED chips face. Since the LED chips face the main lighting face Lm, the emitting direction may also be defined as the normal direction of the main lighting face Lm. For example, the designated point (x1, y1) of the first portion 100*p*1 has an emitting direction ED which is upwardly in FIG. 16D, and the symmetric point (x2, y2) of the second portion 100*p*2 has an emitting direction ED which is upwardly in FIG. 16D. The emitting direction ED of the designated point (x1, y1) and the emitting direction ED of the symmetric point (x2, y2) are symmetric with respect to the Y-axis. In addition, the designated point (x3, y3) of the third portion 100*p*3 has an emitting direction ED towards a lower-left direction in FIG. 16D, and the symmetric point (x4, y4) of the fourth portion 100*p*4 has an emitting direction ED towards a lower-right direction in FIG. 16D. The emitting direction ED of the designated point (x3, y3) and the emitting direction ED of the symmetric point (x4, y4) are symmetric with respect to the Y-axis.

Figure 16E:
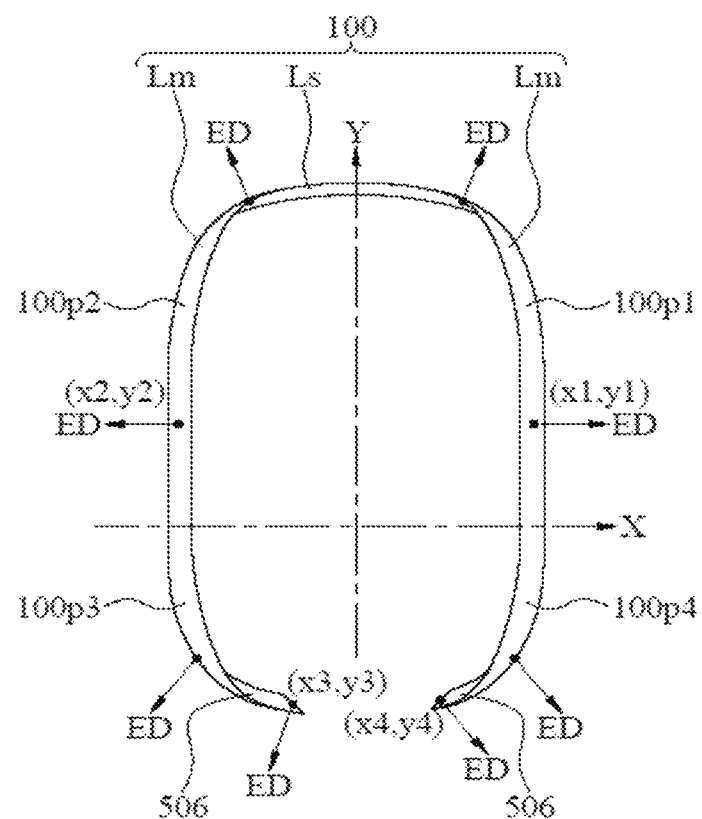
FIG. 16E is the LED filament shown in FIG. 16C presented in two dimensional coordinate system defining four quadrants.

Please refer to FIG. 16E. FIG. 16E is the LED filament 100 shown in FIG. 16C presented in two dimensional coordinate system defining four quadrants. The LED filament 100 in FIG. 16E is the same as that in FIG. 16C, which is a top view of the LED light bulb 20*d* shown in FIG. 16A. As shown in FIG. 16C and FIG. 16E, the origin of the four quadrants is defined as a center of a stand 19*a* of the LED light bulb 20*d* in the top view (e.g., a center of the top of the stand 19*a* shown in FIG. 16A). In the embodiment, the Y-axis is vertical, and the X-axis is horizontal in FIG. 16E. As shown in FIG. 16E, the LED filament 100 in the top view can be divided into a first portion 100*p*1, a second portion 100*p*2, a third portion 100*p*3, and a fourth portion 100*p*4 by the X-axis and the Y-axis. The first portion 100*p*1 of the LED filament 100 is the portion presented in the first quadrant in the top view. The second portion 100*p*2 of the LED filament 100 is the portion presented in the second quadrant in the top view. The third portion 100*p*3 of the LED filament 100 is the portion presented in the third quadrant in the top view. The fourth portion 100*p*4 of the LED filament 100 is the portion presented in the fourth quadrant in the top view.

In some embodiments, the LED filament 100 in the top view may be symmetric in point symmetry (being symmetric with the origin of the four quadrants) or in line symmetry (being symmetric with one of the two axis the four quadrants). In the embodiment, as shown in FIG. 16E, the LED filament 100 in the top view is in line symmetry. In particular, the LED filament 100 in the top view is symmetric with the Y-axis. That is to say, the geometric shape of the first portion 100*p*1 and the fourth portion 100*p*4 are symmetric with that of the second portion 100*p*2 and the third portion 100*p*3. Specifically, the first portion 100*p*1 is symmetric to the second portion 100*p*2 in the top view. Particularly, the first portion 100*p*1 and the second portion 100*p*2 are symmetric in structure in the top view with respect to the Y-axis. In addition, the third portion 100*p*3 is symmetric to the fourth portion 100*p*4 in the top view. Particularly, the third portion 100*p*3 and the fourth portion 100*p*4 are symmetric in structure in the top view with respect to the Y-axis.

Based upon symmetry characteristic of LED filament 100, the structures of the two symmetric portions of the LED filament 100 in the top view (the first portion 100*p*1 and the second portion 100*p*2 or the third portion 100*p*3 and the fourth portion 100*p*4) may be exactly symmetric or be symmetric with a tolerance in structure. The tolerance (or a permissible error) between the structures of the two symmetric portions of the LED filament 100 in the top view may be 20%-50% or less.

For example, as shown in FIG. 16E, a designated point (x1, y1) on the first portion 100*p*1 of the LED filament 100 in the first quadrant is defined as a first position, and a symmetric point (x2, y2) on the second portion 100*p*2 of the LED filament 100 in the second quadrant is defined as a second position. The second position of the symmetric point (x2, y2) is symmetric to the first position of the designated point (x1, y1) with respect to the Y-axis. The first position and the second position may be exactly symmetric or be symmetric with 20%-50% difference. In the embodiment, the first portion 100*p*1 and the second portion 100*p*2 are exactly symmetric in structure. In other words, x2 of the symmetric point (x2, y2) is equal to negative x1 of the designated point (x1, y1), and y2 of the symmetric point (x2, y2) is equal to y1 of the designated point (x1, y1).

For example, as shown in FIG. 16E, a designated point (x3, y3) on the third portion 100*p*3 of the LED filament 100 in the third quadrant is defined as a third position, and a symmetric point (x4, y4) on the fourth portion 100*p*4 of the LED filament 100 in the fourth quadrant is defined as a fourth position. The fourth position of the symmetric point (x4, y4) is symmetric to the third position of the designated point (x3, y3) with respect to the Y-axis. The third position and the fourth position may be exactly symmetric or be symmetric with 20%-50% difference. In the embodiment, the third portion 100*p*3 and the fourth portion 100*p*4 are symmetric with a tolerance (e.g., a difference in coordinates being less than 20%) in structure. In other words, x4 of the symmetric point (x4, y4) is unequal to negative x3 of the designated point (x3, y3), and y4 of the symmetric point (x4, y4) is unequal to y3 of the designated point (x3, y3). As shown in FIG. 16E, the level of the designated point (x3, y3) is slightly lower than that of the symmetric point (x4, y4), and the designated point (x3, y3) is slightly closer to the Y-axis than the symmetric point (x4, y4) is. Accordingly, the absolute value of y4 is slightly less than that of y3, and the absolute value of x4 is slightly greater than that of x3.

As shown in FIG. 16E, a length of the first portion 100*p*1 of the LED filament 100 in the first quadrant in the top view is substantially equal to a length of the second portion 100*p*2 of the LED filament 100 in the second quadrant in the top view. In the embodiment, the length is defined along an elongated direction of the LED filament 100 in a plane view (e.g., a top view, a front view, or a top view). For example, the second portion 100*p*2 elongates in the second quadrant in the top view shown in FIG. 16E to form a reversed "L" shape with two ends respectively contacting the X-axis and the Y-axis, and the length of the second portion 100*p*2 is defined along the reversed "L" shape.

In addition, a length of the third portion 100p3 of the LED filament 100 in the third quadrant in the top view is substantially equal to a length of fourth portion 100p4 of the LED filament 100 in the fourth quadrant in the top view. Since the third portion 100p3 and the fourth portion 100p4 are symmetric with respect to the Y-axis with a tolerance in structure, there may be a slight difference between the length of the third portion 100p3 and the length of fourth portion 100p4. The difference may be 20%-50% or less.

As shown in FIG. 16E, an emitting direction of a designated point of the first portion 100p1 and an emitting direction of a symmetric point of the second portion 100p2 symmetric to the designated point are symmetric in direction in the top view with respect to the Y-axis. In the embodiment, the emitting direction may be defined as a direction towards which the LED chips face. Since the LED chips face the main lighting face Lm, the emitting direction may also be defined as the normal direction of the main lighting face Lm. For example, the designated point (x1, y1) of the first portion 100p1 has an emitting direction ED towards the right in FIG. 16E, and the symmetric point (x2, y2) of the second portion 100p2 has an emitting direction ED towards left in FIG. 16E. The emitting direction ED of the designated point (x1, y1) and the emitting direction ED of the symmetric point (x2, y2) are symmetric with respect to the Y-axis. In addition, the designated point (x3, y3) of the third portion 100p3 has an emitting direction ED towards a lower-left direction in FIG. 16E, and the symmetric point (x4, y4) of the fourth portion 100p4 has an emitting direction ED towards a lower-right direction in FIG. 16E. The emitting direction ED of the designated point (x3, y3) and the emitting direction ED of the symmetric point (x4, y4) are symmetric with respect to the Y-axis. In addition, an emitting direction ED of any designated point of the first portion 100p1 and an emitting direction ED of a corresponding symmetric point of the second portion 100p2 symmetric to the designated point are symmetric in direction in the top view with respect to the Y-axis. An emitting direction ED of any designated point of the third portion 100p3 and an emitting direction ED of a corresponding symmetric point of the fourth portion 100p4 symmetric to the designated point are symmetric in direction in the top view with respect to the Y-axis.

Definition of the omni-directional light depends on regions and varies over time. Depending on different institutions and countries, LED light bulbs which claim omni-directional light may need to meet different standards. For example, page 24 of the ENERGY STAR Program Requirements for Lamps (bulbs)—Eligibility Criteria Version 1.0 defines that an omnidirectional lamp in base-on position has to emit at least 5% of total flux (lm) in 135° to 180° zone, that 90% of measured intensity values may vary by no more than 25% from the average of all measured values in all planes, and that luminous intensity (cd) is measured within each vertical plane at a 5° vertical angle increment (maximum) from 0° to 135°. Japanese JEL 801 requires luminous flux of an LED lamp within a 120 degrees zone about a light axis shall not be less than 70% of total flux. Because the above embodiment possesses a symmetrical arrangement of LED filament, an LED light bulb with the LED filament is able to meet various standards of omni-directional lamps.

Figure 17A:
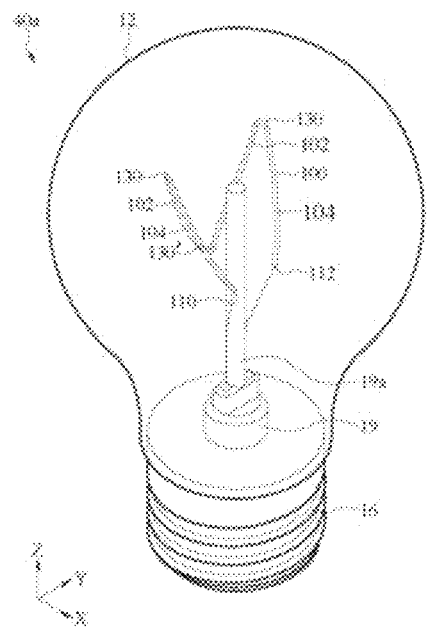
FIG. 17A to FIG. 17D are respectively a perspective view, a side view, another side view and a top view of an LED light bulb in accordance with an embodiment of the present invention.
Figure 17B:
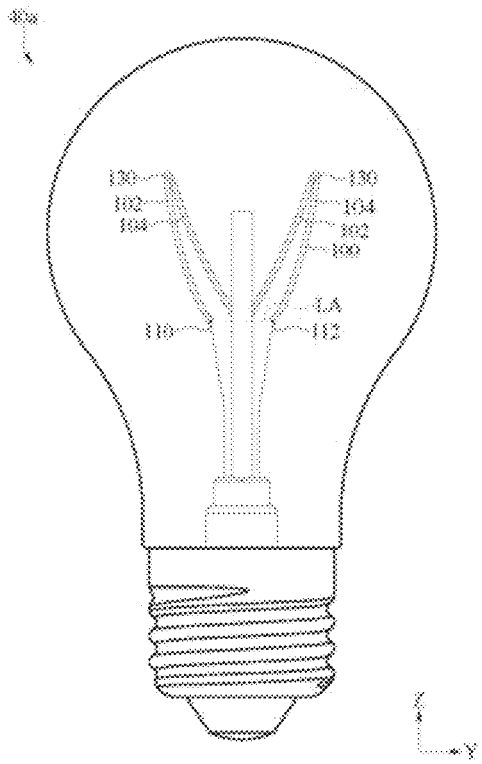
Figure 17C:
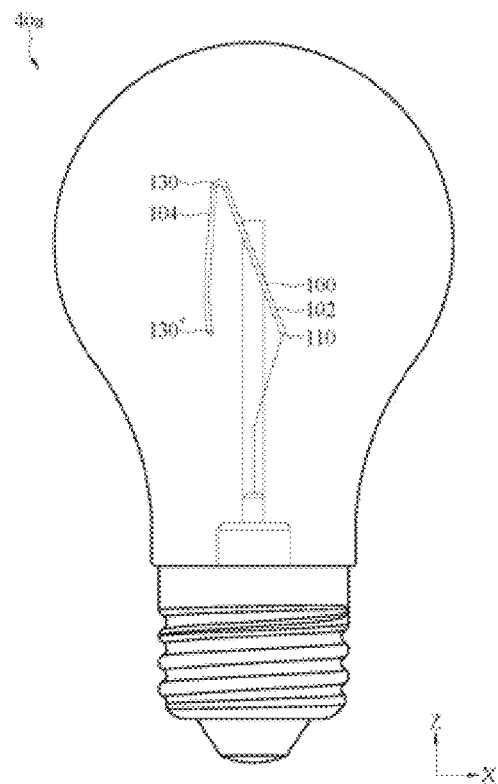
Figure 17D:
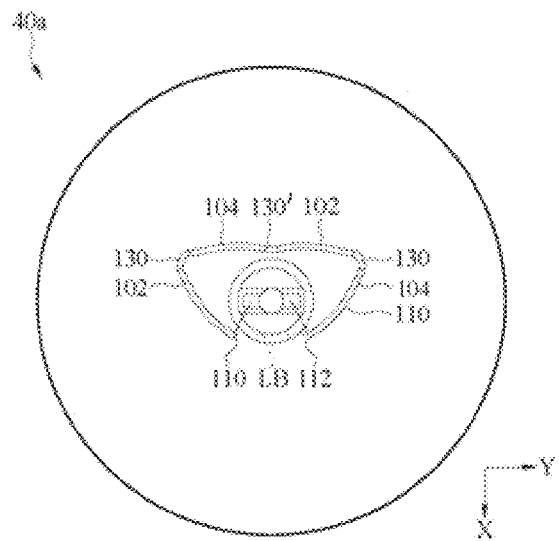

Referring to FIG. 17A, FIG. 17B, FIG. 17C and FIG. 17D, FIG. 17A illustrates a schematic diagram of an LED light bulb 40a according to an embodiment of the present invention, FIG. 17B to FIG. 17D are a side view, another side view and the top view of the LED light bulb, respectively. In the present embodiment, the LED light bulb 40a includes a lamp housing 12, a bulb base 16 connected to the lamp housing 12, a stem 19, and a single LED filament 100. Moreover, the LED light bulb 40a and the single LED filament 100 disposed in the LED light bulb 40a can refer to related descriptions of the previous embodiments, wherein the same or similar components and the connection relationship between components is no longer detailed.

In the present embodiment, the stem 19 is connected to the bulb base 16 and located in the lamp housing 12, the stem 19 has a stand 19a extending vertically to the center of the lamp housing 12, the stand 19a is located on the central axis of the bulb base 16, or is located on the central axis of the LED light bulb 40a. The LED filament 100 is disposed around the stand 19a and is located within the lamp housing 12, and the LED filament 100 can be coupled to the stand 19a through a cantilever to maintain a predetermined curve and shape. Wherein a detailed description of the cantilever can be referenced to the previous embodiment and the drawings. The LED filament 100 includes two conductive electrodes 110, 112 at both ends, a plurality of LED sections 102, 104 and a plurality of conductive sections 130. As shown in FIG. 17A to FIG. 17D, in order to separate the conductive section 130 and the LED sections 102, 104 in the drawing, the plurality of the conductive sections 130 of the LED filament 100 is illustrated as points or small segments, which is only for the illustrations. It is easier to understand, and not for any limitation, and the subsequent embodiments are similar to the related drawings by the point or small segment distribution of the conductive section 130 to distinguish from the LED sections 102, 104. As described in various previous embodiments, each of the LED sections 102, 104 can include a plurality of LED chips connected to each other, and each of the conductive sections 130 can include a conductor. Each conductive section 130 is located between adjacent two LED sections 102, 104. The conductors in each conductive section 130 connect the LED chips in the adjacent two LED sections 102, 104, and the LED chips in the two LED sections 102 adjacent to the two conductive electrodes 110, 112 are respectively connected to the two conductive electrodes 110, 112. The stem 19 can be connected to the two conductive electrodes 110, 112 by means of conductive brackets, details of the conductive brackets can be referred to the previous embodiment and the drawings.

As shown in FIG. 17A to FIG. 17D, the LED filament 100 comprises two first conductive sections 130, one second conductive sections 130', and four LED sections 102, 104, and every two adjacent LED sections 102, 104 are connected through the bending first and second conductive section 130, 130'. Moreover, since the first and second conductive sections 130, 130' have better bendability than that of the LED sections 102, 104, the first and second conductive sections 130, 130' between the two adjacent LED sections 102, 104 can be bent severely, so that the angle between the two adjacent LED sections 102, 104 can be smaller, for example, the included angle can reach 45 degrees or less. In the present embodiment, each LED section 102, 104 is slightly curved or not bent compared to the first and second conductive sections 130, 130', so that a single LED filament 100 in the LED light bulb 40a can be bent severer because of the first and second conductive sections 130, 130', and the curling change in bending is more significant. Moreover, the LED filament 100 can be defined as a piece following each bending conductive sections 130, 130', and each LED section 102, 104 is formed into a respective piece.

As shown in FIG. 17B and FIG. 17C, each of the first and second conductive sections 130, 130' and the two adjacent LED sections 102, 104 is composed to form a U-shaped or V-shaped bent structure, that is, the U-shaped or V-shaped bent structure formed by each of the first and second conductive sections 130, 130' and the adjacent two LED sections 102, 104 is bent with two pieces, and the two LED sections 102, 104 are respectively formed the two pieces. In the present embodiment, the LED filament 100 is bent into four pieces by the first and second conductive sections 130, 130', the four LED sections 102, 104 are respectively formed the four pieces. Also, the number of LED sections 102, 104 is one more than the number of the conductive sections 130, 130'.

As shown in FIG. 17B, in the present embodiment, the conductive electrodes 110, 112 are located between the highest point and the lowest point of the LED filament 100 in the Z direction. The highest point is located at the highest first conductive section 130 in the Z direction, and the lowest point is located at the lowest second conductive section 130' in the Z direction. The lower second conductive section 130' and the higher first conductive section 130 are defined with the conductive electrodes 110, 112 as being close to or away from the bulb base 16. Referring to FIG. 17B, in the YZ plane, the positions of the conductive electrodes 110, 112 may constitute a line LA showing with dotted line, there are two first conductive sections 130 above the line LA, and one second conductive sections 130' below the line LA. In other words, in the Z direction, the number of the first conductive sections 130 positioned above the line LA to which the conductive electrodes 110, 112 are connected may be one more than the number of the second conductive section 130' positioned below the line LA. It is also contemplated that relative to the conductive electrodes 110, 112 as a whole, the number of the first conductive sections 130 away from the bulb base 16 is one more than the number of the second conductive section 130' near the bulb base 16. Further, if the LED filament 100 is projected on the YZ plane (refer to FIG. 17B), the line LA connected by the conductive electrodes 110, 112 has at least one intersection with the projection of the LED sections 102, 104. In the YZ plane, the lines LA connected by the conductive electrodes 110, 112 respectively intersect the projections of the two LED sections 104, so that the line LA and the projection of the adjacent two LED sections 104 have two intersections.

As shown in FIG. 17C, if the LED filament 100 is projected on the XZ plane, the projections of the opposing two LED sections 102, 104 overlap each other. In some embodiments, the projections of the opposing two LED sections 102, 104 on a particular plane may be parallel to each other.

As shown in FIG. 17D, if the LED filament 100 is projected on the XY plane, the projections of the conductive electrodes 110, 112 on the XY plane can be connected in a straight line LB showing with dotted line, and the projections of the first and second conductive sections 130,130' on the XY plane are not intersected or overlapped with the line LB, and the projections of the first and second conductive sections 130, 130' on the XY plane are respectively located on one side of the line LB. For example, as showing in FIG. 17D, the projections of the first conductive sections 130 on the XY plane are above the line LB.

As shown in FIG. 17B to FIG. 17D, in the present embodiment, and the projection lengths of the LED filament 100 on the projection planes perpendicular to each other can have a designed proportion, so that the illumination is more uniform. For example, the projection of the LED filament 100 on the first projection surface, such as the XY plane, has a length L1, the projection of the LED filament 100 on the second projection surface, such as the YZ plane, has a length L2, and the projection of the LED filament 100 on the third projection planes, such as the XZ plane, has a length L3. The first projection plane, the second projection plane and the third projection plane are perpendicular to each other, and the normal line of the first projection plane is parallel to the axis of the LED light bulb 40*a* from the center of the lamp housing 12 to the center of the bulb base 16. Further, the projection of the LED filament 100 on the XY plane as shown in FIG. 17D, and the projection thereof will be similar to an inverted and deformed U shape, and the total length of the projection of the LED filament 100 on the XY plane is the length L1. The projection of the LED filament 100 on the YZ plane as shown in FIG. 17B, the projection thereof will be similar to the inverted and deformed W shape, and the total length of the projection of the LED filament 100 on the YZ plane is the length L2. The projection of the LED filament 100 on the XZ plane can be as shown in FIG. 17C, the projection of which will be similar to an inverted V shape, and the total length of the projection of the LED filament 100 on the XZ plane is the length L3. In the present embodiment, the length L1, the length L2, and the length L3 are approximately in a ratio of 1:1:0.9. In some embodiments, the length L1, the length L2, and the length L3 are approximately in a ratio of 1:(0.5 to 1):(0.6 to 0.9). For example, if the ratio of the length L1, the length L2, and the length L3 is closer to 1:1:1, the illumination uniformity of the single LED filament 100 in the LED light bulb 40*a* is better, and the omni-directional light appearance is better.

In some embodiments, the projected length of the LED filament 100 in the XZ plane or in the YZ plane is, for example but not limited thereto, a minimum of the height difference between the first conductive section 130 and the second conductive section 130' in the Z direction multiply by the number of LED sections 102, 104, or a minimum of the height difference of the LED filament 100 in the Z direction multiply by the number of LED sections 102, 104. In the present embodiment, the total length of the LED filament 100 is about 7 to 9 times the total length of the first conductive section 130 or the second conductive section 130'.

In the present embodiment, the LED filament 100 can be bent at the positions of the first and second conductive sections 130, 130' to form various curves, so that not only the overall aesthetic appearance of the LED light bulb 40*a* can be increased but also the light emitting of the LED light bulb 40*a* can be more uniform, and the better illumination is achieved.

Figure 18A:
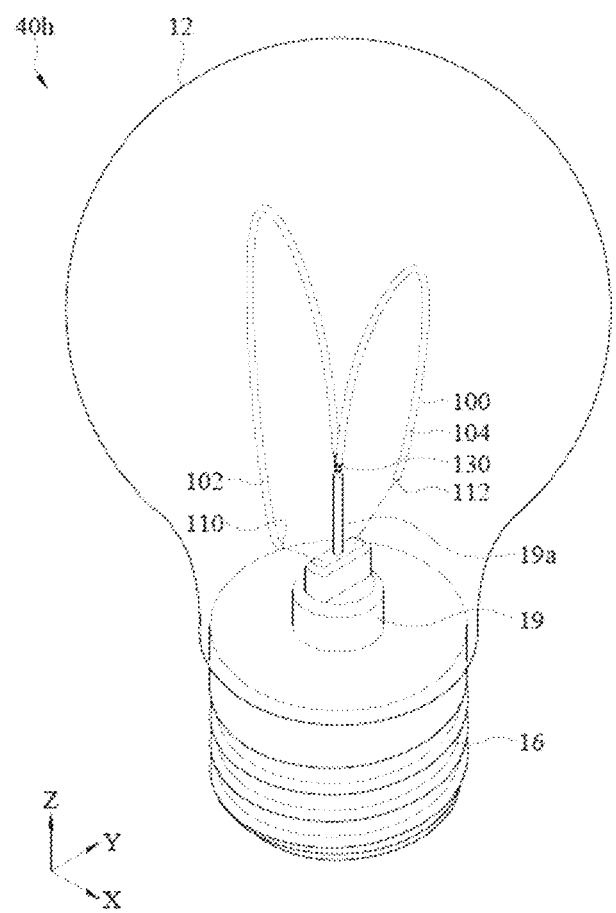
FIG. 18A to FIG. 18D are respectively a perspective view, a side view, another side view and a top view of an LED light bulb in accordance with an embodiment of the present invention.
Figure 18B:
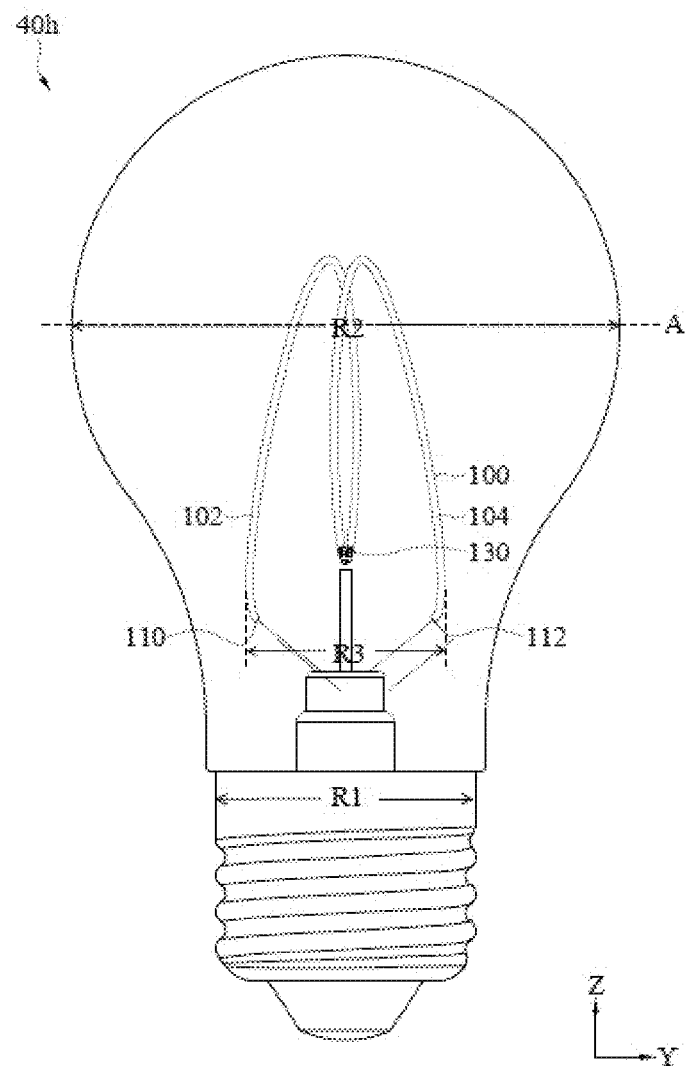
Figure 18C:
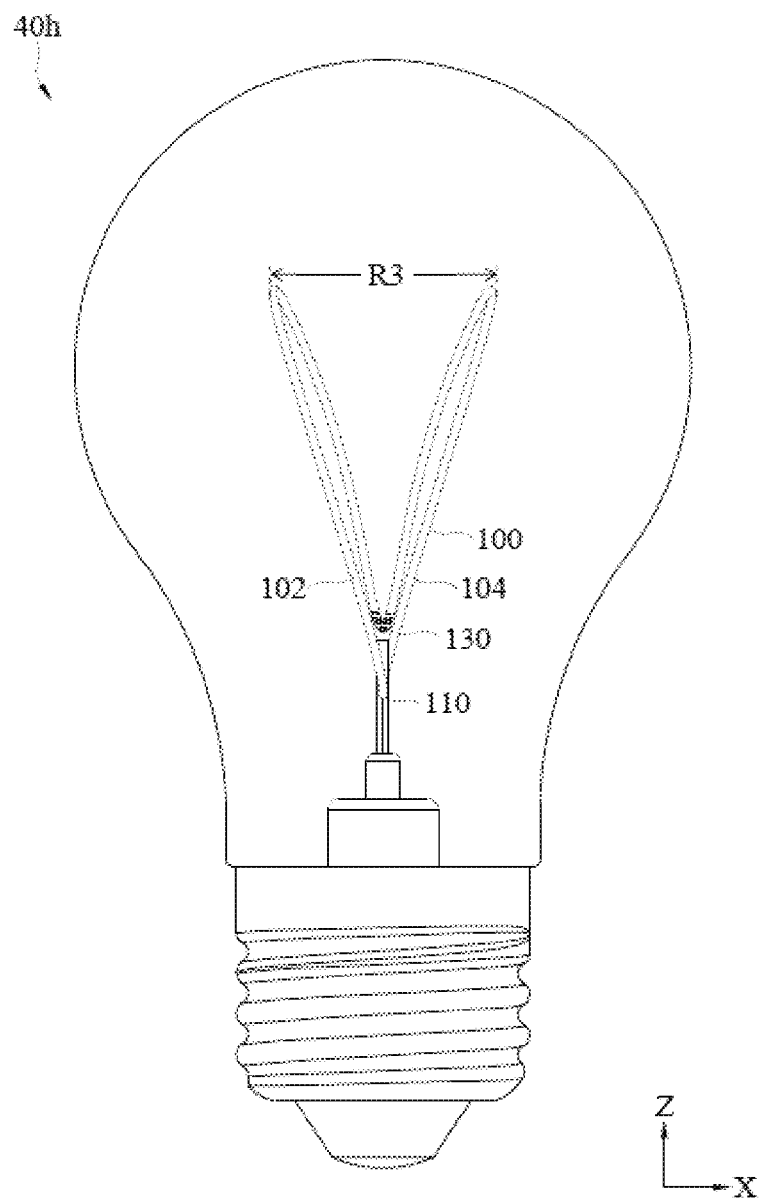
Figure 18D:
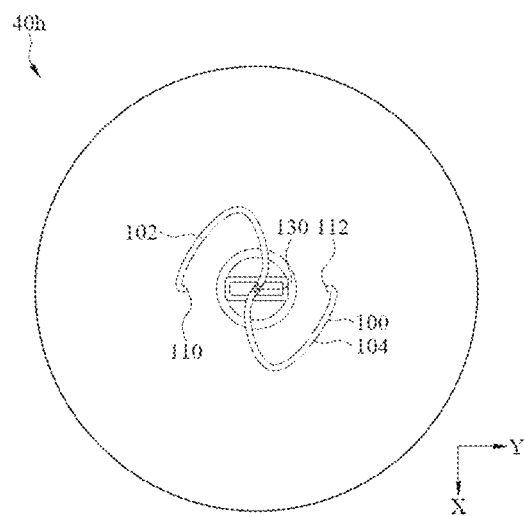

Referring to FIG. 18A to FIG. 18D, FIG. 18A is a perspective diagram of an LED light bulb 40*h* according to an embodiment of the present invention, and FIG. 18B to FIG. 18D are respectively side view, another side view, and top view of the FIG. 18A. In the present embodiment, the LED light bulb 40*h* includes a lamp housing 12, a bulb base 16 connected to the lamp housing 12, a stem 19, a stand 19*a*, and a single LED filament 100. The LED filament 100 includes two conductive electrodes 110, 112 at two ends, a plurality of LED sections 102, 104 and a single conductive section 130. Moreover, the LED light bulb 40*h* and the single LED filament 100 disposed in the LED light bulb 40*h* can refer to related descriptions of the previous embodiments, wherein the same or similar components and the connection relationship between components is no longer detailed.

Referring to FIG. 18A to FIG. 18D, in the present invention, the LED filament section 100 includes one conductive section 130, two LED sections 102, 104, and between two adjacent LED sections 102, 104 is connected by the conductive section 130. Wherein the LED filament 100 having a circular arc at the highest point of the bending curvature, that is, each of the LED sections 102, 104 respectively having a circular arc at the highest point of the LED filament 100, and the conductive section also exhibits a circular arc at the low point of the LED filament. Moreover, the LED filament 100 can be defined as having a plurality of sections, each of the sections is connected between the first and second conductive sections 130, and each LED section 102, 104 is formed into a respective section.

Moreover, since the LED filament 100 is equipped with a flexible base layer, the flexible base layer preferably is made by an organosilicon-modified polyimide resin composition, and thus the LED sections 102, 104 themselves also have a certain degree of bendability. In the present embodiment, the two LED sections 102, 104 are respectively bent to form in the shape like an inverted deformed U letter, and the conductive section 130 is located between the two LED sections 102, 104, and the degree of the bending of the conductive section 130 is the same as or greater than the degree of the bending of the LED sections 102, 104. In other words, the two LED sections 102, 104 of the LED filament are respectively bent at the high point to form in the shape like an inverted deformed U letter and have a bending radius value at R1, and the conductive section 130 is bent at a low point of the LED filament 100 and has a bending radius value at R2, wherein the value R1 is the same as or greater than the value R2. Through the configuration of the conductive section 130, the LED filament 100 disposing in a limited space can be realized with a small radius bending of the LED filament 100. In one embodiment, the bending points of the LED sections 102, 104 are at the same height in the Z direction. Further, in the Z direction, the stand 19*a* of the present embodiment has a lower position than the stand 19*a* of the previous embodiment, and the height of the present stand 19*a* is corresponding to the height of the conductive section 130. For example, the lowest portion of the conductive section 130 can be connected to the top of the stand 19*a* so that the overall shape of the LED filament 100 is not easily deformed. In various embodiments, the conductive sections 130 may be connected to the stand 19*a* through the perforation of the top of the stand 19*a*, or the conductive sections 130 may be glued to the top of the stand 19*a* to connect with each other, but are not limited thereto. In an embodiment, the conductive section 130 and the stand 19*a* may be connected by a guide wire, for example, a guide wire connected to the conductive section 130 is drawn at the top of the stand 19*a*.

As shown in FIG. 18B, in the present embodiment, the height of the conductive section 130 is higher than the two conductive electrodes 110, 112 in the Z direction, and the two LED sections 102, 104 are respectively shaped upward from the two conductive electrodes 110, 112 to the highest point and then are bent down to connect with the conductive section 130. As shown in FIG. 185C, in the present embodiment, the contour of the LED filament 100 in the XZ plane is similar to the V letter, that is, the two LED sections 102, 104 are respectively shaped obliquely upward and outward and are bent respectively at the highest point and then obliquely inwardly to connect with the conductive section 130. As shown in FIG. 18D, in the present embodiment, the LED filament 100 has a contour in the shape like S letter in the XY plane. As shown in FIG. 18B and FIG. 18D, in the present embodiment, the conductive section 130 is located between the conductive electrodes 110, 112. As shown in FIG. 18D, in the XY plane, the main bending points of the LED sections 102, 104, and the conductive electrodes 110, 112 are substantially on the circumference centered on the conductive section 130.

In this embodiment, as shown in FIG. 18A to FIG. 18D, the LED light bulb includes a lamp housing 12, a lamp cap 16 connected to the lamp housing 12, at least two conductive brackets disposed in the lamp housing 12, a supporting arm (not shown), a stem 19, and a single LED filament 100. The stem 19 includes a stem bottom portion and a stem top portion that are opposite to each other. The stem bottom portion is connected to the lamp cap 16. The stem top portion extends to the inside of the lamp housing 12, for example, the stem top portion may be located approximately at the center of the lamp housing 12. The conductive brackets are connected to the stem 19. The LED filament 100 includes a filament body and two filament electrodes (electrodes or conductive electrodes) 110, 112. The two filament electrodes 110, 112 are located at two opposite ends of the filament body. The filament body is the other portion of the LED filament 100 excluding the filament electrodes 110, 112. The two filament electrodes 110, 112 are connected to the two conductive brackets, respectively. One end of the supporting arm is connected to the stem 19, and the other end is connected to the filament body.

During the manufacturing process of traditional bulbs, in order to avoid a tungsten wire burning in the air thereby causing the oxidative fracture failure, a glass structure with a horn shape (hereinafter refer to as "horn stem") is designed to be disposed at the opening of the glass lamp housing and then the horn stem is sintered and sealed to the glass lamp housing. Then, a vacuum pump is connected to the lamp housing through the port of the horn stem to replace the air inside the lamp housing with nitrogen so as to suppress the combustion and oxidation of the tungsten wire inside the lamp housing. Eventually, the port of the horn stem will be sintered and sealed. Therefore, the vacuum pump can pump out the air inside the lamp housing and substitute it with all nitrogen or a combination of nitrogen and helium in a proper ratio through the stem, to improve the thermal conductivity of the gas inside the lamp housing and remove water mist hidden in the air at the same time. In one embodiment, the air may alternatively be pumped out and substitute it with a combination of nitrogen and oxygen or nitrogen and air in a proper ratio. The content of oxygen or air is 1-10% of the volume of the lamp housing, preferably 1-5%. When a base layer contains saturated hydrocarbons, during the use of the LED light bulb, the saturated hydrocarbons will generate free radicals under the effect of light, heat, stress, etc. The generated free radicals or activated molecules will combine with oxygen to form peroxide free radicals. Thus, filling the lamp housing with oxygen can improve the heat and light resistance of the base layer containing the saturated hydrocarbons.

In the manufacturing process of the LED light bulb, in order to increase the refractive index of the lamp housing 12 to the light emitted by the LED filament, some foreign matter, for example, rosin, may be attached to an inner wall of the lamp housing 12. The average thickness of the foreign matter deposited per square centimeter of the inner wall area of the lamp housing 12 is 0.01-2 mm, and the thickness of the foreign matter is preferably 0.01-0.5 mm. In one embodiment, the content of the foreign matter per square centimeter of the inner wall area of the lamp housing 12 is 1-30% of the content of the foreign matter on the inner wall of the entire lamp housing 12, preferably 1-10%. For example, the content of the foreign matter may be adjusted by vacuum drying the lamp housing. In another embodiment, some impurities may be left in the gas filled in the lamp housing 12. The content of the impurities in the gas filled is 0.1-20% of the volume of the lamp housing 12, preferably 0.1-5%. For example, the content of the impurities may be adjusted, for example, by a method of vacuum drying to the lamp housing. Because the gas filled contains a small amount of impurities, the light emitted by the LED filament is emitted or refracted by the impurities to increase a luminous angle, which is beneficial to improving the luminous effect of the LED filament.

A Cartesian coordinate system having an X-axis, a Y-axis and a Z-axis is oriented for the LED light bulb, where the Z-axis is parallel to the stem 19, and the total length of the projection of the LED filament 100 on the XY plane, YZ plane and XZ plane is respectively the length L1, length L2, and length L3. In the present embodiment, the length L1, the length L2, and the length L3 are approximately in a ratio of 0.8:1:0.9. In some embodiments, the length L1, the length L2, and the length L3 are approximately in a ratio of (0.5 to 0.9):1:(0.6 to 1), the ratio of the length L1, the length L2, and the length L3 is closer to 1:1:1, the illumination uniformity of the LED filament 100 in the LED light bulb 40a is better, and the omni-directional light appearance is better. The LED filament 100 has at least one first bending point and at least two second bending points when the LED filament is bent. The at least one first bending point and the at least two second bending points are arranged alternately, and the height of any one of the at least one first bending point on the Z-axis is greater than that of any one of the at least two second bending points. In one embodiment, the distances between any of two adjacent first bending points on the Y-axis and the X-axis are equal, and the LED filament has a neat and beautiful appearance. In one embodiment, a distance between any of two adjacent first bending points on the Y-axis or the X-axis has a maximum value D1 and a minimum value D2, where the range of D2 is from 0.5D1 to 0.9D1, and the luminous flux distribution on each plane is relatively consistent. Assuming that a diameter of the lamp cap 16 is R1 (referring to FIG. 18B), a maximum diameter of the lamp housing 12 or a maximum horizontal spacing of the lamp housing 12 in the YZ-plane is R2 (referring to FIG. 18B), a maximum width in the Y-axis direction on the YZ-plane (referring to FIG. 18B) or a maximum width in the X-axis direction on the XZ-plane (referring to FIG. 18C) of the LED filament 100 is R3, then R3 is between R1 and R2, that is, R1<R3<R2. When the LED filament is bent, the distance between adjacent first bending points and/or adjacent second bending points in the Z-axis direction is wide, which is beneficial to improving the heat dissipation effect of the LED filament. In the manufacturing process of the LED light bulb, the LED filament 100 may be placed into an inner space of the lamp housing 12 in a manner of folding first, and then the LED filament 100 may be stretched in the lamp housing 12 manually or mechanically, so that a maximum length of the LED filament 100 on the XZ-plane satisfies the above-mentioned relationship.

As shown in FIG. 18A to FIG. 18D, in this embodiment, the LED filament 100 has one conductive section 130 and two LED sections 102, 104, and every two adjacent LED sections 102, 104 are connected to each other by the conductive section 130. The bent portion of the LED filament 100 at the highest point has an arc shape, that is, the LED sections 102, 104 respectively has an arc shape at the highest point of the LED filament 100, and the conductive section 130 shows an arc shape at a low point of the LED filament 100 as well. The LED filament 100 may be configured to have a structure where each bent conductive section 130 is followed by one segment, and each LED section 102, 104 is formed into are respective section.

Moreover, since the base layer as a flexible substrate (preferably made of a silicone-modified polyimide resin composition) is adopted by the LED filament 100, the silicone-modified polyimide resin composition includes organosilicon-modified polyimide, a thermal curing agent, heat dissipation particles, and phosphor. In this embodiment, two LED sections 102, 104 are respectively bent to form an inverted U shape, the conductive section 130 is located between the two LED sections 102, 104 and the bending degree of the conductive section 130 is the same as or greater than that of the LED sections 102/104. That is, the two LED sections 102, 104 are respectively bent at a high point of the LED filament to form an inverted U shape and have a bending radius r1, the conductive section 130 is bent at a low point of the LED filament 100 and has a bending radius r2, and r1 is greater than r2. Through the configuration of the conductive section 130, the LED filament 100 can be bent with a small radius of gyration in a limited space. In one embodiment, the bending points of the LED section 102 and the LED section 104 are at the same height in the Z direction, the LED filament 100 has a certain symmetry in some directions, so the light distribution of the LED light bulb may be more uniform. In one embodiment, the bending points of the LED section 102 and the LED section 104 are at different height in the Z direction, the height of the bending points of the LED section 102 is greater than that the bending points of the LED section 104, in the case of the same LED filament length, when the LED filament is placed in the lamp housing in this way, part of the LED filament will be more biased towards the lamp housing, so the heat dissipation of the LED filament is better. In addition, in the Z direction, a stand 19a of this embodiment has a smaller height than a stand 19a of the previous embodiment, and the height of the stand 19a of this embodiment corresponds to the height of the conductive section 130 or the stand 19a is presumably in contact with part of the conductor section 130. For example, the lowest portion of the conductive section 130 may be connected to the top portion of the stand 19a, so that the overall shape of the LED filament 100 is not easily deformed. In different embodiments, the conductive section 130 may pass through a through hole of the top portion of the stand 19a to be connected to the stand 19a, or the conductive section 130 may be attached to the top portion of the stand 19a to be connected to the stand 19a, but it is not limited thereto. In one embodiment, the conductive section 130 may be connected to the stand 19a by a conductive wire, for example, the conductive wire is extended from the top portion of the stand 19a and connected to the conductive section 130.

As shown in FIG. 18B, in this embodiment, in the Z direction, the height of the conductive section 130 is greater than that of the two electrodes 110, 112. The two LED sections 102 may be seen as the two electrodes 110 and 112 extending upward to the highest point respectively and then bending down and further extending to connect to the conductive section 130. As shown in FIG. 18C, in this embodiment, the outline of the LED filament 100 in the XZ-plane is similar to a V shape, that is, the two LED sections 102, 104 respectively extend upward and outward obliquely, and respectively extend downward and inward obliquely to the conductive section 130 after being bent at the highest points. As shown in FIG. 18D, in this embodiment, the outline of the LED filament 100 in the XY-plane has an S shape. As shown in FIG. 18B and FIG. 18D, in this embodiment, the conductive section 130 is located between the electrodes 110, 112. As shown in FIG. 18D, in this embodiment, in the XY-plane, the bending point of the LED section 102, the bending point of the LED section 104, and the electrodes 110, 112 are substantially located on a circumference of a circle taking the conductive section 130 (or the stem 19 or the stand 19a) as a center. For example, in the XY-plane, the bending point of the LED section 102 and the bending point of the LED section 104 are located on the same circumference of a circle taking the stem 19 or the stand 19a as a center. In some embodiments, in the XY-plane, the bending point of the LED section 102, the bending point of the LED section 104, and the electrodes 110, 112 are located on the same circumference of a circle taking the stem 19 or the stand 19a as a center.

In this embodiment, as shown in FIG. 18A to FIG. 18D, the LED bulb includes a lamp housing 12, a bulb base 16 connected to the lamp housing 12, a stem 19, and a single LED filament 100 where the stem 19, and the single LED filament 100 are in the lamp housing 12. The stem 19 includes a stem bottom and a stem top (or stand 19a or pole 19a) opposite to the stem bottom. The stem bottom is connected to the bulb base 16, and the stem top extends into the interior of the lamp housing 12 (e.g., the stem top may be extended into approximately the center of the lamp housing 12). The LED filament 100 includes a filament body and two filament electrodes 110 and 112. The two filament electrodes 110 and 112 are located at opposite ends of the filament body. The filament body is the part of the LED filament 100 that excludes the filament electrodes 110 and 112.

During the manufacturing process of traditional bulbs, in order to avoid a tungsten wire burning in the air thereby causing the oxidative fracture failure, a glass structure with a horn shape (hereinafter refer to as "horn stem") is designed to be disposed at the opening of the glass lamp housing and then the horn stem is sintered and sealed to the glass lamp housing. Then, a vacuum pump is connected to the lamp housing through the port of the horn stem to replace the air inside the lamp housing with nitrogen so as to suppress the combustion and oxidation of the tungsten wire inside the lamp housing. Eventually, the port of the horn stem will be sintered and sealed. Therefore, the vacuum pump can be applied to replace the air inside the lamp housing with full nitrogen or to configure a moderate ratio of nitrogen and helium inside the lamp housing through the stem to improve the thermal conductivity of the gas in the lamp housing and to remove the water mist in the air at the same time. In one embodiment, the gas inside the lamp housing can also be replaced with a moderate ratio of nitrogen and oxygen or a moderate ratio of nitrogen and air. The oxygen or air content is 1% to 10%, preferably 1% to 5% of the volume of the lamp housing. When the base layer contains saturated hydrocarbons, during the use of the LED bulbs, the saturated hydrocarbons will generate free radicals under the effect of light, heat, stress, etc. The generated free radicals or activated molecules will combine with oxygen to form peroxide radicals. Thus, the lamp housing filled with oxygen may increase thermal resistance and light resistance of the base layer having saturated hydrocarbons.

During the manufacturing process of the LED bulb, in order to increase the refractive index of the lamp housing 12 to the light emitted by the LED filament, some impurities, such as rosin, may be attached to the inner wall of the lamp housing 12. The lamp housing 12 can be vacuum dried to reduce the impurity content in the inner wall of the lamp housing 12 or in the gas filled in the lamp housing 12. After the lamp housing 12 is vacuum dried, the average thickness of the impurity deposition per square centimeter of the inner wall area of the lamp housing 12 is 0.01 to 2 mm, and the thickness of the impurity is preferably 0.01 to 0.5 mm. In one embodiment, the content of the impurity per square centimeter of the inner wall area of the lamp housing 12 accounts for 1% to 30%, preferably 1% to 10% of the content of the impurity on the inner wall of the entire lamp housing 12. The content of the impurity can be adjusted, for example, by a method of vacuum drying to the lamp housing 12. In another embodiment, a part of impurities may be left in the gas of the lamp housing 12, and the content of impurities in the gas is 0.1% to 20%, preferably 0.1 to 5%, of the volume of the lamp housing 12. The impurity content may be adjusted by the method of vacuum drying to the lamp housing 12. Because a small amount of impurities is contained in the filling gas, the light emitted by the LED filament is scattered or refracted by the impurities, and thus the light emitting angle may be increased, which is beneficial to improving the light emitting effect of the LED filament. Furthermore, since the impurity content in the filling gas is low, the heat transfer effect is increased, and the heat dissipation effect of the LED light bulb is improved. Finally, by further reducing the impurity content in the base layer 240b (for example, the silicone-modified polyimide resin composition), the strength of the base layer 240b is increased, thereby effectively increasing the service life of the LED filament.

A Cartesian coordinate system having an X-axis, a Y-axis and a Z-axis is oriented for the LED light bulb, where the Z-axis is parallel to the stem 19, and the LED filament 100 has at least two first bending point and at least one second bending points when the LED filament is bent. The at least two first bending point and the at least one second bending points are arranged alternately, and the height of any one of the at least two first bending point on the Z-axis is greater than that of any one of the at least one second bending points. In one embodiment, the distances between any of two adjacent first bending points on the Y-axis or on the Z-axis are equal. Therefore, the appearance of the LED filament can be neat and beautiful. In an embodiment, the distance between the two adjacent first bending points on the Y-axis or on X-axis has a maximum value D1 and a minimum value D2, where the range of D2 is from 0.5D1 to 0.9D1, and the light flux distribution on each plane is relatively consistent. Let (1) the diameter of the bulb base 16 be R1 (shown in FIG. 18A), (2) the maximum diameter of the lamp housing 12 or the maximum horizontal distance between the lamp housings 12 in the Y-Z plane be R2 (shown in FIG. 18B), and (3) the maximum width of the LED filament 100 in the Y-axis direction on the Y-Z plane (shown in FIG. 18B) or the maximum width in the X-axis direction on the X-Z plane be R3 (shown in FIG. 18C). Specifically, FIG. 18B and FIG. 18C are merely illustrative, and the magnitude of R1, R2, and R3 is such that R3 is between R1 and R2, that is, R1<R3<R2, and is not a visual magnitude as shown in FIG. 18B and FIG. 18C. When the LED filament is bent, the distance between adjacent first bending points and/or adjacent second bending points in the Z-axis direction is wide, which is beneficial to improving the heat dissipation effect of the LED filament. In the manufacturing process of the LED bulb, the LED filament 100 can be folded into the inner space of the lamp housing 12 first, and then the filament 100 can be manually or mechanically extended in the lamp housing 12 so that the maximum length of the filament 100 on the X-Z plane satisfies the above-mentioned relationship.

As shown in FIG. 18A to FIG. 18D, in this embodiment, the LED filament 100 has one conductor section 130 and two LED sections 102 and 104. The two adjacent LED sections 102 and 104 are connected through the conductor section 130. The bent portion of the LED filament 100 at the highest point has an arc shape. That is, the LED sections 102 and 104 show arc shapes respectively at the highest point of the LED filament 100. The conductor section 130 shows an arc shape at the lower point of the LED filament as well. The LED filament 100 may be configured to have a structure where each bent conductor section 130 is followed by one segment, and each LED sections 102,104 is formed into a respective section.

Moreover, since a flexible substrate (preferably made of a silicone-modified polyimide resin composition) is adopted by the LED filament 100, the LED sections 102 and 104 also have a certain degree of bending ability. In this embodiment, the two LED sections 102 are respectively bent to form an inverted U shape, and the conductor section 130 is located between the two LED sections 102, and the degree of bending of the conductor section 130 is the same as or greater than that of the LED section 102. That is, the two LED sections 102 are respectively bent at the higher point of the LED filament 100 to form an inverted U shape and have a bent radius r1. The conductor section 130 is bent at the lower point of the LED filament 100 and has a bent radius r2, where r1 is greater than r2. The arrangement of the conductor sections 130 enables the LED filament 100 to achieve a bending with a small turning radius in a limited space. In one embodiment, the bending points of the LED section 102 and that of the LED section 104 are at the same height in the Z direction. In addition, the height of the pole 19a corresponds to the height of the conductor section 130. For example, the lowest portion of the conductor section 130 may be connected to the top of the pole 19a, so that the overall shape of the LED filament 100 may not be easily deformed. In different embodiments, the conductor sections 130 may be connected to the pole 19a by passing through a hole on the top of the pole 19a, or the conductor sections 130 may be connected to the pole 19a by being glued on the top of the pole 19a, but is not limited thereto. In one embodiment, the conductor section 130 and the pole 19a may be connected by a conductive wire. For example, a conductive wire is extended from the top of the pole 19a and connected to the conductor section 130.

As shown in FIG. 18B, in this embodiment, in the Z direction, the height of the conductor section 130 is higher than that of the two electrodes 110 and 112. The two LED sections 102 may be seen as the two electrodes 110 and 112 extending upward to the highest point respectively and then bending down and further extending to connect to the conductor section 130. As shown in FIG. 18C, in this embodiment, the outline of the LED filament 100 in the X-Z plane is similar to a V shape, that is, the two LED sections 102 are extended obliquely upward and outward respectively, and are bent at the highest point then extended downwardly and inwardly to the conductor section 130. As shown in FIG. 18D, in this embodiment, the outline of the LED filament 100 in the X-Y plane has an S shape. As shown in FIG. 18B and FIG. 18D, in this embodiment, the conductor section 130 is located between the electrodes 110 and 112. As shown in FIG. 18D, in this embodiment, in the X-Y plane, the bending point of the LED section 102, the bending point of the LED section 104, and the electrodes 110, 112 are located substantially on a circumference of a circle taking the conductor section 130 as a center.

The meaning of the term "a single LED filament" and "a single strip LED filament" as used in the present invention is mainly composed of the aforementioned conductive section, the LED section, the connection between thereof, the light conversion layer (including the consecutive top layer or the bottom layer, with continuous formation to cover or support all the components), and two conductive electrodes electrically connected to the conductive brackets of the LED light bulb disposing at both ends of the LED filament, which is the single LED filament structure referred to in the present invention.

Figure 19A:
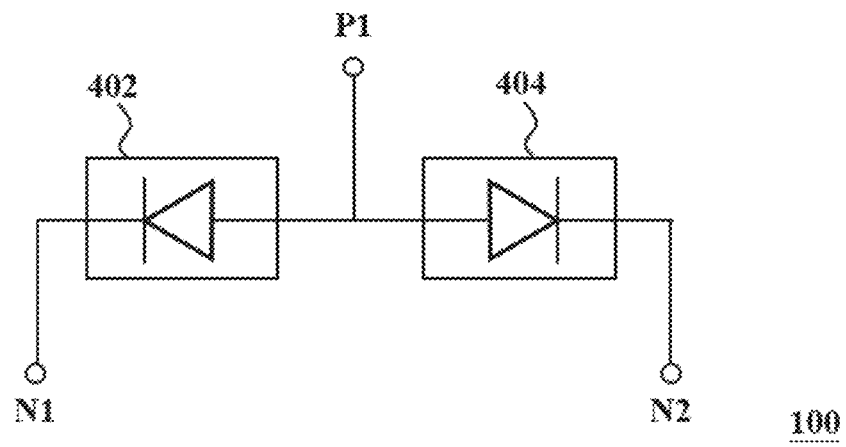
FIG. 19A to FIG. 19C are schematic circuit diagrams of an LED filament in accordance with an embodiment of the present invention.

In some embodiments, LED filament 100 may have multiple LED sections. At least part or all of LED chips on a single LED section are electrically connected in series. Different LED sections are electrically connected in parallel. Anode and cathode of each LED section may serve as a positive electrode and negative electrodes of the LED filament, respectively. The negative electrodes separately connect with two or more of the conductive supports (e.g., conductive supports 51a, 51b in FIG. 15A) and finally connect to a power module (such as power module 518 in FIG. 15A). As shown in FIG. 19A, which is a schematic circuit diagram of the LED filament according to some embodiments of the present invention, LED filament 100 in this embodiment has two LED sections 402, 404. Each LED section 402, 404 includes one or more LED chips. LED chips in a single LED section are electrically connected in series. Two LED sections 402, 404 have respective current paths after they have been electrically connected (i.e. in parallel). In detail, in this embodiment, anodes of LED sections 402, 404 are electrically connected together to serve as a positive electrode P1 of LED filament 100. Cathodes of LED section 402 and 404 serve as a first negative electrode N1 and a second negative electrode N2, respectively. Positive electrode P1, first negative electrode N1 and second negative electrode N2 are separately electrically connected to the power module through conductive supports such as conductive supports 51a, 51b and power module 518 shown in FIG. 15A.

Figure 19B:
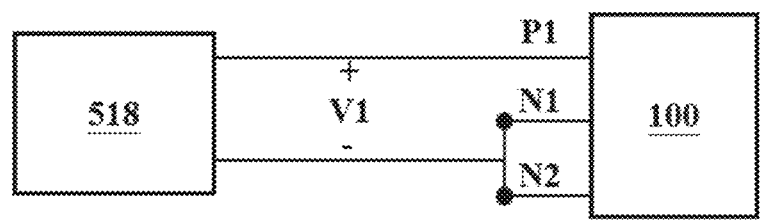
Figure 19C:
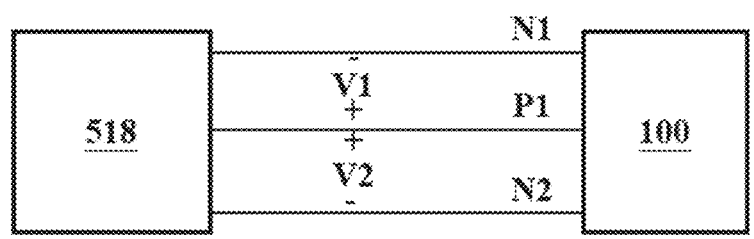

In more detail, the connection relationship between positive electrode P1, first negative electrode N1 and second negative electrode N2 may be shown as FIG. 19B or FIG. 19C, in which FIG. 19B and FIG. 19C are two schematic views of electrical connections of the LED filament according to some embodiments of the present invention. Please refer to FIG. 19B first. In this embodiment, positive electrode P1 of LED filament 100 is electrically connected to a first output terminal (also called "positive output terminal) of power module 518. First and second negative electrodes N1, N2 of LED filament 100 are electrically connected together and then jointly electrically connected to a second output terminal (also called "negative output terminal") of power module 518. Further refer to FIG. 19A, under the electrical relationship shown in FIG. 19B, LED sections 402, 404 can be deemed as being electrically connected to the output terminals of power module 518 in parallel. Thus, all LED sections 402, 404 are driven by driving voltage V1 between the first and second output terminals. Under a precondition of LED sections 402, 404 having identical or similar chips number and arrangement, the driving current from power module 518 will evenly dividedly flow to each of LED sections 402, 404. As a result, LED sections 402, 404 can present approximately even intensity and/or color temperature.

Please further refer to FIG. 19C. In this embodiment, positive electrode P1 of LED filament 100 is electrically connected to the first output terminal of power module 518, first negative electrode N1 of LED filament 100 is electrically connected to the second output terminal (also called "first negative output terminal") of power module 518, and the second negative electrode N2 of LED filament 100 is electrically connected to the third output terminal (also called "second negative output terminal") of power module 518. Driving voltage V1 is formed between the first output terminal and the second output terminal of power module 518, and another driving voltage V2 is formed between the first output terminal and the third output terminal of power module 518. Referring to FIG. 19A together, under the electrical relationship shown in FIG. 19C, LED section 402 is electrically connected between the first output terminal and the second output terminal, and LED section 404 is electrically connected between the first output terminal and the third output terminal. As a result, LED sections 402 and 404 can be deemed as being driven by driving voltages V1, and V2, respectively. In such an arrangement, the driving currents provided by power module 518 to LED sections 402, 404 can be independently controlled by adjusting output voltages V1 and V2, so as to make LED sections 402, 404 separately generate corresponding intensity and/or color temperature. In other words, dimming the different LED sections individually on a single LED filament can be implemented by design and control of the power module based on the arrangement of FIG. 19C.

In some embodiments, the second and third output terminals of power module 518 can be electrically connected together through a resistor, and either of the second and third output terminals of the power module 518 is electrically connected to a ground terminal. By this arrangement, negative output terminals with different levels can be obtained to generate two different driving voltages V1 and V2. In some embodiments, levels of the second and third output terminals can be controlled by a circuit. The present invention is not limited thereto.

Figure 20A:
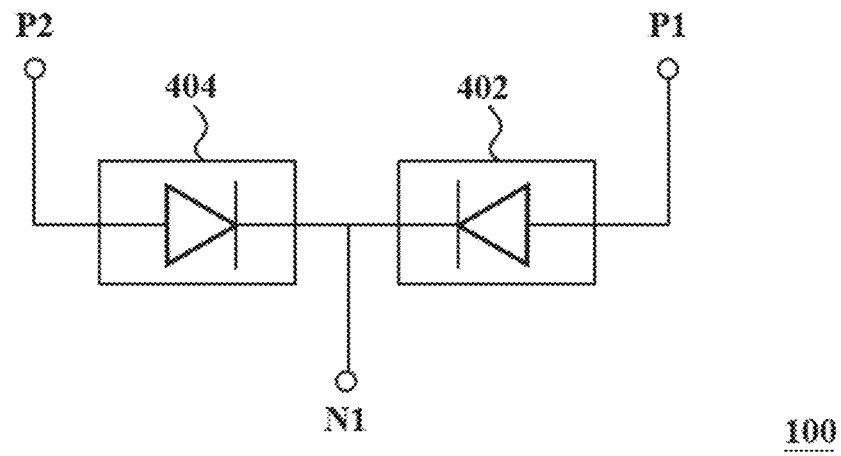
FIG. 20A to FIG. 20C are schematic circuit diagrams of an LED filament in accordance with another embodiment of the present invention.

FIG. 20A is a schematic circuit diagram of the LED filament according to some embodiments of the present invention. In this embodiment, LED filament 100, which is similar to the one shown in FIG. 19A, has two LED sections 402, 404, and thus the details of the LED sections 402, 404 will not be repeated herein. A main difference between this embodiment and the embodiment shown in FIG. 19A is that cathodes of LED sections 402, 404 of this embodiment are electrically connected together to serve as negative electrode N1 of the LED filament, and anodes of LED sections 402, 404 serve as first positive electrode P1 and second positive electrode P2 of LED filament 100, respectively. Negative electrode N1, first positive electrode P1 and second positive electrode P2 of LED filament 100 are electrically connected to the power module through conductive supports, such as conductive supports 51a, 51b and power module 518 shown in FIG. 15A.

Figure 20B:
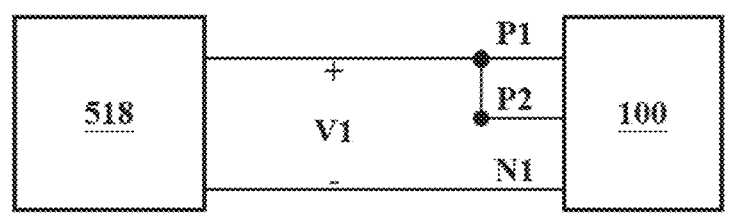
Figure 20C:
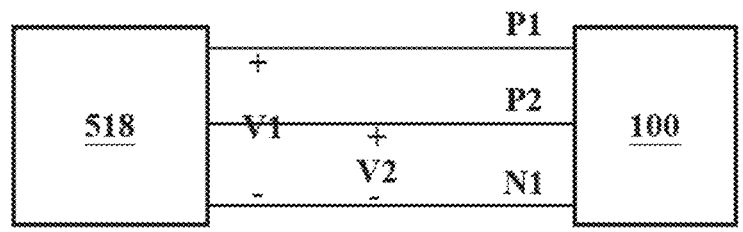

The electrical relationship between negative electrode N1, first positive electrode P1 and second positive electrode P2 of LED filament 100 and the power module may be shown in FIG. 20B or FIG. 20C. FIG. 20B and FIG. 20C are two schematic views of electrical connections of the LED filament according to two different embodiments. Please refer to FIG. 20B first. In this embodiment, a first positive electrode P1 and a second positive electrode P2 of LED filament 100 are electrically connected together and jointly electrically connected to a first output terminal (also called "positive output terminal) of power module 518. Negative electrode N1 of LED filament 100 is electrically connected to a second output terminal (also called "negative output terminal") of power module 518. Further refer to FIG. 20A, under the electrical relationship shown in FIG. 20B, LED sections 402, 404 can be deemed as being electrically connected to the output terminals of power module 518 in parallel. Thus, all LED sections 402, 404 are driven by driving voltage V1 between the first and second output terminals. Under a precondition of LED sections 402, 404 having identical or similar chips number and arrangement, the driving current from power module 518 will evenly dividedly flow to each of LED sections 402, 404. As a result, LED sections 402, 404 can present approximately even intensity and/or color temperature. This arrangement is equivalent to that of the embodiment shown in FIG. 20B.

Please further refer to FIG. 20C. In this embodiment, positive electrode P1 of LED filament 100 is electrically connected to the first output terminal of power module 518, second positive electrode P2 of LED filament 100 is electrically connected to the second output terminal (also called "second positive output terminal") of power module 518, and negative electrode N1 of LED filament 100 is electrically connected to the third output terminal (also called "negative output terminal") of power module 518. Driving voltage V1 is formed between the first output terminal and the third output terminal of power module 518, and another driving voltage V2 is formed between the second output terminal and the third output terminal of power module 518. Please further refer to FIG. 20A. Under the electrical relationship shown in FIG. 20C, LED section 402 is electrically connected between the first output terminal and the third output terminal, and LED section 404 is electrically connected between the second output terminal and the third output terminal. As a result, LED sections 402 and 404 can be deemed as being driven by driving voltages V1, and V2, respectively. In such an arrangement, the driving currents provided by power module 518 to LED sections 402, 404 can be independently controlled by adjusting output voltages V2, V2 so as to make LED sections 402, 404 separately generate corresponding intensity and/or color temperature. In other words, in the arrangement of FIG. 20C, a dimming function can be implemented to a single LED filament by design and control of the power module.

Figure 21A:
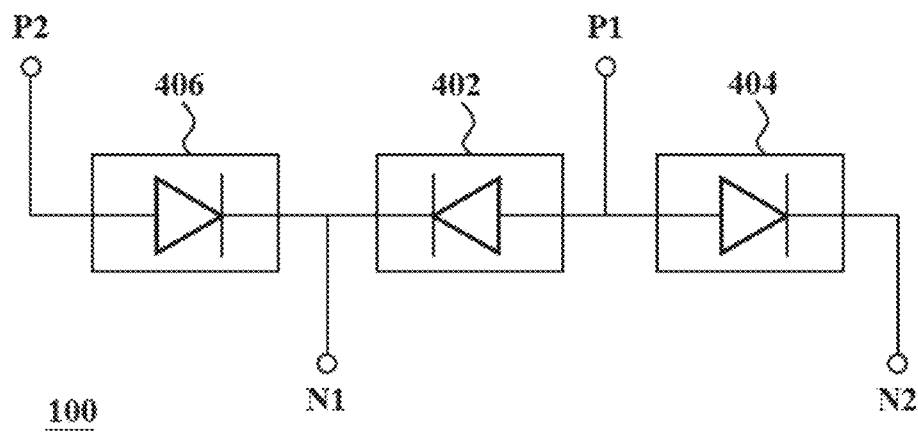
FIG. 21A to FIG. 21D are schematic circuit diagrams of an LED filament in accordance with another embodiment of the present invention.

FIG. 21A is a schematic circuit diagram of the LED filament according to some embodiments of the present invention. In this embodiment, LED filament 100 has three LED sections 402, 404, 406 as shown in FIG. 21A. In detail, LED filament 100 of this embodiment is based on FIG. 19A and adds LED section 406 (also deemed as being based on FIG. 20A and adding LED section 404 in FIG. 21A, wherein LED section 406 in FIG. 21A corresponds to LED section 404 in FIG. 20A). The arrangement of LED sections 402, 404 can refer to the above embodiments, it will not be repeated here. In this embodiment, the arrangement of LED section 406, which is identical or similar to that of LED section 402 or 404, includes one or more LED chips. The LED chips are electrically connected in series. Three LED sections 402, 404, 406 have respective current paths after they have been electrically connected (i.e. in parallel). In detail, in this embodiment, cathodes of LED sections 406 and 402 are electrically connected together (i.e. cathodes of LED sections 402, 406 jointly serve as a first negative electrode N1). And anode of LED section 406 serves as a second positive electrode P2 of LED filament 100. In other words, In this embodiment, LED filament 100 further includes second positive electrode P2 formed by connecting to the anode of LED section 406 other than first positive electrode P1, first negative electrode N1 and second negative electrode N2.

Figure 21B:
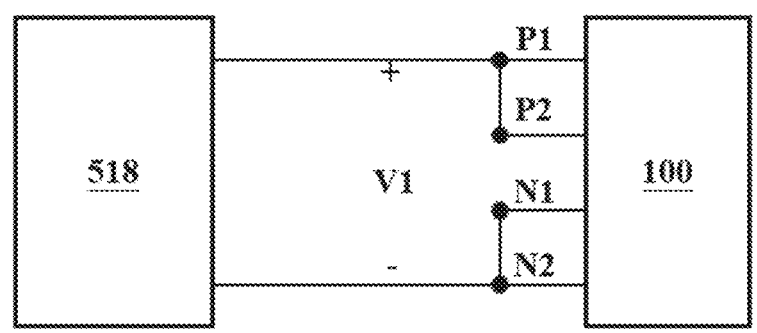
Figure 21C:
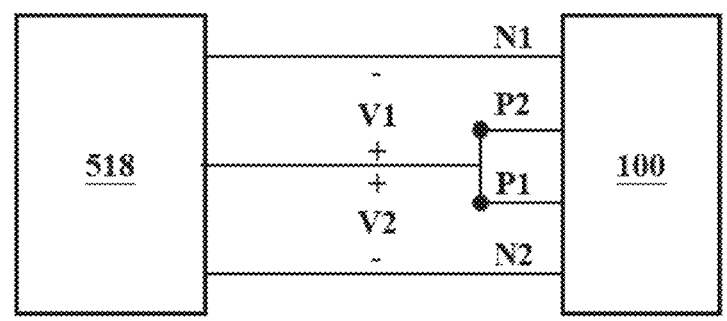
Figure 21D:
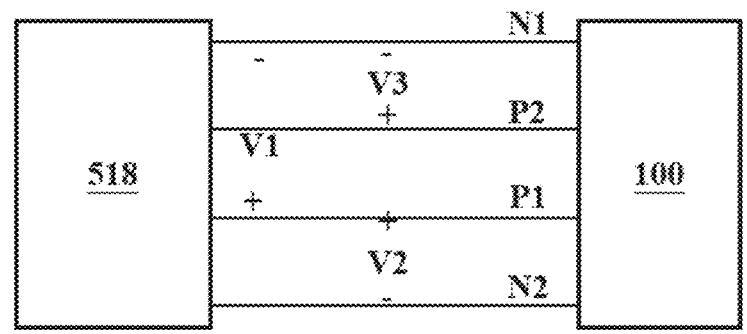

In this embodiment, under the arrangement of LED filament 100, the electrical relationship between LED filament 100 and the power module may be shown in FIG. 21B to FIG. 21D to implement the current sharing drive control or sectional independent control. FIG. 20B and FIG. 20C are two schematic views of electrical connections of two embodiments of the LED filament. Please refer to FIG. 20B first. In this embodiment, a first positive electrode P1 and a second positive electrode P2 of LED filament 100 are electrically connected together and jointly electrically connected to a first output terminal (also called "positive output terminal) of power module 518. First negative electrode N1 and second negative electrode N2 of LED filament 100 are electrically connected together and electrically connected to a second output terminal (also called "negative output terminal") of power module 518. Further refer to FIG. 21A, under the electrical relationship shown in FIG. 21B, LED sections 402, 404, 406 can be deemed as being electrically connected to the output terminals of power module 518 in parallel. Thus, all LED sections 402, 404, 406 are driven by driving voltage V1 between the first and second output terminals. Under a precondition of LED sections 402, 404, 406 having identical or similar chips number and arrangement, the driving current from power module 518 will evenly dividedly flow to each of LED sections 402, 404, 406. As a result, LED sections 402, 404, 406 can present approximately even intensity and/or color temperature. This arrangement is equivalent to that of the embodiment shown in FIGS. 19B and 20B.

Please further refer to FIG. 21C. In this embodiment, first positive electrode P1 and second positive electrode P2 of LED filament 100 are electrically connected together and jointly electrically connected to the first output terminal (also called "first positive output terminal") of power module 518, first negative electrode N1 of LED filament 100 is electrically connected to the second output terminal (also called "first negative output terminal") of power module 518, and second negative electrode N2 of LED filament 100 is electrically connected to the third output terminal (also called "second negative output terminal") of power module 518. Under such an arrangement, both first positive electrode P1 and second positive electrode P2 can be deemed as the same terminal. Thus, the whole circuit is equivalent to FIG. 19C. Related control manner, functions and effects can refer to the description of FIG. 19C. The arrangement of this embodiment can make a single filament have a two-stage dimming effect.

Please further refer to FIG. 21D. In this embodiment, first positive electrode P1 of LED filament 100 is electrically connected to the first output terminal (also called "first positive output terminal") of power module 518, second positive electrode P2 of LED filament 100 is electrically connected to the second output terminal (also called "second positive output terminal") of power module 518, first negative electrode N1 of LED filament 100 is electrically connected to the third output terminal (also called "first negative output terminal"), and second negative electrode N2 is electrically connected to fourth output terminal (also called "second negative output terminal") of power module 518. Further refer to FIG. 21A, under such an arrangement shown in FIG. 21D, LED section 402 is electrically connected between the first and third terminals, LED section 404 is electrically connected between the first and fourth output terminals, and LED section 406 is electrically connected between the second and third terminals. Thus, LED sections 402, 404, 406 can be deemed as being driven by driving voltages V1, V2, V3, respectively. In such an arrangement, the driving currents provided by power module 518 to LED sections 402, 404, 406 can be independently controlled by adjusting output voltages V2, V2, V3 so as to make LED sections 402, 404, 406 separately generate corresponding intensity and/or color temperature. The arrangement of this embodiment can make a single filament have a three-stage dimming effect.

Figure 22A:
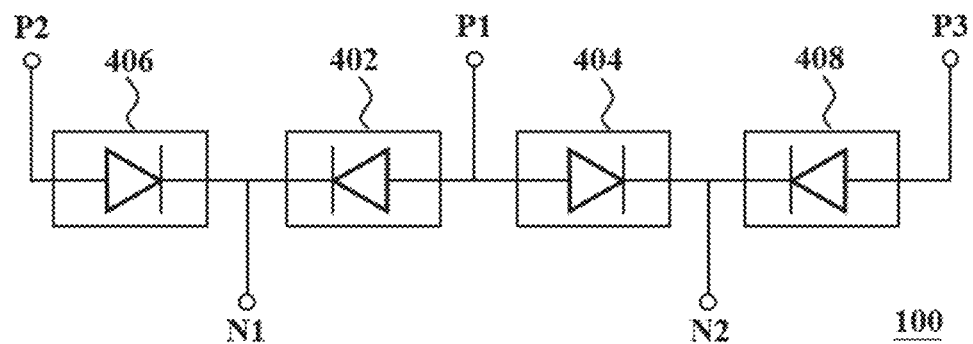
FIG. 22A to FIG. 22E are schematic circuit diagrams of an LED filament in accordance with another embodiment of the present invention.
Figure 22B:
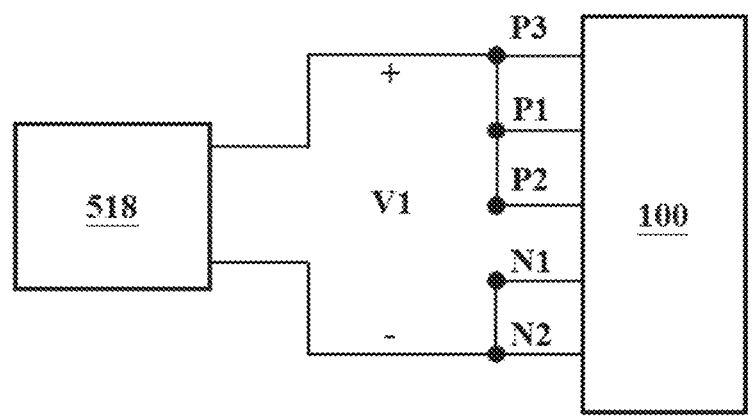

FIG. 22A is a schematic circuit diagram of an embodiment of the LED filament of the present invention. In this embodiment, LED filament 100 has four LED sections 402, 404, 406, 408 as shown in FIG. 22A. In detail, LED filament 100 of this embodiment is based on FIG. 21A and further includes LED section 408. The arrangement of LED sections 402, 404, 406 can refer to the above embodiments, it will not be repeated here. In this embodiment, the arrangement of LED section 408, which is identical or similar to that of LED section 402, 404 or 406, includes one or more LED chips. The LED chips are electrically connected in series. Three LED sections 402, 404, 406, 408 have respective current paths after they have been electrically connected (i.e. in parallel). In detail, cathodes of LED sections 408 and 404 are electrically connected together (i.e. cathodes of LED sections 402, 406 jointly serve as a second negative electrode N2). And anode of LED section 408 serves as a third positive electrode P3 of LED filament 100. In other words, In this embodiment, LED filament 100 further includes third positive electrode P3 formed by connecting to the anode of LED section 408 other than first positive electrode P1, second positive electrode P2, first negative electrode N1 and second negative electrode N2.

In this embodiment, under the arrangement of LED filament 100, the electrical relationship between LED filament 100 and the power module may be shown in FIG. 22B to FIG. 22E to implement the current sharing drive control or sectional independent control. FIG. 22B to FIG. 22E are four schematic views of electrical connections of four embodiments of the LED filament. Please refer to FIG. 22B first. In this embodiment, a first positive electrode P1, a second positive electrode P2 and a third positive electrode P3 of LED filament 100 are electrically connected together and jointly electrically connected to a first output terminal (also called "positive output terminal) of power module 518. First negative electrode N1 and second negative electrode N2 of LED filament 100 are electrically connected together and electrically connected to a second output terminal (also called "negative output terminal") of power module 518. Further refer to FIG. 22A, under the electrical relationship shown in FIG. 22B, LED sections 402, 404, 406, 408 can be deemed as being electrically connected to the output terminals of power module 518 in parallel. Thus, all LED sections 402, 404, 406, 408 are driven by driving voltage V1 between the first and second output terminals. Under a precondition of LED sections 402, 404, 406, 408 having identical or similar chips number and arrangement, the driving current from power module 518 will evenly dividedly flow to each of LED sections 402, 404, 406, 408. As a result, LED sections 402, 404, 406 can present approximately even intensity and/or color temperature. This arrangement is equivalent to that of the embodiment shown in FIG. 19B, FIG. 20B, and FIG. 21B.

Figure 22C:
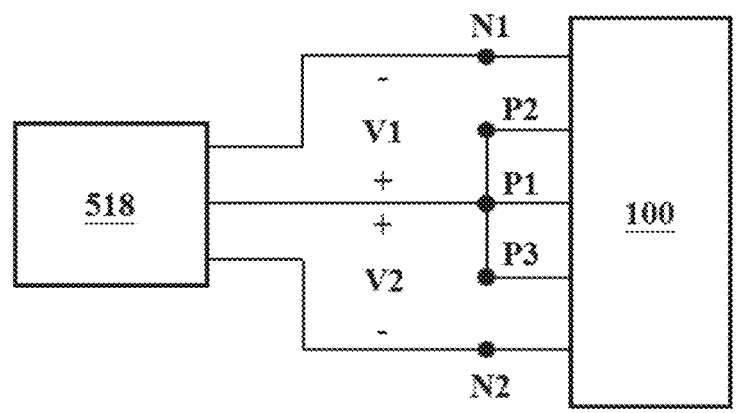

Please further refer to FIG. 22C. In this embodiment, first positive electrode P1, second positive electrode P2 and third positive electrode P3 of LED filament 100 are electrically connected together and jointly electrically connected to the first output terminal (also called "first positive output terminal") of power module 518, first negative electrode N1 of LED filament 100 is electrically connected to second output terminal (also called "first negative output terminal") of power module 518, and second negative electrode N2 of LED filament 100 is electrically connected to the third output terminal (also called "second negative output terminal") of power module 518. Under such an arrangement, first positive electrode P1, second positive electrode P2 and third positive electrode P3 can be deemed as the same terminal. Thus, the whole circuit is equivalent to FIG. 19C. Related control manner, functions and effects can refer to the description of FIG. 19C. The arrangement of this embodiment can make a single filament have a two-stage dimming effect.

Figure 22D:
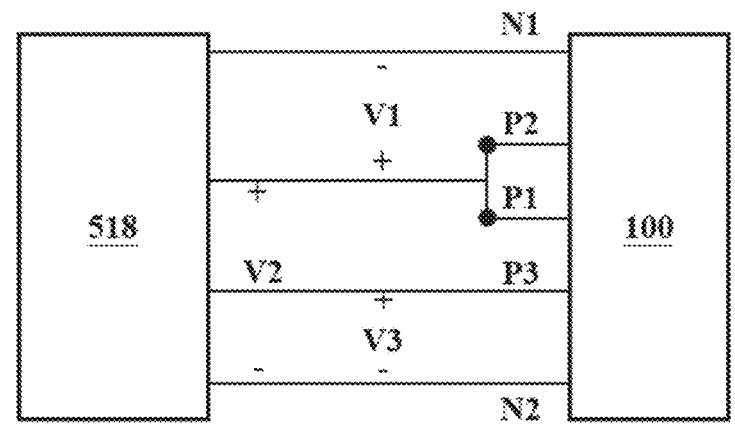

Please further refer to FIG. 22D. In this embodiment, first positive electrode P1 and second positive electrode P2 of LED filament 100 are electrically connected to the first output terminal (also called "first positive output terminal") of power module 518, third positive electrode P3 of LED filament 100 is electrically connected to the second output terminal (also called "second positive output terminal") of power module 518, first negative electrode N1 of LED filament 100 is electrically connected to the third output terminal (also called "first negative output terminal"), and second negative electrode N2 is electrically connected to the fourth output terminal (also called "second negative output terminal") of power module 518. Under such an arrangement, first positive electrode P1 and second positive electrode P2 can be deemed as the same terminal. Thus, the whole circuit is equivalent to FIG. 21D. Related control manner, functions and effects can refer to the description of FIG. 21D. The arrangement of this embodiment can make a single filament have a three-stage dimming effect.

Figure 22E:
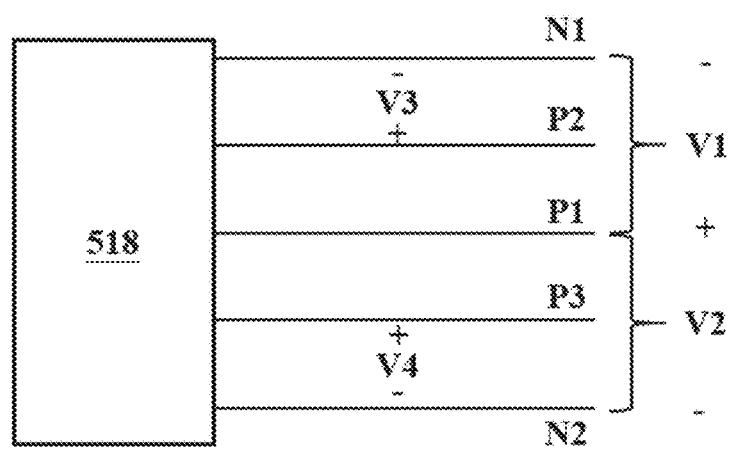

Please further refer to FIG. 22E. In this embodiment, first positive electrode P1 of LED filament 100 is electrically connected to the first output terminal (also called "first positive output terminal") of power module 518, second positive electrode P2 of LED filament 100 is electrically connected to the second output terminal (also called "second positive output terminal") of power module 518, third positive electrode P3 of LED filament 100 is electrically connected to the third output terminal (also called "third positive output terminal") of power module 518, first negative electrode N1 of LED filament 100 is electrically connected to the fourth output terminal (also called "first negative output terminal"), and second negative electrode N2 is electrically connected to the fifth output terminal (also called "second negative output terminal") of power module 518. Under such an arrangement, a driving voltage V1 is formed between the first output terminal and the fourth output terminal of power module 518, another driving voltage V2 is formed between the first output terminal and the fifth output terminal of power module 518, still another driving voltage V3 is formed between the second output terminal and the fourth output terminal of power module 518, and yet another driving voltage V4 is formed between the third output terminal and the fifth output terminal of power module 518. Further refer to FIG. 22A, under the electrical relationship shown in FIG. 22E, LED section 402 is electrically connected between the first and fourth terminals, LED section 404 is electrically connected between the first and fifth output terminals, LED section 406 is electrically connected between the second and fourth terminals, and LED section 408 is electrically connected between the third and fifth output terminals. Thus, LED sections 402, 404, 406, 408 can be deemed as being driven by driving voltages V1, V2, V3, V4, respectively. In such an arrangement, the driving currents provided by power module 518 to LED sections 402, 404, 406, 408 can be independently controlled by adjusting output voltages V2, V2, V3, V4 so as to make LED sections 402, 404, 406, 408 separately generate corresponding intensity and/or color temperature. The arrangement of this embodiment can make a single filament have a four-stage dimming effect.

In sum, according to the abovementioned embodiments, the description has clearly disclosed a strip of filament with multiple dimming control by two, three or four LED sections. According to the description, a person having ordinary skill in the art can easily implement a strip of filament with multiple dimming control by five or more LED sections.

Figure 23:
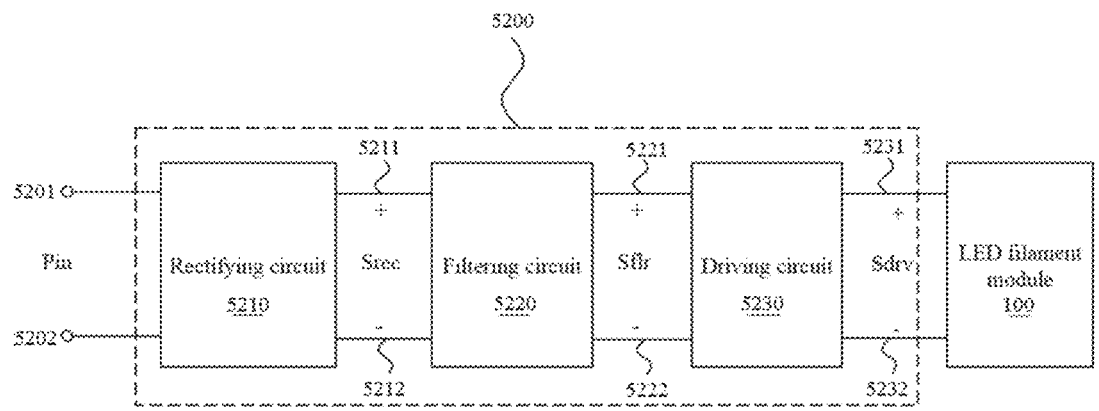
FIG. 23 is a block diagram of a power supply module of an LED light bulb in accordance with an embodiment of the present invention.

Next part of the present disclosure will describe the circuit design of the driving circuit of the filament bulb. From circuit perspective, power module 518 in FIG. 15A may be represented by a circuit block 5200 (below described and referred to as "power module 5200") as shown in FIG. 23. FIG. 23 is a circuit block diagram of a power module of an LED filament bulb according to some embodiments of present invention. Referring to FIG. 23, power module 5200 includes a rectifying circuit 5210, a filtering circuit 5220, and a driving circuit 5230. Rectifying circuit 5210 is coupled to a first pin 5201 and a second pin 5202, also known as external connection terminals, to receive and then rectify an external driving signal Pin, in order to output a rectified signal Srec through a first rectifying output terminal 5211 and a second rectifying output terminal 5212. In different embodiments, external driving signal Pin may be an AC driving signal, an AC power supply signal (such as a power grid signal), or even a DC signal, which choices each typically do not affect operations of the LED filament bulb. When the LED filament bulb is designed to emit light or light up based on a DC signal, rectifying circuit 5210 in power module 5200 may be omitted. In a configuration without rectifying circuit 5210, first rectifying output terminal 5211 and second rectifying output terminal 5212 would be directly coupled to input terminals (as 5211 and 5212) of filtering circuit 5220.

Filtering circuit 5220 is coupled to rectifying circuit 5210 in order to filter rectified signal Srec, that is, input terminals of filtering circuit 5220 are coupled to first rectifying output terminal 5211 and second rectifying output terminal 5212 to receive and then filter rectified signal Srec, in order to output a filtered signal Sflr through a first filtering output terminal 5221 and a second filtering output terminal 5222. First rectifying output terminal 5211 may be regarded as a first filtering input terminal and second rectifying output terminal 5212 may be regarded as a second filtering input terminal, of filtering circuit 5220. In this embodiment, filtering circuit 5220 may filter out ripples in rectified signal Srec, to make the waveform of produced filtered signal Sflr smoother than that of rectified signal Srec. Besides, circuit configuration of filtering circuit 5220 may be set to realize filtering with respect to a certain or specific (band of) frequency, to filter out frequency response or output energy at a certain or specific frequency in response to external driving signal Pin.

Driving circuit 5230 is coupled to filtering circuit 5220, to receive and then perform power conversion to filtered signal Sflr, in order to generate a driving power Sdrv, that is, input terminals of driving circuit 5230 are coupled to first filtering output terminal 5221 and second filtering output terminal 5222 to receive filtered signal Sflr and then generate driving power Sdrv used for driving LED filament module 100 for emitting light. First filtering output terminal 5221 may be regarded as a first driving input terminal and second filtering output terminal 5222 may be regarded as a second driving input terminal, of driving circuit 5230. Driving power Sdrv generated by driving circuit 5230 is then provided to LED filament module 100 through a first driving output terminal and a second driving output terminal, to enable an LED filament (as 100) of LED filament module 100 to light up in response to driving power Sdrv. Some embodiments of rectifying circuit 5210, filtering circuit 5220, and driving circuit 5230 of power module 5200 in possible configurations are presented and described below, but the invention is not limited thereto.

Figure 24A:
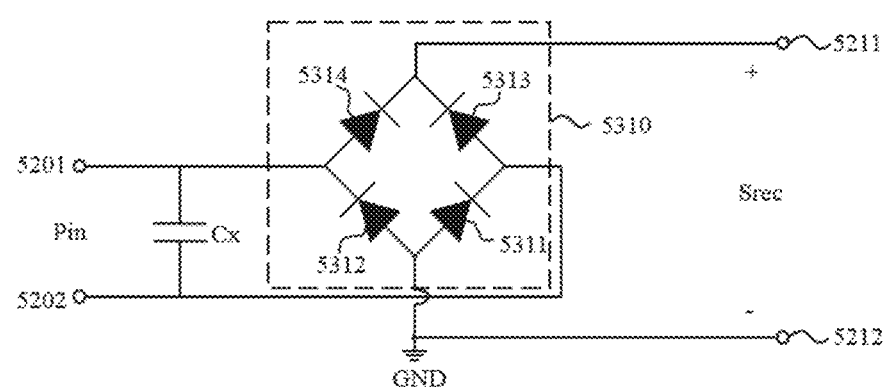
FIG. 24A is a schematic diagram of a rectifying circuit in accordance with an embodiment of the present invention.

FIG. 24A is a circuit diagram of a rectifying circuit according to some embodiments of present invention. Referring to FIG. 24A, rectifying circuit 5310 is a bridge rectifier including diodes 5311-5314 used for performing (full-wave) rectification to a received signal. Diode 5311 has an anode coupled to a second rectifying output terminal 5212, and a cathode coupled to a second pin 5202. Diode 5312 has an anode coupled to second rectifying output terminal 5212, and a cathode coupled to a first pin 5201. Diode 5313 has an anode coupled to second pin 5202, and a cathode coupled to a first rectifying output terminal 5211. And diode 5314 has an anode coupled to first pin 5201, and a cathode coupled to first rectifying output terminal 5211. In this embodiment, diodes 5311-5314 may be referred to as first diode 5311, second diode 5312, third diode 5313, and fourth diode 5314.

Operations of rectifying circuit 5310 when first and second pins 5201 and 5202 receive an AC signal as external driving signal Pin are described as follows. During the AC signal's positive half cycle, assuming the voltage level at first pin 5201 being higher than that at second pin 5202, diodes 5311 and 5314 operate in a forward-biased state to conduct current, while diodes 5312 and 5313 are cut off as being reverse-biased, which states of the four diodes form a circuit loop between the first and second pins 5201 and 5202. Under the configuration of the diodes during the AC signal's positive half cycle, an input current from or caused by the AC signal flows through first pin 5201, diode 5314, and first rectifying output terminal 5211 in sequence into a later-stage load, and after which flows through second rectifying output terminal 5212, diode 5311, and second pin 5202 in sequence, out of the LED filament bulb. Accordingly, during the AC signal's negative half cycle, the voltage level at first pin 5202 is higher than that at second pin 5201, so diodes 5312 and 5313 operate in a forward-biased state to conduct current, while diodes 5311 and 5314 are cut off as being reverse-biased, which states of the four diodes form a circuit loop between first and second pins 5201 and 5202. Under the configuration of the diodes during the AC signal's negative half cycle, an input current from or caused by the AC signal flows through second pin 5202, diode 5313, and first rectifying output terminal 5211 in sequence into a later-stage load, and after which flows through second rectifying output terminal 5212, diode 5312, and first pin 5201 in sequence, out of the LED filament bulb. Therefore, no matter during the AC signal's positive or negative half cycle, the positive polarity of rectified signal Srec output by rectifying circuit 5310 remains at first rectifying output terminal 5211 and the negative polarity of rectified signal Srec remains at second rectifying output terminal 5212. According to the above description of operations, the rectified signal output by rectifying circuit 5210 is a full-wave rectified signal.

Operations of rectifying circuit 5310 when first and second pins 5201 and 5202 are coupled to a DC power supply to receive a DC signal therefrom as external driving signal Pin are described as follows. When first pin 5201 is coupled to the positive electrode, and second pin 5202 is coupled to the negative electrode, of the DC power supply, diodes 5311 and 5314 operate in a forward-biased state to conduct current, while diodes 5312 and 5313 are cut off as being reverse-biased, which states of the four diodes form a circuit loop between first and second pins 5201 and 5202. In this case the circuit configuration and operations of rectifying circuit 5310 are the same as those of rectifying circuit 5310 under and during the above-described AC signal's positive half cycle. On the other hand, when first pin 5201 is coupled to the negative electrode, and second pin 5202 is coupled to the positive electrode, of the DC power supply, diodes 5312 and 5313 operate in a forward-biased state to conduct current, while diodes 5311 and 5314 are cut off as being reverse-biased, which states of the four diodes form a circuit loop between first and second pins 5201 and 5202. In this case the circuit configuration and operations of rectifying circuit 5310 are the same as those of rectifying circuit 5310 under and during the above-described AC signal's negative half cycle.

From the above description, it is known that no matter whether rectifying circuit 5310 in this embodiment receives an AC signal or a DC signal, rectifying circuit 5310 can properly output rectified signal Srec.

Besides, in some embodiments, a capacitor Cx may be disposed between input terminals of rectifying circuit 5310, wherein capacitance of capacitor Cx may be for example 47 nF and capacitor Cx may be used to reduce EMI (: electromagnetic interference) effects of power module 5200.

Figure 24B:
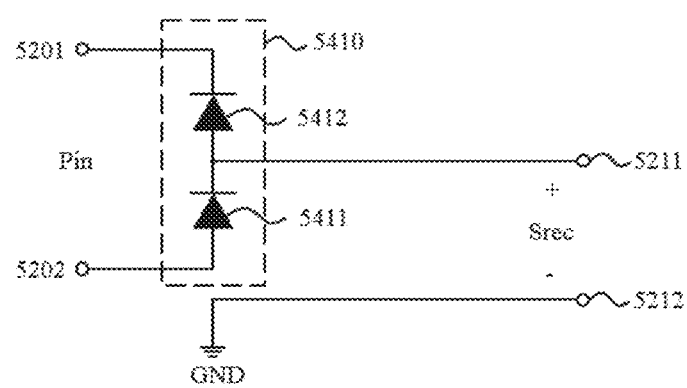
FIG. 24B is a schematic diagram of a rectifying circuit in accordance with another embodiment of the present invention.

FIG. 24B is a circuit diagram of a rectifying circuit according to some embodiment of present invention. Referring to FIG. 24B, rectifying circuit 5410 includes diodes 5411 and 5412 used for performing (half-wave) rectification to a received signal. Diode 5411 has an anode coupled to second pin 5202, and a cathode coupled to first rectifying output terminal 5211. Diode 5412 has an anode coupled to first rectifying output terminal 5211, and a cathode coupled to first pin 5201. Depending on practical applications involving rectifying circuit 5210, second rectifying output terminal 5212 may be omitted or grounded. In this embodiment, diodes 5411 and 5412 may be referred to as a first diode 5411 and a second diode 5412.

Next, in a similar vein, what follows are descriptions of operations of rectifying circuit 5410 under the two operational situations of when the received signal is an AC signal and when the received signal is a DC signal, respectively.

Operations of rectifying circuit 5410 when first and second pins 5201 and 5202 receive an AC signal as external driving signal Pin are described as follows. During the AC signal's positive half cycle, assuming the input voltage level at first pin 5201 from the AC signal being higher than that at second pin 5202, diodes 5411 and 5412 are in a reverse-biased state, so rectifying circuit 5410 ceases to output rectified signal Srec, or rectified signal Srec output by rectifying circuit 5410 is at a zero level. On the other hand, during the AC signal's negative half cycle, the input voltage level at first pin 5201 from the AC signal is lower than that at second pin 5202, so diodes 5411 and 5412 operate in a forward-biased state to conduct current, causing the AC signal to flow through diode 5411 and first rectifying output terminal 5211 into a later-stage load, after which the current of the AC signal flowing out through second rectifying output terminal 5212, another circuit of the LED filament bulb, or a ground terminal. According to the above description of operations, the rectified signal output by rectifying circuit 5410 is a half-wave rectified signal.

Operations of rectifying circuit 5410 when first and second pins 5201 and 5202 are coupled to a DC power supply to receive a DC signal as external driving signal Pin are described as follows. When first pin 5201 is coupled to the positive electrode, and second pin 5202 is coupled to the negative electrode, of the DC power supply, diodes 5411 and 5412 are cut off as being reverse-biased, so rectifying circuit 5410 ceases to output rectified signal Srec. On the other hand, when first pin 5201 is coupled to the negative electrode, and second pin 5202 is coupled to the positive electrode, of the DC power supply, diodes 5411 and 5412 operate in a forward-biased state to conduct current forming a circuit loop, so in this case the circuit configuration and operations of rectifying circuit 5410 are the same as those of rectifying circuit 5410 under and during the above-described AC signal's negative half cycle. From this description, in this embodiment, when first pin 5201 is coupled to the negative electrode, and second pin 5202 is coupled to the positive electrode, of the DC power supply, the rectifying circuit 5410 can still operate normally.

Figure 25A:
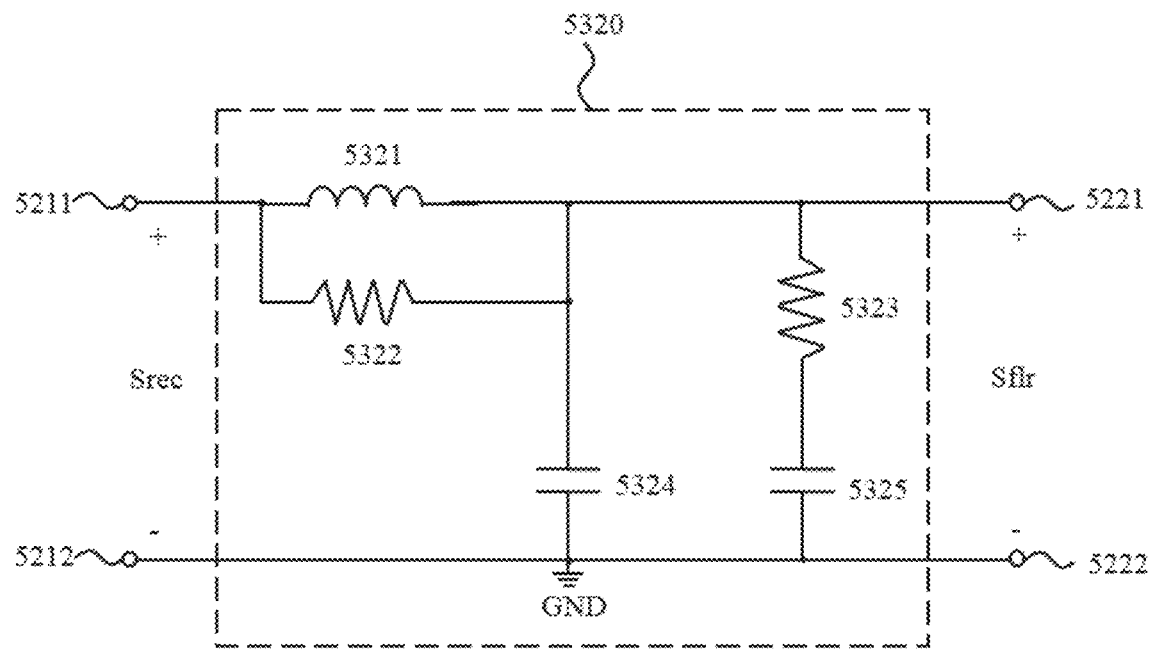
FIG. 25A is a schematic diagram of a filtering circuit in accordance with an embodiment of the present invention.

FIG. 25A is a circuit diagram of a filtering circuit according to some embodiments of present invention. Referring to FIG. 25A, the filtering circuit 5320 includes an inductor 5321, resistors 5322 and 5323, and capacitors 5324 and 5325. Inductor 5321 has a first end coupled to first rectifying output terminal 5211, and has a second end coupled to a first filtering output terminal 5221. So inductor 5321 is electrically connected between first rectifying output terminal 5211 and first filtering output terminal 5221 in series. Resistor 5322 has a first end coupled to first rectifying output terminal 5211 and the first end of inductor 5321, and has a second end coupled to first filtering output terminal 5221 and the second end of inductor 5321. So resistor 5322 and inductor 5321 are electrically connected in parallel. Resistor 5323 has a first end coupled to first filtering output terminal 5221 and the second end of inductor 5321. Capacitor 5324 has a first end coupled to first filtering output terminal 5221 and the second end of inductor 5321, and has a second end coupled to second rectifying output terminal 5212 and second filtering output terminal 5222, wherein second rectifying output terminal 5212 and second filtering output terminal 5222 may be regarded as the same terminal and/or a ground terminal GND. Capacitor 5325 has a first end coupled to a second end of resistor 5323, and has a second end coupled to second rectifying output terminal 5212 and second filtering output terminal 5222. Under the structure and configuration of filtering circuit 5320 in this embodiment, filtering circuit 5320 can perform low-pass filtering to rectified signal Srec, to filter out high-frequency components of rectified signal Srec so as to produce a filtered signal Sflr then output through first and second filtering output terminals 5221 and 5222.

Figure 25B:
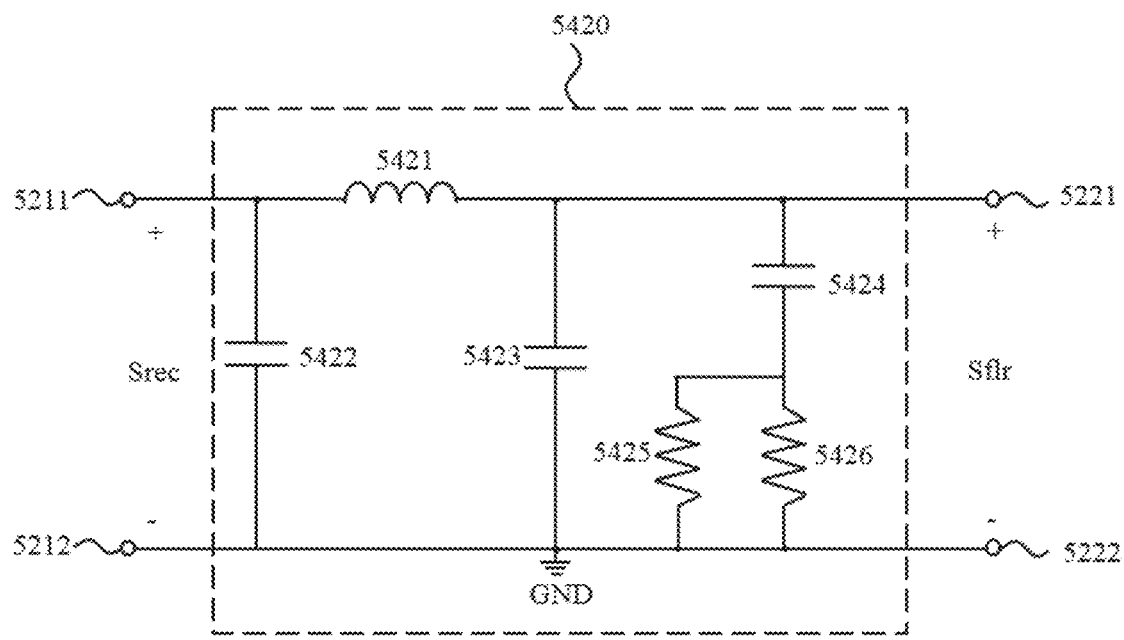
FIG. 25B is a schematic diagram of a filtering circuit in accordance with another embodiment of the present invention.

FIG. 25B is a circuit diagram of a filtering circuit according to some embodiments of the present invention. Referring to FIG. 25B, filtering circuit 5420 comprises a x-shape filtering circuit and includes an inductor 5421, capacitors 5422, 5423, and 5424, and resistors 5425 and 5426. Inductor 5421 has a first end coupled to first rectifying output terminal 5211, and has a second end coupled to a first filtering output terminal 5221. So inductor 5421 is electrically connected between first rectifying output terminal 5211 and first filtering output terminal 5221 in series. Capacitor 5422 has a first end coupled to first rectifying output terminal 5211 and first end of inductor 5421, and has a second end coupled to second rectifying output terminal 5212 and a second filtering output terminal 5222, so the first end of capacitor 5422 is coupled to first filtering output terminal 5221 through inductor 5421. Capacitor 5423 has a first end coupled to first filtering output terminal 5221 and the second end of inductor 5421, and has a second end coupled to second rectifying output terminal 5212 and second filtering output terminal 5222, so the first end of capacitor 5423 is coupled to first rectifying output terminal 5211 through inductor 5421. Capacitor 5424 has a first end coupled to first filtering output terminal 5221 and the second end of inductor 5421, and has a second end coupled to first ends respectively of resistors 5425 and 5426, whose respective second ends are coupled to second rectifying output terminal 5212 and second filtering output terminal 5222.

By way of structural equivalence, the positional structure of inductor 5421 and capacitor 5423 of filtering circuit 5420 is similar to that of inductor 5321 and capacitor 5324 of filtering circuit 5320. Compared to filtering circuit 5320 in FIG. 25A, filtering circuit 5420 further includes capacitor 5422, which is similar to inductor 5421 and capacitor 5423 in having a low-pass filtering function. So compared to filtering circuit 5320 in FIG. 25A, filtering circuit 5420 has better ability to filter out high-frequency components, which ability causes the waveform of its output filtered signal Sflr to be smoother.

Inductors 5321 and 5421 in the above embodiments each have an inductance preferably in the range of about 10 nH~10 mH. And capacitors 5324, 5325, 5422, 5423, and 5424 each have a capacitance preferably in the range of about 100 pF~1 uF.

Figure 26:
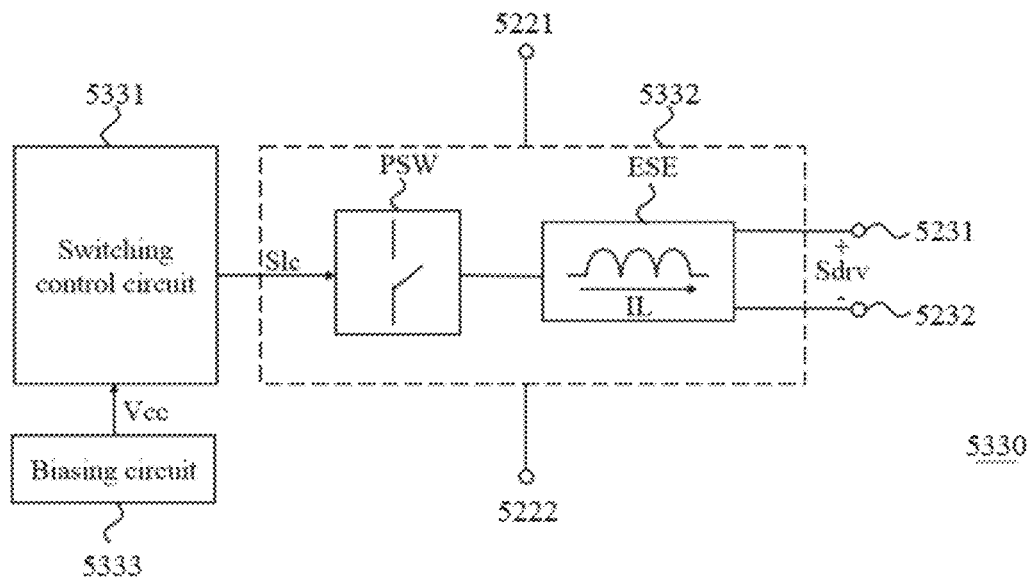
FIG. 26 is a block diagram of a driving circuit in accordance with an embodiment of the present invention.

FIG. 26 is a circuit diagram of a driving circuit according to some embodiments of the present invention. Referring to FIG. 26, the driving circuit 5330 includes a switching control circuit 5331 and a conversion circuit 5332, for performing power conversion based on, or in a mode of being, a current source, in order to drive the LED filament module to emit light. Conversion circuit 5332 includes a switching circuit PSW (which may be referred to as a power switch) and an energy storage circuit ESE. And conversion circuit 5332 is coupled to first and second filtering output terminals 5221 and 5222 to receive and then convert filtered signal Sflr, under the control by switching control circuit 5331, into a driving power Sdrv to be output at a first and a second driving output terminals 5231 and 5232 for driving the LED filament module. Under the control by switching control circuit 5331, driving power Sdrv output by conversion circuit 5332 comprises a steady current, causing the LED filament module to steadily emit light. Besides, driving circuit 5330 may further include a biasing circuit 5333, which may be configured to generate working voltage Vcc based on voltage on an input power line of the power module, wherein working voltage Vcc is provided to and used by switching control circuit 5331, so that switching control circuit 5331 can be activated and then operate in response to working voltage Vcc.

Figure 27A:
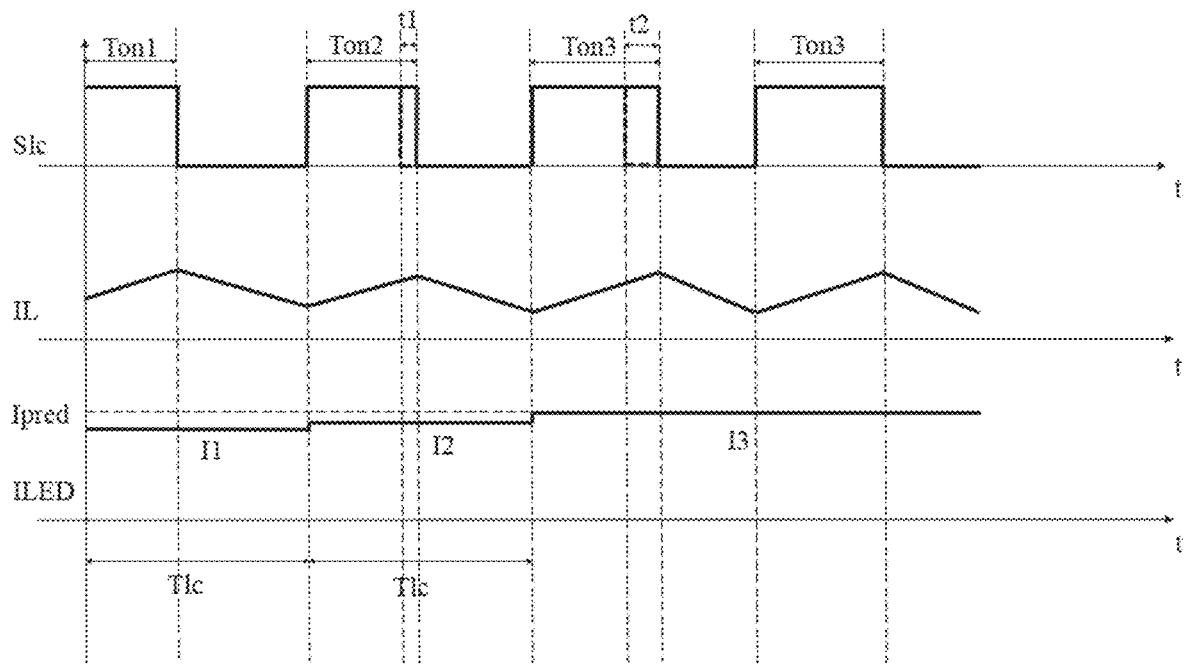
FIG. 27A to FIG. 27D are schematic diagrams showing signal waveforms of a driving circuit in accordance with various embodiments of the present invention.
Figure 27B:
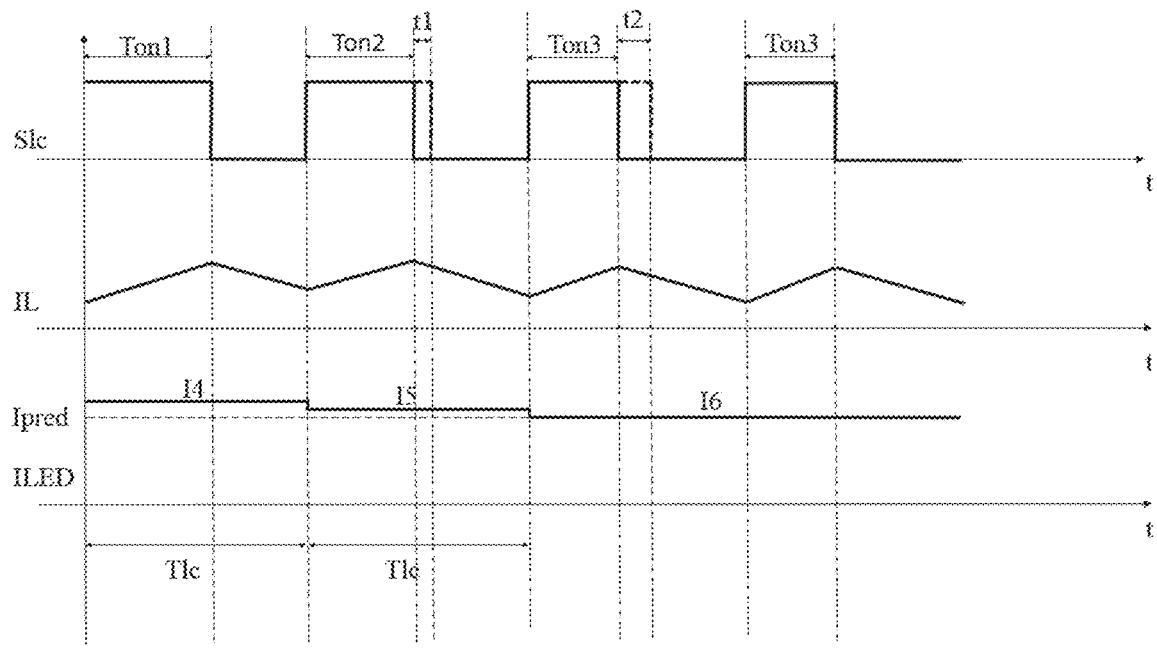
Figure 27C:
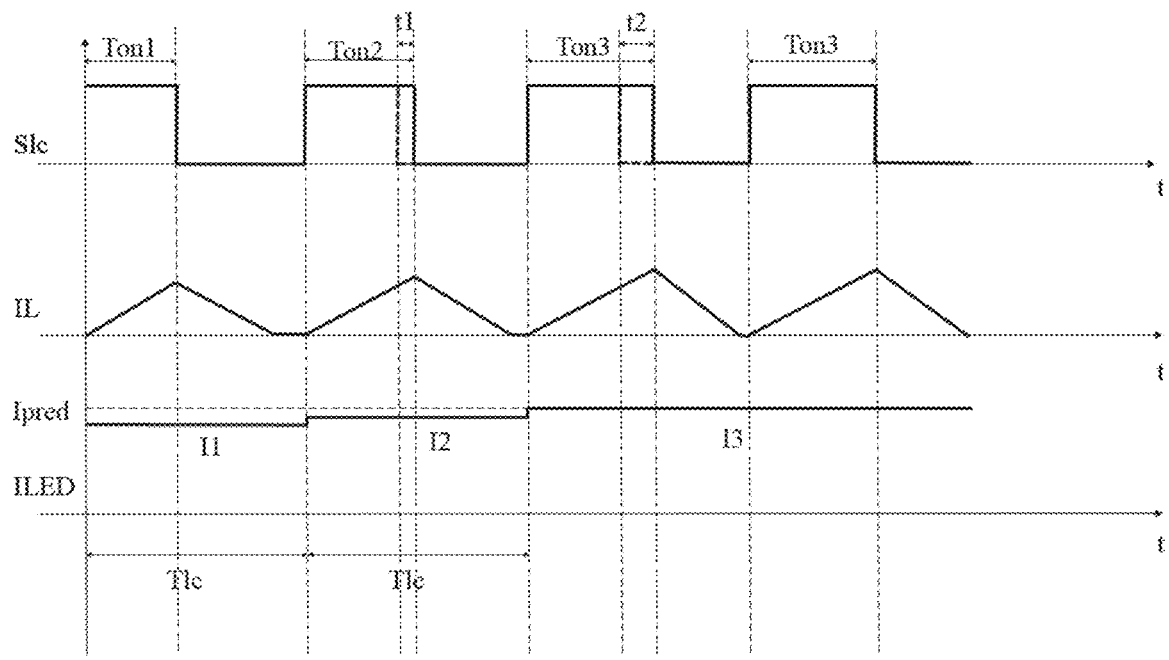
Figure 27D:
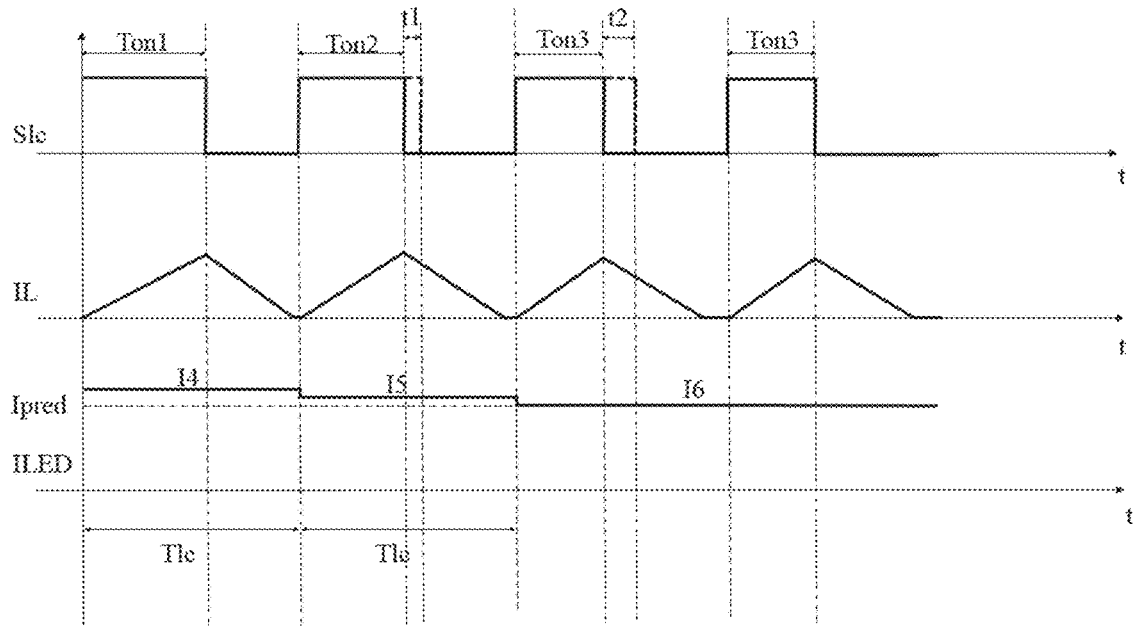

Next, operations of driving circuit 5330 are further described with reference to the illustrating signal waveforms shown in FIG. 27A to FIG. 27D. FIG. 27A FIG. 27D are signal waveform diagrams related to and in different embodiments of operating the driving circuit (5230/5330). FIG. 27A and FIG. 27B illustrate signal waveforms and control situation in an embodiment of operating driving circuit 5330 in a continuous-conduction mode (CCM). FIG. 27C and FIG. 27D illustrate signal waveforms and control situation in an embodiment of operating driving circuit 5330 in a discontinuous-conduction mode (DCM). In the signal-waveform diagrams, the horizontal axis represents time, which is denoted by "t", and the vertical axis represents the variable of voltage or current depending on which type of signal is being described or referred to.

Switching control circuit 5331 in this embodiment is configured to perform real-time regulation or adjusting of the duty cycle of a lighting control signal Slc according to current operational states of the LED filament bulb, in order to turn on or turn off switching circuit PSW according to or in response to lighting control signal Slc. Switching control circuit 5331 can determine or judge a current operational state of the LED filament bulb by detecting one or more of an input voltage (such as a voltage level on first pin 5201 or second pin 5202, on first rectifying output terminal 5211, or on first filtering output terminal 5221), an output voltage (such as a voltage level on first driving output terminal 5231), an input current (such as a current on the input power line or flowing through rectifying output terminal 5211/5212 and filtering output terminal 5221/5222), and an output current (such as a current flowing through driving output terminal 5231/5232 or through switching circuit PSW). Energy storage circuit ESE is configured to alternate or switch its operation between being charged with energy and discharging energy, according to the state of switching circuit PSW being turned on or turned off, in order to maintain or make a driving current ILED received by the LED filament module be stable above a predefined current value Ipred. Lighting control signal Slc has a fixed signal period Tlc and a signal amplitude, wherein the pulse on time (such as Ton1, Ton2, or Ton3, and also referred to as a pulse width) during each of signal period Tlc may be adjusted according to control needs. And the duty cycle of lighting control signal Slc is the ratio of the pulse on time to signal period Tlc. For example, if pulse on time Ton1 is 40% of signal period Tlc, this means the duty cycle of lighting control signal Slc during first signal period Tlc is 0.4.

FIG. 27A illustrates variations in signal waveforms during multiple consecutive signal periods Tlc related to operating driving circuit 5330 when driving current ILED is below predefined current value Ipred. Referring to both FIG. 26 and FIG. 27A, specifically, during first signal period Tlc, switching circuit PSW conducts current during pulse on time Ton1 when lighting control signal Slc is at a high level. So during pulse on time Ton1, in addition to generating driving current ILED for LED filament module 100 according to input power supply received from first filtering output terminal 5221 and second filtering output terminal 5222, conversion circuit 5332 electrically charges energy storage circuit ESE through conducting switching circuit PSW so as to gradually increase a current signal IL flowing through energy storage circuit ESE. In other words, during pulse on time Ton1, energy storage circuit ESE is electrically charged to store energy in response to the input power supply received from first filtering output terminal 5221 and second filtering output terminal 5222.

Subsequently, upon the end of pulse on time Ton1, switching circuit PSW is turned off or not conducting in response to lighting control signal Slc being at a low level. During the time that switching circuit PSW is turned off, the input power supply received from first filtering output terminal 5221 and second filtering output terminal 5222 is not provided to the LED filament module, but instead energy storage circuit ESE discharges electrical energy to generate driving current ILED for the LED filament module, wherein current signal IL flowing through energy storage circuit ESE gradually decreases due to the energy discharging. Therefore, even when lighting control signal Slc is at a low level, that is, when switching circuit PSW is turned off or disabled, driving circuit 5330 continues to provide electrical power to the LED filament module due to the energy discharging from and by energy storage circuit ESE. In other words, for this case, no matter whether switching circuit PSW is turned on or turned off, driving circuit 5330 will continually provide a stable driving current ILED to the LED filament module, wherein the current value of driving current ILED during first signal period Tlc is about I1 as shown in FIG. 27A.

During first signal period Tlc, switching control circuit 5331 judges that current value I1 of driving current ILED is below a predefined current value Ipred, according to a current detection signal indicative of a working state of the LED filament. Thus upon entering into second signal period Tlc, switching control circuit 5331 adjusts the pulse on time of lighting control signal Slc into Ton2, which is equal to pulse on time Ton1 plus a unit duration t1.

During second signal period Tlc, operations of switching circuit PSW and energy storage circuit ESE are similar to their operations during the previous or first signal period Tlc. The difference(s) in operations between two signal periods Tlc is mainly that since pulse on time Ton2 is longer than pulse on time Ton1, the charging time and discharging time of energy storage circuit ESE during second signal period Tlc are longer and shorter respectively than their counterparts during first signal period Tlc, causing an average value I2 of driving current ILED provided by driving circuit 5330 during second signal period Tlc higher than current value I1 and closer to predefined current value Ipred.

Similarly, since at this stage current value I2 of driving current ILED is still below predefined current value Ipred, during third signal period Tlc switching control circuit 5331 again adjusts the pulse on time of lighting control signal Slc into Ton3, which is equal to pulse on time Ton2 plus unit duration t1 or equal to pulse on time Ton1 plus duration t2 of 2 unit durations t1. During third signal period Tlc, operations of switching circuit PSW and energy storage circuit ESE are similar to their operations during each of first two signal periods Tlc. Because pulse on time Ton3 is further longer than pulse on time Ton2, the current value of driving current ILED provided by driving circuit 5330 during third signal period Tlc is raised to I3 approximately reaching predefined current value Ipred. Afterwards, since current value I3 of driving current ILED during third signal period Tlc has reached predefined current value Ipred, switching control circuit 5331 maintains a constant duty cycle of lighting control signal Slc, to maintain the current value of driving current ILED continually at predefined current value Ipred.

FIG. 27B illustrates variations in signal waveforms during multiple consecutive signal periods Tlc related to operating driving circuit 5330 when driving current ILED is above predefined current value Ipred. Referring to both FIG. 26 and FIG. 27B, specifically, during first signal periods Tlc shown in FIG. 27B, switching circuit PSW conducts current during pulse on time Ton1 when lighting control signal Slc is at a high level. So during pulse on time Ton1, in addition to generating driving current ILED for LED filament module 18 according to input power supply received from first filtering output terminal 5221 and second filtering output terminal 5222, conversion circuit 5332 electrically charges energy storage circuit ESE through conducting switching circuit PSW so as to gradually increase a current signal IL flowing through energy storage circuit ESE. In other words, during pulse on time Ton1, energy storage circuit ESE is electrically charged to store energy in response to the input power supply received from first filtering output terminal 5221 and second filtering output terminal 5222.

Subsequently, upon the end of pulse on time Ton1, switching circuit PSW is turned off or not conducting in response to lighting control signal Slc being at a low level. During the time that switching circuit PSW is turned off, the input power supply received from first filtering output terminal 5221 and second filtering output terminal 5222 is not provided to LED filament module 100, but instead energy storage circuit ESE discharges electrical energy to generate driving current ILED for LED filament module 100, wherein current signal IL flowing through energy storage circuit ESE gradually decreases due to the energy discharging. Therefore, even when lighting control signal Slc is at a low level, that is, when switching circuit PSW is turned off or disabled, driving circuit 5330 continues to provide electrical power to LED filament module 100 due to the energy discharging from and by energy storage circuit ESE. In other words for this case, no matter whether switching circuit PSW is turned on or turned off, driving circuit 5330 will continually provide a stable driving current ILED to LED filament module 100, wherein the current value of driving current ILED during first signal period Tlc is about 14 as shown in FIG. 27B.

During first signal period Tlc, switching control circuit 5331 judges that current value I4 of driving current ILED is above a predefined current value Ipred, according to a current detection signal Sdet. Thus upon entering into second signal period Tlc, switching control circuit 5331 adjusts the pulse on time of lighting control signal Slc into Ton2, which is equal to pulse on time Ton1 minus a unit duration t1.

During second signal period Tlc, operations of switching circuit PSW and energy storage circuit ESE are similar to their operations during previous or first signal period Tlc. The difference(s) in operations between two signal periods Tlc is mainly that since pulse on time Ton2 is shorter than pulse on time Ton1, the charging time and discharging time of energy storage circuit ESE during second signal period Tlc are shorter and longer respectively than their counterparts during first signal period Tlc, causing an average value I5 of driving current ILED provided by driving circuit 5330 during second signal period Tlc lower than current value I4 and closer to predefined current value Ipred.

Similarly, since at this stage current value I5 of driving current ILED is still above predefined current value Ipred, during third signal period Tlc switching control circuit 5331 again adjusts the pulse on time of lighting control signal Slc into Ton3, which is equal to pulse on time Ton2 minus unit duration t1 or equal to pulse on time Ton1 minus duration t2 of 2 unit durations t1. During third signal period Tlc, operations of switching circuit PSW and energy storage circuit ESE are similar to their operations during each of first two signal periods Tlc. Because pulse on time Ton3 is further shorter than pulse on time Ton2, the value of driving current ILED provided by driving circuit 5330 during third signal period Tlc is lowered to I6 approximately reaching predefined current value Ipred. Afterwards, since current value I6 of driving current ILED during third signal period Tlc has reached predefined current value Ipred, switching control circuit 5331 maintains a constant duty cycle of lighting control signal Slc, to maintain the current value of driving current ILED continually at predefined current value Ipred.

From the above descriptions of the embodiments of both FIG. 27A and FIG. 27B, it's seen that driving circuit 5330 adjusts the pulse width or pulse on time of lighting control signal Slc for each of consecutive signal periods Tlc, in a stepping manner depending on the level of driving current ILED in relation to predefined current value Ipred, to gradually bring the value of driving current ILED above or below predefined current value Ipred to approach or be closer to predefined current value Ipred, so as to realize outputting of a stable or constant current.

In addition, the above embodiments of FIG. 27A and FIG. 27B are examples of operating driving circuit 5330 in a continuous-conduction mode, wherein when switching circuit PSW is turned off energy storage circuit ESE does not discharge current to the extent that current signal IL flowing through energy storage circuit ESE decreases to zero. By using driving circuit 5330 operating in the continuous-conduction mode to provide power for the LED filament module, the electrical power provided to the LED filament module is relatively stable and is not likely to cause signal ripples.

Next are descriptions of embodiments of a control situation of operating driving circuit 5330 in a discontinuous-conduction mode. Referring to both FIG. 26 and FIG. 27C, the signal waveforms and operations of the driving circuit 5330 shown by FIG. 27C are similar to those shown by FIG. 27A. The difference(s) between the two embodiments of FIG. 27C and FIG. 27A is mainly that because driving circuit 5330 in this embodiment of FIG. 27C operates in a discontinuous-conduction mode, when switching circuit PSW is turned off or disabled by lighting control signal Slc being at a low level energy storage circuit ESE discharges current to the extent that current signal IL flowing through energy storage circuit ESE decreases to zero, followed by energy storage circuit ESE being charged again upon starting of next signal period Tlc. Apart from this difference, description of other operations of this embodiment of FIG. 27C can be referred to the above description of the embodiment of FIG. 27A and so is not repeated again.

Then referring to both FIG. 26 and FIG. 27D, the signal waveforms and operations of driving circuit 5330 shown by FIG. 27D are similar to those shown by FIG. 27B. The difference(s) between the two embodiments of FIG. 27D and FIG. 27B is mainly that because driving circuit 5330 in this embodiment of FIG. 27D operates in a discontinuous-conduction mode, when switching circuit PSW is turned off or disabled by lighting control signal Slc being at a low level energy storage circuit ESE discharges current to the extent that current signal IL flowing through energy storage circuit ESE decreases to zero, followed by energy storage circuit ESE being charged again upon starting of next signal period Tlc. Apart from this difference, description of other operations of this embodiment of FIG. 27D can be referred to the above description of the embodiment of FIG. 27B and so is not repeated again.

By using driving circuit 5330 operating in the discontinuous-conduction mode to provide power for the LED filament module, energy or power loss incurred in performing power conversion by driving circuit 5330 can be reduced, thereby resulting in a higher conversion efficiency. The following are descriptions to introduce and further explain several concrete circuit examples of driving circuit 5330.

Figure 28A:
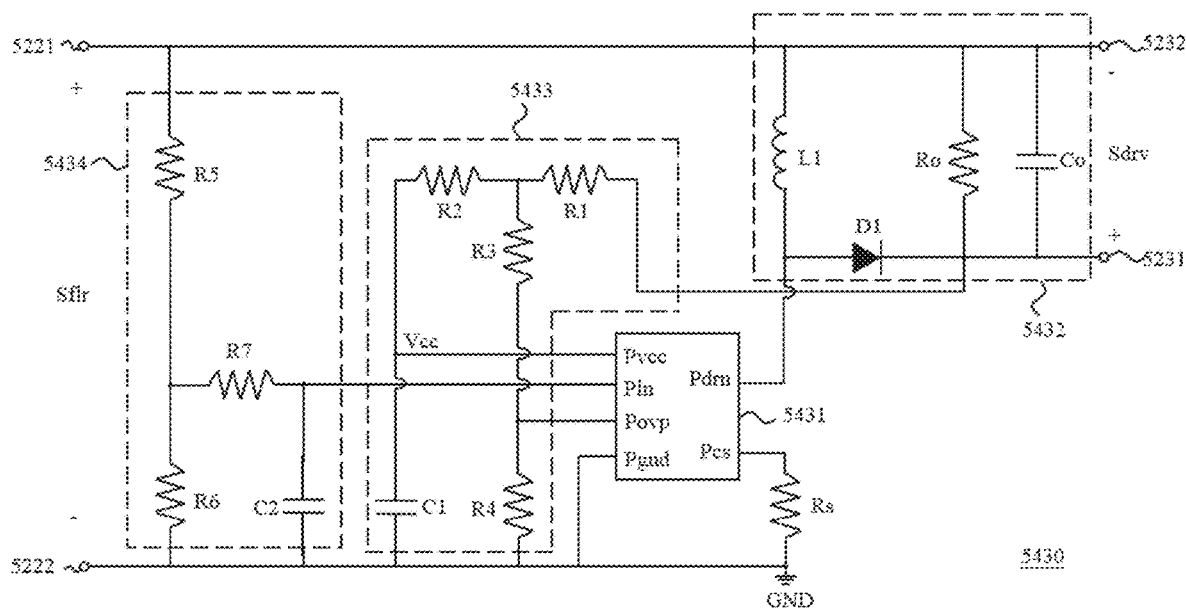
FIG. 28A is a perspective diagram of a driving circuit in accordance with an embodiment of the present invention.

FIG. 28A is a circuit diagram of a driving circuit according to some embodiments of the present invention. Referring to FIG. 28A, in this embodiment, driving circuit 5430 comprises a buck DC-to-DC converter circuit, including a controller 5431, an output circuit 5432, a biasing circuit 5433 and a sampling circuit 5434. Driving circuit 5430 is coupled to first filtering output terminal 5221 and second filtering output terminal 5222 to convert received filtered signal Sflr to driving power Sdrv for driving the LED filament module coupled between first and second driving output terminals 5231 and 5232.

Controller 5431 includes for example an integrated-circuit chip, which has a drain-terminal or drain pin Pdrn, a source-terminal or source pin Pcs, an power pin Pvcc, a voltagesampling pin Pln, an overvoltage protection pin Povp, and a ground pin Pgnd. Drain pin Pdrn is coupled to output circuit 5432. Source pin Pcs is coupled to second filtering output terminal 5222 and ground terminal GND through a resistor Rs. Power pin Pvcc and overvoltage protection pin Povp are coupled to biasing circuit 5433. Voltage sampling pin Pln is coupled to sampling circuit 5434. And ground pin Pgnd is coupled to second filtering output terminal 5222 and ground terminal GND.

In this embodiment of FIG. 28A, the above-mentioned switching circuit or power switch (PSW) of conversion circuit 5332 is for example integrated in controller 5431, and has first and second terminals electrically connected to drain pin Pdrn and source pin Pcs respectively. Therefore, controller 5431 can determine current conduction or cutoff at or through drain pin Pdrn, source pin Pcs, and/or corresponding current path(s), by controlling switching of its internal switching circuit between, or into one of, conduction and cutoff states. In some other embodiments, the above-mentioned switching circuit is a discrete device disposed external to controller 5431. In applications using a discrete device as switching circuit, definitions or connection-structure of pins of controller 5431 would be adjusted accordingly, such as setting drain pin Pdrn as a pin to be electrically connected to a control terminal of the discrete switching circuit instead and for providing a lighting control signal.

Output circuit 5432 includes a diode D1, an inductor L1, a capacitor Co, and a resistor Ro, wherein inductor L1 and capacitor Co act as (part of) the energy storage circuit (ESE) of conversion circuit 5332. Diode D1 acts as a freewheeling diode; has its anode coupled to drain pin Pdrn of controller 5431 so as to be coupled through drain pin Pdrn to the first or drain terminal of the switching circuit (PSW) within controller 5431; and has its cathode coupled to first driving output terminal 5231 Inductor L1 has a first end coupled to the anode of the diode D1 and the drain pin Pdrn of the controller 5431, and has a second end coupled to first filtering output terminal 5221 and second driving output terminal 5232. Resistor Ro and capacitor Co are electrically connected in parallel and coupled between first and second driving output terminals 5231 and 5232. In this embodiment, first filtering output terminal 5221 and second driving output terminal 5232 can be regarded as the same terminal.

In this embodiment of FIG. 28A, the controller 5431 is configured to control current conduction or cutoff on a path between drain pin Pdrn and source pin Pcs. When there is current conduction on the path between drain pin Pdrn and source pin Pcs, a current flows from first filtering output terminal 5221 into driving circuit 5430, and flows through inductor L1 and drain pin Pdrn into controller 5431, and then flows through source pin Pc and second filtering output terminal 5222 to ground terminal GND. In this case of current conduction, the current flowing through inductor L1 increases with time and causes inductor L1 to be in a state of storing electrical energy; while the voltage across capacitor Co decreases with time and causes capacitor Co to be in a state of releasing electrical energy in order to maintain the LED filament module as emitting light. On the other hand, when the path between drain pin Pdrn and source pin Pcs is in a cutoff state or not conducting current, inductor L1 is in a state of releasing or discharging electrical energy and the current flowing through inductor L1 decreases with time. In this cutoff case the current flowing through inductor L1 flows through diode D1, first driving output terminal 5231, the LED filament module, second driving output terminals 5232, and then back to inductor L1, forming a current flyback; and capacitor Co is in a state of storing electrical energy with its voltage increasing with time.

It should be noted that capacitor Co may be omitted. When capacitor Co is omitted, and there is current conduction on the path between drain pin Pdrn and source pin Pcs, a current flowing through inductor L1 doesn't flow through first filtering output terminal 5221 and second driving output terminal 5232, so the LED filament module does not emit light. But when the path between drain pin Pdrn and source pin Pcs is in a cutoff state, a current flowing through inductor L1 flows through freewheeling diode D1 to the LED filament module to cause the LED filament to emit light. By adjusting or controlling the duration of light emission by the LED filament and the magnitude of current flowing through the LED filament module, an average luminance of the emitted light stable above a defined value can be achieved, so as to achieve a favorable function of emitting stable light. Apart from the above, since driving circuit 5430 of this embodiment takes a non-isolation power-conversion structure, feedback control, if any, of switching circuit or power switch (PSW) performed by controller 5431 may be based on detecting a magnitude of current flowing through the switching circuit or power switch.

In another aspect, driving circuit 5430 keeps the current flowing through the LED module without variety, so for some LED modules (for example, white, red, blue and green LED modules), it can be improved that color temperature changes with current. In other words, the LED module can keep color temperature constant under different current intensity. Inductor L1 which serves as an energy storage circuit releases stored energy when the switching circuit turns off. This makes not only the LED filament keep lighting but also the current in the LED filament does not suddenly drop to the lowest value. When the switching circuit turns on again, it is unnecessary that both current and voltage goes from the lowest value to the highest value. Thereby, discontinuous lighting of LED filament can be avoided to cause the luminance of the LED filament being varied, to decrease the lowest conducting cycle and to raise the driving frequency.

Biasing circuit 5433 includes capacitor C1 and resistors R1-R4. A first end of capacitor C1 is electrically connected to power pin Pvcc. A second end of capacitor C1 is electrically connected to second filtering output terminal 5222 and ground terminal GND. A first end of resistor R1 is electrically connected second driving output terminal 5232. A first end of resistor R2 is electrically connected to a second end of resistor R1. A second end of resistor R2 is electrically connected to the first end of capacitor C1 and power pin Pvcc. A first end of resistor R3 is electrically connected a second end of resistor R1 and the first end of resistor R2. A second end of resistor R3 is electrically connected to overvoltage protection pin Povp of controller 5431. A first end of resistor R4 is electrically connected to the second end of resistor R3. A second end of resistor R4 is electrically connected to both second filtering output terminal 5222 and ground terminal GND.

Resistors R1 and R2 acquire a voltage of second driving output terminal 5232 to generate working voltage Vcc. Working voltage Vcc is stabilized by capacitor C1 and transmitted to power pin Pvcc for being used by controller 5431. Resistors R3 and R4 acquire or sample a voltage of second driving output terminal 232 by voltage division so that controller 5431 can determine if the overvoltage protection function should be executed or not according to the voltage of overvoltage protection pin Povp.

Sampling circuit 5434 includes capacitor C2 and resistors R5-R7. A first end of capacitor C2 is electrically connected to voltage sampling pin Pln. A second end of capacitor C2 is electrically connected to both second filtering output terminal 5222 and ground terminal GND. A first end of resistor R5 is electrically connected to both first filtering output terminal 5221 and second driving output terminal 5232. A first end of resistor R6 is electrically connected to a second end of resistor R5. A second end of resistor R6 is electrically connected to both second filtering output terminal 5222 and ground terminal GND. A first end of resistor R7 is electrically connected to both the second end of resistor R7 and the first end of resistor R6. A second end of resistor R7 is electrically connected to both voltage sampling pin Pln and the first end of capacitor C2.

Resistors R5 and R6 acquire or sample a voltage of the power line (i.e. the voltage of first filtering output terminal 5221) by voltage division. The sampled voltage is transmitted to voltage sampling pin Pln of controller 5431 through resistor R7. Capacitor C2 is used for stabilizing a voltage of voltage sampling pin Pin.

Figure 28B:
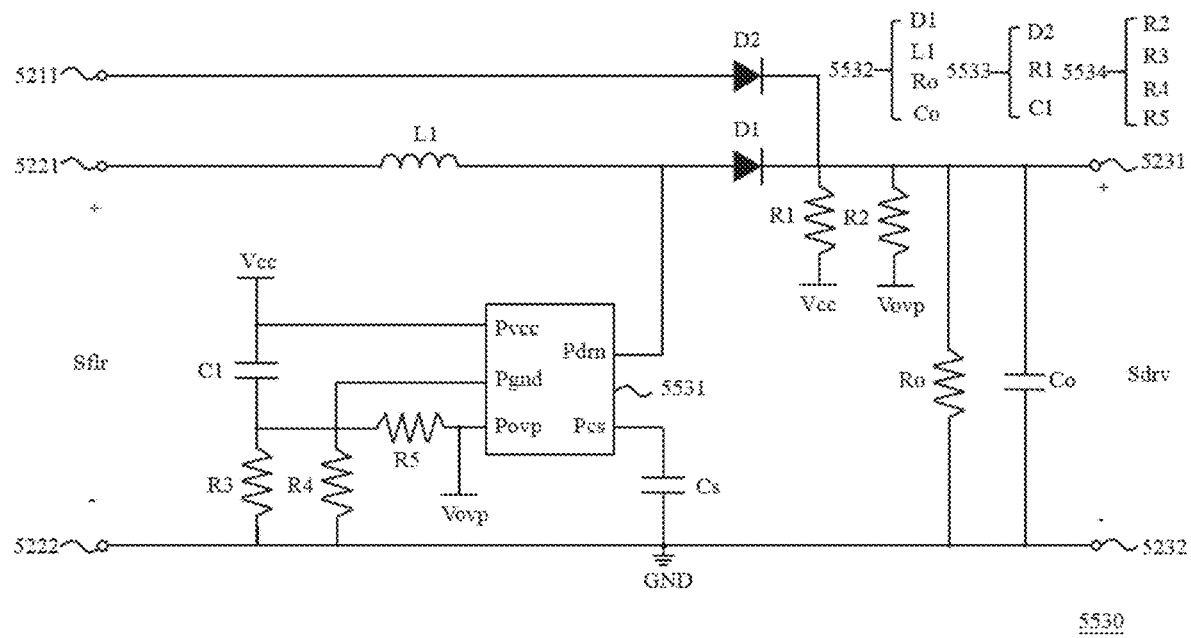
FIG. 28B is a perspective diagram of a driving circuit in accordance with another embodiment of the present invention.

Please refer to FIG. 28B, which is a schematic circuit diagram of the driving circuit according to some embodiments of the present invention. In this embodiment, a boost DC-to-DC converter serves as the driving circuit 5530 as an example, which includes controller 5531, output circuit 5532, biasing circuit 5533 and sampling circuit 5534. The driving circuit is electrically connected to both first filtering output terminal 5221 and second filtering terminal 5222 for converting the received filtered signal Sflr into a driving power Sdrv to drive the LED filament module electrically connected between first and second driving output terminals 5231 and 5232. In addition, driving circuit 5530 is further electrically connected to first rectifying output terminal 5211 for acquiring voltage of the power line (or bus line) to generate working voltage Vcc.

Controller 5531 may be an integrated circuit or a chip including drain pin Pdrn, source pin Pcs, power pin Pvcc, overvoltage protection pin Povp and ground pin Pgnd. Drain pin Pdrn is electrically connected to output circuit 5532. Source pin Pcs is electrically connected to second filtering output terminal 5222, second driving output terminal 5532 and ground terminal GND through capacitor Cs. Power pin Pvcc is electrically connected to biasing circuit 5533. Overvoltage protection pin Povp is electrically connected to sampling circuit 5534. Ground pin Pgnd is electrically connected to both biasing circuit 5533 and sampling circuit 5534.

In this embodiment, the switching circuit/power switch (PSW) may be integrated in controller 5531, and the first end and the second end of the switching circuit are electrically connected to drain pin Pdrn and source pin Pcs, respectively. In other words, controller 5531 can determine switch-on or switch-off of a current path related to drain pin Pdrn and source pin Pcs by controlling the switching state of the switching circuit within controller 5531. In other embodiments, the switching circuit may also be a discrete element which is not integrated into controller 5531. Under such a situation using a discrete element as a switching circuit, definition of pinout of controller 5531 will be correspondingly adjusted. For example, drain pin Pdrn can be adjusted to connect to a control end of the switching circuit and to serve as a pin providing a lighting control signal.

Output circuit 5532 includes diode D1, inductor L1, capacitor Co and resistor Ro. Both inductor L1 and capacitor C1 serve as an energy storage circuit (ESE) of the converting circuit. Diode D1 serves as a freewheeling diode, whose anode is electrically connected to drain pin Pdrn of controller 5531 by connecting drain pin Pdrn to the first end/drain of the switching circuit in controller 5531. The cathode of diode D1 is electrically connected to first driving output terminal 5231. The first end of inductor L1 is electrically connected to first filtering output terminal 5221. The second end of inductor L1 is electrically connected to both drain pin Pdrn of controller 431 and the anode of diode D1. Resistor Ro and capacitor Co are electrically connected in parallel and electrically connected between first driving output terminal 5231 and second driving output terminal 5232. In this embodiment, first filtering output terminal 5221 is electrically connected to first driving output terminal 5231 via both diode D1 and inductor L1.

Controller 5531 controls switch-on and switch-off between drain pin Pdrn and source pin Pcs. When circuit between drain pin Pdrn and source pin Pcs is switched on, current will flow in first filtering output terminal 5521 to controller 5531 via inductor L1 and drain pin Pdrn, and finally flow to ground terminal GND via source pin Pcs, capacitor Cs and second filtering output terminal 5222. At this time, current flowing through inductor L1 increases with time and inductor L1 is in a status of energy storing. Meanwhile, capacitor Co is in a status of energy releasing to drive the LED filament module to emit light. When drain pin Pdrn and source pin Pcs are switched off, inductor L1 is in a status of energy releasing, and the current in inductor L1 decreases with time. The current in inductor L1 flows to capacitor Co and the LED filament via diode D1. At this time, capacitor Co is in a status of energy storing.

It is noted that capacitor Co may be omitted. When capacitor Co is omitted and drain pin Pdrn and source pin Pcs are switched on, the current in inductor L1 does not flow through first driving output terminal 5231 and second driving output terminal 5232 to make the LED filament module not light. When drain pin Pdrn and source pin Pcs are switched off, the current in inductor L1 flows to the LED filament module via freewheeling diode D1 to light up the LED filament. By controlling lighting time of the LED filament and magnitude of the current flowing therethrough, the average intensity of the LED filament can be stabilized at a predetermined value to obtain an effect of identically stable lighting.

Biasing circuit 5533 includes diode D2, capacitor C1 and resistor R1. The anode and the cathode of diode D1 are electrically connected to first rectifying output terminal 5211 and first driving output terminal 5231, respectively. The first end and the second end of capacitor C1 are electrically connected to power pin Pvcc and ground pin Pgnd, respectively. The first end of resistor R1 is electrically connected to cathodes of diodes D1 and D2 and first driving output terminal 5231. The second end of resistor R1 is electrically connected to the first end of capacitor C1 and power pin Pvcc. Resistor R1 acquires a voltage of first driving output terminal 5231 to generate a working voltage Vcc. Working voltage Vcc is stabilized by capacitor C1 and transmitted to power pin Pvcc of controller 5431 for being used by controller 5431.

Sampling circuit 5534 includes resistor R2-R5. The first end and the second end of resistor R2 are electrically connected to first driving output terminal 5231 and overvoltage protection pin Povp, respectively. Resistors R3 and R4 are electrically connected in parallel. The first ends of resistors R3 and R4 are electrically connected to ground pin Pgnd. The second ends of resistors R3 and R4 are electrically connected to second filtering output terminal 5222, second driving output terminal 5232 and ground terminal GND. The first end and the second end of resistor R5 are electrically connected to ground pin Pgnd and both the second end of resistor R2 and overvoltage protection terminal Povp.

Resistors R2 to R5 acquire or sample a voltage of the output voltage (i.e. the voltage of first driving output terminal 5231) by voltage division. The sampled voltage is transmitted to overvoltage protection pin Povp of controller 5531. As a result, controller 5531 can determine if the overvoltage protection function should be executed or not according to a voltage of overvoltage protection pin Povp.

Additionally, driving circuits 5430, 5530 is shown by a single-stage DC-to-DC power conversion circuit as an example, but not limited to this. For example, driving circuit 5330 can be a two-stage power conversion circuit which includes an active power factor correction circuit and a DC-to-DC converter.

Figure 29:
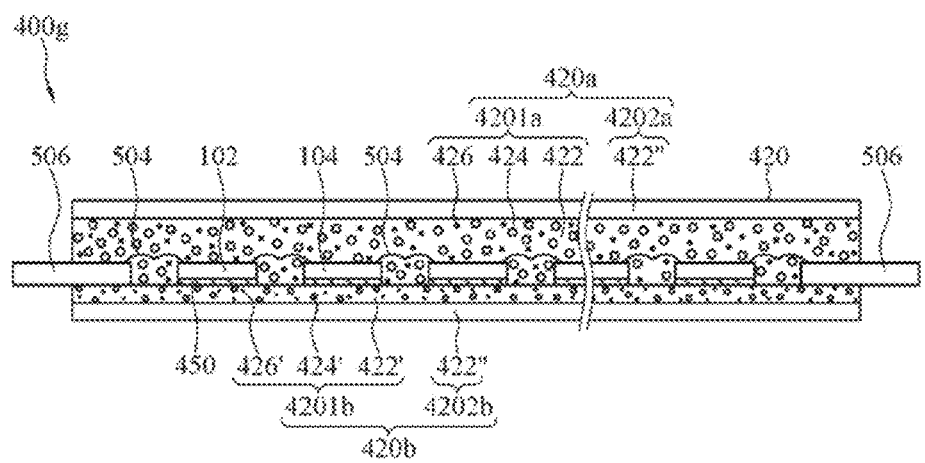
FIG. 29 is a cross-sectional view of an LED filament according to an embodiment of the present disclosure.
Figure 47:
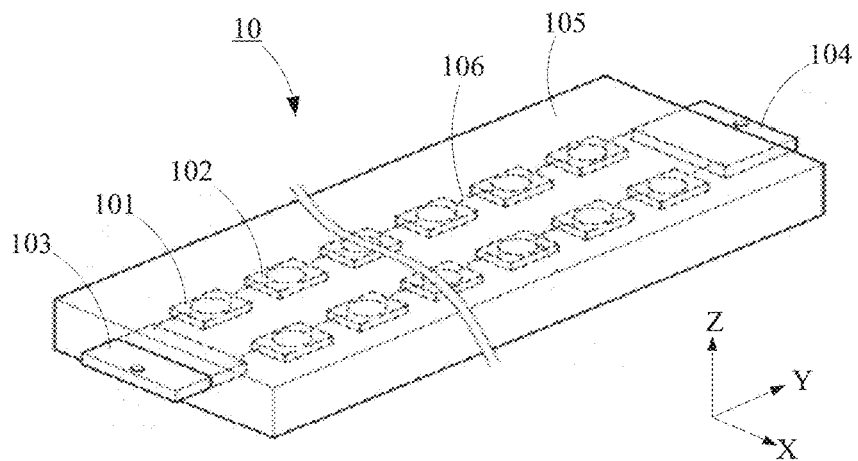

Please refer to FIG. 47. FIG. 47 illustrates a cross-sectional view of an LED filament 400g according to an embodiment of the present disclosure. Please refer to FIG. 29. FIG. 29 illustrates a cross-sectional view of an LED filament 400g according to an embodiment of the present disclosure. As shown in FIG. 29, in the embodiment, the LED filament 400g is analogous to and can be referred to the LED filament 100 comprising the top layer 420a and the base layer 420b. A difference between the LED filament 400g and 100 is that the top layer 420a of the LED filament 400g is further divided into two layers, a phosphor glue layer 4201a and a transparent layer 4202a. The phosphor glue layer 4201a may be the same as the top layer 420a and comprises an adhesive 422, phosphors 424, and inorganic oxide nanoparticles 426. The transparent layer 4202a comprises an adhesive 422" only. The transparent layer 4202a may be of highest transmittance than other layers and can protect the phosphor glue layer 4201a. In some embodiments (not shown), the transparent layer 4202a encloses the phosphor glue layer 4201a, i.e., all sides of the phosphor glue layer 4201a except the one adjacent to the phosphor film layer 4201b are covered by the transparent layer 4202a.

In addition, the base layer 420b of the LED filament 400g is further divided into two layers, a phosphor glue layer 4201b and a transparent layer 4202b. The phosphor glue layer 4201b may be the same as the base layer 420b and comprises an adhesive 422', phosphors 424', and inorganic oxide nanoparticles 426'. The transparent layer 4202b comprises an adhesive 422" only. The transparent layer 4202b may be of highest transmittance than other layers and can protect the phosphor glue layer 4201b. In some embodiments (not shown), the transparent layer 4202b encloses the phosphor glue layer 4201b, i.e., all sides of the phosphor glue layer 4201b except the one adjacent to the phosphor film layer 4201a are covered by the transparent layer 4202b.

The transparent layers 4202a, 4202b not only protect the phosphor glue layer 4201a and the phosphor film layer 4201b but also strengthen the whole structure of the LED filament. Preferably, the transparent layers 4202a, 4202b may be thermal shrink film with high transmittance.

In some embodiments, the transparent layers 4202a, 4202b may be analogous to the aforementioned external transparent layer enclosing the entire enclosure (e.g., the phosphor film layers 4201a, 4201b) of the LED filament 400g and defines segments by distinct refractive indexes on the axial direction of the LED filament 400g. That is to say, the transparent layers 4202a, 4202b may have different compositions with different refractive indexes on different portions on the axial direction of the LED filament 400g.

In another embodiment, the aforementioned external transparent layer (e.g., the transparent layers 4202a, 4202b of FIG. 29) may be divided into segments on the axial direction of the LED filament by their thickness. The thickness of the external transparent layers of the segments of the LED filaments on the axial direction of the LED filament may be different from one another. The thickness of the external transparent layers of the segments of the LED filaments may be symmetric in the top view or in the side view. The symmetric thickness can be referred to the above discussion regarding the symmetric refractive indexes and the symmetric surface roughness.

As shown in FIG. 30 to FIG. 36, FIG. 37A to FIG. 37C, and FIG. 38A to FIG. 38E, an LED filament includes a light conversion layer 220/420, LED chip units 202/204 (or LED sections 402/404), and electrodes (or conductive electrodes) 210, 212/410, 412. The light conversion layer 220/420 wraps the LED chip units 202/204 (or LED sections 402/404) and parts of the electrodes (or conductive electrodes) 210, 212/410, 412, and parts of the electrodes (or conductive electrodes) 210, 212/410, 412 are exposed outside the light conversion layer 220/420, the adjacent LED chip units 202, 204 (or LED sections 402, 404) are electrically connected to each other, and the LED chip units 202/204 (or LED sections 402/404) and the electrodes (or conductive electrodes) 210, 212/410, 412 are electrically connected. The LED filament includes at least two LED chips 442, the two adjacent LED chips 442 are electrically connected to each other, the LED chip units 202/204 (or LED sections 402/404) include at least one LED chip 442 with an upper surface and a lower surface opposite to each other, the light conversion layer 420 includes a top layer 420a and a carrying layer, and the top layer 420a and the carrying layer may separately be a layered structure having at least one layer. The layered structure may be selected from: a phosphor glue with high plasticity (relative to a phosphor film), a phosphor film with low plasticity, a transparent layer, or any combination of the three. The phosphor glue/phosphor film includes the following components: organosilicon-modified polyimide and/or glue. The phosphor glue/phosphor film may also include phosphor and inorganic oxide nanoparticles (or heat dissipation particles). The transparent layer may be composed of light-transmitting resin (such as silica glue and polyimide) or a combination thereof. The glue may be, but is not limited to, silica glue. In one embodiment, materials of the top layer 420a and the carrying layer are the same. In one embodiment, the carrying layer includes a base layer, and in the height direction of the LED filament, the height of the top layer is greater than the height of the base layer. The base layer includes an upper surface and a lower surface opposite to each other, and the top layer includes an upper surface and a lower surface opposite to each other, where the upper surface of the base layer is in contact with a part of the lower surface of the top layer; the upper surface of the LED chip is close to the upper surface of the top layer relative to the lower surface of the LED chip, and the distance from the lower surface of the LED chip to the lower surface of the base layer is less than the distance from the lower surface of the LED chip to the upper surface of the top layer, because the thermal conductivity of the top layer is greater than the thermal conductivity of the base layer, and the heat transfer from the LED chip to the outer surface of the base layer is shorter, so the heat is not easy to collect, and the heat dissipation effect of the LED filament is good. In one embodiment, if the LED filament is supplied with electrical power no more than 8 W, when the LED filament is lit, at least 4 lm luminous flux of light is emitted every millimeter of a LED filament length on average or a filament body length on average or a top layer length on average. In one embodiment, there are at least two LED chips every millimeter of a LED filament length on average or a filament body length on average or a top layer length on average. In an environment at 25° C., the temperature of the LED filament is not greater than the junction temperature when the LED filament is lit for 15,000 h.

Figure 30:
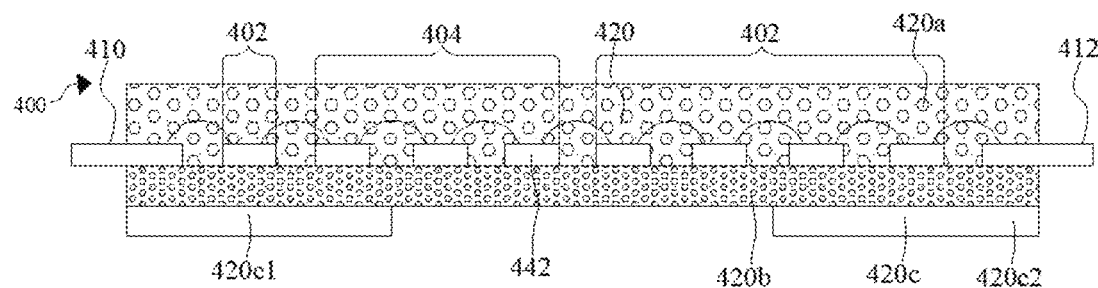
FIG. 30 is a schematic structural diagram of another embodiment of an LED filament according to this application.

FIG. 30 is a schematic structural diagram of an embodiment of an LED filament according to this application. An LED filament 400 includes: a light conversion layer 420, LED sections 402/404, and electrodes 410/412. The LED sections 402/404 have at least one LED chip 442. In the LED filament, the two adjacent LED chips are electrically connected to each other, and the LED chips and the electrodes 410/412 are electrically connected. For example, the electrical connection may be achieved by using a circuit film or a first conductive wire in FIG. 31 described below. The light conversion layer 420 includes a top layer 420a and a carrying layer, the carrying layer includes a base layer 420b and a transparent layer 420c, and the base layer 420b is located between the top layer 420a and the transparent layer 420c (at least located on a certain section of the LED filament 400). In one embodiment, the base layer 420b includes an upper surface and a lower surface opposite to each other, the upper surface of the base layer 420b is in contact with a part of the top layer 420a, and the lower surface of the base layer 420b is in contact with the transparent layer 420c. In some embodiments, a part of the lower surface of the base layer 420b is in contact with the transparent layer 420c, and the transparent layer 420c supports a part of the base layer 420b, thereby enhancing the strength of the base layer 420b and facilitating die bonding, and the part of the base layer 420b that is not covered by the transparent layer 420c can allow heat generated by some LED chips 442 to be directly dissipated through the base layer 420b. In this embodiment, the total length of the base layer 420b is the same as the total length of the top layer 420a. In one embodiment, the total length of the transparent layer 420c is 5-100% of the total length of the base layer 420b. In one embodiment, the length of the transparent layer 420c is less than that of the base layer 420b, the total length of the transparent layer 420c is 10-80% of the total length of the base layer 420b. In one embodiment, the total length of the transparent layer 420c is 10-50% of the total length of the base layer 420b. When the LED filament is thinner (for example, the width of the LED filament is ≤120 μm), the heat dissipation area of the LED chips 442 is relatively reduced. By providing the transparent layer 420c located below the base layer 420b, on the one hand, the deformation of the base layer 420b caused by heating can be reduced; and on the other hand, the transparent layer 420c can assist in supporting the LED chips 442, helping die bonding. In one embodiment, the transparent layer 420c includes a first transparent layer 420c1 and a second transparent layer 420c2. The first transparent layer 420c1 and the second transparent layer 420c2 both extend in the length direction of the LED filament 400. The first transparent layer 420c1 extends from one end of the base layer 420b, the second transparent layer 420c2 extends from the other end of the base layer 420b, and the extending direction of the first transparent layer 420c1 is opposite to the extending direction of the second transparent layer 420c2. In one embodiment, the light conversion layer 420 has a first end and a second end opposite to the first end. In one embodiment, the LED chips 442 are located between the first end and the second end of the light conversion layer 420. If the LED chip 442 closest to the first end is denoted as LED chip n1, then LED chips from the first end to the second end are sequentially LED chip n2, LED chip n3, . . . , and LED chip nm, where m is an integer and m≤800. In one embodiment, the value of m is 50≤m≤300. In the length direction of the LED filament 400, the length of the first transparent layer 420c1/the second transparent layer 420c2 is at least greater than the distance from the first end of the light conversion layer 420a to the LED chip n2. There is a gap between the first transparent layer 420c1 and the second transparent layer 420c2. In the length direction of the LED filament 400, the distance between the first transparent layer 420c1 and the second transparent layer 420c2 is greater than the length of the first transparent layer 420c1 and/or the second transparent layer 420c2. When the LED filament 400 is bent, the electrode 410/412 is prone to be separated from the light conversion layer 420, or the part where the light conversion layer 420 is in contact with the electrode 410/412 is prone to cracks. The first transparent layer 420c1 and the second transparent layer 420c2 can perform structural reinforcement on the part where the light conversion layer 420 is in contact with the electrodes 410,412, which prevents the part where the light conversion layer 420 is in contact with the electrodes 410,412 from cracks.

Figure 31:
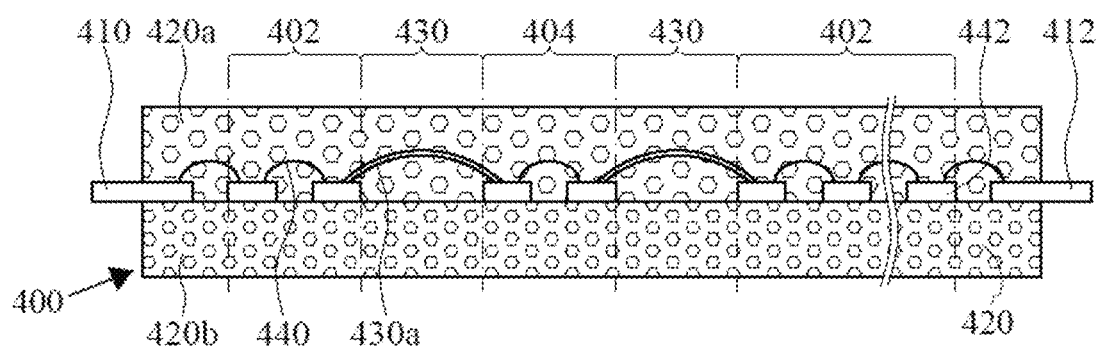
FIG. 31 is a schematic structural diagram of another embodiment of an LED filament according to this application.
Figure 32:
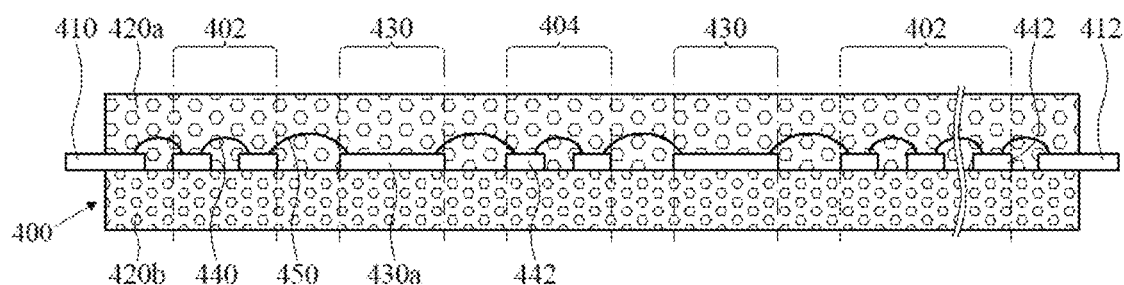
FIG. 32 is a schematic structural diagram of another embodiment of an LED filament according to this application.

FIG. 31 is a schematic structural diagram of another embodiment of an LED filament according to this application. As shown in FIG. 32, an LED filament 400 includes: a light conversion layer 420, LED sections 402, 404, electrodes 410, 412, and conductive sections 430 configured to electrically connect two adjacent LED sections 402, 404. The LED sections 402, 404 include at least two LED chips 442, and two adjacent LED chips 442 are electrically connected to each other by a first conductive wire 440. In this embodiment, the conductive section 430 includes a conductor 430a connecting the LED sections 402, 404. The shortest distance between two LED chips 442 respectively located in two adjacent LED sections 402, 404 is greater than the distance between two adjacent LED chips 442 in the LED section 402/404, and the length of the first conductive wire 440 is less than the length of the conductor 430a. Therefore, it is ensured that, when bending occurs between the two LED sections 402, 404, the conductive section 430 is not easily broken due to the stress generated. The light conversion layer 420 is coated on at least two sides of the LED chips 442/the electrodes 410, 412. Parts of the electrodes 410, 412 are exposed outside the light conversion layer 420. The light conversion layer 420 has a top layer 420a and a carrying layer as an upper layer and a lower layer of the LED filament 400 respectively. In this embodiment, the carrying layer includes a base layer 420b, and the base layer 420b includes an upper surface and a lower surface opposite to the upper surface. The upper surface of the base layer 420b is close to the top layer 420a relative to the lower surface of the base layer 420b. The LED sections 402/404 and parts of the electrodes 410/412 are disposed on the upper surface of the base layer 420b, or at least one side of the LED sections 402/404 is in contact (direct contact or indirect contact) with the upper surface of the base layer 420b.

As shown in FIG. 32, in this embodiment, the conductive section 430 is also located between the two adjacent LED sections 402, 404, and a plurality of the LED chips 442 in the LED sections 402, 404 are electrically connected to each other by the first conductive wires 440. However, the conductor 430a in the conductive section 430 in FIG. 32 is not in the form of a conductive wire but in a sheet or film form. In some embodiments, the conductor 430a may be copper foil, gold foil, or other materials that can perform electrical conduction. In this embodiment, the conductor 430a is attached to the surface of the base layer 420b and adjacent to the top layer 420a, that is, located between the base layer 420b and the top layer 420a. Moreover, the conductive section 430 and the LED sections 402, 404 are electrically connected by second conductive wires 450, that is, the two LED chips 442 respectively located in two adjacent LED sections 402, 404 and having the shortest distance from the conductive section 430 are electrically connected to the conductor 430a in the conductive section 430 by the second conductive wires 450. The length of the conductive section 430 is greater than the distance between two adjacent LED chips 442 in one LED section 402/404, and the length of the first conductive wire 440 is less than the length of the conductor 430a. This design ensures that the conductive section 430 has good bendability because the conductive section 430 has a relatively long length. Assuming that a maximum thickness of the LED chip 442 in the radial direction of the filament is H, the thickness of the electrodes 410, 412 and the conductor 430a in the radial direction of the LED filament is 0.5H to 1.4H, preferably 0.5H to 0.7H. Due to the height difference between the LED chip 442 and the electrode 410/412, the LED chip 442 and the conductor 430a, it can ensure the wire bonding process can be carried out while ensures the quality of the wire bonding process (that is, having good strength), thereby improving the stability of the product.

Figure 33:
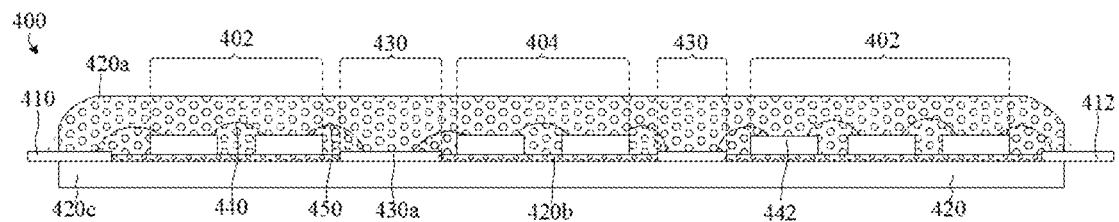
FIG. 33 to FIG. 35B are schematic structural diagrams of a plurality of embodiments of an LED filament according to this application.

As shown in FIG. 33, an LED filament 400 includes: a light conversion layer 420, LED sections 402, 404, electrodes 410, 412, and conductive sections 430 configured to electrically connect two adjacent LED sections 402, 404. The LED section 402, 404 includes at least one LED chip 442. The conductive section 430 and the LED section 402, 404 are electrically connected by a second conductive wire 450, that is, the two LED chips 442 respectively located in two adjacent LED sections 402, 404 and having the shortest distance from the conductive section 430 are electrically connected to the conductor 430a in the conductive section 430 by the second conductive wires 450. The LED chips 442 are electrically connected to each other by the first conductive wire 440. The conductive section 430 includes the conductor 430a connecting the LED sections 402, 404. For example, the conductor 430a is a conductive metal sheet or metal strip, such as a copper sheet or an iron sheet. The shortest distance between two LED chips 442 respectively located in two adjacent LED sections 402, 404 is greater than the distance between two adjacent LED chips 442 in the LED section 402/404, and the length of the first conductive wire 440 is less than the length of the conductor 430a. Therefore, it is ensured that, when bending occurs between the two LED sections 402,404, the conductive section 430 has a large force area, and the conductive section 430 is not easily broken due to the stress generated. The light conversion layer 420 covers at least two sides of the LED chips 442/the electrodes 410, 412. Parts of the electrodes 410, 412 are exposed outside the light conversion layer 420. The light conversion layer 420 includes a top layer 420a and a carrying layer, the carrying layer includes a base layer 420b and a transparent layer 420c, and the base layer 420b is located between the top layer 420a and the transparent layer 420c. The base layer 420b and the top layer 420a cover at least two sides of the LED chips 442. The thermal conductivity of the transparent layer 420c is greater than the thermal conductivity of the base layer 420b. The thickness of the base layer 420b in the radial direction of the LED filament 400 is less than or equal to the thickness of the conductor 430a in the radial direction of the LED filament 400. When the LED filament is thinner (for example, the width of the LED filament is ≤120 μm), the heat dissipation area of the LED chips is relatively reduced. By providing the transparent layer 420c located below the base layer 420b, on the one hand, the deformation of the base layer 420b caused by heating can be reduced, and on the other hand, the transparent layer 420c can assist in supporting the LED chips 442, helping die bonding. For example, the transparent layer 420c may be a hard substrate such as an alumina ceramic plate or a sapphire substrate, or a soft substrate with high thermal conductivity (for example, the thermal conductivity ≥2.0 (W/(m·K))). A translucent alumina ceramic plate or a transparent sapphire substrate facilitates the penetration of the light emitted by the LED chips 442 toward the transparent layer 420c, thereby realizing omnidirectional light of the LED filament 400. In this embodiment, the top layer 420a, the base layer 420b, and the transparent layer 420c wrap the conductor 430a. On one hand, the impact of the external environment on the conductor 430a is reduced, and on the other hand, the carrying capacity of the conductor 430a in electrical connection is improved, and the stability of the electrical connection when the conductor 430a is bent is improved. In some embodiments, the thickness of the base layer 420b in the height direction of the LED filament 400 is less than or equal to the thickness of the conductor 430a in the height direction of the LED filament 400. The heat conduction path of the heat generated by the LED chips 442 to the transparent layer 420c is short, improving the heat dissipation effect of the LED filament 400. In other embodiments, the thickness of the transparent layer 420c in the height direction of the LED filament 400 is greater than the thickness of the base layer 420b in the height direction of the LED filament 400. The heat conduction path of the heat generated by the LED chips 442 to the transparent layer 420c is short, such that the heat dissipation effect of the LED filament 400 is improved. In some embodiments, the absolute value of the height difference between the LED chip 442 and the conductor 430a in the height direction of the LED filament 400 is greater than the height of the LED chip 442 in the height direction of the LED filament 400. When the LED filament 400 is bent, the second conductive wire 450 is less deformed after being stretched under force, and the second conductive wire 450 is not prone to be broken. In some embodiments, the base layer 420b is in contact with at least one side of the LED chips 442 and one side of the conductive section 430. In this embodiment, the LED chips 442 and the conductors 430a are located on different sides of the base layer 420b.

Figure 34:
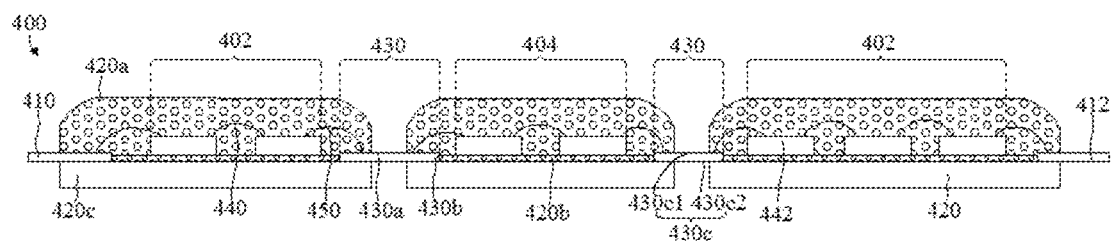
Figure 35A:
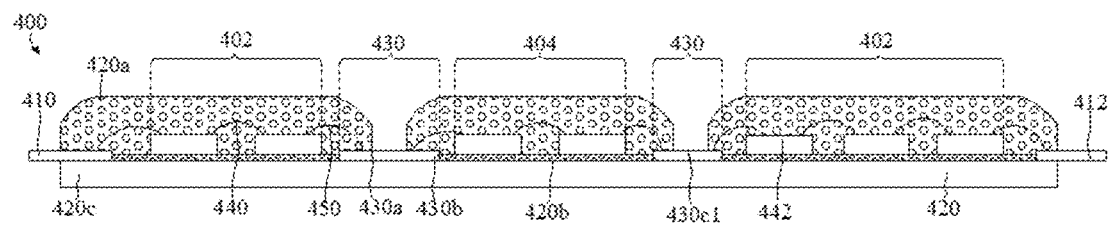
Figure 35B:
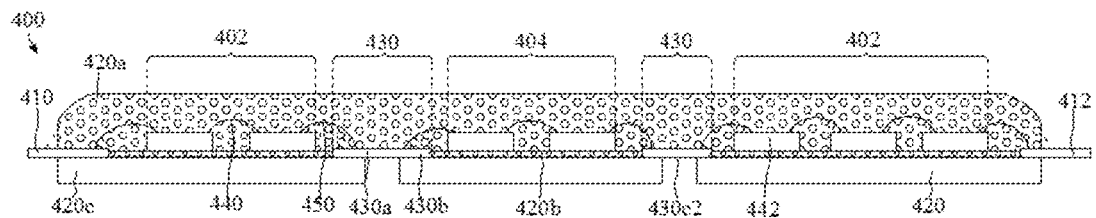

Referring to FIG. 34 to FIG. 35B, in some embodiments, the conductor 430a includes a covering portion 430b and an exposed portion 430c, and the length of the exposed portion 430c in the axial direction of the LED filament 400 is less than the distance between adjacent LED chips 442 in any LED section 402/404. When the LED filament 400 is bent, the exposed portion 430c is slightly deformed under force with a small bending region and a small deformation degree, which is beneficial to keeping a bending shape of the LED filament 400. As shown in FIG. 34, the exposed portion 430c includes a first exposed portion 430c1 and a second exposed portion 430c2, the portion of the top layer 420a where the conductor 430a is exposed is the first exposed portion 430c1, and the portion of the transparent layer 420c where the conductor 430a is exposed is the second exposed portion 430c2. The length of the first exposed portion 430c1 in the axial direction (length direction) of the LED filament 400 is greater than or equal to the length of the second exposed portion 430c2 in the axial direction of the LED filament 400 to ensure the stability of the electrical connection and the uniform force when the conductor 430a is bent. As shown in FIG. 35A, the exposed portion only includes the first exposed portion 430c1. The length of the first exposed portion 430c1 in the axial direction of the LED filament is less than or equal to the distance between adjacent LED chips in any LED section 402/404. When the LED filament 400 is bent, the stress generated during the bending is concentrated on the conductive section 430, which reduces the risk of breakage of the conductive wires 440 connecting adjacent LED chips 442. As shown in FIG. 35B, the exposed portion only includes the second exposed portion 430c2, which can relieve stress concentration of the conductors 430a. The length of the second exposed portion 430c2 in the axial direction of the LED filament 400 is less than or equal to the distance between adjacent LED chips 442 in any LED section 402/404. Since a part of the conductors 430a are located between adjacent transparent layers 420c, the stability of the support of the transparent layers 420c to the conductors 430a can be ensured.

Figure 36:
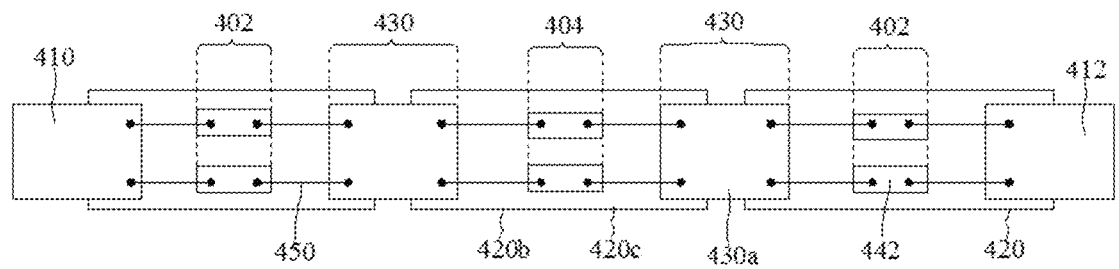
FIG. 36 is a top view of an embodiment of an LED filament with a top layer removed according to this application.

Referring to FIG. 36, an LED filament 400 has: a light conversion layer 420, LED sections 402, 404, electrodes 410, 412, and conductive sections 430 configured to electrically connect two adjacent LED sections 402, 404. The LED section 402, 404 includes at least one LED chip 442. The conductive section 430 and the LED section 402, 404 are electrically connected by a second conductive wire 450, that is, the two LED chips 442 respectively located in two adjacent LED sections 402, 404 and having the shortest distance from the conductive section 430 are electrically connected to the conductor 430a in the conductive section 430 by the second conductive wires 450. The conductive section 430 includes the conductor 430a connecting the LED sections 402, 404. For example, the conductor 430a is a conductive metal sheet or metal strip, such as a copper sheet or an iron sheet. The shortest distance between two LED chips 442 respectively located in two adjacent LED sections 402, 404 is greater than the distance between two adjacent LED chips 442 in the LED section 402/404, the two adjacent LED chips 442 are electrically connected to each other by the first conductive wire 440, and the length of the first conductive wire 440 is less than the length of the conductor 430a. When bending occurs between the two LED sections 402, 404, the conductive section 430 has a large force area, and the conductive section 430 is not easily broken due to the stress generated. The light conversion layer 420 covers at least two sides of the LED chips 442/the electrodes 410, 412. Parts of the electrodes 410, 412 are exposed outside the light conversion layer 420. The light conversion layer 420 includes a top layer (not shown) and a carrying layer. The carrying layer includes a base layer 420b and a transparent layer 420c. The LED chips 442 in the LED section 402/404 are arranged along the radial direction of the LED filament (or the width direction of the LED filament). Each LED chip 442 in the LED section 402/404 is connected to the conductor 430a and/or the electrode 410/412. In this embodiment, the widths of the base layer 420b and the transparent layer 420c in the radial direction of the LED filament are equal, the contact area between the base layer 420b and the transparent layer 420c is large, and there is no delamination between the base layer 420b and the transparent layer 420c. In other embodiments, the width of the base layer 420b in the radial direction of the LED filament is less than the width of the transparent layer 420c in the radial direction of the LED filament, the top layer (not shown) is in contact with the base layer 420b and the transparent layer 420c, and the thickness of the base layer 420b is less than the thickness of the top layer. The heat emitted by the LED chips 442 is conducted to the top layer and the transparent layer 420c at the same time through the base layer 420b, thereby improving the heat dissipation efficiency of the LED filament. Besides, the top layer and the transparent layer 420c completely wrap the base layer 420b, which can protect the base layer 420b from the external environment, and further can reduce the probability of the breakage of the second conductive wires 450 due to the protection from a plurality of sides of the top layer when the LED filament is bent, improving the yield of the product.

Figure 37A:
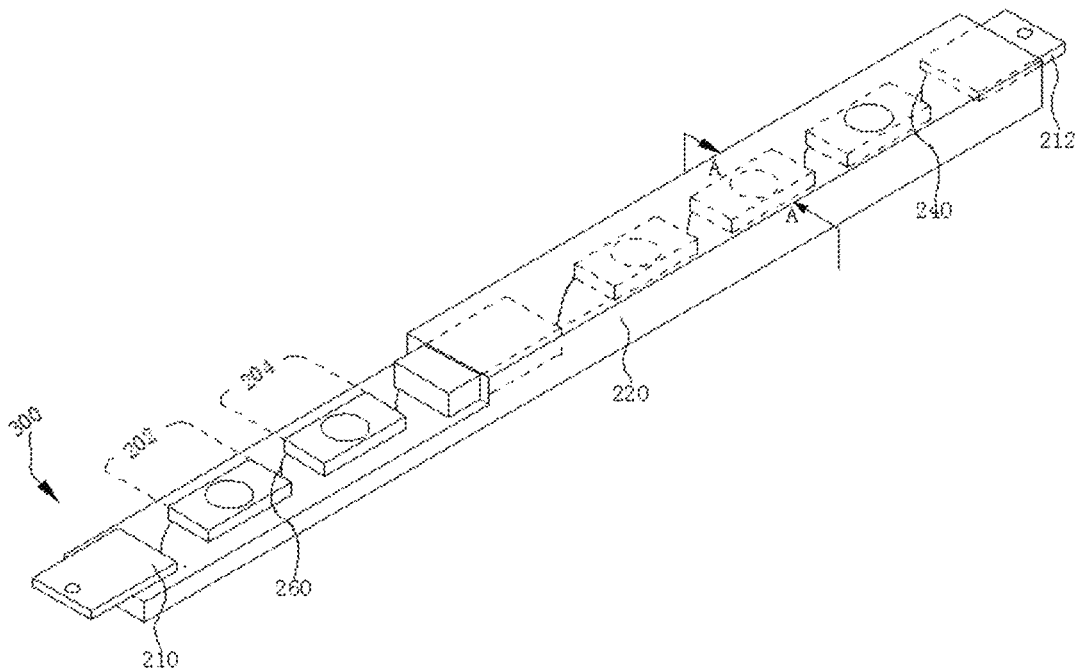
FIG. 37A is a schematic structural diagram of an embodiment of an LED filament according to this application.
Figure 37B:
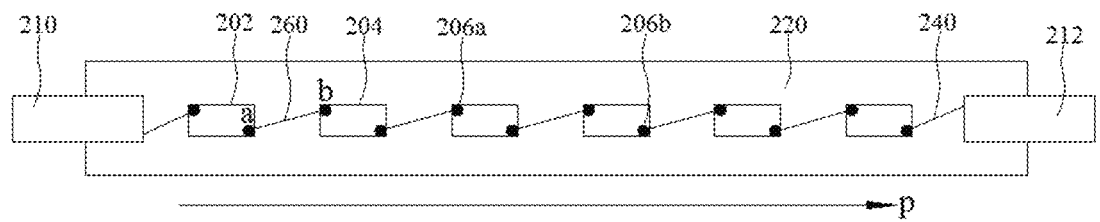
FIG. 37B is a top view of FIG. 37A.
Figure 37C:
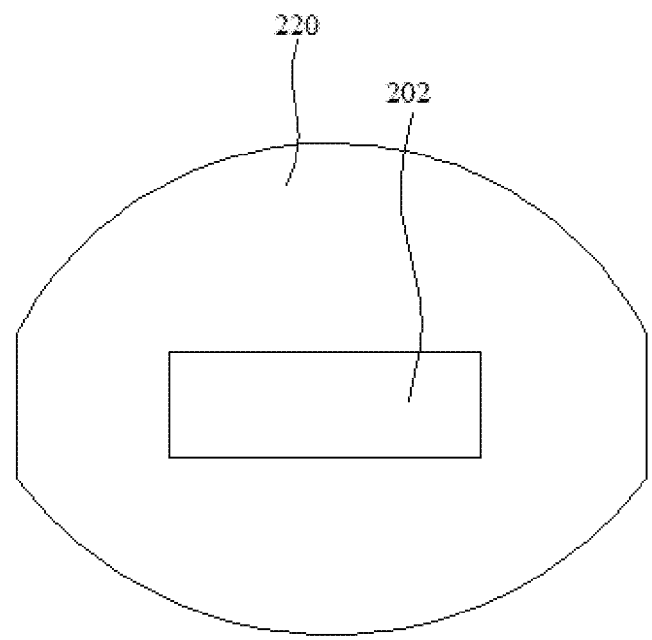
FIG. 37C is a schematic partial cross-sectional view of a position A-A in FIG. 37A.

Still referring to FIG. 37A to FIG. 37C, FIG. 37A is a schematic three-dimensional partial cross-sectional view of an embodiment of an LED filament according to this application, FIG. 37B is a bottom view of FIG. 37A, and FIG. 37C is a schematic partial cross-sectional view of a position A-A in FIG. 37A. An LED filament 300 includes a plurality of LED chip units 202, 204, at least two conductive electrodes 210, 212, and a light conversion layer 220. The LED chip units 202, 204 are electrically connected to each other. The conductive electrodes 210, 212 are configured corresponding to the LED chip units 202, 204 and are electrically connected to the LED chip units 202, 204 by first conductive portions 240. The light conversion layer 220 wraps the LED chip units 202, 204 and the conductive electrodes 210, 212, and exposes at least parts of the two conductive electrodes 210, 212. The light conversion layer 220 includes silica glue, phosphor, and heat dissipation particles. In some embodiments, the LED chip unit 202/204 includes at least one LED chip. The concentration of phosphor corresponding to each surface of the LED chip is the same, so that the light conversion rate of each surface is the same, and the light uniformity of the LED filament is good.

The LED chip unit 202/204 includes at least one LED chip, and the LED chip unit 202/204 has a first electrical connecting portion 206a and a second electrical connecting portion 206b. In the length direction of the LED filament, the distance between first connecting portions 206a of two adjacent LED chip units is greater than the distance between the two adjacent LED chip units. In some embodiments, in the length direction of the LED filament, the distance between the first connecting portion 206a and the second connecting portion 206b of two adjacent LED chip units 202, 204 is greater than the distance between the two adjacent LED chip units 202, 204, and at least a part of the first electrical connecting portion 206a and the second electrical connecting portion 206b is in contact with the light conversion layer 220. The first electrical connecting portion 206a and the second electrical connecting portion 206b are located on the same side of the LED chip unit 202/204.

In one embodiment, the second electrical connecting portion 206b of the LED chip unit 202 is electrically connected to the first electrical connecting portion 206a of the LED chip unit 204. For example, the second electrical connecting portion 206b of the LED chip unit 202 may be electrically connected to the first electrical connecting portion 206a of the LED chip unit 204 by the second conductive portion 260. The second conductive portion 260 has an end point a and an end point b, a line connecting the end point a and the end point b forms a straight line ab, and the straight line ab intersects the length direction p of the LED filament. In some embodiments, the light conversion layer 220 includes a top layer and a carrying layer (not shown). The top layer wraps the LED chip units 202, 204 and the conductive electrodes 210, 212, and exposes at least parts of the two conductive electrodes 210, 212. The carrying layer includes a base layer. The base layer includes an upper surface and a lower surface opposite to the upper surface. The upper surface of the base layer is close to the top layer relative to the lower surface of the base layer. At least one of the first conductive portion 240 and the second conductive portion 260 is in contact (direct contact or indirect contact) with the upper surface of the base layer. When the LED filament is bent, the curvature radius of the base layer after being bent under force is relatively small, and the first conductive portion and the second conductive portion are not prone to be broken. In one embodiment, the first electrical connecting portion 206a and the second electrical connecting portion 206b are in contact (direct contact or indirect contact) with the upper surface of the base layer. The LED chip unit may be a flip chip or a mini LED chip. The mini LED refers to an LED with a package size of 0.1-0.2 mm, also referred to as the mini light emitting diode. When the LED chip unit is electrically connected, for example, the second electrical connecting portion 206b of the LED chip unit 202 may be a positive connection point, and the first electrical connecting portion 206a of the LED chip unit 204 may be a negative connection point, the second electrical connecting portion 206b of the LED chip unit 202 is electrically connected to the first electrical connecting portion 206a of the LED chip unit 204 by the second conductive portion 260. In another example, the second electrical connecting portion 206b of the LED chip unit 202 may be a negative connection point, and the first electrical connecting portion 206a of the LED chip unit 204 may be a positive connection point, the second electrical connecting portion 206b of the LED chip unit 202 is electrically connected to the first electrical connecting portion 206a of the LED chip unit 204 by the second conductive portion 260. The first conductive portion 240 and the second conductive portion 260 may be in the form of wires or films, such as copper wires, gold wires, circuit films, or copper foil.

Figure 38A:
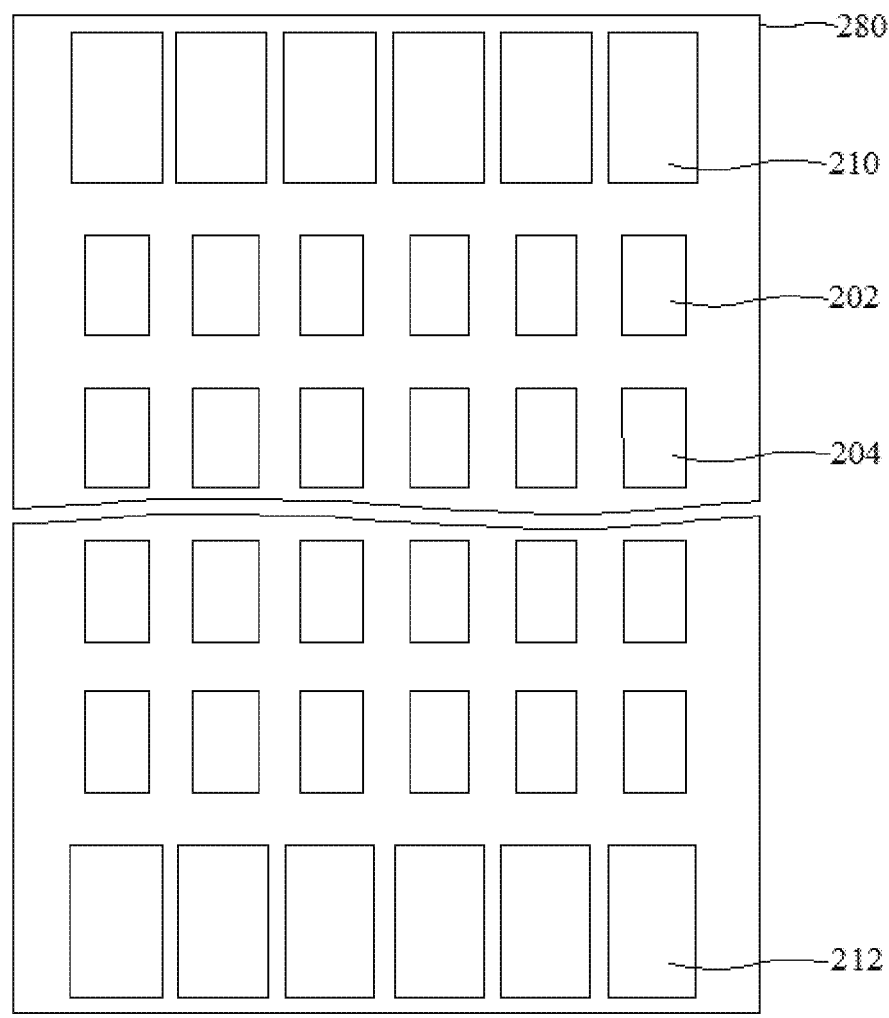
FIG. 38A to FIG. 38E are schematic diagrams of a first embodiment of a method for manufacturing an LED filament according to this application.

FIG. 38A to FIG. 38E are schematic diagrams of one embodiment of a method for manufacturing an LED filament according to this application. The method for manufacturing an LED filament includes the following steps:

S20. Lay LED chip units 202, 204 and conductive electrodes 210, 212 on a carrier 280 (as shown in FIG. 38A).

Figure 38B:
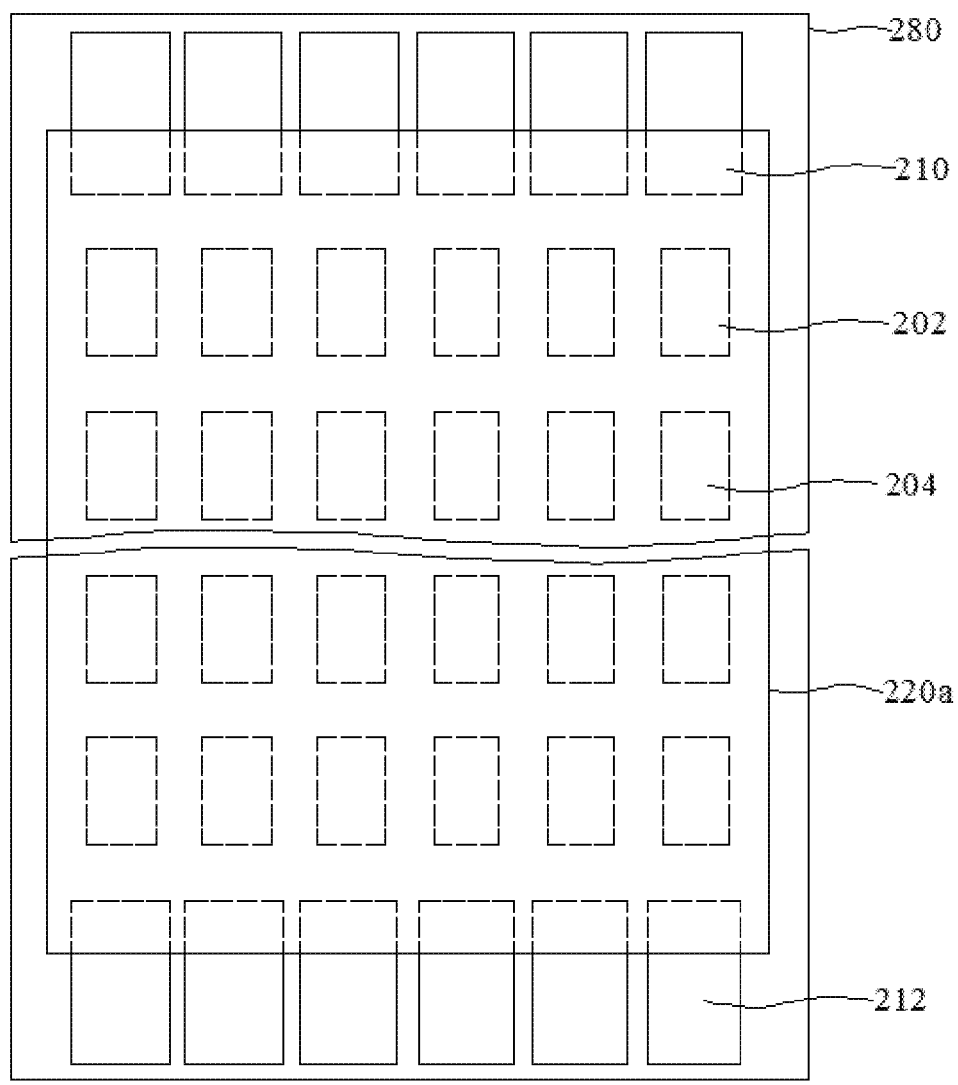

S22A. Coat the portion where the LED chip units 202, 204 and the conductive electrodes 210, 212 are not in contact with the carrier 280 with a top layer 220a, and then cure (or solidify) the LED chip units 202, 204 and the conductive electrodes 210, 212 that are coated with the top layer 220a, so that the top layer 220a is cured and covers the LED chip units 202, 204 and the conductive electrodes 210, 212 on the carrier, and at least parts of the two conductive electrodes 210, 212 are exposed (as shown in FIG. 38B). The curing procedure is, for example, but not limited to, heating or ultraviolet (UV) irradiation.

S22B. There are several ways to flip the LED chip units 202, 204 and the conductive electrodes 210, 212 that are coated with the top layer 220a, one is that the LED chip units 202, 204 and the conductive electrodes 210, 212 are only disposed on the carrier 280 with no adhesion therebetween and therefore can be flipped directly, and the flipped semi-finished product may be laid on the carrier 280.

The other is that, if there is a glue-like substance, such as a photoresist used in a semiconductor process or easy-to-remove die-bonding glue, for adhesion between the carrier 280 and the LED chip units 202, 204 and the conductive electrodes 210, 212, after being properly baked, the glue-like substance has the effect of temporarily fixing the LED chip units 202, 204 and the conductive electrodes 210, 212 on the carrier 280. Therefore, before or after the LED chip units 202, 204 and the conductive electrodes 210, 212 that are coated with the top layer 220a are flipped, the photoresist coated on the carrier 280 may be cleaned with acetone, or the die-bonding glue on the carrier may be removed with a corresponding solvent, so that the LED chip units 202, 204 and the conductive electrodes 210, 212 that are coated with the top layer 220a can be separated from the carrier 280. In addition, washing may be further performed to remove residual photoresist or die-bonding glue.

Figure 38C:
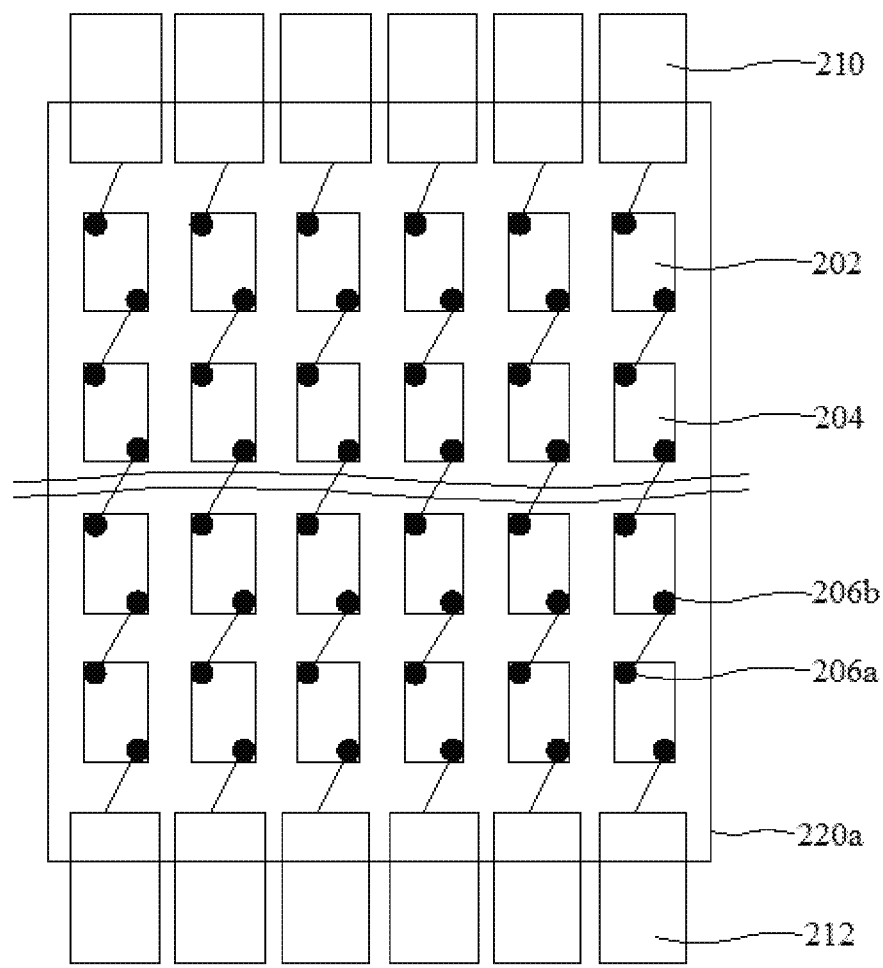

S24. Electrically connect adjacent LED chip units 202, 204, and the LED chip units 202/204 with the conductive electrodes 210, 212 (as shown in FIG. 38C).

Figure 38D:
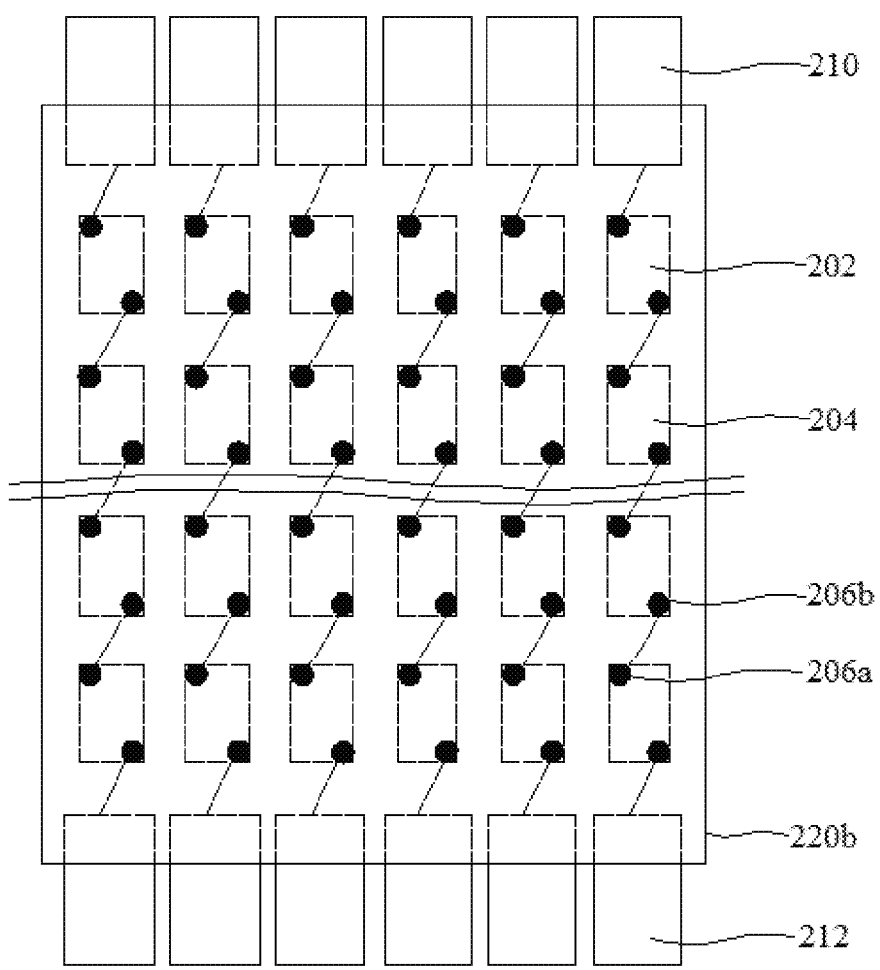

S26. After step S24, coat the portion where the LED chip units 202, 204 and the conductive electrodes 210, 212 are not coated with the top layer 220a with a base layer 220b, and perform curing after the coating is completed (as shown in FIG. 38D).

Figure 38E:
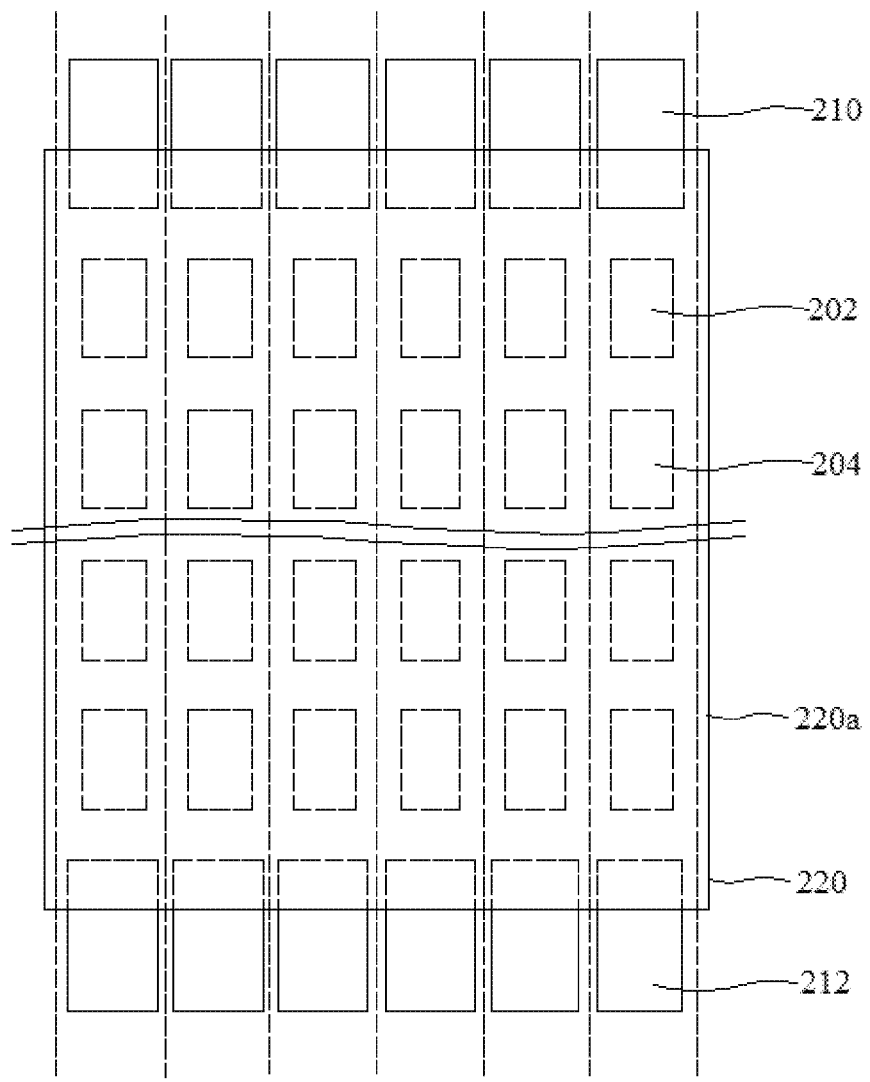

After step S26, another step S28 of cutting the LED chip units 202, 204 and the conductive electrodes 210, 212 that are wrapped with a light conversion layer 220 as cutting positions shown by dashed lines in FIG. 38E may be included. In this way, a strip-shaped element after cutting is the LED filament 300. The cutting method of step S28 is not limited to FIG. 38E, and every two adjacent columns of LED chip units 202, 204 may be cut into a single LED filament.

In the method for manufacturing an LED filament in this embodiment, the top layer 220a and the base layer 220b may be made of phosphor and silica glue in the same proportion. If the top layer 220a and the base layer 220b further contain oxidized nanoparticles, the proportions of phosphor, silica glue, and oxidized nanoparticles in the top layer 220a and the base layer 220b are the same. In other words, the materials of the top layer 220a and the base layer 220b are the same, and the top layer 220a and the base layer 220b are distinguished only for the convenience of description. Certainly, in other embodiments, the proportions of phosphor, silica glue, and oxidized nanoparticles in the top layer 220a and the base layer 220b may be different.

Figure 39:
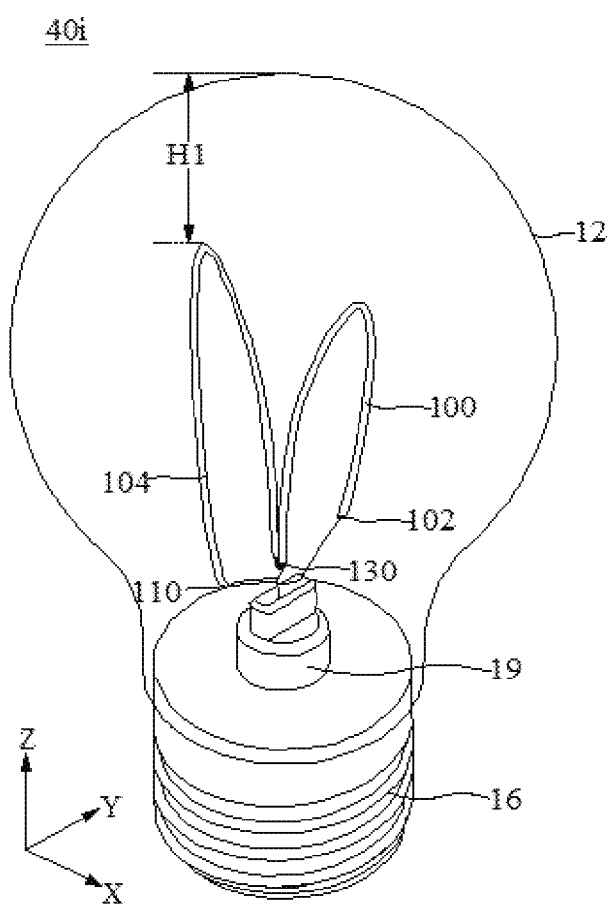
FIG. 39 is a schematic diagram of an LED light bulb according to an embodiment of this application.

Referring to FIG. 39, FIG. 39 is a schematic diagram of an LED light bulb 40i according to an embodiment of this application. The LED light bulb 40i in this embodiment has the same basic structure as the LED light bulb 40h in FIG. 18A to FIG. 18D, including a lamp housing 12, a lamp cap 16 connected to the lamp housing 12, at least two conductive brackets disposed in the lamp housing 12, a supporting arm (not shown), a stem 19, and a single LED filament 100. The difference is that the LED light bulb 40i in this embodiment does not have a stand 19a. The stem 19 includes an inflation pipe, and the gas in the lamp housing 12 is filled through the inflation pipe. As shown in FIG. 39, in the Z-axis direction, the shortest distance from the LED filament 100 (or the bending point of the LED section 102/104) to the lamp housing 12 is H1, the shortest distance from the conductive section 130 to the stem 19 of the LED filament 100 is H2, and H1 is less than or equal to H2, the bending point of the LED section 102/104 is closer to the lamp housing, so the heat dissipation path of the LED filament is short, thereby improving the heat dissipation effect of the LED light bulb. In one embodiment, H1 is greater than H2, the LED filament is approximately located in the middle area of the lamp housing, and the luminous effect of the light bulb is better.

Figure 40A:
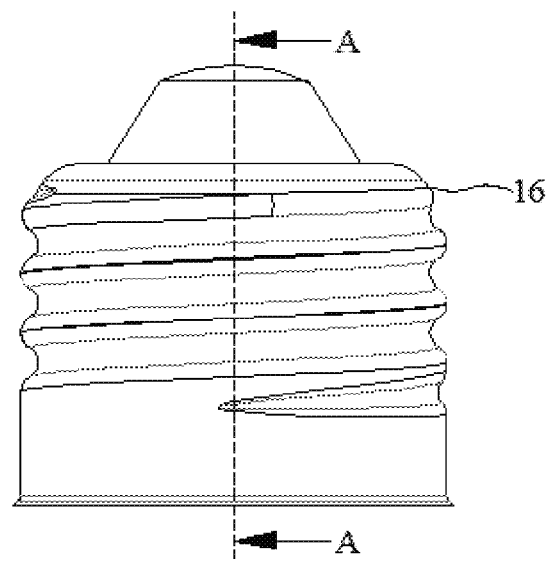
FIG. 40A is a schematic diagram of a lamp cap according to an embodiment of this application.
Figure 40B:
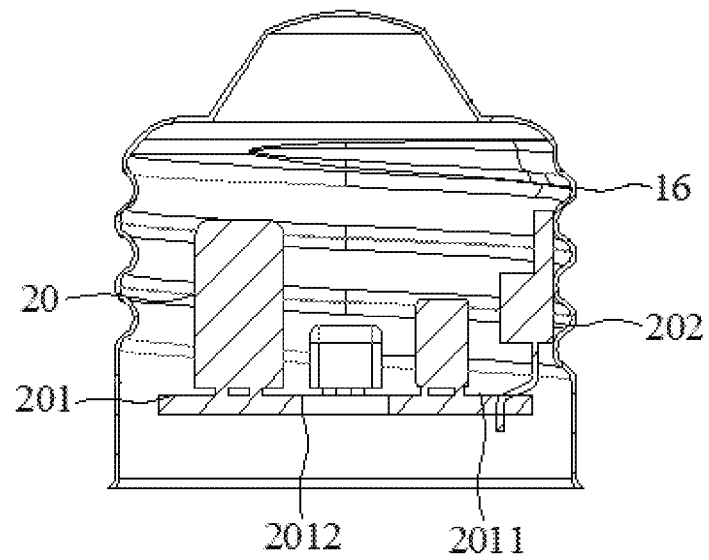
FIG. 40B is a schematic diagram of a cross section A-A in FIG. 40A.

Referring to FIG. 40A and FIG. 40B, FIG. 40A is a schematic structural diagram of a lamp cap according to an embodiment of this application, and FIG. 40B is a schematic diagram of a cross section A-A in FIG. 40A. In this embodiment, a power component 20 is disposed in a lamp cap 16, the power component 20 includes a substrate 201, a heating element (an element that generates more heat during operation, such as an IC or a resistor) and a non-heat-resistant element (such as an electrolytic capacitor) are disposed on the substrate 201, the lamp cap 16 has an inner surface and an outer surface opposite to the inner surface, the outer surface of the lamp cap 16 is away from the power component 20, the heating element is closer to the inner surface of the lamp cap 16 than the non-heat-resistant element, an insulation sheet 202 is disposed on the heating element, and the insulation sheet 202 is in contact with the inner surface of the lamp cap 16, for example, the insulation sheet 202 may be in contact with the inner surface of the lamp cap 16 by welding or using fasteners. In one embodiment, the heating element is integrally encapsulated into a component, a heat dissipation sheet is disposed on the component, and the heat dissipation sheet is in contact with the inner surface of the lamp cap 16. For example, after an IC and a rectifier bridge are encapsulated into a component, the heat dissipation sheet is in contact with the inner surface of the lamp cap 16 by welding or using fasteners, and the heat dissipation sheet may be welded to the inner surface of the lamp cap 16 as a negative wire.

In another embodiment, the substrate 201 is in direct contact with the inner surface of the lamp cap 16. Compared with the indirect contact between the substrate and the lamp cap through glue, the direct contact can improve the heat dissipation effect of the light bulb based on the reduction of heat transfer media.

In another embodiment, the heating element is covered with a heat conduction glue. For example, the substrate 201 has a first surface 2011 and a second surface 2012, the second surface 2012 is away from the LED filament, the heating element and the non-heat-resistant element are respectively located on the first surface 2011 and the second surface 2012, and the first surface 2011 is covered with the heat conduction glue, the heat generated by the heating element may be transferred to the lamp cap 16 through the heat conduction glue, thereby improving the heat dissipation effect of the LED light bulb.

Figure 41A:
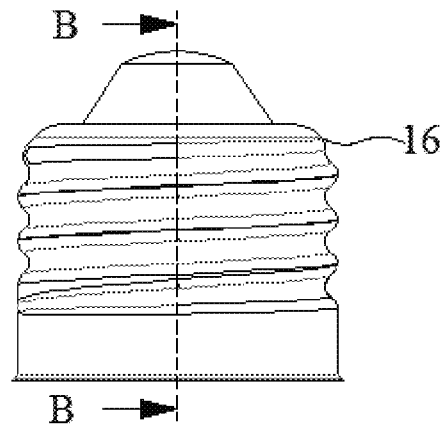
FIG. 41A is a schematic diagram of a lamp cap according to an embodiment of this application.
Figure 41B:
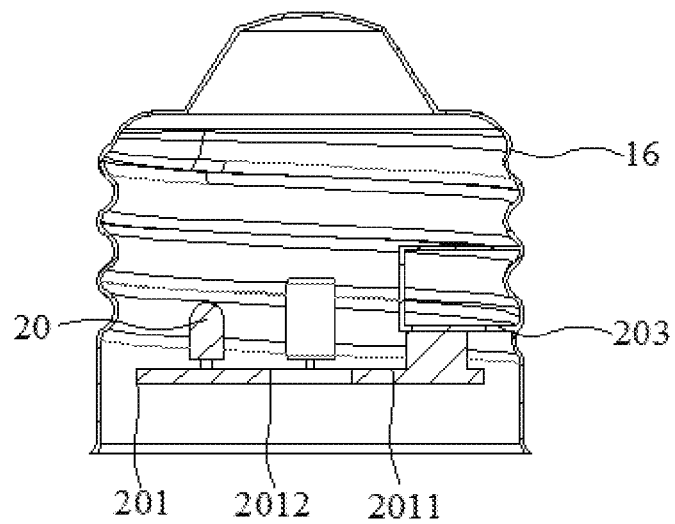
FIG. 41B is a schematic diagram of an embodiment of a cross section B-B in FIG. 41A.
Figure 41C:
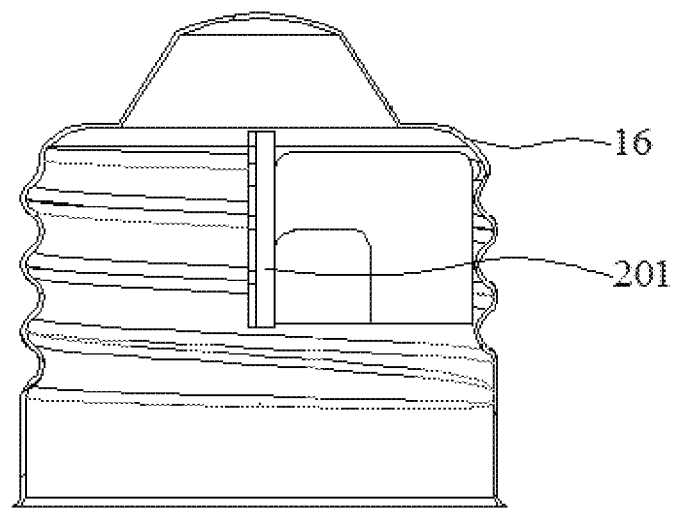
FIG. 41C is a schematic diagram of an embodiment of a cross section B-B in FIG. 41A.

Referring to FIG. 41A to FIG. 41C, FIG. 41A is a schematic diagram of a lamp cap according to an embodiment of this application, FIG. 41B is a schematic diagram of an embodiment of a cross section B-B in FIG. 41A, and FIG. 41C is a schematic diagram of an embodiment of a cross section B-B in FIG. 41A. In another embodiment, as shown in FIG. 41A, a heat conduction portion 203 is disposed on the inner surface of the lamp cap 16, the heat conduction portion 203 may be a net bag accommodating the heating element or a metal member in contact with the heating element, the thermal conductivity of the heat conduction portion 203 is greater than or equal to the thermal conductivity of the lamp cap 16, and the heat generated by the heating element may be quickly transferred to the lamp cap 16 through the heat conduction portion 203, thereby improving the heat dissipation effect of the LED light bulb.

In another embodiment, each surface of the power component 20 is covered with the heat conduction glue, and a part of the heat conduction glue is in contact with the inner surface of the lamp cap 16. For example, a flexible substrate may be used to be integrally mounted in the lamp cap 16 by pouring the heat conduction glue into the lamp cap 16. The power component is entirely covered with the heat conduction glue to increase the heat dissipation area, thereby greatly improving the heat dissipation effect of the LED light bulb.

In another embodiment, as shown in FIG. 41C, the substrate 201 is parallel to the axial direction of the lamp cap 16 or the axial direction of the stem 19 in FIG. 18A to FIG. 18D, FIG. 39, and FIG. 42A to FIG. 42D, since all the heating elements can be placed on the side of the substrate 201 close to the lamp cap 16, the heat generated by the heating elements can be quickly transferred to the lamp cap 16, thereby improving the heat dissipation efficiency of the power component; in addition, heating elements and non-heat-resistant elements can be separately arranged on the different surfaces of the substrate 201, it can reduce the influence of the heat generated by the heating element on the heat-resistant element, and improve the overall reliability and life of the power component. In one embodiment a heating element (an element that generates more heat during operation, such as an IC or a resistor) and a non-heat-resistant element (such as an electrolytic capacitor) are disposed on the substrate 201. The heating element is closer to the inner surface of the lamp cap 16 than other electronic elements (such as non-heat-resistant elements or other non-heat sensitive elements, for example, a capacitor). Therefore, compared with other electronic elements, the heating element has a shorter heat transfer distance from the lamp cap 16, which is more conducive to the heat generated by the heating element during operation being conducted to the lamp cap 16 for heat dissipation, thereby improving the heat dissipation efficiency of the power component 20.

As shown in FIG. 39 to FIG. 41A through FIG. 41C, the projections of the inflation pipe and the substrate 201 on the XY-plane overlap. In some embodiments, the projections of the inflation pipe and the substrate 201 on the XZ-plane and/or YZ-plane are separated (or do not overlap), or in the height direction of the lamp cap 16 (or Z-axis direction), there is a certain distance between the inflation pipe and the substrate 201, so the inflation pipe and the substrate 201 are not in contact with each other, and thereby increasing the accommodation space of the power component and improving the utilization rate of the substrate 201. In addition, when the substrate 201 is in contact with the inner surface of the lamp cap 16, a cavity is formed between the first surface 2011 of the substrate 201 and the stem 19, and the heat generated by the heating element located on the first surface of the substrate 201 may be transferred through the cavity, which reduces the thermal impact on the non-heat-resistant element located on the second surface, thereby increasing the service life of the power component.

Figure 42A:
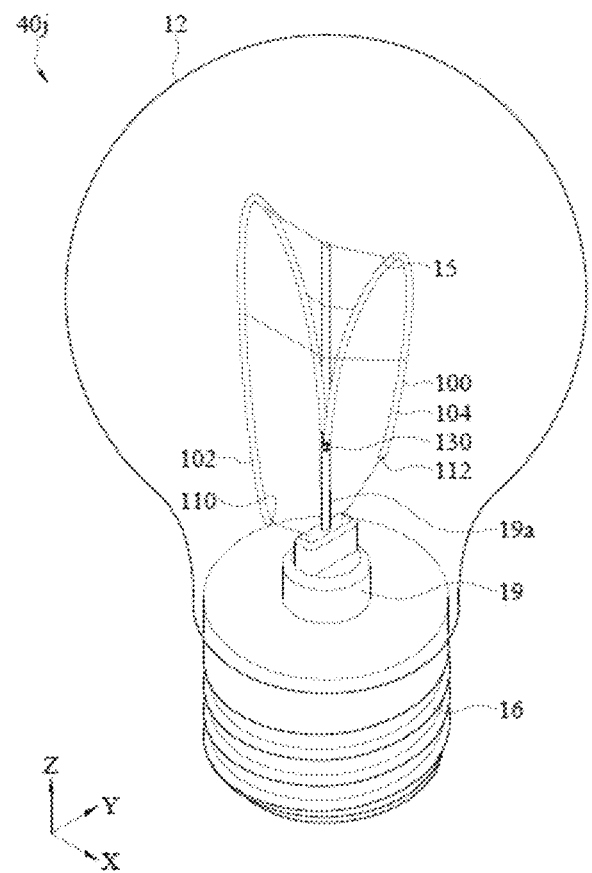
FIG. 42A to FIG. 42D are respectively a schematic diagram, a side view, another side view, and a top view of an LED light bulb according to an embodiment of this application.
Figure 42B:
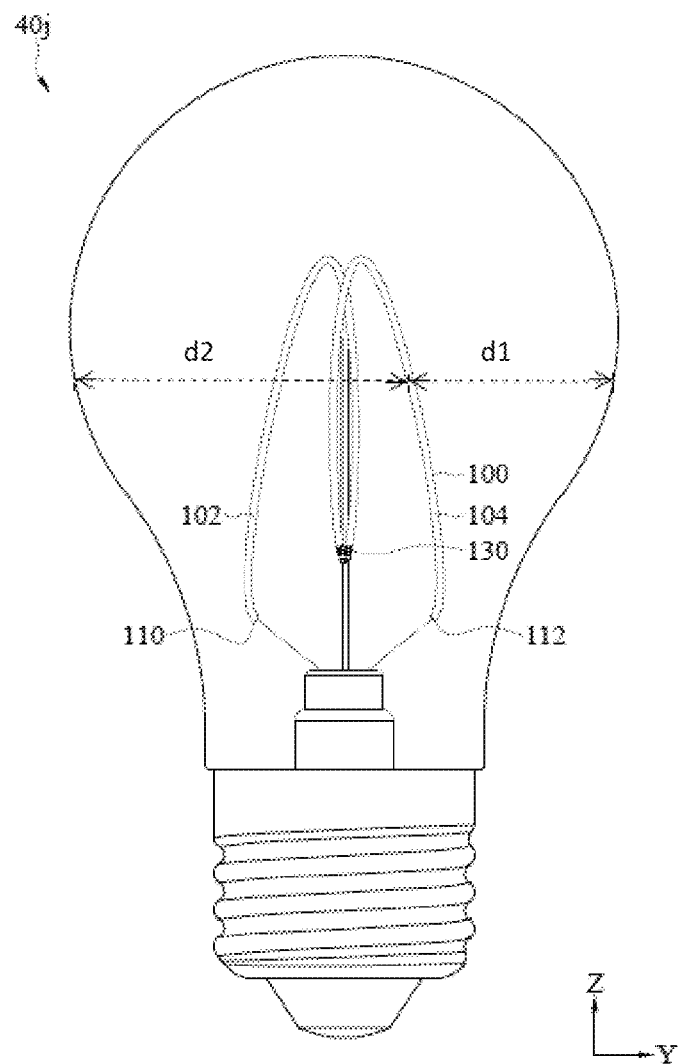
Figure 42C:
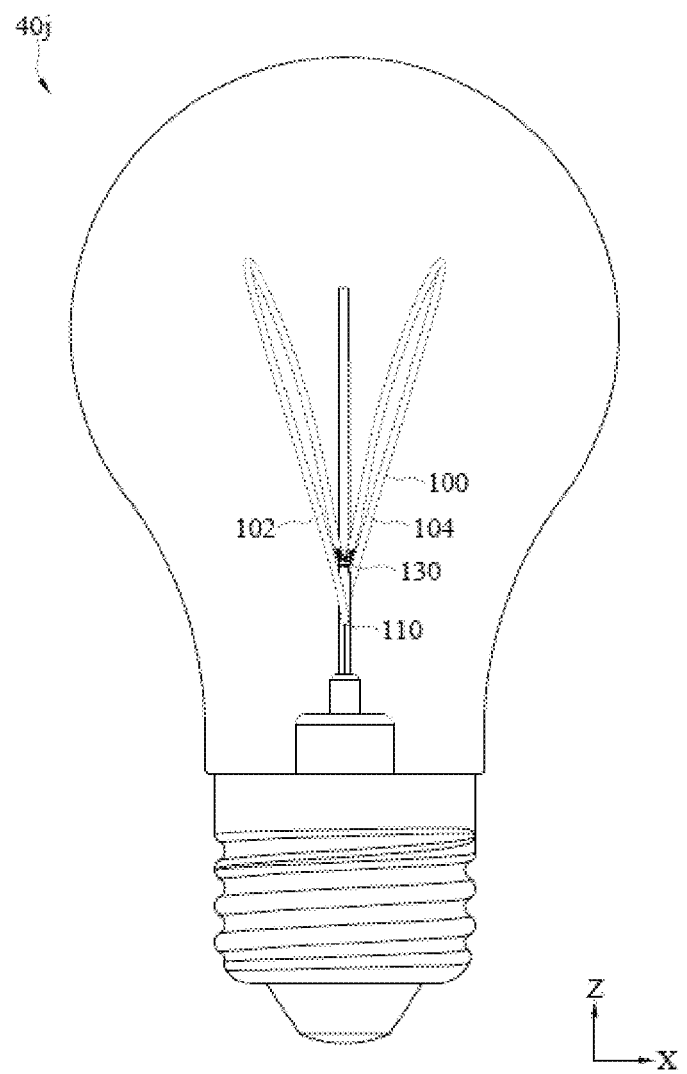
Figure 42D:
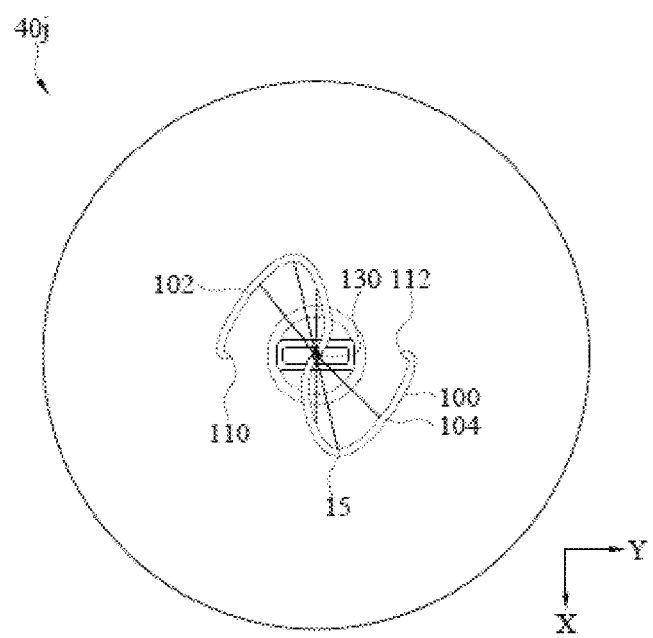

Referring to FIG. 42A to FIG. 42D, FIG. 42A to FIG. 42D are schematic diagrams of an LED light bulb 40j according to an embodiment of this application. The LED light bulb 40j in this embodiment has the same basic structure as the LED light bulb 40h in FIG. 18A to FIG. 18D, including a lamp housing 12, a lamp cap 16 connected to the lamp housing 12, at least two conductive brackets disposed in the lamp housing 12, at least one supporting arm 15, a stem 19, and an LED filament 100, and the supporting arms 15 are not shown in FIG. 42B and FIG. 42C. The stem 19 includes the stand 19a. Each supporting arm 15 includes a first end and a second end that are opposite to each other. The first end of each supporting arm 15 is connected to the stand 19a, and the second end of each supporting arm 15 is connected to the LED filament 100. The LED light bulb shown in FIG. 42C is different from the light bulb shown in FIG. 18A to FIG. 18D in that the height of the stand 19a is greater than the distance between a bottom portion of the stand 19a and the conductive section 130 in the Z-axis direction, and the stand 19a comprises the bottom portion of the stand 19a and the top portion of the stand 19a opposite to each other, where the bottom portion of the stand 19*a* is closer to the inflation pipe. As shown in FIG. 42D, in the XY-plane, the central angle corresponding to the arc where at least two bending points of the LED filament 100 are located ranges from 170° to 220°, so that there is a proper distance between bending points of the LED section 102, 104 to ensure the heat dissipation effect of the LED filament 100. At least one supporting arm 15 is located at the bending point of the LED filament 100, for example, at the bending point of the LED section 102/104. Each supporting arm 15 has an intersection with the LED filament 100. On the XY-plane, at least two intersections are located on a circumference of a circle taking the stem 19 (or the stand 19*a*) as a center, the LED filament has certain symmetry, and the luminous flux in all directions is roughly the same, so that the Light bulb can emit light evenly. In one embodiment, at least one intersection and the bending point of the conductive section 130 form a straight line La, and the intersection on the straight line La and the electrode 110/112 of the LED filament form a straight line Lb. The range of the angle α between the straight line La and the straight line Lb is 0°<α<90°, preferably 0°<α<60°, so that the LED sections have a proper spacing after bending, and have good light emission and heat dissipation effects. The LED section has a curvature radius at the bending point. For example, the LED section 102 has a curvature radius r3 at the bending point, the LED section 104 has a curvature radius r4 at the bending point, r3 is equal to r4, and the light is uniform on each plane. Certainly, it is also possible to set r3 to be greater than r4 or r3 to be less than r4 to meet lighting requirements and/or heat dissipation requirements in some specific directions. The conductive section 130 has a curvature radius r5 at the bending point, r5 is less than a maximum value of r3 and r4, that is, r5<max (r3, r4), so that the LED filament 100 is not easy to break, and there is a certain distance between the LED sections 102, 104 that are closer to the stem to prevent the heat generated by the two LED sections 102, 104 from affecting each other.

In one embodiment, the LED section 102/104 includes a first section and a second section. The first section is extending upward (the direction of the top portion of the lamp housing 12) from the electrode 110/112 to the bending point, and the second section is extending downward (the direction of the lamp cap 16) from the bending point to the conductive section 130 connecting two LED sections 102, 104. The first section and the second section to the lamp housing 12 respectively have a first distance and a second distance that are opposite to each other, and the first distance is less than the second distance. In the first distance direction, the base layer of the LED filament 100 is close to the lamp housing 12, and the top layer of the LED filament 100 is away from the lamp housing 12. For example, in FIG. 42B, the first section of the LED section 104 to the lamp housing 12 has a first distance d1 and a second distance d2, and the first distance d1 is less than the second distance d2. In the first distance d1 direction, the base layer of the LED filament 100 is close to the lamp housing 12, and the top layer of the LED filament 100 is away from the lamp housing 12. When the LED filament 100 is bent, the conductive wire in the LED filament 100 has a small bending stress and is not easy to break, improving the production quality of the LED light bulb 40*j*.

Referring to FIG. 18A to FIG. 18D and FIG. 42A to FIG. 42D, a plane A divides the lamp housing 12 into an upper portion and a lower portion, and the lamp housing 12 has the largest width at the plane A. For example, a plane figure formed by R2 (maximum horizontal spacing) in FIG. 18B is located on the plane A, and when there is an intersection between the stem 19 and the plane A, the lamp housing 12 has a lamp housing top portion and a lamp housing bottom portion that are opposite to each other, the lamp housing bottom portion is close to the lamp cap 12, and the length of the LED filament located between the lamp housing top portion and the plane A (or in the height direction of the LED light bulb, the distance from the highest point of the LED filament to the plane A) is less than the length of the LED filament located between the plane A and the lamp housing bottom portion (or in the height direction of the LED light bulb, the distance from the lowest point of the LED filament to the plane A). Because when there is an intersection between the stem 19 and the plane A, the inner diameter of the lamp housing 12 above the top portion of the stem 19 is small and the volume for accommodating gas is small, if a large part of the LED filament is located on the top portion of the stem 19, the overall heat dissipation effect of the LED filament is affected, thereby reducing the product quality. When there is a distance between the stem 19 and the plane A, and the distance from a stem top portion to the plane A is less than the height of the stand 19*a*, the stem 19 includes a stem bottom portion and a stem top portion opposite to each other, the stem bottom portion is connected to the lamp cap 16, the stem top portion extends to the direction of the lamp housing top portion, and the length of the LED filament located between the stem top portion and the lamp housing top portion (or the distance between the highest point of the LED filament and the stem top portion) is less than the length of the LED filament located between the stem top portion and the lamp housing bottom portion (or the distance between the stem top portion and the lowest point of the LED filament). Most of the LED filament can be indirectly supported by the stem 19, so as to ensure the stability of the LED filament shape during the transportation of the LED light bulb. In some embodiments, when there is a distance between the stem 19 and the plane A, and the distance from the stem top portion to the plane A is greater than the height of the stand 19*a*, the stem 19 includes a stem bottom portion and a stem top portion opposite to each other, the stem bottom portion is connected to the lamp cap 12, the stem top portion extends to the direction of the lamp housing top portion, and the length of the LED filament located between the stem top portion and the lamp housing top portion is greater than the length of the LED filament located between the stem top portion and the lamp housing bottom portion. Since the volume of gas contained between the stem top portion and the lamp housing bottom portion is large, and most of the LED filament is located between the stem top portion and the lamp housing bottom portion, which facilitates the heat dissipation of the LED filament.

Figure 43:
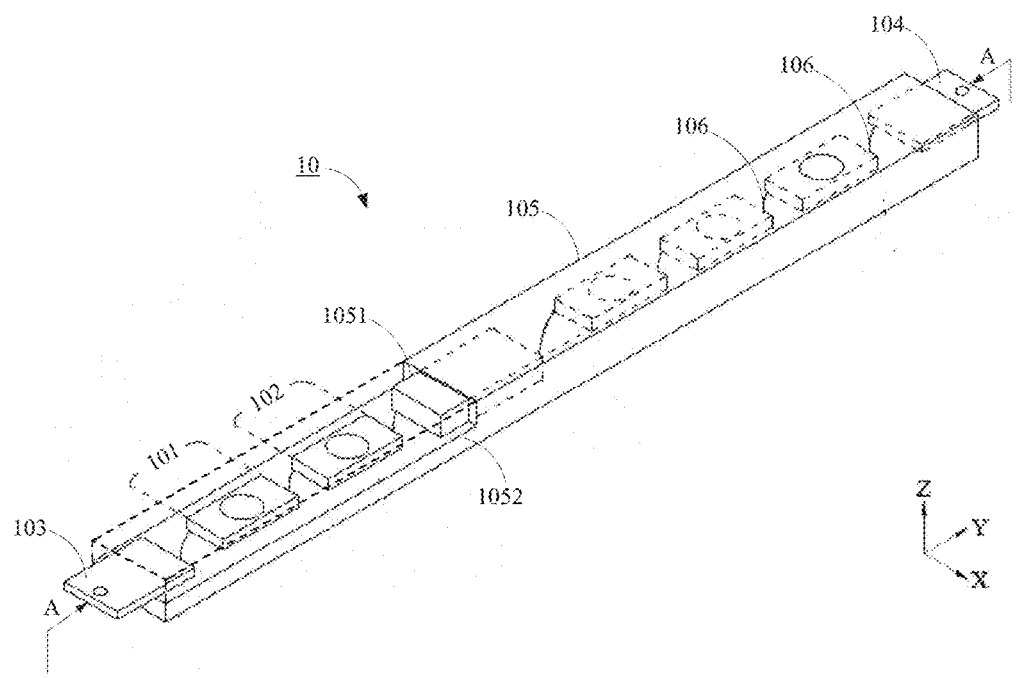
FIG. 43 is a partially perspective schematic view of the LED filament of the disclosure in an embodiment.
Figure 44:
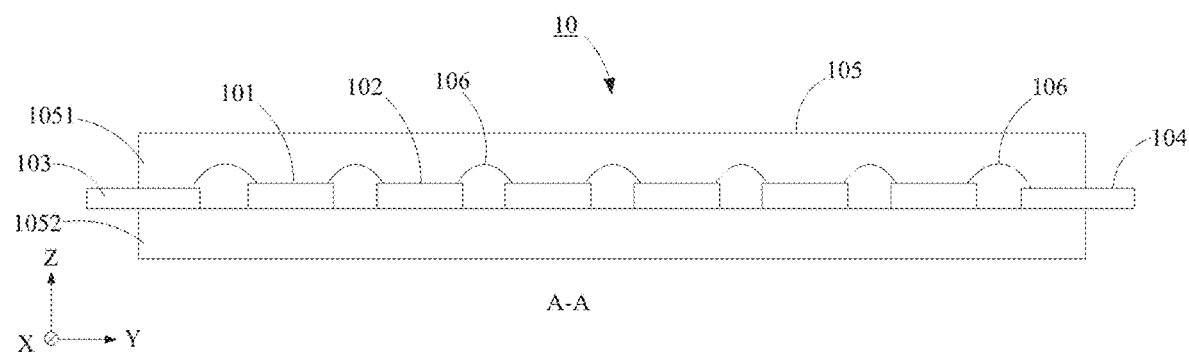
FIG. 44 is a cross-sectional schematic view along line 2-2 in FIG. 43.

Please refer to FIG. 43 and FIG. 44. FIG. 43 is a partially perspective schematic view of the LED filament of the disclosure in an embodiment and FIG. 44 is a cross-sectional schematic view along line A-A in FIG. 43. As shown in FIG. 43 and FIG. 44, the LED filament 10 includes at least one LED chip (at least two LED chips 101, 102 are shown in the figure as an example), at least one electrode (at least two electrodes 103, 104 are shown in the figure as an example), a light conversion layer 105 (in a specific embodiment, the light conversion layer can be called "plastic layer" or "silica gel layer") and a conductive portion 106. Adjacent LED chips 101, 102 are electrically connected by the conductive portion 106 to implement an electric connection between the LED chips 101, 102. The conductive portion 106 is electrically connected between the LED chip 101 or 102 and the electrode 103 or 104 to implement an electric connection between the LED chip 101 or 102 and the electrode 103 or 104. The light conversion layer 105 wraps the LED chips 101, 102, the conductive portion 106 and at least part of the electrodes 103, 104.

After the electrodes 103, 104 have been connected to a power source (a voltage source or a current source), the LED filament 10 can emit light. As shown in FIG. 43 and FIG. 44, a cross-section of the LED filament 10 is configured into, but not limited to, a rectangular shape, while a triangular, circular, oval, polygonal, or rhombic shape is also available, and the cross-section of the LED filament 10 may even be an irregular shape such as a square with chamfered or rounded corners.

In an embodiment, the light conversion layer 105 includes silica gel and fluorescent powders, and the light conversion layer 105 may further include heat dispersing particles. For example, the heat dispersing particles may be nanometer oxide particles such as, but not limited to, nanometer particles formed by aluminum oxide ($Al_2O_3$), silicon oxide ($SiO_2$), zirconia ($ZrO_2$), titanium oxide ($TiO_2$), calcium oxide (CaO), strontium oxide (SrO) or barium oxide (BaO).

In an embodiment, as shown in FIG. 43 and FIG. 44, the light conversion layer 105 includes a top layer 1051 and a carrying layer 1052 (in specific embodiments, the carrying layer can be called base layer). The top layer 1051 wraps the LED chips 101, 102, the conductive portion 106 and the electrodes 103, 104 with at least exposing part of the two electrodes 103, 104 (or exposing at least part of the two electrodes 103, 104). The carrying layer 1052 includes an upper surface and a lower surface opposite to the upper surface. In comparison with the lower surface of the carrying layer, the upper surface 1052 of the carrying layer 1052 is adjacent to the top layer 1051. In some examples, each of the top layer 1051 and the carrying layer 1052 may be a layered structure with at least one layer. Preferably, in some embodiments, the layered structure may be one of fluorescent powder glue with high plasticity (in comparison with fluorescent powder film), fluorescent powder film with low plasticity, and a transparent layer, or the layered structure may be a combination of at least any two thereof. The fluorescent powder glue or the fluorescent powder film includes the following components: silica gel-modified polyimide and/or glue. The fluorescent powder glue/film may also include fluorescent powder and inorganic oxide nanoparticles (or heat dispersing particles). The transparent layer can be made of light-transmitting resin (such as silica gel or polyimide) or a combination thereof. The glue can be, but is not limited to, silica gel. It should be understood that the above-mentioned structure and composition of the top layer 1051 and the carrying layer 1052 are only examples. In other examples, the top layer 1051 and the carrying layer 1052 may have the same or different structures and/or compositions to form a variety of LED filaments with different properties.

In an embodiment, in the height direction of the LED filament 10 (the Z-axis direction in FIG. 43 and FIG. 44), the height of the top layer 1051 is greater than the height of the carrying layer 1052. The top layer 1051 includes an upper surface and a lower surface opposite thereto. The upper surface of the carrying layer 1052 is in contact with at least part of the lower surface of the top layer 1051. The LED chip 101, 102 includes an upper surface and a lower surface opposite thereto. The upper surface of the LED chip 101, 102 is closer to the upper surface of the top layer 1051 than the lower surface of the LED chip 101, 102. The distance between the lower surface of the LED chip 101, 102 and the lower surface of the carrying layer 1052 is less than the distance between the lower surface of the LED chip 101, 102 and the upper surface of the top layer 1051, i.e., the path of the heat generated by the LED chips 101, 102 being conducted to the outer surface of the carrying layer 1052 is shorter, so that heat is hard to be accumulated, thereby allowing the LED filament to obtain a better heat-dissipation effect.

To increase the combination strength of the top layer 1051 and the carrying layer 1052, in some embodiments, the contact area, shapes or interfaces of the top layer 1051 and the carrying layer 1052 may be properly adjusted to make the junction surface between these two layers be not a single plane. In an example, at least part of the contact surfaces of the top layer 1051 and the carrying layer 1052 form surfaces which match with each other. Such matching may be engaging, for example, surfaces which engage with each other may be wavy or jagged. In another example, the upper surface of the carrying layer 1052 may also be configured with higher roughness to enhance the combination strength with the top layer 1051. In still another example, the carrying layer 1052 may be provided with multiple via holes to make the top layer 1051 penetrate the carrying layer 1052 to increase the contact area between the top layer 1051 and the carrying layer 1052. Furthermore, after the top layer 1051 penetrates the via holes, the top layer 1051 may further extend to the other side of the carrying layer 1052. Therefore, the top and the bottom of the carrying layer 1052 are held by the top layer 1051, so that the connection between the carrying layer 1052 and the top layer 1051 is similar to pivoting.

It is noted that the top layer 1051 as shown in FIG. 43 and FIG. 44 disposed on the upper surface of the carrying layer 1052 is an exemplary structure of the light conversion layer 105 only. The top layer 1051 and the carrying layer 1052 may also be disposed to be other connecting manners. For example, the carrying layer 1052 may be provided with a receiving groove in the length direction of the LED filament (the Y-axis direction in FIG. 43 and FIG. 44), the LED chips 101, 102 are disposed on the bottom of the receiving groove, and the top layer 1051 is filled in the receiving groove. For another, the carrying layer 1052 is configured as six surfaces wrapping the LED chips 101, 102 (i.e., the LED chips 101, 102 are wrapped in the central portion of the carrying layer 1052), and the top layer 1051 wraps the carrying layer 1052. The disclosure does not limit the structure of the light conversion layer 105.

The LED chips 101, 102 are wrapped in the light conversion layer 105. The LED filament may include one, two, or more LED chips (i.e., three or more than three). The shape of the LED chip may be of, but not limited to, a strip shape. A strip-shaped chip may have less electrodes to reduce the opportunity of shading the light emitted from an LED. In addition, surfaces of the LED chips 101, 102 may be coated with a transparent conductive indium tin oxide (ITO). The ITO layer is helpful to even distribution of current and improvement of luminous efficiency of the LED chips 101, 102. In detail, the length-width ratio of the LED chip may be configured into 2:1 to 10:1, for example, but not limited to, 14×28 or 10×20. In addition, the LED chips 101, 102 may adopt LED chips with large power operated with a low current, so that the LED chips 101, 102 can still have sufficient intensity under the condition of keeping a low current density, and the LED chips 101, 102 will not generate a large amount of heat to further improve the overall luminous efficiency.

The LED chip 101, 102 itself may adopt a sapphire substrate or a light-permeable transparent substrate, such that the substrate of the LED chip 101, 102 will not shade the light emitted from the LED chip 101, 102. In other words, the LED chip 101, 102 itself can emit light from its periphery.

The LED chips are electrically connected with each other. As shown in FIG. 43 and FIG. 44, adjacent LED chips 101, 102 are electrically connected with each other through the conductive portion 106. Take FIG. 43 and FIG. 44 as an example, each LED chip 101, 102 may be electrically connected in series, but the electric connection is not limited thereto; the electrical connection may also be done in parallel first and then in series. For example, but not limited to, two LED chips 101, 102 are first connected in parallel, and then two parallel-connected chips 101, 102 are then connected in series. An embodiment in which two LED chips are first connected in series and then two series-connected chips are then connected in parallel is also available.

The electrodes 103, 104 are disposed to correspond to the LED chips 101, 102 and are correspondingly electrically connected to the LED chips 101, 102. As shown in FIG. 43 and FIG. 44, each LED chip 101, 102 is arranged in a row and adjacent LED chips 101, 102 adopt an electric connection in series. The two electrodes 103, 104 are disposed at two ends of the LED filament to be separately connected with two ends of the LED chips 101, 102. Each electrode 103, 104 is partially exposed from the light conversion layer 105. The arrangement of the electrodes 103, 104 and the LED chips 101, 102 is not limited thereto.

Please refer to FIG. 45 to FIG. 49, which are schematic views of arrangements of the LED chips and the electrodes in different embodiments.

Figure 45:
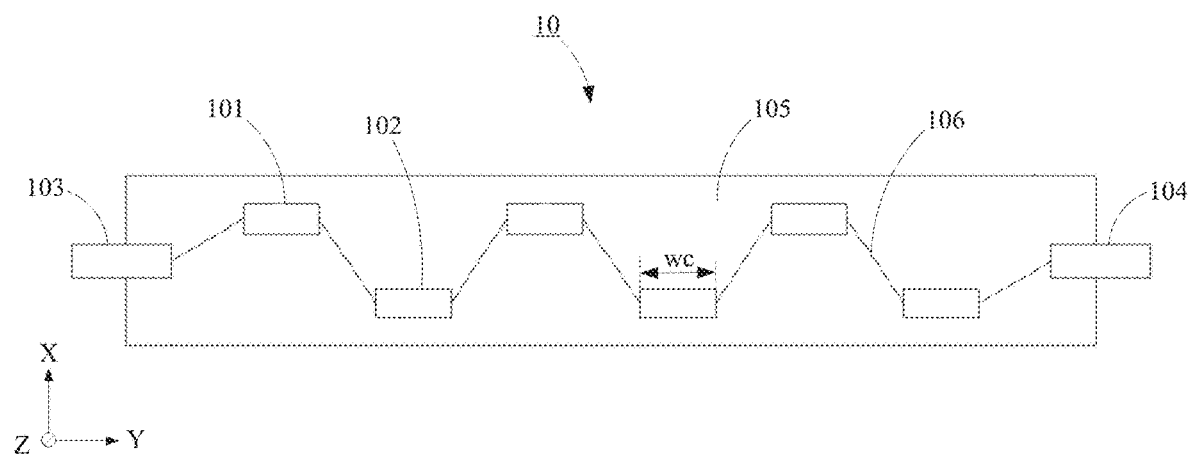
FIG. 45 to FIG. 49 are schematic views of arrangements of the LED chips and the electrodes of the disclosure in different embodiments.

In the embodiment shown in FIG. 45, adjacent LED chips 101, 102 still adopt an electric connection in series, but multiple LED chips 101, 102 are divided into two rows to be disposed on the LED filament 10 (i.e., adjacent LED chips 101, 102 are alternately arranged in the width direction of the filament 10 (the X-axis direction in FIG. 45), in other words, the LED chips 101, 102 located at different rows of the two rows of LED chips 101, 102 are incompletely superposed when viewed from a lateral side of the filament, or the superposing area is less than 100%), and the two rows of LED chips 101, 102 are respectively arranged along the length direction of the LED filament 10 (the Y-axis direction in FIG. 45). Adjacent LED chips 101, 102 are connected with each other through the conductive portion 106. In FIG. 45, the two electrodes 103, 104 are disposed at two ends of the LED filament 10 to be connected with two ends of the LED chips 101, 102 through the conductive portion 106. Each electrode 103, 104 is partially exposed from the light conversion layer 105. In the embodiment shown in FIG. 45, the LED chips 101, 102 has a length size wc along the length direction of the LED filament 10. The ratio of the sum of lengths wc of all LED chips 101, 102 (i.e., Σwc) to the length of the LED filament 10 is greater than 0.5, 0.6, 0.65 or 0.7 to guarantee the arrangement density of the LED chips 101, 102 in the length direction of the LED filament 10 so as to increase the total luminous flux and reduce the graininess of light emission. Because the adjacent LED chips 101, 102 are alternately arranged in the width direction of the LED filament 10, a better bendability can be obtained under the condition of the LED chips 101, 102 having the same intervals. Contrarily, in the case that the ratio of the sum of lengths wc of all LED chips 101, 102 (i.e., Σwc) to the length of the LED filament 10 is greater than 0.5, 0.6, 0.65 or 0.7 and the LED chips 101, 102 are arranged in a single row, the LED filament 10 may have poor bendability, so that the LED filament cannot be bent properly and the shape of the LED filament 10 will be limited.

Figure 46:
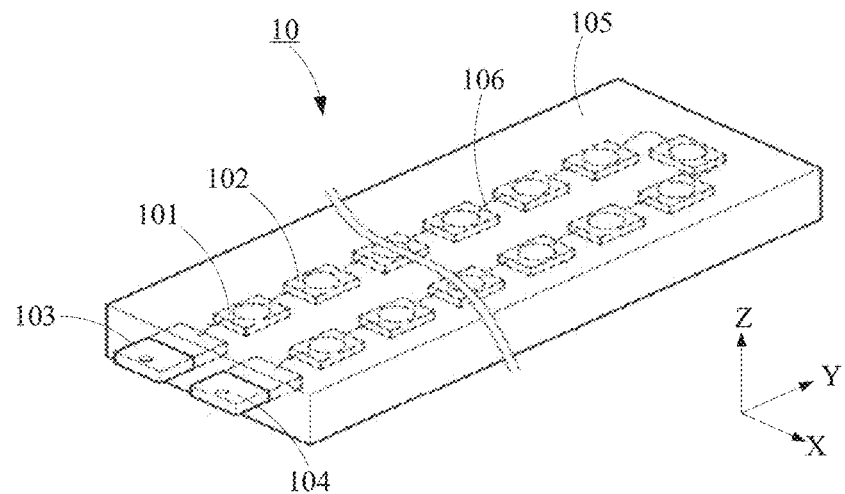

In the embodiment shown in FIG. 46, the multiple LED chips 101, 102 are arranged into an inverted-U shape or an n-shape, and the adjacent LED chips 101, 102 adopt an electric connection in series. The electrodes 103, 104 are arranged at the open end of the inverted-U shape or the n-shape and respectively electrically connected to corresponding one of the LED chips 101, 102. From the perspective view, the two electrodes 103, 104 are disposed at an end of the LED filament 10 (the end corresponds to the open end of the inverted-U shape or the n-shape) and are partially exposed from the light conversion layer 105.

Figure 48:
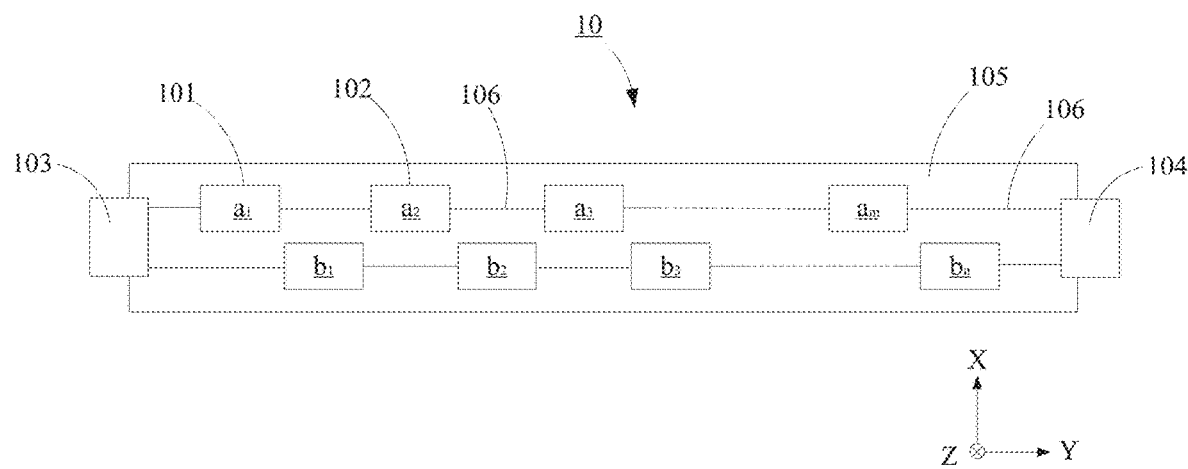

In some embodiments, as shown in FIG. 47 and FIG. 48, the multiple LED chips 101, 102 may also be arranged into at least two substantially parallel rows (two rows are shown in FIG. 47 and FIG. 48 as an example). Each row of LED chips 101, 102 is respectively electrically connected in series. The two electrodes 103, 104 are disposed at two ends of the at least two rows of LED chips 101, 102 and respectively connected to each row of LED chips 101, 102 to form a configuration in which two LED chips are first connected in series and then two series-connected chips are then connected in parallel. FIG. 47 and FIG. 48 adopt two electrodes as an example, but the disclosure is not limited thereto, three or four electrodes may be available, for example, one of the electrodes 103, 104 in FIG. 47 or FIG. 48 is replaced with two independent sub-electrodes, the two sub-electrodes are respective positive terminals of an electric power and the remained electrode is a common ground terminal, or all of two electrode in FIG. 47 or FIG. 48 are replaced with two sub-electrodes to match with different applications.

In the embodiment shown in FIG. 48, one of the rows of LED chips, which is the closest to an end of the LED filament, is referred to as LED chip $a_1$, and the LED chips in this row from an end of the LED filament to the other end are referred to as $a_1, a_2, a_3, \ldots,$ and $a_m$ (m is an integer). The other one of the rows of LED chips, which is the closest to an end of the LED filament, is referred to as LED chip $b_1$, and the LED chips in this row from an end of the LED filament to the other end are referred to as $b_1, b_2, b_3, \ldots,$ and $b_n$ (n is an integer). In the length direction of the LED filament 10 (the Y-axis direction in FIG. 48), LED chip $b_n$ is between LED chip $a_n$ and LED $a_{n+1}$ (for example, when viewing from the length direction, LED chip $b_1$ is between LED chip $a_1$ and LED chip $a_2$, and LED chip $b_2$ is between LED chip $a_2$ and LED chip $a_3$). Further, the projection of LED chip $b_n$ in the width direction of the LED filament 10 and the projection of LED chip $a_n$ in the width direction of the LED filament 10 (the X-axis direction in FIG. 48) do not have an overlapping area. In other words, in some embodiments, one row of LED chips and the other row of LED chips are alternately arranged in the width direction (the X-axis direction in FIG. 48). Of course, in some embodiments, the projection of LED chip $b_n$ in the width direction of the LED filament 10 and the projection of LED chip $a_n$ in the width direction of the LED filament 10 (the X-axis direction in FIG. 48) have a certain overlapping area, but the overlapping area is less than 100%. It should be understood that FIG. 48 adopts two rows of LED chips, which have the same numbers, to serve as an example. In actual applications, the numbers of two rows of LED chips are not necessarily the same or different, i.e., the maximum of n may be greater than, less than, or equal to the maximum of m, as long as one row of LED chips, which has a less number and a corresponding number of LED chips in the other row are alternately arranged or at least partially alternately arranged with each other. The remaining LED chips of the row having a greater number are still extending and arranged along the length direction of the LED filament. In one embodiment, as shown in FIG. 48, the plurality of LED chips further comprises a first row of LED chips and a second row of LED chips, the first row of LED chips and the second row of LED chips are connected in parallel, the LED chips of the first row of LED chips are connected in series, the LED chips of the second row of LED chips connected in series, and the first row of LED chips and the second row of LED chips are alternately arranged along a width direction of the LED filament 10.

Under the arrangement of the same number of LED chips, the longer the LED filament is, the larger the interval between two adjacent LED chips is. After the LED filament is lit, light spots (or called graininess) seen by the naked eye will become more obvious to seriously affect viewing comfort of users. In addition, the LED filaments with the same length, the greater the number of LED chips is, the smaller the interval between two LED chips is, and heat generated by adjacent LED chips will be affected mutually. To guarantee that the LED filament has a great effect of light emission and heat dissipation performance, the embodiment shown in FIG. 48 adopts two rows of LED chips connected in parallel, and the LED chips in one row and the LED chips in the other row are alternately arranged in the width direction of the LED filament, so that the light emitted by one row of LED chips can complement light spots generated by the other row of LED chips to improve the light-emitting effect of the LED filament. In addition, in comparison with an LED filament with the same LED filament length and the same number of LED ships, an interval between two adjacent LED chips in each row of LED chips is larger, so heat generated by adjacent LED chips will be hard to be affected mutually and the junction temperature of the LED filament lowers.

Figure 49:
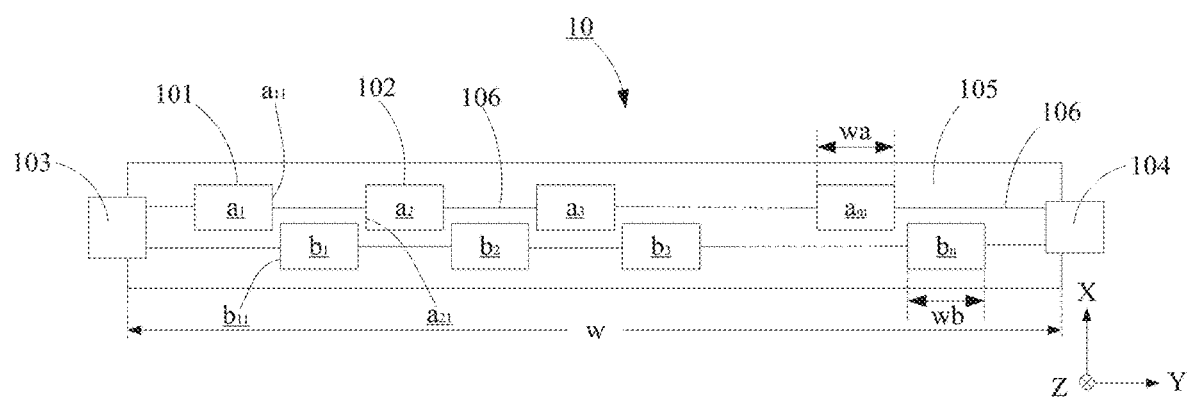

Moreover, as shown in FIG. 49, on the condition of the arrangement of the LED chips as shown in FIG. 48, the projections of LED chips in one row and LED chips in the other row have an overlapping area in the length direction of the LED filament 10 (the Y-axis direction in FIG. 49) so as to reduce the width of the LED filament to make both the width of the LED filament closer to a conventional tungsten filament lamp, thereby allowing the LED filament to be more pretty when being bent or wound. In detail, each of LED chip $a_m$ and LED $b_n$ has multiple sides. In the length direction of the LED filament 10, a side of LED chip $b_n$ is between the same sides of LED chip $a_n$ and LED chip $a_{n+1}$ (for example, in FIG. 49, a side of LED chip $b_1$ is between a side an of LED chip $a_1$ and a side $a_{21}$ of LED chip $a_2$). In some embodiments, the side an faces the side $a_{21}$. In some embodiments, in the width direction of the LED filament 10 (for example, the X-axis direction in FIG. 49), widths of LED chip $a_m$ and LED chip $b_n$ are wa and wb, respectively. The width w of the LED filament 10 is not less than the sum of wa and wb, i.e., w≥wa+wb.

In any embodiment shown in FIG. 43 to FIG. 49, adjacent LED chips 101, 102 are electrically connected with each other through the conductive portion 106, and the LED chips 101, 102 and the electrodes 103, 104 are electrically connected with each other through the conductive portion 106, too. The conductive portion 106 may be a conductive metal wire, conductive film, or conductive metallic sheet. In the following embodiments, the conductive portion 106 is configured into a conductive metal wire as an example, which should not be deemed as a limitation to the disclosure. A conductive metal wire serving as the conductive portion 106 as an example, the diameter of the conductive metal wire may be configured to be between 0.5 mil and 1.5 mil and may be a single metal wire such as a gold wire, a silver wire, an aluminum wire or a copper wire or an alloy wire made of two or more metals with a certain proportion such as a gold-silver alloy wire.

The connection between the conductive portion 106 and the LED chips 101, 102 and the connection between the conductive portion 106 and the electrodes 103, 104 are fixed connections. In detail, the LED chips 101, 102 is provided with a first electrical connecting portion and a second electrical connecting portion (for example, the electrical connecting portion may be a solder joint or pad). The first end of the conductive portion 106 is fixed on the second electrical connecting portion of an LED chip 101, and the second end is fixed on the first electrical connecting portion of another LED chip 102 adjacent to the LED chip 101, so as to implement an electrical connection or signal connection between adjacent LED chips 101, 102. The electrode 103, 104 is also provided with an electrical connecting portion (for example, the electrical connecting portion may be a solder joint or pad). The first end and the second end of the conductive portion 106 are respectively fixed to the electrode 103, 104 and the electrical connecting portion of the LED chip 101, 102 adjacent to the electrode 103, 104, so as to implement an electrical connection or signal connection between the electrodes 103, 104 and the LED chips 101, 102.

In some embodiments, the conductive portion 106 is formed by wiring. The wiring is formed by wire bonding. In some embodiments, a wire and a corresponding electrical connecting portion are connected and fixed with each other using thermocompression bonding, ultrasonic bonding or thermosonic bonding to form each conductive portion 106 in the LED filament 10. These bonding methods require applying pressure to the wire.

Specifically, the wire bonding may be implemented using a wire bonding machine (which may be referred to as a wire soldering machine). The wire bonding machine is provided with a ceramic capillary which has a through hole (also referred to as wire hole) allowing the wire to pass through. The wire is heated in front of the ceramic capillary using a firing member to form a ball-shaped article, and the ceramic capillary brings the ball-shaped article to move downward to correspond to the electrical connecting portion to be connected (for example, the second electrical connecting portion of an LED chip) to apply pressure on the wire to form the first joining portion (or also referred to as the first soldering point), so that the fixation of the first end of the conductive portion is implemented. Then, the ceramic capillary is moved toward another electrical connecting portion to be connected (for example, the first electrical connecting portion of another LED chip adjacent to the LED chip) along a constant trace, thereby forming the arc shape of the conductive portion. Further, the ceramic capillary again moves downward to correspond to the electrical connecting portion to apply pressure on the wire to form the second joining portion (or also referred to as the second soldering point), so that the fixation of the second end of the conductive portion is implemented. Thereafter, the ceramic capillary is moved laterally to cut the wire and a wire bonded conductive portion can be formed. In other words, during the wire bonding process, the wire is between the LED chip and the ceramic capillary or between the electrode and the ceramic capillary, and by using the ceramic capillary to apply pressure on the wire, the wire and the LED chip (or the electrode) can be bonded.

It is noted that the wire is referred to the material used for forming the conductive portion such as a conductive metal wire, and the conductive portion formed thereby is a conductive metal wire, too. In addition, the disclosure refers to the region formed by joining the wire and the electrical connecting portion as "joining portion". To distinguish different joining portions, during the process of forming a conductive portion, the region formed by joining the start point of the wire and the electrical connecting portion is referred to as first joining portion (or first soldering joint), the region formed by joining the end point of the wire and the electrical connecting portion is referred to as second joining portion (or second soldering joint), an end of the conductive portion, which is connected to the first joining portion, is defined as a first end of the conductive portion, and an end of the conductive portion, which is connected to the second joining portion, is defined as a second end of the conductive portion.

Figure 50:
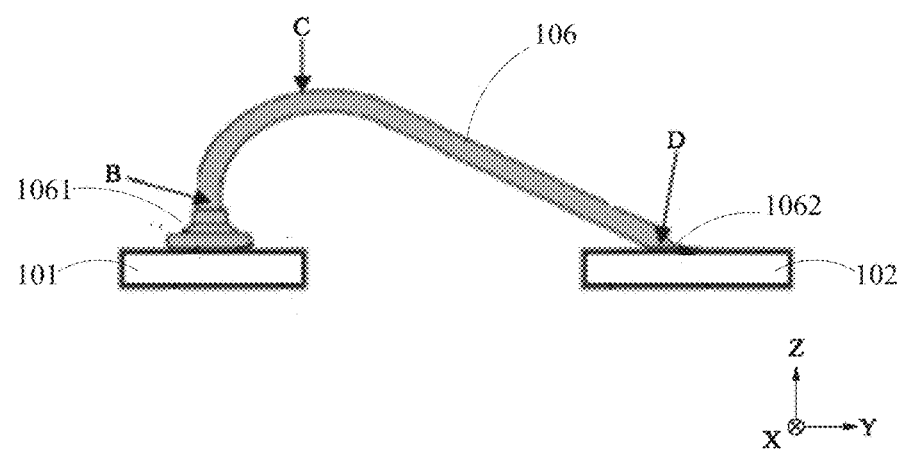
FIG. 50 is a structural schematic view of the conductive portion of the disclosure in an embodiment.

Referring to FIG. 50, a structural schematic view of the conductive portion, according to one embodiment of the present disclosure is shown. FIG. 50 shows the conductive portion 106 connected between adjacent LED chips 101 and 102 as an example. The conductive portion 106 may also be connected between the LED chip 101, 102 and the electrode 103, 104. After the conductive portion 106 has been formed, the connection quality of the conductive portion 106 primarily depends upon three positions B, C, and D in FIG. 50. That is, an unreliable connection in the conductive portion 106 mainly results from poor quality at the positions B, C, or D. Position B is the junction of the first end of the conductive portion 106 and the first joining portion 1061. Position D is the junction of the second end of the conductive portion 106 and the second joining portion 1062, and position C is the line segment of the conductive portion 106 (i.e., the region between position B and position D).

Figure 51:
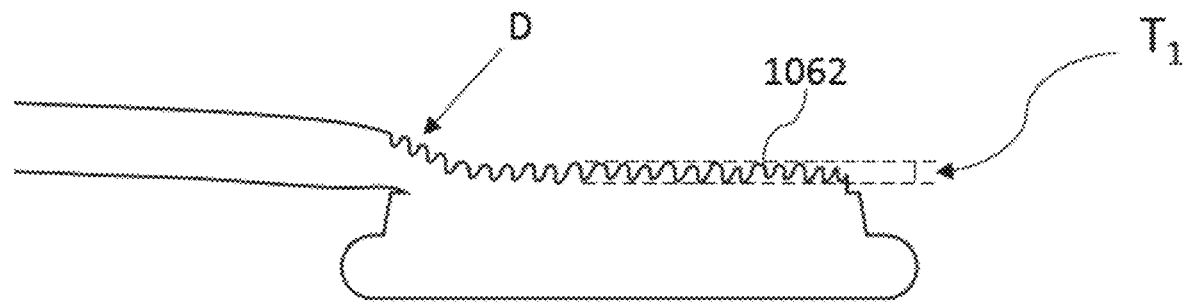
FIG. 51 is a structural schematic view of the second joining portion in related art.
Figure 52A:
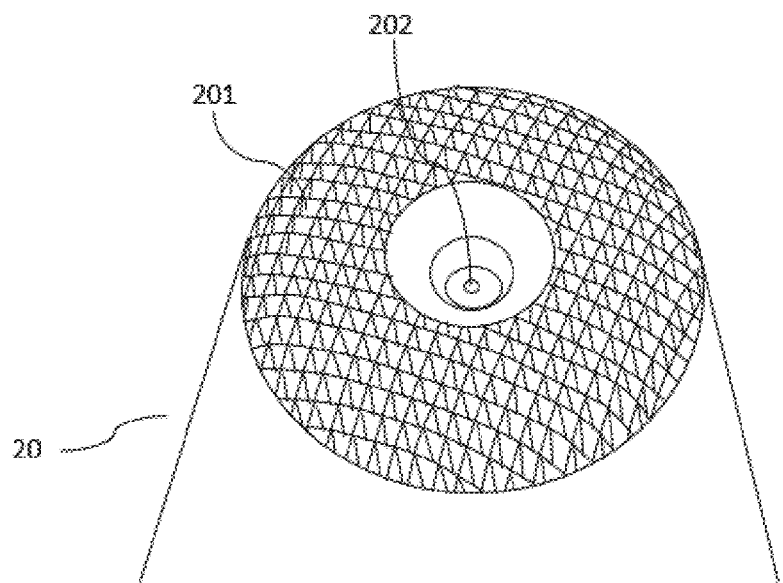
FIG. 52A is a structural schematic view of the ceramic capillary in related art.
Figure 52B:
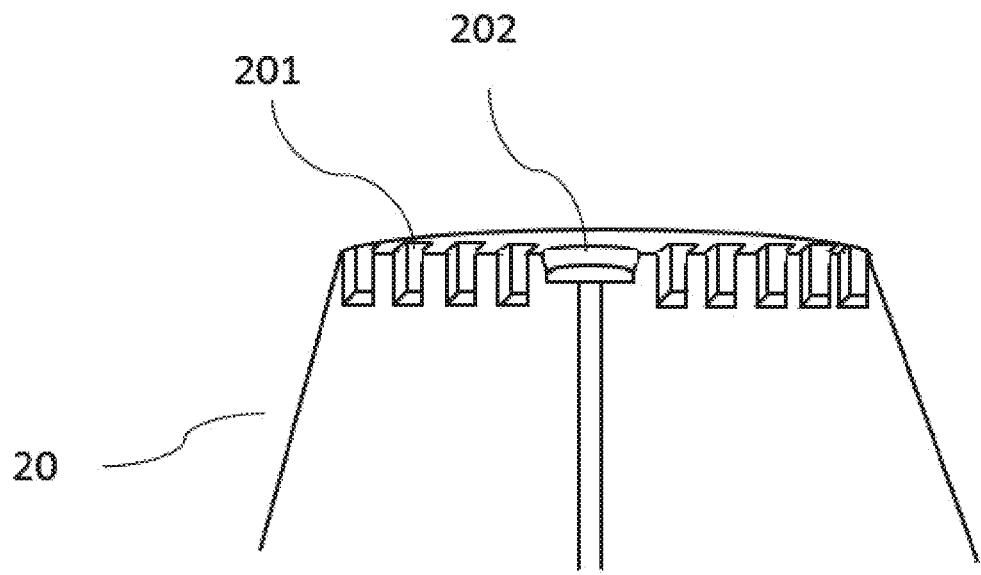
FIG. 52B is a cross-sectional structural schematic view of the ceramic capillary shown in FIG. 52A.

As known to the inventor, the conductive portion 106 may be formed using bond stick on ball (BSOB) technique. Take FIG. 50 as an example, a solder ball is placed on the first electrical connecting portion of the LED chip 102 in advance, the first joining portion 1061 is formed when bonding, and then the second joining portion 1062 is formed. The second joining portion 1062 is formed by pressing the wire on the solder ball to be joined so as to form the second joining portion 1062 as shown in FIG. 51. The second joining portion 1062 has a meshy surface. The second joining portion 1062 and the meshy surface are formed by the ceramic capillary 20, as shown in FIG. 52A and FIG. 52B. The surface of the second joining portion 1062 forms an obviously highly staggered region, which can be specifically said to be a bulge structure and an indent structure, according to some embodiments. The first height difference $T_1$ between the highest point of the bulge structure and the lowest point of the indent structure is between 5 um and 15 um, i.e., $5 \leq T_1 \leq 15$ um, in some embodiments. The height difference between the bulge structure and the indent structure in the position D may also be called $T_1$, and $5$ um$\leq T_1 \leq 15$ um, in some embodiments. The ceramic capillary 20 includes a surface 201 and a wire hole 202 for being passed by the wire (which may be a conductive metal wire). The surface is a face being in contact with the wire. In some embodiments, the surface 201 shown in FIG. 52A and FIG. 52B is configured as a mesh structure. The mesh structure is configured as a recess structure with an array arrangement in some embodiments. Further, in some embodiments, the depth of the recess structure may be made larger to make the surface 201 have higher roughness. Therefore, deep indentations will be left on the surface of the wire during the wire bonding process. As shown in FIG. 51, a surface of the second joining portion 1062 has a bulge structure and an indent structure, which correspond to the surface 201 of the mesh structure of the ceramic capillary 20 shown in FIG. 52A. The depth of the indent structure is relatively larger, and the overall thickness of the area in which the indent structure is located is relatively smaller. The thinner part is more susceptible to fracture compared to other regions. This may lead to issues such as an open or short circuit when connecting with other circuits, causing the LED filament to malfunction. For instance, some or all of the LED chips may not light up or may have abnormal brightness. In one embodiment, the first electrical connecting portion of the LED chip 102 is configured as a negative electrode (or cathode) of the LED chip 102, the second electrical connecting portion of the LED chip 102 is configured as a positive electrode (or anode) of the LED chip 102. That is, the first joining portion 1061 is formed on the positive electrode of the LED chip 101, and the second joining portion 1062 is formed on the negative electrode of the LED chip 102. In one embodiment, as shown in FIG. 51, the end portion of the conductive portion 106, the electrical connecting portion of the LED chip 102, and the first solder layer together form a joining portion (in FIG. 51, the second joining portion 1062), the joining portion has a meshy surface, and a plurality of bulges and a plurality of indents are alternately arranged on the meshy surface.

Figure 53A:
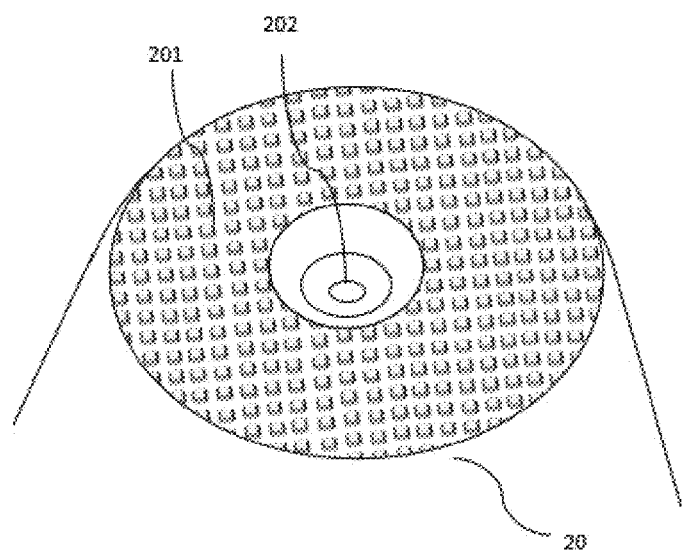
FIG. 53A is a structural schematic view of the ceramic capillary of the disclosure in an embodiment.
Figure 53B:
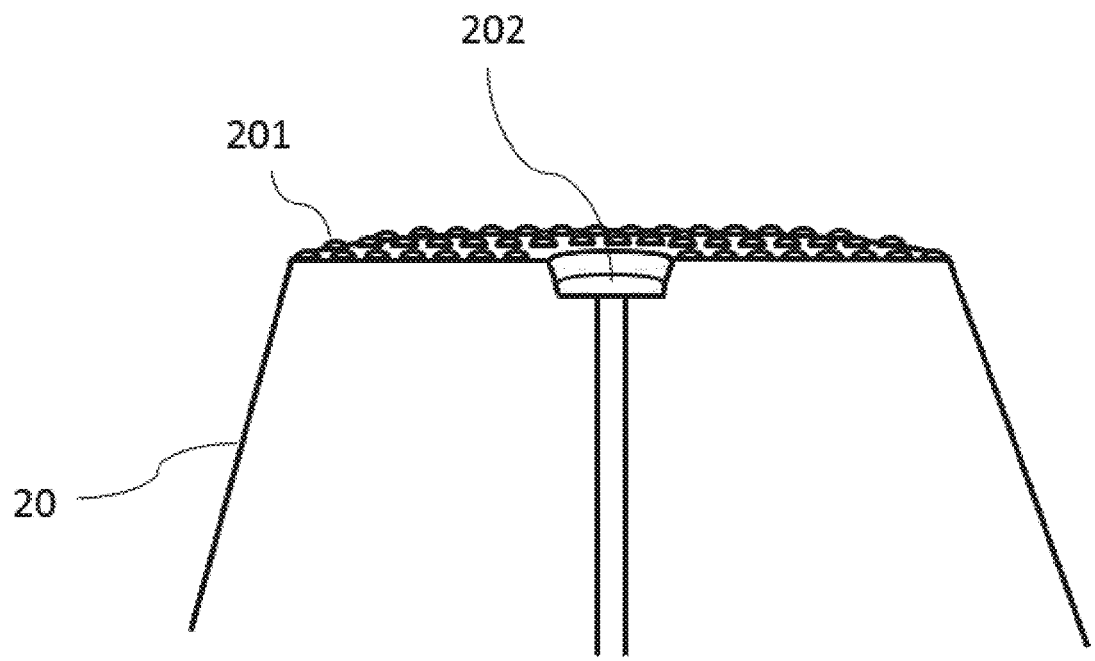
FIG. 53B is a cross-sectional structural schematic view of the ceramic capillary shown in FIG. 53A.
Figure 54:
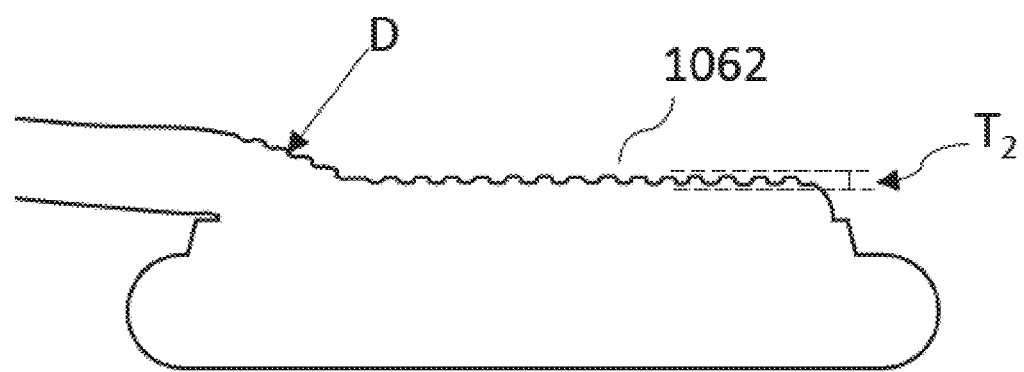
FIG. 54 is a structural schematic view of the second joining portion of the disclosure in an embodiment.

To solve the problem of fracture of position D, in some embodiments, the surface of the second joining portion 1062 is provided with a corresponding structure by providing ceramic capillaries with different surface structures. FIG. 53A and FIG. 53B. FIG. 53A are structural schematic views of the ceramic capillary according to embodiments of the present invention. FIG. 53B is a cross-sectional structural schematic view corresponding thereto. In comparison with the ceramic capillary structure shown in FIG. 52A and FIG. 52B, the surface 201 of the ceramic capillary 20 in FIG. 53A and FIG. 53B also features a mesh structure. However, the mesh structure in FIG. 53A and FIG. 53B is configured as a bulge structure with an array arrangement, and the bulge structure includes tiny bulges. That is, the height difference between the bulge portion and the non-bulge portion in the bulge structure is smaller, at least smaller than the depth of the recess structure shown in FIG. 52A and FIG. 52B. Furthermore, each bulge in the structure has an edge that is smoothly arcuate in shape, according to some embodiments of the present invention. FIG. 54 is a structural schematic view of the second joining portion 1062 according to one embodiment of the present disclosure. Like the tiny bulge structure on the surface 201 of the ceramic capillary 20 in FIG. 53A, the surface of the second joining portion 1062 in FIG. 54 is a tiny indented surface. The height difference between the highest point of the bulge structure and the lowest point of the indent structure is called second height difference $T_2$. In some embodiments, $T_2$ ranges between 1 um and 5 um, i.e., $1$ um$\leq T_2 \leq 5$ um. The height difference between the highest point of the bulge structure and the lowest point of the indent structure in position D may also be called second height difference T2. In some embodiments, T2 ranges between 1 um and 5 um, i.e., $1$ um$\leq T_2 \leq 5$ um. Position D and the second joining portion 1062 do not contain any particularly thin parts, which helps prevent fracture.

Figure 55:
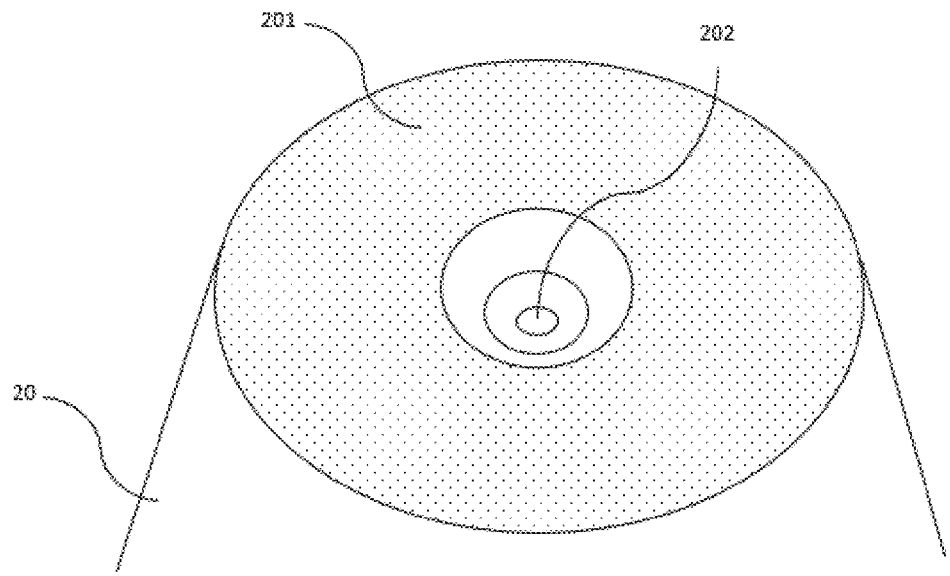
FIG. 55 is a structural schematic view of the ceramic capillary of the disclosure in an embodiment.
Figure 56:
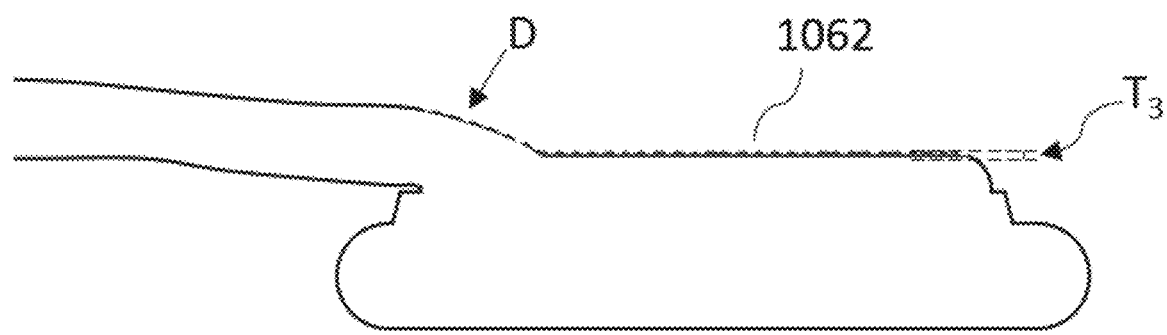
FIG. 56 is a structural schematic view of the second joining portion of the disclosure in an embodiment.
Figure 57A:
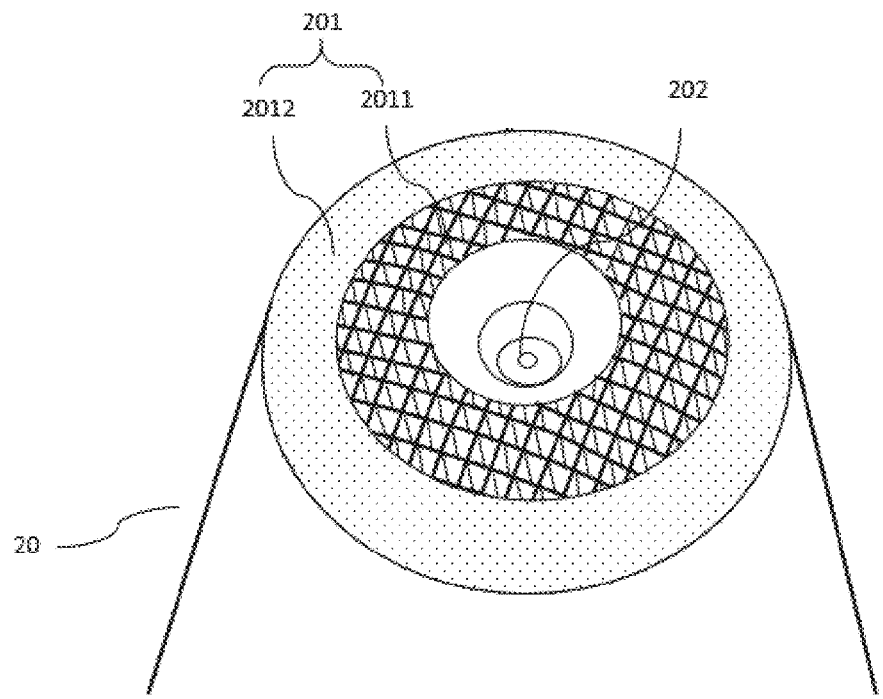
FIG. 57A to FIG. 57D are schematic view of the ceramic capillary having surfaces with two roughnesses of the disclosure in different embodiments.
Figure 57B:
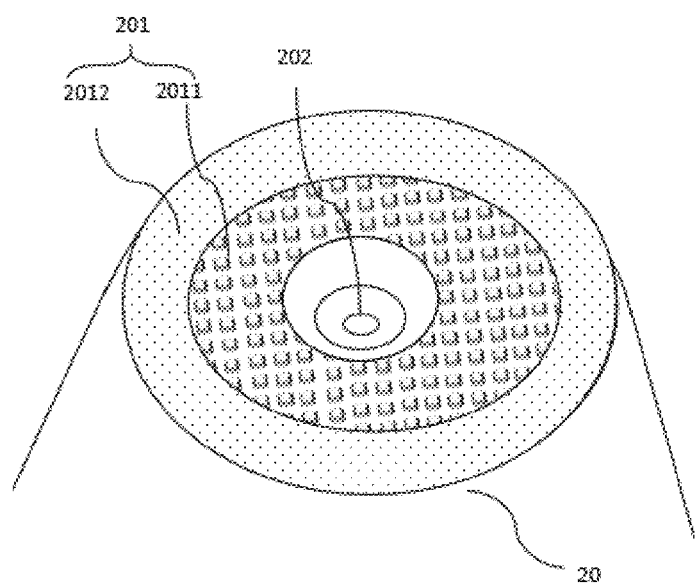
Figure 57C:
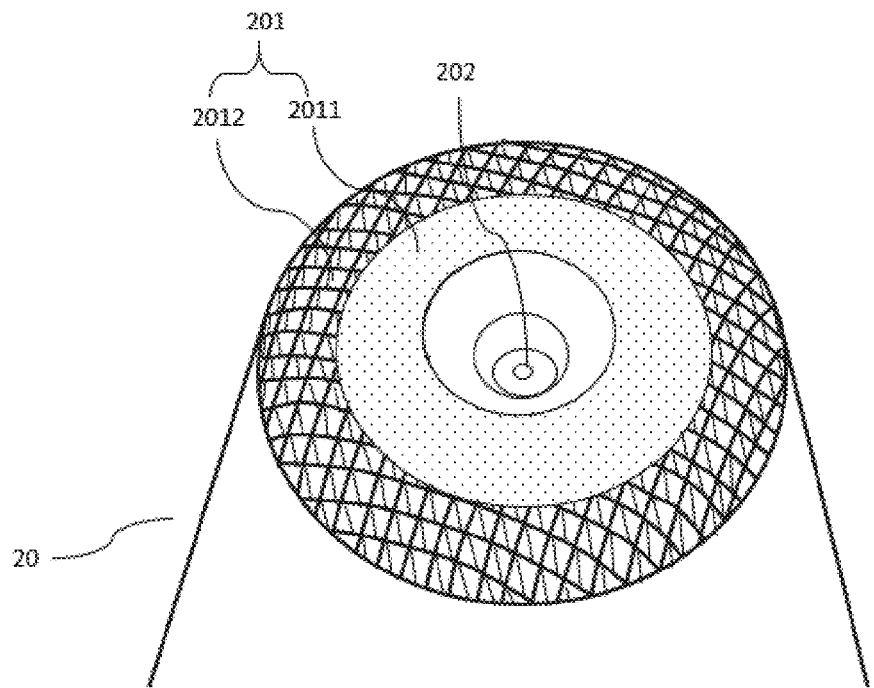
Figure 57D:
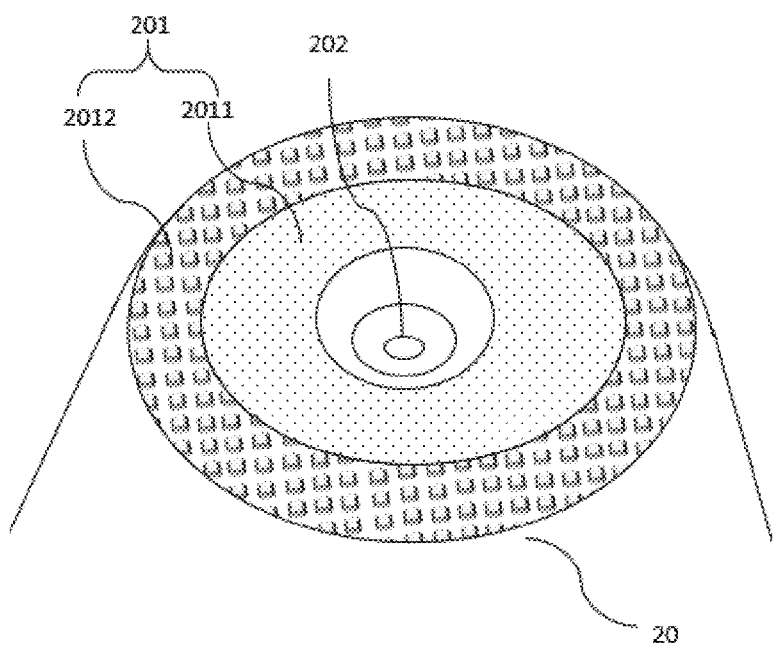

FIG. 55 is a structural schematic view of the ceramic capillary, according to one embodiment of the present invention. In comparison with the ceramic capillary shown in FIG. 52A, the surface 201 of the ceramic capillary 20 in FIG. 55 is configured as a frosted structure. The surface of the frosted structure has a grainy texture. For example, the grainy structure may be formed by a tiny bulge structure and an indent structure, but the height difference between the bulge structure and the indent structure is too small to form a noticeable mesh-like appearance. The ceramic capillary 20 uses the surface 201 with the frosted structure to exert pressure on the wire, creating a corresponding structure on the surface of the second joining portion 1062. In FIG. 56, a structural schematic view of the second joining portion according to one embodiment is shown. In comparison with the frosted structure of the surface 201 of the ceramic capillary 20 in FIG. 55, the surface of the second joining portion 1062 has a frosted surface without any obviously thin regions. This effectively improve the problem of fracture in position D. In FIG. 56, the height difference between the highest point of the bulge structure and the lowest point of the indent structure at position D, formed by the second joining portion 1062 of the ceramic capillary 20 shown in FIG. 55, is referred to as $T_3$. According to some embodiments, $T_3$ ranges from 0 to 1 um, i.e., $0 \leq T_3 \leq 1$ um.

FIG. 57A to FIG. 57D are schematic views of the ceramic capillary 20 with surfaces having two different roughness levels, according to embodiments of the present invention. When comparing the ceramic capillary structure shown in FIG. 52A to the ceramic capillary in FIG. 57A to FIG. 57D, the surface 201 in FIG. 57A to FIG. 57D is configured to include a first portion 2011 and a second portion 2012. The second portion 2012 surrounds the first portion 2011, and the first portion 2011 and the second portion 2012 together form the surface 201 of the ceramic capillary. The roughness of the first portion 2011 is different from the roughness of the second portion 2012. Specifically, in one embodiment, the first portion 2011 is configured as a recess-shaped mesh structure, while the second portion 2012 is configured as a frosted structure. There is an obvious difference in surface roughness between the two portions 2011, 2012. The surface roughness of the first portion 2011 is much greater than the surface roughness of the second portion 2012. In the embodiment shown in FIG. 57B, the first portion 2011 is configured as a bulge-shaped mesh structure and the second portion 2012 is configured as a frosted structure. An obvious difference in surface roughness exists between the two portions 2011, 2012. The surface roughness of the first portion 2011 is much greater than the surface roughness of the second portion 2012. In the embodiment shown in FIG. 57C, the first portion 2011 is configured as a frosted structure and the second portion 2012 is configured as a recess-shaped mesh structure. An obvious difference in surface roughness exists between the two portions 2011, 2012. The surface roughness of the first portion 2011 is much less than the surface roughness of the second portion 2012. In the embodiment shown in FIG. 57D, the first portion 2011 is configured as a frosted structure and the second portion 2012 is configured as a bulge-shaped mesh structure. An obvious difference in surface roughness exists between the two portions 2011, 2012. The surface roughness of the first portion 2011 is much less than the surface roughness of the second portion 2012.

Figure 58:
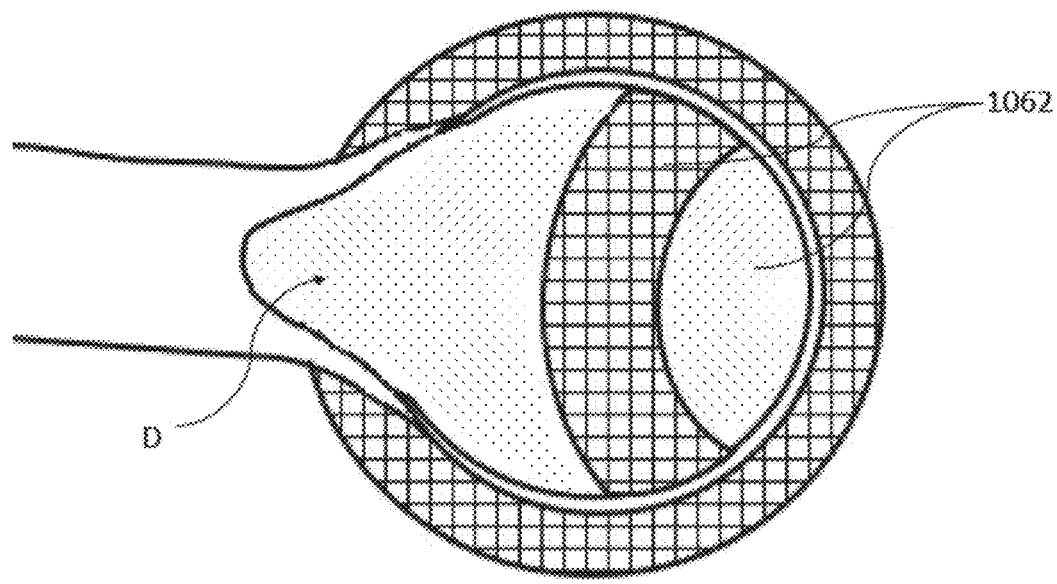
FIG. 58 is a structural schematic view of the second joining portion of the disclosure in an embodiment.

In the embodiments of the ceramic capillary with two different surface roughness, such as the ceramic capillary shown in any embodiment of FIG. 57A to FIG. 57D, when the ceramic capillary applies pressure to the wire (a conductive metal wire or the conductive portion) during wiring, the corresponding surface of the wire will also exhibit two different surface roughness. FIG. 58 is a structural schematic view of the second joining portion according to one embodiment of present invention. Surface of the second joining portion 1062 in FIG. 58 has two different roughness which is formed by the ceramic capillary shown in FIG. 57D. According to the embodiment shown in FIG. 58, the problem of fracture at position D can be effectively improved.

In other embodiments, the surface of the ceramic capillary may also be configured to have regions with more than two different roughness levels. This allows the surface of the joined portion, formed by applying pressure, to have regions with more than two different roughness levels. This can also improve the problem of fracture at position D. In addition, the surface of the ceramic capillary with varying levels of roughness may also be arranged in non-annular patterns. In some embodiments, it may be in the form of independent blocks, strips, or other shapes, as long as there are surfaces with two or more noticeable surface roughness levels on the surface of the ceramic capillary to be apply pressure to the wire.

In some embodiments, the wire hole 202 in the ceramic capillary has at least two different diameters. In some embodiments, the wire hole 202 may include a circular through hole portion and a cylindrical through hole portion connected to a small surface of the circular through hole portion. The diameter of the larger surface of the circular through hole is greater than the diameter of the wire.

In the above embodiments, the problem of fracture of the conductive portion can be improved by changing the surface structure of the second joining portion.

Figure 59A:
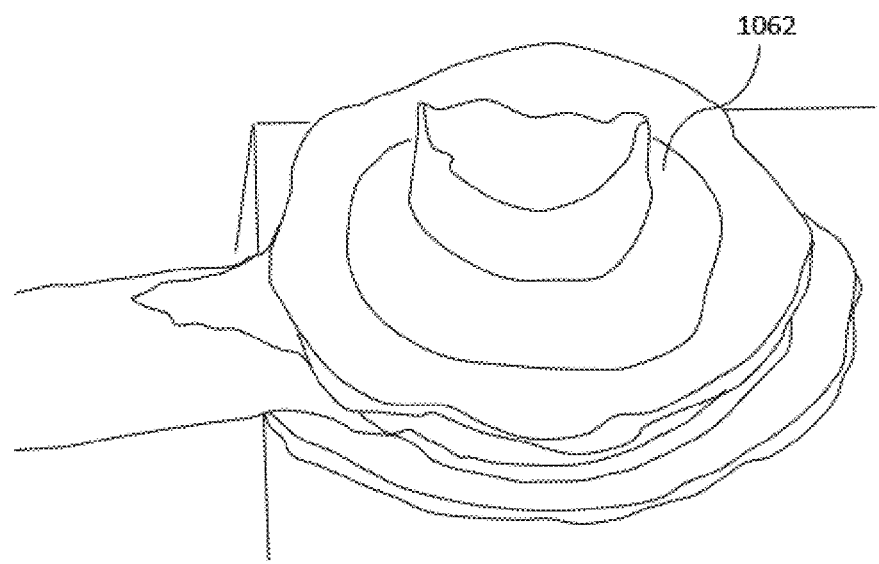
FIG. 59A is a structural schematic view of the second joining portion of the disclosure in an embodiment.
Figure 59B:
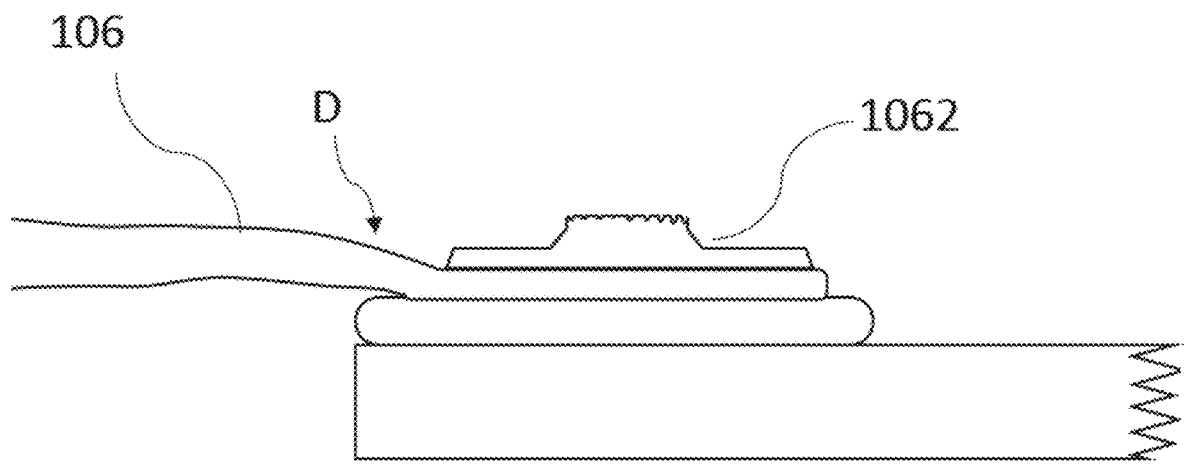
FIG. 59B is a cross-sectional structural schematic view of the second joining portion of the disclosure in FIG. 59A.

In other embodiments of the present disclosure, the conductive portion 106 formed by the BWB (Ball Wire Bonding), as shown in FIG. 50. It is also necessary to place a solder ball on the first electrical connecting portion of the LED chip 102 in advance. During the bonding process, the first joining portion 1061 is formed first, followed by the formation of the second joining portion 1062. The second joining portion 1062 is formed by using a ceramic capillary method to press the wire to be bonded on the solder ball that has been placed on the first electrical connecting portion. Another solder ball is then soldered and pressed thereon to form the second joining portion 1062, creating a three-layer structure with the conductive portion 106 being sandwiched between two solders. (See FIG. 59A for a schematic view of the second joining portion, according to one embodiment of the present disclosure). FIG. 59B is a corresponding cross-sectional schematic view. As a result, the second end of the conductive portion is protected by the solder ball to effectively prevent the conductive portion from fracturing at position D. The process involves bonding a solder ball onto a corresponding position of the LED chip 102 and pressing the solder ball to form the required shape. Then, the conductive portion 106 is bonded on a side of the first solder ball that is away from the LED chip 102. Finally, a second solder ball is bonded on a side of the conductive portion 106 that is away from the first solder ball in order to fix the conductive portion 106 and the LED chip 102, and ultimately form the second joining portion 1062. The LED chip 102 is bonded with the melted solder first. In the electrical connection, the current is conducted from the conductive portion 106 to the solder (i.e., the first solder ball) bonded with the LED chip 102 first, and then conducted to the LED chip 102. In other words, in one embodiment, as shown in FIG. 59A and FIG. 59B, the second solder ball is formed as a second solder layer, and the end portion of the conductive portion 106 is between the first solder layer and the second solder layer.

In some embodiments, when the first solder ball, the conductive portion 106 and the second solder ball are bonded to the LED chip 102, the projection area of the flattened first solder ball (or first solder layer) and the flattened second solder ball (or second solder layer) on the LED chip 102 after soldering are larger than the projection area of the bonding region between the first solder layer, the second solder layer, and the conductive portion 106 on the LED chip 102, such that the flattened first solder ball and the flattened second solder ball wrap the conductive portion 106 and the bonding region between the first solder layer and the conductive portion 106 as well as the bonding region between the second solder layer and the conductive portion 106. The first flattened solder ball and the second flattened solder ball are at least partially bonded, so the two flattened solder balls after soldering can completely wrap the bonding region of the conductive portion 106 to increase the strength of the bonding region of the conductive portion 106 to avoid fracture. In one embodiment, as shown in FIG. 59A and FIG. 59B, each of a projection area of the first solder layer on the electrical connecting portion of the LED chip 102 and a projection area of the second solder layer on the electrical connecting portion of the LED chip 102 is larger than a projection area of a bonding region between the conductive portion 106 and the first solder layer, and between the conductive portion 106 and the second solder layer on the electrical connecting portion of the LED chip 102.

In some embodiments, the projection area of the bonding region between the conductive portion 106 and the solder balls on the LED chip is smaller than the projection area of the first flattened solder ball on the LED chip, and the projection area of the first flattened solder ball on the LED chip is smaller than the projection area of the second flattened solder ball on the LED chip. The second flattened solder ball completely covers the bonding region between the first flattened solder ball and the conductive portion 106 on the LED chip 102. The flattened second solder ball is at least partially directly bonded to the LED chip 102. In one embodiment, as shown in FIG. 59A and FIG. 59B, a projection area of a bonding region between the conductive portion 106 and the electrical connecting portion of the LED chip 102 is smaller than the projection area of the first solder layer, and the projection area of the first solder layer is smaller than the projection area of the second solder layer.

Figure 60A:
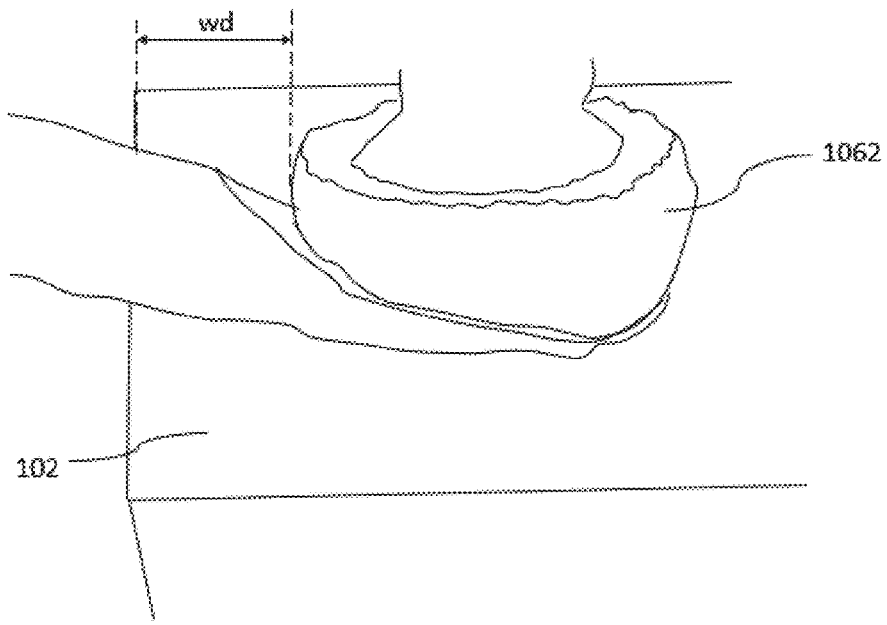
FIG. 60A is a structural schematic view of the second joining portion of the disclosure in an embodiment.
Figure 60B:
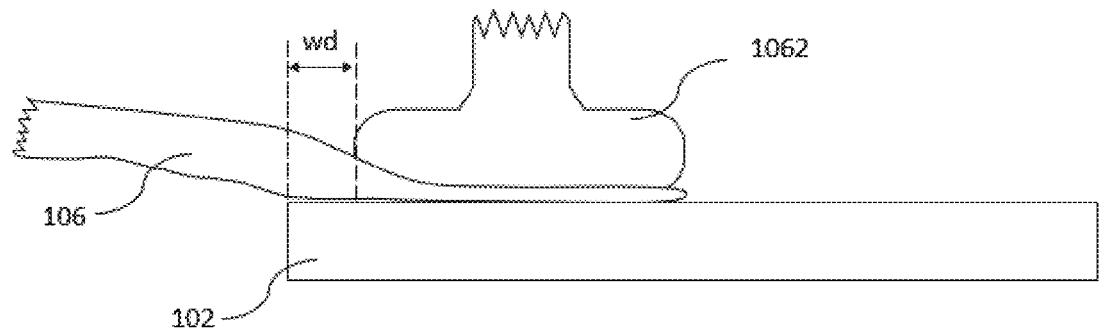
FIG. 60B is a cross-sectional structural schematic view of the second joining portion of the disclosure in FIG. 60A.

In other some embodiments of the disclosure, the conductive portion 106 is formed by the BBOS (Bond Ball on Stitch) technique. In FIG. 50A and FIG. 50B, when bonding, the first joining portion 1061 is formed first. Then the ceramic capillary is moved to apply pressure and bond the wire to the first electrical connecting portion of the LED chip 102. Subsequently, another solder ball is formed on the wire, resulting in the formation of the second joining portion 1062, as shown in FIG. 60A and FIG. 60B (FIG. 60A is a structural schematic view of the second joining portion 1062, according to an embodiment, and FIG. 60B is a cross-sectional schematic view corresponding to FIG. 60A). FIG. 59B is a corresponding cross-sectional schematic view. Thus, the second end of the conductive portion is still covered by a solder layer to greatly improve the problem of fracture of the conductive portion at position D and increase the efficiency of wire soldering. In one embodiment, the first electrical connecting portion of the LED chip 102 is configured as a positive electrode (also called anode), and the second electrical connecting portion of the LED chip 102 is configured as a negative electrode (also called cathode). That is, in one embodiment, the first joining portion 1061 is formed on the negative electrode of the LED chip 101, and the second joining portion 1062 is formed on the positive electrode of the LED chip 102. In one embodiment, the conductive portion 106 is bonded with the LED chip 102 first, and then a solder ball is bonded on a side of the conductive portion 106, which is away from the LED chip 102 to finally form the second joining portion 1062. The projection area of the solder on the LED chip 102 is larger than the projection area of the bonding region between the conductive portion 106 and the LED chip 102, so that the bonding region between the conductive portion 106 and the LED chip 102 can be completely wrapped on the LED chip 102. That is, the conductive portion 106 itself is bonded to the LED chip 102, and the LED chip is further wrapped by a solder ball. Therefore, two fixations are provided to increase firmness and reduce the number of processing steps, according to one embodiment. In one embodiment, as shown in FIG. 60A and FIG. 60B, the solder ball is formed as a first solder layer, and the end portion of the conductive portion 106 is between the electrical connecting portion of the LED chip 101 and the first solder layer. In one embodiment, as shown in FIG. 60A and FIG. 60B, a projection area of the first solder layer on the electrical connecting portion of the LED chip 101 is larger than a projection area of a bonding region between the conductive portion 106 and the electrical connecting portion of the LED chip 101.

Figure 61A:
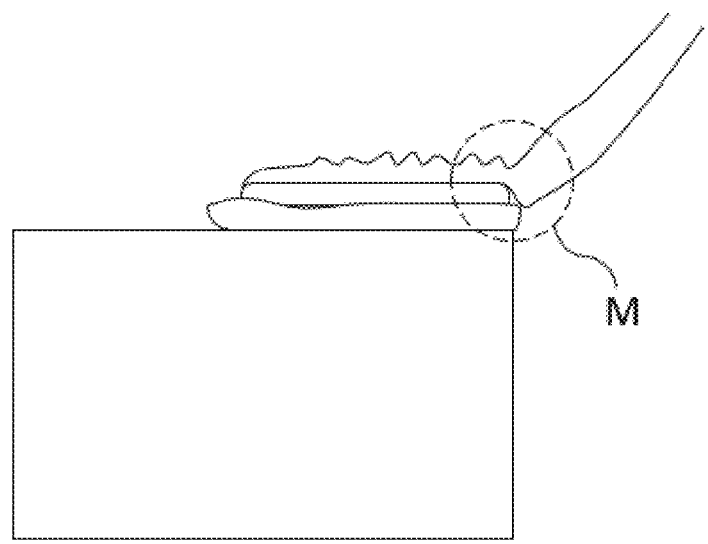
FIG. 61A and FIG. 61B are schematic views of the cutting position of the second end of the conductive portion of the related art.
Figure 61B:
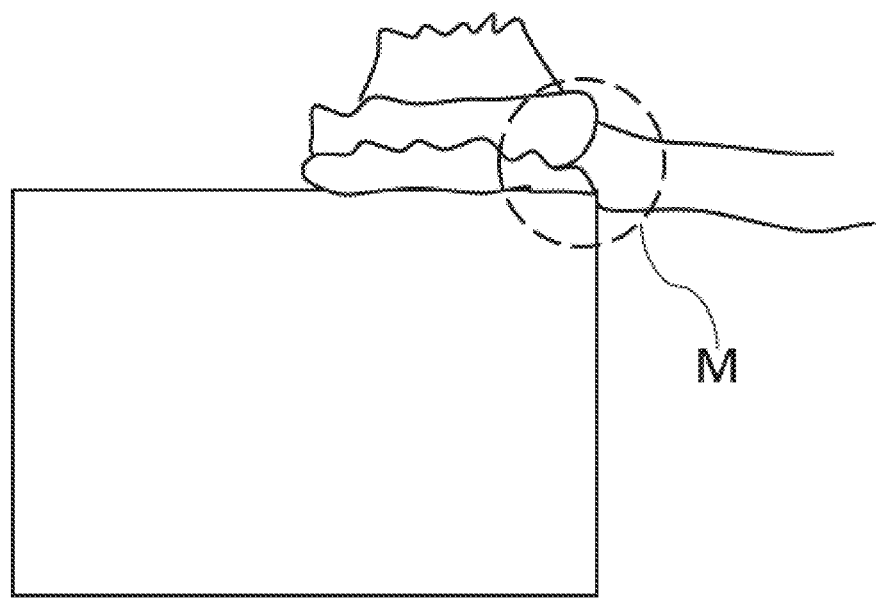

Further, in any of the embodiments using the ceramic capillary to apply pressure to the wire to perform bonding, if a portion of the loading surface of the ceramic capillary is above an edge of the LED chip 102, the position at which the wire is applied with a pressure will bear a stronger cutting force caused by the edge of the LED chip 102 and the wire is thus easy to be fractured. FIG. 61A and FIG. 61B are schematic views of the cutting phenomenon of the second end of the conductive portion above an edge of the LED chip 102. In FIG. 61A and FIG. 61B, the cutting phenomenon is marked by a circle M. When the bonding position is excessively adjacent to an edge of the LED chip, the lower portion of the wire at which the wire is applied with the pressure will correspond to or adjacent to the edge of the LED chip or the edge of the electrode, wherein the height of the edge may have a sudden change. Accordingly, the junction of the second end of the conductive portion 106 will be affected by cutting forces and raise fracture.

Accordingly, in any of the embodiments adopting the manner which using the ceramic capillary to apply pressure on the wire to implement wiring, the second joining portion may be further arranged on the LED chip (or the electrode) with a first preset distance to the edge of the LED chip (or the electrode). In the embodiment, the edge of the LED chip (or the electrode) is referred to the edge of the LED chip (or the electrode) corresponding to the intersectant side of the projection of the LED chip (or the electrode) and the conductive portion in the height direction of the LED filament. A first preset distance exists between the second joining portion and the LED chip (or the electrode). In other words, in wiring, the position of the wire, which is applied with a pressure, is provided with a flat loading surface which can eliminate the cutting effect to greatly reduce the risk of fracture of the wire. Take FIG. 60A and FIG. 60B as an example, a first preset distance wd exists between the second joining portion 1062 and the edge of the LED chip 102. The junction of the second joining portion 1062 formed on the positive electrode of the LED chip 102 and the conductive portion 106 gradually inclines or rises from the near end toward the distal end (i.e., extending form the positive electrode of the LED chip 102 toward the conductive portion 106) to form a joining slope or a joining ramp or form a joining portion which gradually becomes thicker and thicker from the near end toward the distal end, so as to eliminate the problem of sudden change of the height of the edge shown in FIG. 61A and FIG. 61B. The junction of the second joining portion 1062 of the positive electrode of the LED chip 102 and the conductive portion 106 forms a complete loading surface of the second joining portion 1062. In comparison with FIG. 61B, the second joining portion 1062 moves forward by a certain distance toward the inside of the LED chip, so that the lower side of the wire in FIG. 60A is a complete loading surface and no cutting occurs at position D to further reduce the risk of fracture of the wire.

In FIG. 60A and FIG. 60B, it should be understood that the distance between the edge of the second joining portion 1062 and the edge of the LED chip (or the electrode) stands for the first preset distance. For example, the first preset distance of the second joining portion may be configured within a range between 20 um and 60 um, preferably, in some embodiments, between 30 um and 50 um, such as 30 um, 35 um, 40 um, 45 um or 50 um. Of course, in other embodiments, the first preset distance may also be the distance between the center point of the second joining portion 1062 and the edge of the LED chip (or the electrode) in which a length corresponding to the radius of the second joining portion is added under the circumstance shown in FIG. 60A and FIG. 60B. For example, the first preset distance of the second joining portion may be configured within a range between 20 um+R1 and 60 um+R1, preferably, in some embodiments, a range between 30 um+R1 and 50 um+R1, such as 30 um+R1, 35 um+R1, 40 um+R1, 45 um+R1 or 50 um+R1, where R1 stands for the radius of the second joining portion.

In some embodiments, the second joining portion is formed by using the ceramic capillary to continuously apply pressure on the wire after the ceramic capillary moves downward to the electrical connecting portion to be connected on the LED chip (or the electrode), therefore, in some embodiments, by arranging a second preset distance between the electrical connecting portion on the LED chip (or the electrode) and the edge of the LED chip (or the electrode), the second joining portion can also be arranged on the LED chip (or the electrode) with keeping the first preset distance between the edge of the LED chip (or the electrode) and the second joining portion. There is no necessary relationship between the first preset distance and the second preset distance. The first preset distance may be greater than, equal to, or less than the second preset distance. In some embodiments, a distance between the edge of the electrical connecting portion and the edge of the LED chip (or the electrode) may be used to stand for the second preset distance. For example, the second preset distance may be configured within a range between 20 um and 60 um, preferably, in some embodiments, between 30 um and 50 um, such as 30 um, 35 um, 40 um, 45 um or 50 um. In other embodiments, a distance between the center of the electrical connecting portion and the edge of the LED chip (or the electrode) may be used to stand for the second preset distance. For example, the second preset distance may be configured within a range between 20 um+R2 and 60 um+R2, preferably, in some embodiments, between 30 um+R2 and 50 um+R2, such as 30 um+R2, 35 um+R2, 40 um+R2, 45 um+R2 or 50 um+R2, where R2 stands for the radius of the electrical connecting portion, for example, the radius R2 of the electrical connecting portion may be configured within a range between 25 um and 35 um such as 25 um, 30 um or 35 um.

FIG. 51 to FIG. 61B and related descriptions thereto analyze and solve the problem of fracture of the conductive portion 106 at position D, but the fracture of the conductive portion 106 may occur at position B. Fracture at position B still causes malfunctions of the conductive portion 106 to further make the LED filament malfunction.

Figure 62:
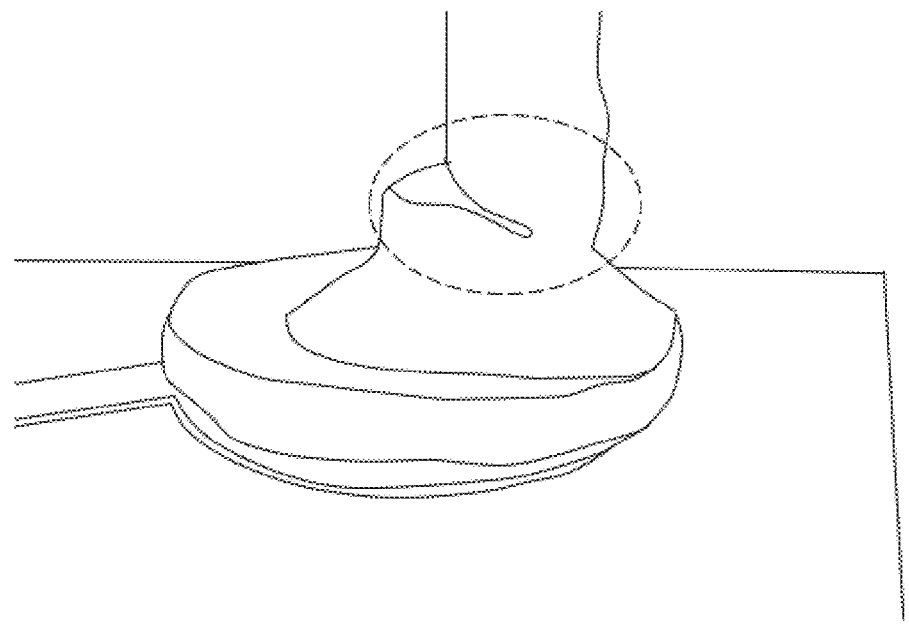
FIG. 62 is a structural schematic view of the first joining portion of the related art.
Figure 63:
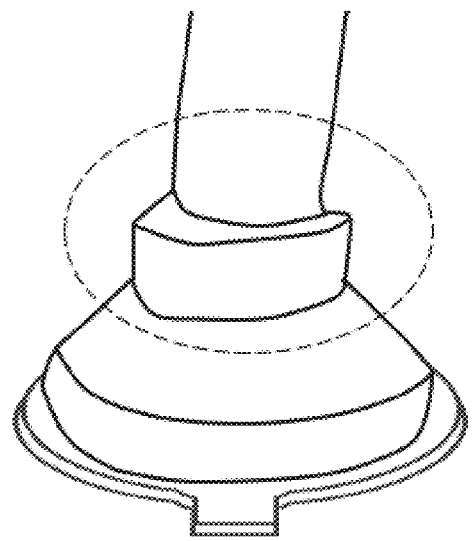
FIG. 63 is a structural schematic view of the first joining portion of the disclosure in an embodiment.

During the process of forming the first joining portion, malfunctions will occur during the electronic flame-off ball formation to result in serious damage at position B. As shown in FIG. 62, which is a structural schematic view of the first joining portion, in the region defined by a dotted line, the wire is seriously misaligned with the first joint portion. Fracture easily occurs in the misaligned region. Thus, in some embodiments of the disclosure, the conductive portion adopts a silver conductive metal wire. During the process of forming the first joining portion, the electronic flame-off ball formation is proper and no damage occurs at position B. As shown in FIG. 63, which is a structural schematic view of the first joining portion of the disclosure in an embodiment, the wire extends upward from the first joint portion without any misalignment.

Furthermore, as shown in FIG. 50, the conductive portion 106 extends between the first joining portion 1061 and the second joining portion 1062 and has a certain arc portion. Please refer to FIG. 64A and FIG. 64B, which are partially schematic views of the first end of the conductive portion of the related art at different viewing angles. The first joining portion 1061 is formed on the surface of the LED chip 101. The conductive portion 106 extends upward along the first joining portion 1061, and an included angle of approximately 90 degrees is between the conductive portion 106 and the surface at which the first joining portion 1061 is. That is, the conductive 106 extends from the first joining portion 1061 substantially along the height direction of the LED chip (the Z-axis direction in FIG. 64A and FIG. 64B). The conductive portion 106 further has a bent portion 1063 (or called bent point). The bent portion 1063 makes the conductive portion 106 extend from the height direction of the LED chip toward the length direction of the LED chip (the Y-axis direction in FIG. 64A and FIG. 64B).

Figure 64A:
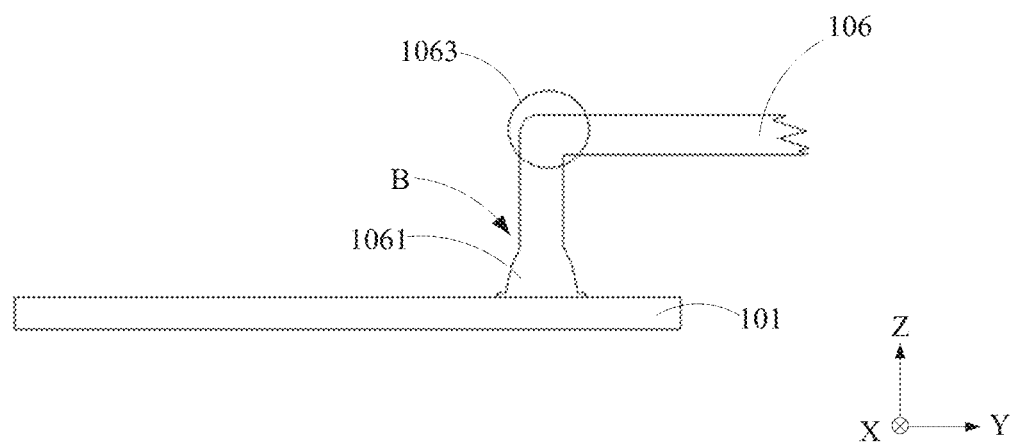
FIG. 64A and FIG. 64B are partially schematic views of the first end of the conductive portion of the related art at different viewing angles.
Figure 64B:
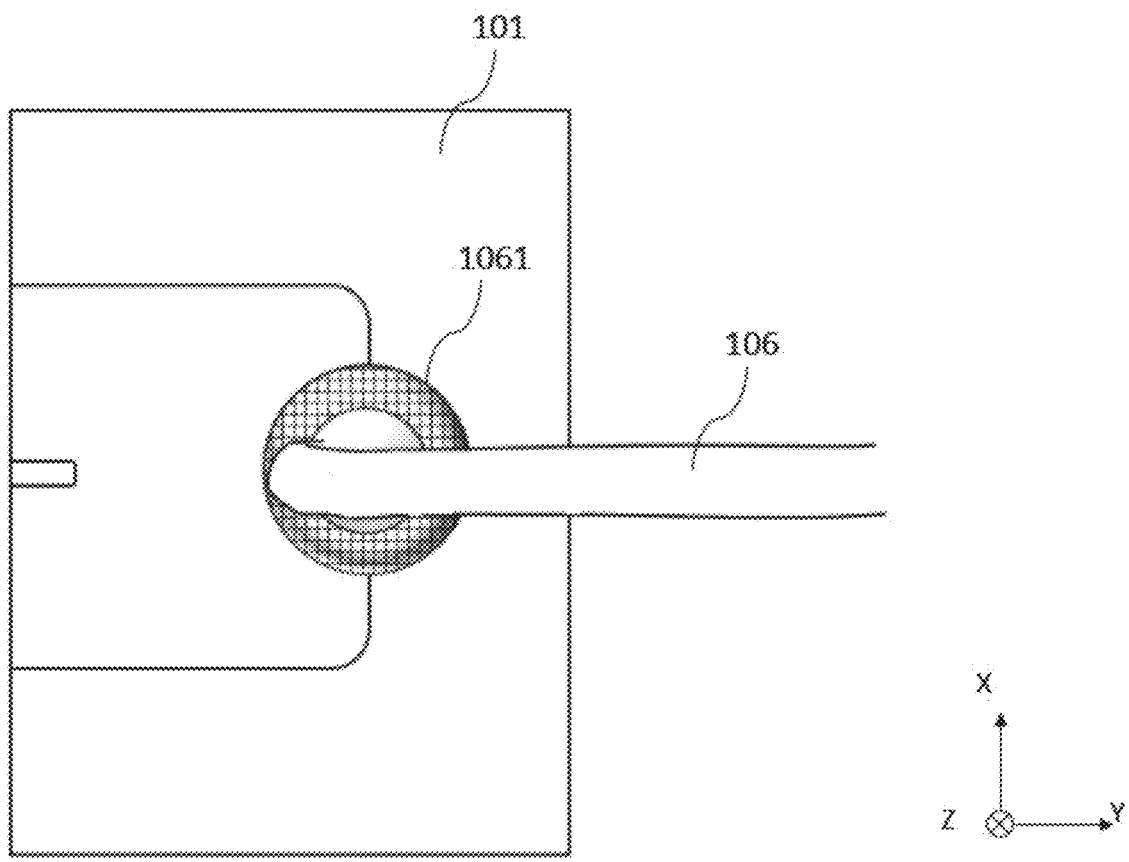

In the arc portion of the conductive portion 106 shown in FIG. 50, FIG. 64A, and FIG. 64B, the start orientation of the bent portion 1063 is to correspond to the height direction of the LED chip (i.e., correspondingly toward the direction of the first joining portion 1061 or the Z-axis direction in FIG. 64A) and then is bent toward the length direction of the LED chip (the Y-axis direction in FIG. 64A). Such an arc structure makes the joint position (position B) of the conductive portion 106 and the first joining portion 1061 be a fulcrum of the bent portion 1063, and the force exerted to the bent portion 1063 will be eventually delivered to position B. Therefore, in the process of producing or using the LED filament, fracture at position B will occur to cause malfunctions of the LED filament when the LED filament is vibrated, bent, or fell down which makes the bent portion 1063 bear a force.

Therefore, in some embodiments of the disclosure, structural design is applied to the arc portion of the conductive portion to address the issue of the fracture of position B. In one embodiment, the conductive portion includes at least two bent portions to make the conductive portion be extending along at least two different planes (or along at least three different direction). In some embodiments, the conductive portion has a first bent portion and a second bent portion to make the conductive portion have a part perpendicular to the LED chip 101 (or along the height direction of the LED chip 101) and a part parallel to the LED chip 101.

Figure 65A:
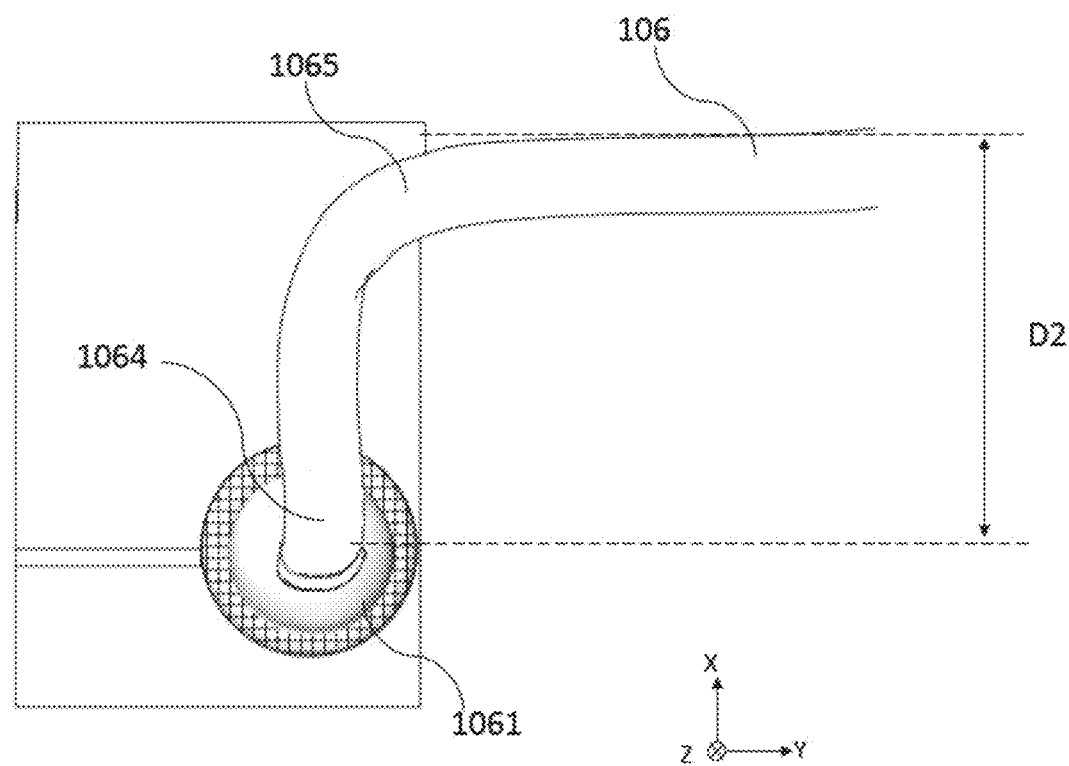
FIG. 65A and FIG. 65B are partially schematic views of the first end of the conductive portion of the disclosure in an embodiment.
Figure 65B:
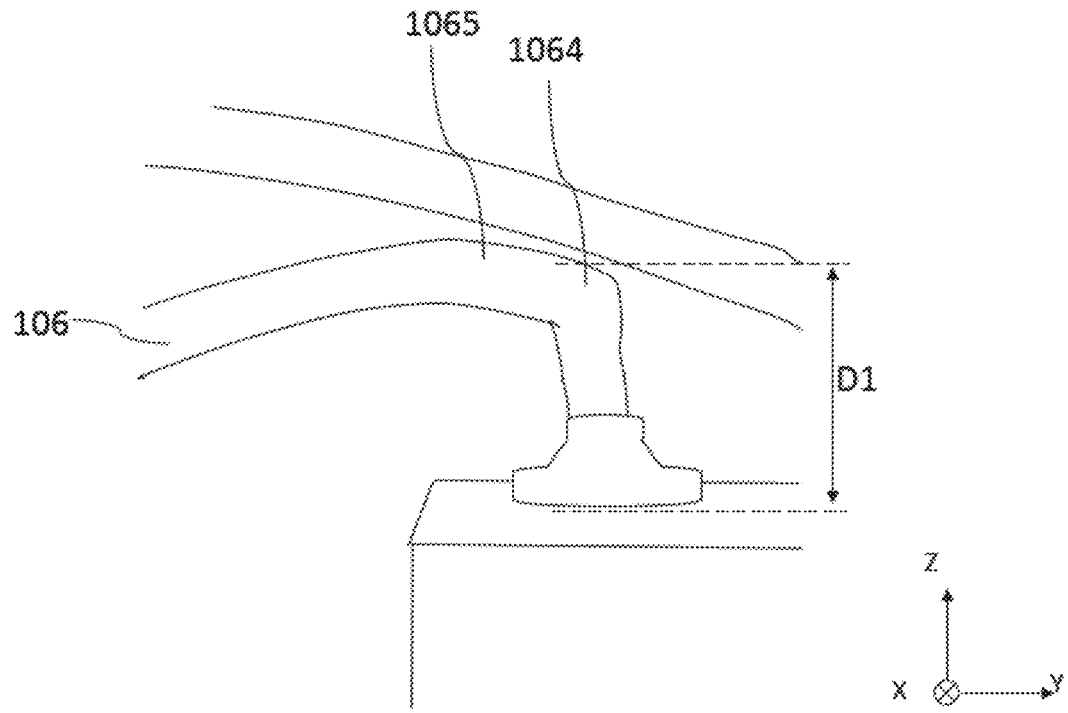

Please refer to FIG. 65A and FIG. 65B, which are partially schematic views of the first end of the conductive portion of present invention in an embodiment. As shown, the conductive portion 106 extends upward from the first joining portion 1061 (it can be understood as an angle of approximately 90 degrees is between the conductive portion 106 and the surface at which the first joining portion 1061 is) and bent along the width direction of the LED chip 101 to form a first bent portion 1064, and the conductive portion 106 further extends and is bent along the length direction of the LED chip 101 to form a second bent portion 1065. In other words, in some embodiments, the conductive portion 106 has the first bent portion 1064 and the second bent portion 1065. The conductive portion 106 extends upward from the first joining portion 1061 and extends toward the width direction of the LED chip 101 through the first bent portion 1064 and toward the length direction of the LED chip 101 through the second bent portion 1065. The conductive portion extending upward from the first joining portion 1061 may also be understood as the conductive portion 106 extending from the first joining portion 1061 substantially along the height direction or perpendicular to the LED chip 101 (the Z-axis direction in FIG. 65A and FIG. 65B). The conductive portion 106 extending toward the width direction of the LED chip 101 may also be understood as substantially extending along the width direction of the LED chip 101. In one embodiment, as shown in FIG. 65A and FIG. 65B, an end portion of the conductive portion 106 is connected to the electrical connecting portion, the conductive portion 106 has a first bent portion 1064 and a second bent portion 1065, and the conductive portion 106 extends from the electrical connecting portion along a first direction of the LED chip 101, extends toward a second direction of the LED chip 101 through the first bent portion 1064, and extends toward a third direction of the LED chip 101 through the second bent portion 1065, and wherein the first direction, the second direction, and the third direction are different directions. In some embodiments, the first direction is a height direction of the LED chip, the second direction is a width direction of the LED chip, and the third direction is a length direction of the LED chip.

In comparison with the structure shown in FIG. 64A and FIG. 64B, the conductive portion 106 shown in FIG. 65A and FIG. 65B, the region between the first bent portion 1064 and the second bent portion 1065 may serve as a buffering region for buffering or dispersing force exerted to the conductive portion 106 to avoid or reduce deformation of the conductive portion 106 to prevent fracture at position B. In detail, the first bent portion 1064 and the second bent portion 1065 shown in FIG. 65A and FIG. 65B may adjust the extension direction of the conductive portion 106 from a direction perpendicular to the chip into along the width direction of the chip and then further adjust the extension direction of the conductive portion 106 into along the length direction of the chip. Such configuration will affect neither the connection between the conductive portion 106 and adjacent two LED chips nor the connection between the LED chip and the electrode. However, such configuration makes the conductive portion 106 form an arc outswing, i.e., a correspondingly buffering region, and the force apply to the conductive portion 106 will be released in the buffering region (in other words, the force is shunted into different directions) without being transmitted to the first bent portion 1064 or with only a very small part being transmitted to the first bent portion 1064 and subsequent position B. Therefore, there is no main stress applied on the easy-to-fracture region of the conductive portion, so that the conductive portion 106 would not fracture easily.

Further, the height D1 of the first bent portion 1064 (i.e., the height between the first bent portion 1064 and the surface of the LED chip) is configured within a range between 80 um and 120 um. The length D2 of the buffering region (i.e., the length between the first bent portion 1064 and the second bent portion 1065) is configured within a range between 100 um and 120 um.

Figure 66A:
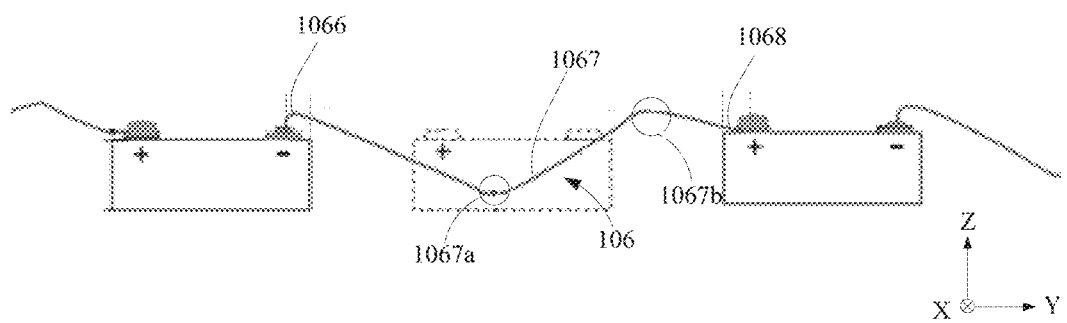
FIG. 66A and FIG. 66B are partially structural schematic views of the LED filament of the disclosure in an embodiment at different viewing angles.
Figure 66B:
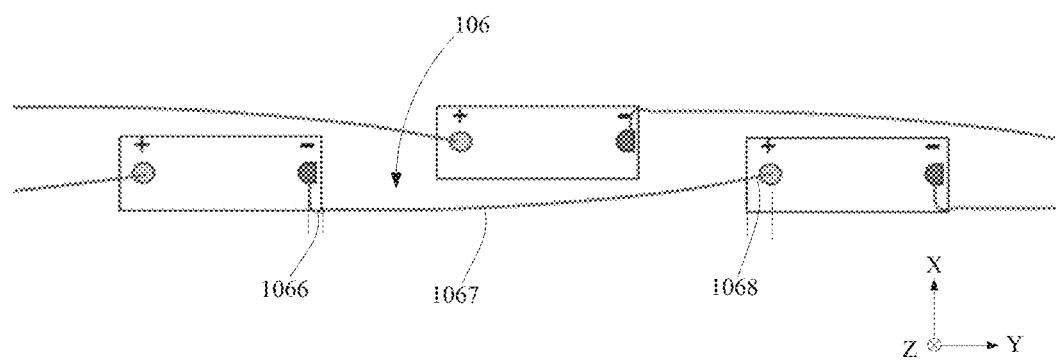

FIG. 66A and FIG. 66B are structural schematic views of the LED filament according to an embodiment of present invention. The conductive portion 106 has a first portion 1066, a second portion 1067 connected to the first portion 1066, and a third portion 1068 connected to the second portion 1067. When the first portion 1066 is projected on a corresponding LED chip (or the electrode) along the height or thickness direction of the LED filament (the Z axis direction shown in FIG. 66A and FIG. 66B), the first portion 1066 is completely within the LED chip (or the electrode). In other words, the first portion 1066 does not exceed the edge of the corresponding LED chip (or the electrode) along the length direction of the LED filament (the Y axis direction shown in FIG. 66A and FIG. 66B). When the second portion 1067 is projected on corresponding two adjacent LED chips (or an LED chip and an electrode connected to the LED chip) connected through the conductive portion 106 along the length direction of the LED filament, the second portion 1067 is between the corresponding two adjacent LED chips (or the LED chip and the electrode). In other words, the second portion 1067 is between the corresponding two adjacent LED chips (or an LED chip and an electrode connected to the LED chip) along the length direction of the LED filament which indicates that the second portion 1067 is between the edges of the two adjacent LED chips (or the edges of the LED chip and the electrode). The third portion 1068 corresponds to the second end of the conductive portion 106, and the third portion 1068 is used to be connected to the LED chip 102 (or the electrode). It can also be understood that, when the third portion 1068 is projected on the corresponding LED chip (or the electrode) along the height or thickness direction of the LED filament, the third portion 1068 is completely within the LED chip (or the electrode). In other words, the third portion 1068 does not exceed the edge of the corresponding LED chip (or the electrode) in the length direction of the LED filament.

In some embodiments, the first portion 1066 corresponds to the first end of the conductive portion 106, one end of the first portion 1066 is connected to the LED chip 101 (or the electrode), and the other end of the first portion 1066 is connected to the second portion 1067, and the other end of the first portion 1066 does not exceed the corresponding LED chip 101 (or the electrode) in the length direction of the LED filament. Further, the first portion 1066 includes the first bent portion 1064 and the second bent portion 1065 as shown in FIG. 65A and FIG. 65B.

In some embodiments, the ratio of the length of the first portion 1066 to the distance between the junction of the first portion 1066 and the LED chip and the edge of the LED chip in the length direction of the LED chip (the projection length of the first portion 1066 in the height or thickness direction of the LED filament) is greater than 1.15, 1.2, 1.3 or 1.4 to reduce the risk of fracture of the junction of the first portion 1066 and the LED chip when the first portion 1066 is pulled.

In some embodiments, the ratio of the length of the first portion 1066 to the distance between the junction of the first portion 1066 and the LED chip and the edge of the first portion 1066 in the length direction of the LED chip (the projection length of the first portion 1066 in the height or thickness direction of the LED filament) is less than 2. If the first portion 1066 is too long, the first portion 1066 will have a larger bending extent or occupy a space in the height or thickness direction of the LED filament. This will adversely affect the LED filament (for example, a larger bending extent may cause a greater inner stress in the first portion 1066 to occupy a space in the height or thickness of the LED filament; a thicker light conversion layer would be required to cover the LED filament).

In some embodiments, the ratio of the length of the first portion 1066 to the projection length of the first portion 1066 in the height or thickness direction of the LED filament is greater than the ratio of the length of the second portion 1067 to the projection length of the second portion 1067 in the height or thickness direction of the LED filament. It is expressed by a formula: L1/T1>L2/T2, where L1 is the length of the first portion 1066, T1 is the projection length of the first portion 1066 in the height or thickness direction of the LED filament, L2 is the length of the second portion 1067, and T2 is the projection length of the second portion 1067 in the height or thickness direction of the LED filament. Usually, when the LED filament is bent, the junction of the first portion 1066 and the LED chip (or the electrode) is easier to be fractured because of being pulled. As a result, the risk of fracture of the junction of the first portion 1066 and the LED chip (or the electrode) can be further reduced by configuring L1/T1>L2/T2.

The length of the third portion 1068 adopts the length of the first portion 1066 in any embodiment, which can be referred to the descriptions about the first portion 1066, and the description of the third portion 1068 is omitted.

When the LED filament is bent, the second portion 1067 of the conductive portion 106 is a main bending region (parts at which the LED chips are located are not easy to be bent). To reduce the risk of fracture of the second portion 1067 when the LED filament is bent, the length of the second portion 1067 is configured to be greater than the distance between two adjacent LED chips (or an LED chip and an electrode) corresponding thereto. That is, the length of the second portion 1067 is configured to be greater than the projection length of the second portion 1067 in the height or thickness direction of the LED filament, so as to provide a greater margin to the conductive portion 106 when the LED filament is bent to avoid fracture.

In some embodiments, the ratio of the length of the second portion 1067 to the distance between corresponding two adjacent LED chips (or an LED chip and an electrode) (or the projection length of the second portion 1067 in the height or thickness direction of the LED filament) is greater than 1.1, 1.2, 1.3, or 1.4. Therefore, when the LED filament is bent, the second portion 1067 has a sufficient length to be bent and deformed, thereby preventing the second portion 1067 from fracturing.

In some embodiments, the ratio of the length of the second portion 1067 to the distance between corresponding two adjacent LED chips (or an LED chip and an electrode) (or the projection length of the second portion 1067 in the height or thickness direction of the LED filament) is less than 2. If the length of the second portion 1067 is configured to be too long, it is disadvantageous to the covering performance of the light conversion layer, or even the conductive portion 106 may be exposed from the light conversion layer. In addition, the excessively long second portion 1067 may also cause material waste.

In some embodiments, the second portion 1067 has at least two bending points to make the conductive portion 106 appear substantially wavy (w-shaped or m-shaped). As shown in FIG. 66A, the second portion 1067 has a first bending point 1067a and a second bending point 1067b. The surface on which the junction between the LED chip and the conductive portion is located serves as a base plane. The first bending point 1067a is below the first joining portion 1061 or the second joining portion 1062, and the second bending point 1067b is above the first joining portion 1061 or the second joining portion 1062. Therefore, after the second portion 1067 is connected to the first portion 1066, the second portion 1067 extends to the first bending point 1067a on a descendent trend, then taking the first bending point 1067a as a turning point, the second portion 1067 extends to the second bending point 1067b on a rising trend, and finally taking the second bending point 1067b as another turning point, the second portion 1067 extends on a descendent trend to be connected to the third portion 1068 to make the conductive portion 106 appear wavy (an inverted-w-shaped or m-shaped). Accordingly, such configuration further makes the conductive portion 106 have greater stretchability and thus the conductive portion 106 is not easy to fracture.

Figure 67:
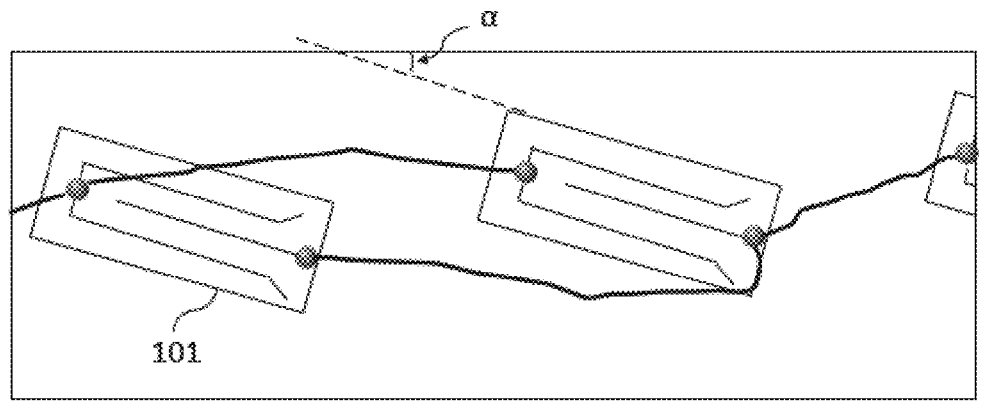
FIG. 67 is a schematic view of the slant arrangement of the LED chips of the disclosure in an embodiment.

In some embodiments, please refer to FIG. 67, which is a schematic view of the slant arrangement of the LED chips 101 of the invention in an embodiment, as shown, two adjacent LED chips 101 are arranged aslant. The slant arrangement indicates that the two adjacent LED chips 101 are arranged slant relative to the length direction of the LED filament with long sides of two adjacent LED chips 101 being kept parallel. That is, the two LED chips 101 are aslant arranged with the same slant angle so as to reduce the arc span of the conductive portion connected between the adjacent LED chips by ⅓, and the stretchability of the conductive portion becomes larger to reduce the risk of fracture of the conductive portion between the LED chips. Further, the slant angle of the LED chip may be configured within a range between 10° and 20°, where the slant angle is an included angle between the long side of the LED chip and the length direction of the filament as angle α in FIG. 67.

The conductive portion used to be connected between the LED chip and the electrode is easy to fracture at position C. For example, in an embodiment of being provided with multiple rows of LED chips and two rows of LED chips which are close to the electrode having different distances, as shown in FIG. 48 and FIG. 49, two rows of LED chips are alternately arranged, and the distance between the LED chip $b_n$ and the electrode 104 is obviously less than the distance between the LED chip $a_m$ and the electrode 104. The arc span of the conductive portion 106 directly connected between the LED chip $a_m$ and the electrode 104 is obviously greater than the arc span of the conductive portion 106 directly connected between the LED chip $b_n$ and the electrode 104. Therefore, in comparison with the conductive portion 106 between the LED chip $b_n$ and the electrode 104, the stretchability of the arc of the conductive portion 106 between the LED chip $a_m$ and the electrode 104 is small, and thus the conduction portion is easy to fracture.

Figure 68:
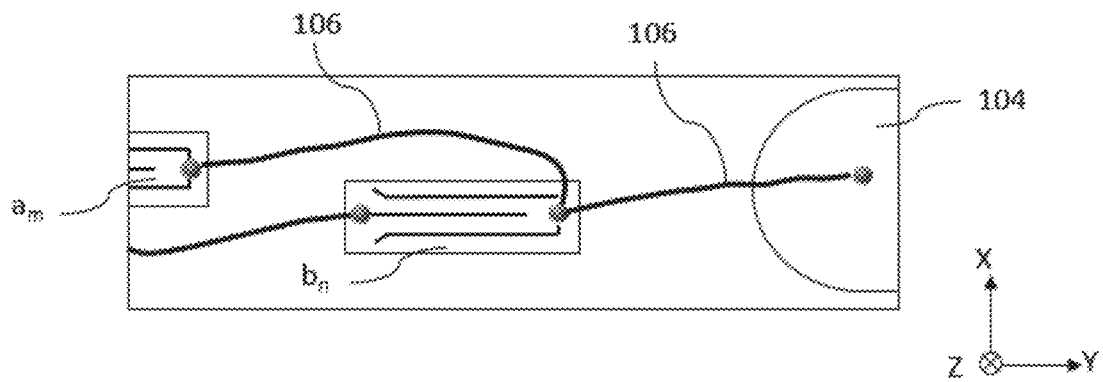
FIG. 68 is a structural schematic view of the connection between the LED chip and the electrode of the disclosure in an embodiment.

Therefore, in some embodiments, at least the LED chips which are near the electrode and to be connected to the electrode are configured to have a common solder joint so as to decrease the length of the conductive portion and thus reduce the risk of fracture of the conductive portion between the LED chip and the electrode. Please refer to FIG. 68, which is a structural schematic view of the connection between the LED chip and the electrode of the invention in an embodiment. The LED chip $a_m$ is a chip in the first row of chips, which is the closest to the electrode 104, and the LED chip $b_n$ is a chip in the second row of chips, which is the closest to the electrode 104. Two ends of a conductive portion 106 are respectively connected to the first electrical connecting portion of the LED chip $a_m$ and the first electrical connecting portion of the LED chip $b_n$ to make the LED chip $a_m$ and the LED chip $b_n$ have a common-electrode (which may be a common-cathode or a common-anode, the common-electrode is common-cathode when the first electrical connecting portion is configured as an cathode, and the common-electrode is common-anode when the first electrical connecting portion is configured as an anode). That is, the first electrical connecting portion of the LED chip $b_n$ serves as a common-electrode connecting point and another conductive portion 106 is used to be connected between the common-electrode connecting point and the electrode 104. Under this configuration, the arc span required by the conductive portion 106 connected with the LED chip $a_m$ greatly decreases (by almost one second) to reduce the risk of fracture of the conductive portion between the chip and the electrode.

In addition, other solutions may be adopted to improve the problem of fracture of the conductive portion between the LED chip and the electrode. In some embodiments, the LED chip and the electrode corresponding thereto are connected with each other through at least two conductive portions. Each conductive portion has at least two bending points to form at least two bending regions. The bending regions of the at least two conductive portions are alternately arranged in the height or thickness direction of the LED filament. In some embodiments, the at least two conductive portions may be configured as the structure of the conductive portion mentioned in any above embodiment. Please refer to FIG. 64A and FIG. 64B and related descriptions thereto, as long as the connecting position of the at least two conductive portions is correspondingly adjusted.

Figure 69A:
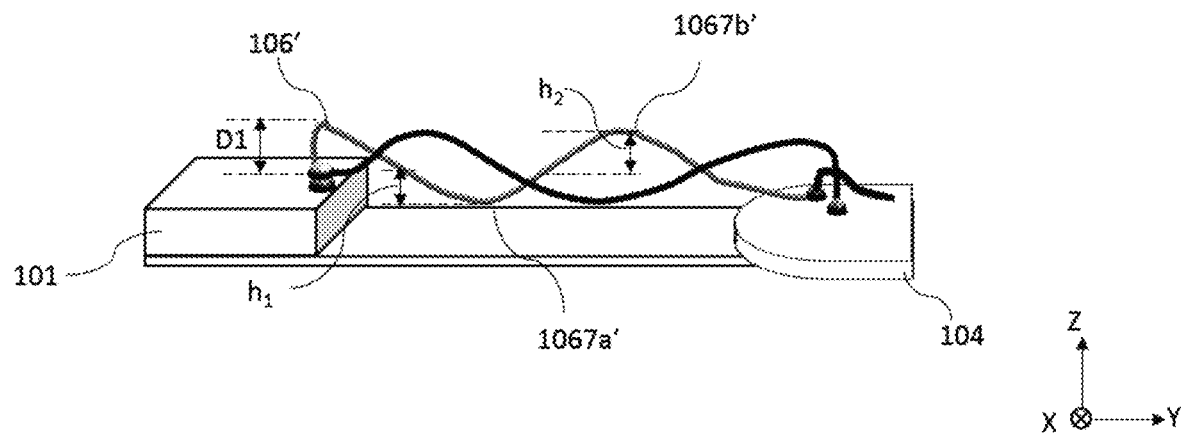
FIG. 69A to FIG. 69C are structural schematic views of the connection between the LED chip and its corresponding electrode through two conductive portions of the disclosure in an embodiment at different viewing angles.
Figure 69B:
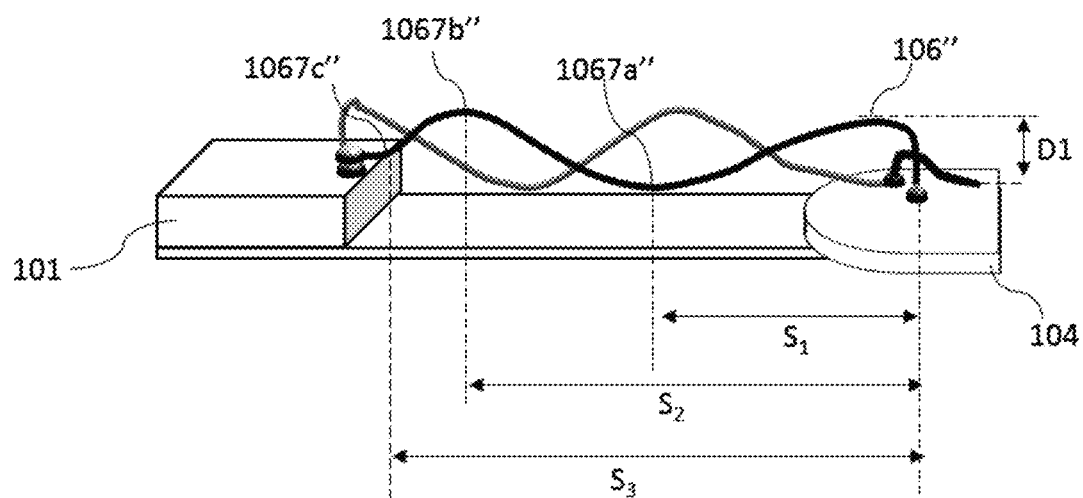
Figure 69C:
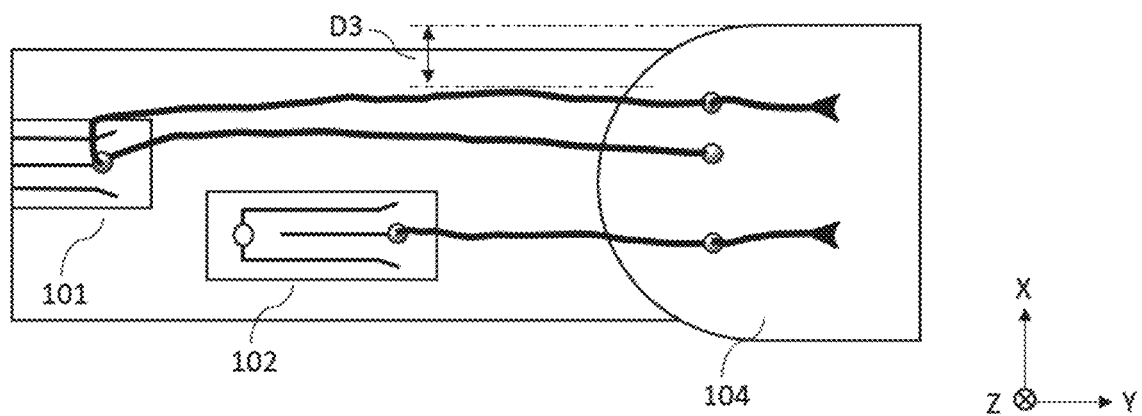

Please refer to FIG. 69A to FIG. 69C, which are structural schematic views of the connection between the LED chip and the corresponding electrode through two conductive portions of the invention in an embodiment at different viewing angles. For the sake of description, two conductive portions are respectively referred to a first conductive portion 106' and a second conductive portion 106". The first end of the first conductive portion 106' is connected to the LED chip 101, and the second end is connected to the electrode 104. The first end of the second conductive portion 106" is connected to the electrode 104, and the second end is connected to the LED chip 101. The first conductive portion 106' has a first bending point 1067a' and a second bending point 1067b'. The first bending point 1067a' correspondingly forms a first bending region with an upward opening (it may also be understood that the first conductive portion 106' extends toward the first bending point 1067a' on a descendent trend first, and then taking the first bending point 1067a' as a turning point, the first conductive portion 106' extends on a rising trend to form the first bending region). The second bending point 1067b' correspondingly forms a second bending region with a downward opening (it may also be understood that the first conductive portion 106' extends on a rising trend first, and then taking the second bending point 1067b' as a turning point, the first conductive portion 106' extends on a descendent trend to form the second bending area). The second conductive portion 106" has a first bending point 1067a" and a second bending point 1067b". The first bending point 1067a" correspondingly forms a first bending region with an upward opening (it may also be understood that the second conductive portion 106" extends toward the first bending point 1067a" on a descendent trend first, and then taking the first bending point 1067a" as a turning point, the second conductive portion 106" extends on a rising trend to form the first bending region). The second bending point 1067b" correspondingly forms a second bending region with a downward opening (it may also be understood that the second conductive portion 106" extends on a rising trend first, and then taking the second bending point 1067b" as a turning point, the second conductive portion 106" extends on a descendent trend to form the second bending area). In other words, in one embodiment, as shown in FIG. 69A, FIG. 69B, and FIG. 69C, the first conductive portion 106' firstly extends downwards and then upwards by taking the first bending point 1067a' as a first turning point, and the first conductive portion 106' then extends upwards and then downwards by taking the second bending point 1067b' as a second turning point; the second conductive portion 106" firstly extends upwards and then downwards by taking the first bending point 1067a" as a first turning point, and the second conductive portion 106" then extend downwards and then upwards by taking the second bending point 1067b" as a second turning point. In this embodiment, the start point of the first conductive portion 106' is at LED chip 101 and the end point of the first conductive portion 106' is at the electrode 104. On the contrary, the start point of the second conductive portion 106" is at the electrode 104 and the end point of the first conductive portion 106" is at LED chip 101. Because the first conductive portion 106' and the second conductive portion 106" are connected between the LED chip 101 and the electrode 104 on contrary descendent and rising trends, after connection, the first bending region formed by the first bending point 1067a' of the first conductive portion 106' and the second bending region formed by the second bending point 1067b" of the second conductive portion 106" are correspondingly alternately arranged along the height direction of the LED chips. Likewise, the second bending region formed by the second bending point 1067b' of the first conductive portion 106' and the first bending region formed by the first bending point 1067a" of the second conductive portion 106" are correspondingly alternately arranged along the height direction of the LED chips. It should be understood that this the alternately arrangement along the height direction of the LED chips does not necessarily require that two bending regions must absolutely align with each other in the height or thickness direction of the LED filament as long as the overall bending trends of the two bending region are alternately arranged.

The forming positions and manners of the bending points of the first conductive portion 106' and the second conductive portion 106" may be referred to the descriptions of FIG. 66A and FIG. 66B, and related descriptions are omitted. The connection and arc structure of the first end of the first conductive portion 106' and the LED chip 101 may adopt the structure described in any embodiment shown in FIG. 64A to FIG. 65B. The connection and arc structure of the first end of the second conductive portion 106" and the electrode 104 may adopt the structure described in any embodiment shown in FIG. 64A to FIG. 65B with no more repeat. Further, the first conductive portion 106' and the second conductive portion 106" may have more bending points. For example, as shown in FIG. 69B, the second conductive portion 106" further has a third bending point 1067c", and the second conductive portion 106" is continuously connected to the LED chip 101 through the third bending point 1067c".

In any embodiment disposed with at least two conductive portions connected between the LED chip and the electrode corresponding thereto, the bending areas of the at least two conductive portions are alternately arranged in the height or thickness direction of the LED filament so as to form complementarity to implement force dispersion and jointly bearing to avoid fracture of the conductive portion between the electrode and he LED chip.

As shown in FIG. 69C, the distance between one of the at least two conductive portions, which is close to the edge of the LED filament (the first conductive portion 106' in FIG. 59B) and the edge of the electrode is configured to be greater than or equal to 30 um, preferably, in some embodiments, greater than or equal to 50 um.

As shown in FIG. 69A, from the length direction of the LED filament, the height difference $h_1$ (i.e., the first turning point distance along the height direction) between the first bending point 1067a' of the first conductive portion 106' and the joining portion of the corresponding chip (the joining portion of the LED chip 101 shown in FIG. 69A) is configured within 40 um±5%. The height difference $h_2$ (i.e., the second turning point distance along the height direction) between the second bending point 1067b' of the first conductive portion 106' and the joining portion of the corresponding chip (the joining portion of the LED chip 101 shown in FIG. 69A) is configured within 75 um±5%. From the height or thickness of the LED filament, the first bending point 1067a' of the first conductive portion 106' is below the surface of the chip (the surface of the chip is a surface which is connected to the first conductive portion 106') ranging between 30 um and 100 um in height direction (the height of the first turning point in FIG. 69A). The second bending point 1067b' of the first conductive portion 106' is above the surface of the chip (the surface of the chip is a surface which is connected to the first conductive portion 106') ranging between 100 um and 160 um in height direction (the height of the second turning point in FIG. 69A).

As shown in FIG. 69B, from the length direction of the LED filament, the horizontal distance S1 (i.e., the first turning point distance along the length direction) between the first bending point 1067a" of the second conductive portion 106" and the joining portion of the corresponding electrode 104 is configured within 40 um±5%. The horizontal distance S2 (i.e., the second turning point distance along the length direction) between the second bending point 1067b" of the second conductive portion 106" and the joining portion of the corresponding electrode 104 is configured within 75 um±5%. The horizontal distance S3 (i.e., the third turning point distance along the length direction) between the third bending point 1067c" of the second conductive portion 106" and the joining portion of the corresponding electrode 104 is configured within 90 um±5%. From the height or thickness of the LED filament, the first bending point 1067a" of the second conductive portion 106" (the LED chip 101 in FIG. 69B) is below the surface of the chip (the surface of the chip connected to the second conductive portion 106") ranging between 30 um and 100 um in height direction (the height of the first turning point in FIG. 69B). The second bending point 1067b" of the second conductive portion 106" (the LED chip 101 in FIG. 69B) is above the surface of the chip (the surface of the chip connected to the second conductive portion 106") ranging between 80 um and 120 um (the height of the second turning point in FIG. 69B).

It should be understood that, for an LED filament, an electrode needs to be connected with multiple LED chips through the conductive portion and different LED chips need to be connected with different electrodes. The invention does not necessarily require that the connection between the LED chip and the corresponding electrode must adopt the same structure, any person having ordinary skill in the art may adopt combinations of the above manners. For example, as shown in FIG. 69A and FIG. 69B, near the electrode 104, the connection with the LED 101 which is away from the electrode 104 adopts a two-wire manner, and the connection with the LED 101 which is adjacent to the electrode 104 still adopts a one-wire manner. Of course, the disposition shown in FIG. 69A and FIG. 69B, which uses at least two conductive portions, can also be used to connect two adjacent LED chips. The disclosure does not make any limitation for this.

The invention further provides a connecting method between two chips and a connecting method between a chip and an electrode. A structure corresponding to the LED filament provided by anyone of the embodiments of the disclosure can be formed by the methods. Please refer to the aforementioned descriptions of FIGS. 1-27C with no more repeat.

The invention further provides an LED filament lamp, which is disposed with the LED filament provided by anyone of the embodiments of the disclosure. Please refer to the aforementioned descriptions of FIG. 1 to FIG. 69C about the LED filament with no more repeat. In detail, the LED filament may be bent or deformed to be disposed in the LED filament lamp. For example, the LED filament lamp is a bulb lamp.

The invention further provides an LED bulb, which includes a lamp housing, a bulb base connected with the lamp housing. The lamp housing is disposed with at least one supporting arm, a stem and an LED filament. The stem includes a stand. Each supporting arm includes a first end and a second end opposite to each other. The first end of the supporting arm is connected to the stand. The second end of the supporting arm is connected to the LED filament. The LED filament may be configured into the LED filament provided by anyone of the embodiments of the disclosure. Please refer to FIG. 1 to FIG. 69C with no more repeat. The LED bulb may also be other structures, for example, the LED bulb includes a lamp housing, a bulb base connected with the lamp housing. The lamp housing is disposed with a stem and an LED filament.

The various embodiments of the present invention described above may be arbitrarily combined and transformed without being mutually exclusive, and are not limited to a specific embodiment. For example, some features as described in the embodiment shown in FIG. C although not described in the embodiment shown in FIG. A, those features may be included in the embodiment of FIG. A. That is, those skilled in the art can apply some features of the FIG. A to the embodiment shown in the FIG. C without additional creativity. Or alternatively, although the invention has illustrated various creation schemes by taking the LED light bulb as an example, it is obvious that these designs can be applied to other shapes or types of light bulb without additional creativity, such as LED candle bulbs, and the like.

The invention has been described above in terms of the embodiments, and it should be understood by those skilled in the art that the present invention is not intended to limit the scope of the invention. It should be noted that variations and permutations equivalent to those of the embodiments are intended to be within the scope of the present invention. Therefore, the scope of the invention is defined by the scope of the appended claims.

What is claimed is:

1. An LED filament, comprising:
an LED section comprising a plurality of LED chips connected in series and a light conversion layer wrapping the plurality of LED chips;
a first conductive electrode disposed at one of two ends of the LED section and electrically connected to the plurality of LED chips, wherein a portion of the first conductive electrode is wrapped by the light conversion layer;
a second conductive electrode disposed at the other one of the two ends of the LED section and electrically connected to the plurality of LED chips, wherein a portion of the second conductive electrode is wrapped by the light conversion layer; and
a conductive portion electrically connected between the plurality of LED chips;
wherein an LED chip among the plurality of LED chips has an electrical connecting portion, an end portion of the conductive portion is connected to the electrical connecting portion, the conductive portion has a first bent portion and a second bent portion, and the conductive portion extends from the electrical connecting portion along a first direction of the LED chip, extends toward a second direction of the LED chip through the first bent portion, and extends toward a third direction of the LED chip through the second bent portion, and wherein the first direction, the second direction, and the third direction are different directions.

2. The LED filament according to claim 1, wherein the first direction is a height direction of the LED chip, the second direction is a width direction of the LED chip, and the third direction is a length direction of the LED chip.

3. The LED filament according to claim 1, wherein a distance between the first bent portion and a surface of the LED chip is between 80 µm and 120 µm and a distance between the first bent portion and the second bent portion is between 100 µm and 120 µm.

4. The LED filament according to claim 1, further comprising a first solder layer, wherein the first solder layer is made of a soldering material, and the end portion of the conductive portion is between the electrical connecting portion of the LED chip and the first solder layer.

5. The LED filament according to claim 4, wherein a projection area of the first solder layer on the electrical connecting portion of the LED chip is larger than a projection area of a bonding region between the conductive portion and the electrical connecting portion of the LED chip.

6. The LED filament according to claim 4, wherein the end portion of the conductive portion, the electrical connecting portion of the LED chip, and the first solder layer together form a joining portion, the joining portion has a meshy surface, and a plurality of bulges and a plurality of indents are alternately arranged on the meshy surface.

7. The LED filament according to claim 4, further comprising a second solder layer, wherein the second solder layer is made of the solder material, and the end portion of the conductive portion is between the first solder layer and the second solder layer.

8. The LED filament according to claim 7, wherein each of a projection area of the first solder layer on the electrical connecting portion of the LED chip and a projection area of the second solder layer on the electrical connecting portion of the LED chip is larger than a projection area of a bonding region between the conductive portion and the first solder layer, and between the conductive portion and the second solder layer on the electrical connecting portion of the LED chip.

9. The LED filament according to claim 7, wherein a projection area of a bonding region between the conductive portion and the electrical connecting portion of the LED chip is smaller than the projection area of the first solder layer, and the projection area of the first solder layer is smaller than the projection area of the second solder layer.

10. The LED filament according to claim 1, wherein the plurality of LED chips further comprises a first row of LED chips and a second row of LED chips, the first row of LED chips and the second row of LED chips are connected in parallel, the LED chips of the first row of LED chips are connected in series, the LED chips of the second row of LED chips connected in series, and the first row of LED chips and the second row of LED chips are alternately arranged along a width direction of the LED filament.

11. The LED filament according to claim 1, further comprising a first conductive portion and a second conductive portion electrically connected between the LED chip and the first conductive electrode; wherein one of two ends of the first conductive portion is connected to the LED chip, the other end of the first conductive portion is connected to the first conductive electrode, one of two ends of the second conductive portion is connected to the first conductive electrode, and the other end of the second conductive portion is connected to the LED chip; wherein the first conductive portion firstly extends downwards and then upwards by taking a first bending point of the first conductive portion as a first turning point of the first conductive portion, and the first conductive portion then extends upwards and then downwards by taking a second bending point of the first conductive portion as a second turning point of the first conductive portion; the second conductive portion firstly extends upwards and then downwards by taking a first bending point of the second conductive portion as a first turning point of the second conductive portion, and the second conductive portion then extend downwards and then upwards by taking a second bending point of the second conductive portion as a second turning point of the second conductive portion.

12. An LED light bulb, comprising:
a lamp housing with a central axis;
a bulb base connected to the lamp housing;
a stem disposed in the lamp housing along the central axis of the lamp housing;
two conductive supports disposed in the lamp housing, the two conductive supports having opposite polarities;
a driving circuit disposed in the bulb base and electrically connected to the two conductive supports; and
a flexible LED filament disposed in the lamp housing and electrically connected to the two conductive supports, the flexible LED filament comprising:
an LED section comprising a plurality of LED chips connected in series and a light conversion layer wrapping the plurality of LED chips;
a first conductive electrode disposed at one of two ends of the LED section and electrically connected to the plurality of LED chips and one of the two conductive supports, wherein a portion of the first conductive electrode is wrapped by the light conversion layer;
a second conductive electrode disposed at the other one of the two ends of the LED section and electrically connected to the plurality of LED chips and the other one of the two conductive supports, wherein a portion of the second conductive electrode is wrapped by the light conversion layer; and a conductive portion electrically connected between the plurality of LED chips;

wherein an LED chip among the plurality of LED chips has an electrical connecting portion, an end portion of the conductive portion is connected to the electrical connecting portion, the conductive portion has a first bent portion and a second bent portion, and the conductive portion extends from the electrical connecting portion along a first direction of the LED chip, extends toward a second direction of the LED chip through the first bent portion, and extends toward a third direction of the LED chip through the second bent portion, and wherein the first direction, the second direction, and the third direction are different directions.

13. The LED light bulb according to claim 12, wherein the first direction is a height direction of the LED chip, the second direction is a width direction of the LED chip, and the third direction is a length direction of the LED chip.

14. The LED light bulb according to claim 12, wherein a distance between the first bent portion and a surface of the LED chip is between 80 μm and 120 μm and a distance between the first bent portion and the second bent portion is between 100 μm and 120 μm.

15. The LED light bulb according to claim 12, wherein the LED filament further comprises a first solder layer, the first solder layer is made of a soldering material, and the end portion of the conductive portion is between the electrical connecting portion of the LED chip and the first solder layer.

16. The LED light bulb according to claim 15, wherein a projection area of the first solder layer on the electrical connecting portion of the LED chip is larger than a projection area of a bonding region between the conductive portion and the electrical connecting portion of the LED chip.

17. The LED light bulb according to claim 15, wherein the end portion of the conductive portion, the electrical connecting portion of the LED chip, and the first solder layer together form a joining portion, the joining portion has a meshy surface, and a plurality of bulges and a plurality of indents are alternately arranged on the meshy surface.

18. The LED light bulb according to claim 15, wherein the LED filament comprises a second solder layer, the second solder layer is made of the solder material, and the end portion of the conductive portion is between the first solder layer and the second solder layer.

19. The LED light bulb according to claim 18, wherein each of a projection area of the first solder layer on the electrical connecting portion of the LED chip and a projection area of the second solder layer on the electrical connecting portion of the LED chip is larger than a projection area of a bonding region between the conductive portion and the first solder layer, and between the conductive portion and the second solder layer on the electrical connecting portion of the LED chip.

20. The LED light bulb according to claim 18, wherein a projection area of a bonding region between the conductive portion and the electrical connecting portion of the LED chip is smaller than the projection area of the first solder layer, and the projection area of the first solder layer is smaller than the projection area of the second solder layer.

21. The LED light bulb according to claim 12, wherein the plurality of LED chips further comprises a first row of LED chips and a second row of LED chips, the first row of LED chips and the second row of LED chips are connected in parallel, the LED chips of the first row of LED chips are connected in series, the LED chips of the second row of LED chips connected in series, and the first row of LED chips and the second row of LED chips are alternately arranged along a width direction of the LED filament.

22. The LED light bulb according to claim 12, wherein the LED filament further comprises a first conductive portion and a second conductive portion electrically connected between the LED chip and the first conductive electrode; wherein one of two ends of the first conductive portion is connected to the LED chip, the other end of the first conductive portion is connected to the first conductive electrode, one of two ends of the second conductive portion is connected to the first conductive electrode, and the other end of the second conductive portion is connected to the LED chip; wherein the first conductive portion firstly extends downwards and then upwards by taking a first bending point of the first conductive portion as a first turning point of the first conductive portion, and the first conductive portion then extends upwards and then downwards by taking a second bending point of the first conductive portion as a second turning point of the first conductive portion; the second conductive portion firstly extends upwards and then downwards by taking a first bending point of the second conductive portion as a first turning point of the second conductive portion, and the second conductive portion then extend downwards and then upwards by taking a second bending point of the second conductive portion as a second turning point of the second conductive portion.

* * * * *